US008471650B2

(12) United States Patent
Yoshikawa et al.

(10) Patent No.: US 8,471,650 B2
(45) Date of Patent: Jun. 25, 2013

(54) DIPLEXER, AND WIRELESS COMMUNICATION MODULE AND WIRELESS COMMUNICATION APPARATUS USING THE SAME

(75) Inventors: Hiromichi Yoshikawa, Kirishima (JP); Shinji Isoyama, Kirishima (JP); Katsuro Nakamata, Kirishima (JP)

(73) Assignee: Kyocera Corporation, Kyoto (JP)

( * ) Notice: Subject to any disclaimer, the term of this patent is extended or adjusted under 35 U.S.C. 154(b) by 693 days.

(21) Appl. No.: 12/739,933

(22) PCT Filed: Oct. 24, 2008

(86) PCT No.: PCT/JP2008/069378

§ 371 (c)(1), (2), (4) Date: Apr. 26, 2010

(87) PCT Pub. No.: WO2009/054515

PCT Pub. Date: Apr. 30, 2009

(65) Prior Publication Data

US 2010/0253448 A1 Oct. 7, 2010

(30) Foreign Application Priority Data

| | | |
|---|---|---|
| Oct. 26, 2007 | (JP) | 2007-278422 |
| Nov. 28, 2007 | (JP) | 2007-306888 |
| Nov. 28, 2007 | (JP) | 2007-306889 |
| Dec. 25, 2007 | (JP) | 2007-331638 |
| Mar. 24, 2008 | (JP) | 2008-075242 |
| Mar. 24, 2008 | (JP) | 2008-075244 |
| Mar. 25, 2008 | (JP) | 2008-077155 |
| Mar. 25, 2008 | (JP) | 2008-078747 |

(51) Int. Cl.

| | |
|---|---|
| *H01P 1/20* | (2006.01) |
| *H01P 3/08* | (2006.01) |
| *H03H 7/01* | (2006.01) |

(52) U.S. Cl.

USPC ............ 333/134; 333/136; 333/185; 333/238

(58) Field of Classification Search

USPC ................. 333/134, 136, 185, 236, 238, 129, 333/202, 204

See application file for complete search history.

(56) References Cited

U.S. PATENT DOCUMENTS

| | | | | |
|---|---|---|---|---|
| 6,411,178 | B1 * | 6/2002 | Matsumura et al. | 333/134 |
| 6,885,259 | B2 * | 4/2005 | Lee et al. | 333/126 |

(Continued)

FOREIGN PATENT DOCUMENTS

| | | |
|---|---|---|
| JP | 10-200306 | 7/1998 |
| JP | 11-088008 | 3/1999 |

(Continued)

*Primary Examiner* — Dean O Takaoka
*Assistant Examiner* — Alan Wong
(74) *Attorney, Agent, or Firm* — DLA Piper LLP (US)

(57) ABSTRACT

A diplexer that can demultiplex and multiplex two signals having wide frequency bands, and a wireless communication module and a wireless communication apparatus using the same, are provided. A diplexer has a multilayer body including a first interlayer, a second interlayer and a third interlayer. On the first interlayer, first resonant electrodes are disposed in an interdigital form. On the second interlayer, a plurality of second resonant electrodes are disposed in an interdigital form. On the third interlayer, there are disposed an input coupling electrode that faces the input-stage first resonant electrode and the input-stage second resonant electrode in an interdigital form, a first output coupling electrode that faces the output-stage first resonant electrode in an interdigital form, and a second output coupling electrode that faces the output-stage second resonant electrode.

32 Claims, 60 Drawing Sheets

U.S. PATENT DOCUMENTS

| | | | | |
|---|---|---|---|---|
| 7,012,481 | B2 | 3/2006 | Maekawa et al. | 333/134 |
| 7,565,116 | B2 * | 7/2009 | Okuyama et al. | 455/83 |
| 7,679,475 | B2 * | 3/2010 | Yoshikawa | 333/204 |
| 8,031,035 | B2 * | 10/2011 | Chernyakov et al. | 333/203 |
| 8,283,995 | B2 * | 10/2012 | Okada et al. | 333/132 |
| 8,330,555 | B2 * | 12/2012 | Yoshikawa et al. | 333/185 |
| 2004/0066256 | A1 | 4/2004 | Maekawa et al. | 333/204 |
| 2006/0103488 | A1 | 5/2006 | Maekawa et al. | 333/134 |

FOREIGN PATENT DOCUMENTS

| | | | |
|---|---|---|---|
| JP | 2000286608 | A | 10/2000 |
| JP | 2001119209 | A | 4/2001 |
| JP | 2002-271109 | | 9/2002 |
| JP | 2003298317 | A | 10/2003 |
| JP | 2004-147300 | | 5/2004 |
| JP | 2004-180032 | | 6/2004 |

* cited by examiner

UPPER FACE
60c
60b
22
60a
SECOND INTERLAYER
24
31b
31a
31d
31c
INTERLAYER B
41b
41a
11
THIRD INTERLAYER
32b
45c
40a
11
40c
45b
45a
40b
32a
FIRST INTERLAYER
30d
30a
30c
30b
23
INTERLAYER A
32c
32d
LOWER FACE
21

DIPLEXER, AND WIRELESS COMMUNICATION MODULE AND WIRELESS COMMUNICATION APPARATUS USING THE SAME

CROSS-REFERENCE TO THE RELATED APPLICATIONS

This application is a national stage of international application No. PCT/JP2008/069378, filed on Oct. 24, 2008 and claims priority under 35 USC 119 to Japanese Patent Application No. 2007-278422, filed on Oct. 26, 2007, Japanese Patent Application No. 2007-306889, filed on Nov. 28, 2007, Japanese Patent Application No. 2007-306888, filed on Nov. 28, 2007, Japanese Patent Application No. 2007-331638, filed on Dec. 25, 2007, Japanese Patent Application No. 2008-075242, filed on Mar. 24, 2008, Japanese Patent Application No. 2008-075244, filed on Mar. 24, 2008, Japanese Patent Application No. 2008-078747, filed on Mar. 25, 2008 and Japanese Patent Application No. 2008-077155, filed on Mar. 25, 2008, the entire contents of all of which are incorporated herein by reference.

TECHNICAL FIELD

The present invention relates to a diplexer, and a wireless communication module and a wireless communication apparatus using the same, and particularly relates to a diplexer that can demultiplex and multiplex two signals having very wide frequency bands, and a wireless communication module and a wireless communication apparatus using the same.

BACKGROUND ART

Recently, a UWB (ultra wide band) has been attracting attention as new communication means. A UWB enables a large volume of data to be transferred using a wide frequency band in a short distance of approximately 10 m. For example, according to the rules of American FCC (Federal Communication Commission), a frequency band of 3.1 to 10.6 GHz is planned to be used. In this manner, the UWB is characterized by using a very wide frequency band.

Recently, studies on a bandpass filter having a very wide pass band that can be used for such a UWB have been extensively performed. For example, it is reported that a very wide pass band having a pass bandwidth in which the fractional bandwidth (bandwidth/center frequency) is more than 100% can be obtained using a bandpass filter to which the principles of a directional coupler have been applied (see a non-patent document "Ultra-wide Bandpass Filter Using Microstrip-CPW Broadside Coupling Structure", March, 2005, Collection of Papers Presented at General Conference of the Institute of Electronics, Information and Communication Engineers, C-2-114 p. 147, for example).

Meanwhile, as a widely used conventional bandpass filter, a configuration is known in which a plurality of quarter-wavelength stripline resonators are arranged side by side and coupled to each other (see Japanese Unexamined Patent Publication JP-A 2004-180032, for example).

However, both bandpass filters proposed in the above-described non-patent document and JP-A 2004-180032 are problematic, and are not suitable for the use for a UWB.

For example, the bandpass filter proposed in the above-described non-patent document is problematic in that the pass bandwidth is too wide. That is to say, a UWB basically uses a frequency band of 3.1 GHz to 10.6 GHz, but International Telecommunications Union, Radio Communications Sector sets up a standard in which the band is divided into a low band that uses a frequency band of approximately 3.1 to 4.7 GHz and a high band that uses a frequency band of approximately 6 GHz to 10.6 GHz so as to avoid 5.3 GHz used by IEEE802.11.a. Thus, each of a low band filter that passes signals in the low band and a high band filter that passes signals in the high band is required to have a pass bandwidth in which the fractional bandwidth is approximately 40% to 50% and to have an attenuation at 5.3 GHz, and, thus, the bandpass filter proposed in the above-described non-patent document having a pass bandwidth in which the fractional bandwidth is more than 100% cannot be used because the pass bandwidth is too wide.

Furthermore, the pass bandwidth of a conventional bandpass filter using ¼ wavelength resonators is too narrow, and, even in the pass bandwidth of the bandpass filter described in JP-A 2004-180032, which has been adjusted so as to have a wider band, the fractional bandwidth is less than 10%. Thus, this filter cannot be used as a UWB bandpass filter that is required to have a wide pass bandwidth corresponding to a fractional bandwidth of 40% to 50%.

Moreover, in the case where both of the low band and the high band are used, in a RF IC that processes high frequency signals, a circuit that processes signals in the low band and a circuit that processes signals in the high band are different from each other, and, thus, two terminals may be provided on the antenna side, and there is increasing need for a diplexer that connects a low band-side terminal and a high band-side terminal, and an antenna.

DISCLOSURE OF INVENTION

The invention was devised in view of these problems in the conventional techniques, and it is an object thereof to provide a diplexer that can demultiplex and multiplex two signals having very wide frequency bands, which can be preferably used in the case where both of the low band and the high band of the UWB are used, and a wireless communication module and a wireless communication apparatus using the same.

It is another object of the invention to provide a diplexer that can demultiplex and multiplex two signals having very wide frequency bands, and in which good input impedance matching is obtained and the insertion loss is small throughout two entire very wide pass bands, and a wireless communication module and a wireless communication apparatus using the same.

It is another object of the invention to provide a diplexer that can demultiplex and multiplex two signals having very wide frequency bands, and that has an excellent isolation characteristic, and a wireless communication module and a wireless communication apparatus using the same.

It is another object of the invention to provide a diplexer that can demultiplex and multiplex two signals having very wide frequency bands, and that has attenuation poles near both ends of two pass bands, and has excellent frequency selectivity, and a wireless communication module and a wireless communication apparatus using the same.

A diplexer of the invention comprises a multilayer body, a first ground electrode, a second ground electrode, a plurality of strip-like first resonant electrodes, a plurality of strip-like second resonant electrodes, a strip-like input coupling electrode, a strip-like first output coupling electrode, and a strip-like second output coupling electrode. The multilayer body has a stack of a plurality of dielectric layers on top of each other. The first ground electrode is disposed on a lower face of the multilayer body. The second ground electrode is disposed on an upper face of the multilayer body. The plurality of first resonant electrodes are arranged side by side on a first interlayer of the multilayer body for mutual electromagnetic-field coupling, with their one ends connected to a ground potential so as to serve as a quarter-wavelength resonator. The plurality of second resonant electrodes are arranged side by side on a second interlayer of the multilayer body different from the first interlayer for mutual electromagnetic-field coupling, with their one ends connected to a ground potential so as to serve as a quarter-wavelength resonator that resonates at a frequency higher than a frequency of the first resonant electrodes. The input coupling electrode is disposed on a third interlayer of the multilayer body located between the first interlayer and the second interlayer, faces an input-stage first resonant electrode of the plurality of first resonant electrodes, over more than half of an entire longitudinal area thereof for electromagnetic-field coupling, faces an input-stage second resonant electrode of the plurality of second resonant electrodes, over more than half of an entire longitudinal area thereof for electromagnetic-field coupling, and has an electric signal input point for receiving input of an electric signal from an external circuit. The first output coupling electrode is disposed on an interlayer of the multilayer body different from the first interlayer, faces an output-stage first resonant electrode of the plurality of first resonant electrodes, over more than half of an entire longitudinal area thereof for electromagnetic-field coupling, and has a first electric signal output point for producing output of an electric signal toward the external circuit. The second output coupling electrode is disposed on an interlayer of the multilayer body different from the second interlayer, faces an output-stage second resonant electrode of the plurality of second resonant electrodes, over more than half of an entire longitudinal area thereof, and has a second electric signal output point for producing output of an electric signal toward the external circuit. The one end of the input-stage first resonant electrode and the one end of the input-stage second resonant electrode are located on a same side. The first output coupling electrode and the second output coupling electrode in a plan view are located on opposite sides with the input coupling electrode interposed therebetween. The electric signal input point is located, on the input coupling electrode, closer to another end of the input-stage first resonant electrode than a center of a part facing the input-stage first resonant electrode, and closer to another end of the input-stage second resonant electrode than a center of a part facing the input-stage second resonant electrode. The first electric signal output point is located, on the first output coupling electrode, closer to another end of the output-stage first resonant electrode than a center of a part facing the output-stage first resonant electrode. The second electric signal output point is located, on the second output coupling electrode, closer to another end of the output-stage second resonant electrode than a center of a part facing the output-stage second resonant electrode.

A diplexer of the invention comprises a multilayer body, a first ground electrode, a second ground electrode, a plurality of strip-like first resonant electrodes, a plurality of strip-like second resonant electrodes, a composite input coupling electrode, a strip-like first output coupling electrode, and a strip-like second output coupling electrode. The multilayer body has a stack of a plurality of dielectric layers on top of each other. The first ground electrode is disposed on a lower face of the multilayer body. The second ground electrode is disposed on an upper face of the multilayer body. The plurality of first resonant electrodes are arranged side by side on a first interlayer of the multilayer body for mutual electromagnetic-field coupling, with their one ends connected to a ground potential so as to serve as a quarter-wavelength resonator. The plurality of second resonant electrodes are arranged side by side on a second interlayer of the multilayer body different from the first interlayer for mutual electromagnetic-field coupling, with their one ends connected to a ground potential so as to serve as a quarter-wavelength resonator that resonates at a frequency higher than a frequency of the first resonant electrodes. The composite input coupling electrode includes a strip-like first input coupling electrode that is disposed on a third interlayer of the multilayer body located between the first interlayer and the second interlayer, and faces an input-stage first resonant electrode of the plurality of first resonant electrodes, over more than half of an entire longitudinal area thereof; a strip-like second input coupling electrode that is disposed on a fourth interlayer of the multilayer body located between the second interlayer and the third interlayer, and faces an input-stage second resonant electrode of the plurality of second resonant electrodes, over more than half of an entire longitudinal area thereof; and an input-side connection conductor that connects the first input coupling electrode and the second input coupling electrode. The composite input coupling electrode makes electromagnetic-field coupling with the input-stage first resonant electrode and the input-stage second resonant electrode, and has an electric signal input point for receiving input of an electric signal. The first output coupling electrode is disposed on an interlayer of the multilayer body different from the first interlayer, faces an output-stage first resonant electrode of the plurality of first resonant electrodes, over more than half of an entire longitudinal area thereof for electromagnetic-field coupling, and has a first electric signal output point for producing output of an electric signal. The second output coupling electrode is disposed on an interlayer of the multilayer body different from the second interlayer, faces an output-stage second resonant electrode of the plurality of second resonant electrodes, over more than half of an entire longitudinal area thereof for electromagnetic-field coupling, and has a second electric signal output point for producing output of an electric signal. The one end of the input-stage first resonant electrode and the one end of the input-stage second resonant electrode are located on a same side. The first output coupling electrode and the second output coupling electrode in a plan view are located on opposite sides with the input coupling electrodes interposed therebetween. The electric signal input point and the input-side connection conductor are located, on the composite input coupling electrode, closer to another end of the input-stage first resonant electrode than a center of a part facing the input-stage first resonant electrode, and closer to another end of the input-stage second resonant electrode than a center of a part facing the input-stage second resonant electrode. The first electric signal output point is located, on the first output coupling electrode, closer to another end of the output-stage first resonant electrode than a center of a part facing the output-stage first resonant electrode. The second electric signal output point is located, on the second output coupling electrode, closer to another end of the output-stage second resonant electrode than a center of a part facing the output-stage second resonant electrode.

A diplexer of the invention comprises a multilayer body, a first ground electrode, a second ground electrode, a plurality of strip-like first resonant electrodes, 2n strip-like second resonant electrodes (n is a natural number), a strip-like input coupling electrode, a strip-like first output coupling electrode, a strip-like second output coupling electrode, a third resonant electrode, and a resonant electrode coupling conductor. A multilayer body has a stack of a plurality of dielectric layers on top of each other. The first ground electrode is disposed on a lower face of the multilayer body. The second ground electrode is disposed on an upper face of the multilayer body. The plurality of first resonant electrodes are arranged side by side on a first interlayer of the multilayer body for mutual electromagnetic-field coupling, with their one ends connected to a ground potential so as to serve as a quarter-wavelength resonator. The 2n second resonant electrodes are arranged side by side on a second interlayer of the multilayer body different from the first interlayer, with their one ends as well as their other ends displaced in relation to each other in a staggered manner, have their one ends connected to a ground potential so as to serve as a quarter-wavelength resonator that resonates at a frequency higher than a frequency of the first resonant electrodes, and make electromagnetic-field coupling with each other. The input coupling electrode is disposed on a third interlayer of the multilayer body located between the first interlayer and the second interlayer, faces an input-stage first resonant electrode of the plurality of first resonant electrodes, over more than half of an entire longitudinal area thereof for electromagnetic-field coupling, faces an input-stage second resonant electrode of the 2n second resonant electrodes, over more than half of an entire longitudinal area thereof for electromagnetic-field coupling, and has an electric signal input point for receiving input of an electric signal. The first output coupling electrode is disposed on an interlayer of the multilayer body different from the first interlayer, faces an output-stage first resonant electrode of the plurality of first resonant electrodes, over more than half of an entire longitudinal area thereof for electromagnetic-field coupling, and has a first electric signal output point for producing output of an electric signal. The second output coupling electrode is disposed on the third interlayer of the multilayer body, faces an output-stage second resonant electrode of the 2n second resonant electrodes, over more than half of an entire longitudinal area thereof for electromagnetic-field coupling, and has a second electric signal output point for producing output of an electric signal. The third resonant electrode is disposed, on the first interlayer of the multilayer body, faces the second output coupling electrode for electromagnetic-field coupling, with one end connected to a ground potential so as to serve as a quarter-wavelength resonator that resonates at a same frequency as a frequency of the first resonant electrodes. The resonant electrode coupling conductor is disposed on a fourth interlayer of the multilayer body located on a side opposite the third interlayer with the first interlayer interposed therebetween, has its one end connected to a ground potential close to the one end of the input-stage first resonant electrode, has its another end connected to a ground potential close to the one end of the third resonant electrode, and has a region facing the one end of the input-stage first resonant electrode for electromagnetic-field coupling and a region facing the one end of the third resonant electrode for electromagnetic-field coupling. The one end of the input-stage first resonant electrode and the one end of the input-stage second resonant electrode are located on a same side. The one end of the output-stage second resonant electrode and the one end of the third resonant electrode are located on a same side. The first output coupling electrode and the second output coupling electrode in a plan view are located on opposite sides with the input coupling electrode interposed therebetween. The electric signal input point is located, on the input coupling electrode, closer to another end of the input-stage first resonant electrode than a center of a part facing the input-stage first resonant electrode, and closer to another end of the input-stage second resonant electrode than a center of a part facing the input-stage second resonant electrode. The first electric signal output point is located, on the first output coupling electrode, closer to another end of the output-stage first resonant electrode than a center of a part facing the output-stage first resonant electrode. The second electric signal output point is located, on the second output coupling electrode, closer to another end of the output-stage second resonant electrode than a center of a part facing the output-stage second resonant electrode.

Further, a diplexer of the invention comprises a multilayer body, a first ground electrode, a second ground electrode, a plurality of strip-like first resonant electrodes, 2n+1 strip-like second resonant electrodes (n is a natural number), a strip-like input coupling electrode, a strip-like first output coupling electrode, a strip-like second output coupling electrode, a third resonant electrode, and a resonant electrode coupling conductor. The multilayer body has a stack of a plurality of dielectric layers on top of each other. The first ground electrode is disposed on a lower face of the multilayer body. The second ground electrode is disposed on an upper face of the multilayer body. The plurality of first resonant electrodes are arranged side by side on a first interlayer of the multilayer body for mutual electromagnetic-field coupling, with their one ends connected to a ground potential so as to serve as a quarter-wavelength resonator. The 2n+1 second resonant electrodes are arranged side by side on a second interlayer of the multilayer body different from the first interlayer, with their one ends as wells as their other ends displaced in relation to each other in a staggered manner, have their one ends connected to a ground potential so as to serve as a quarter-wavelength resonator that resonates at a frequency higher than a frequency of the first resonant electrodes, and make electromagnetic-field coupling with each other. The input coupling electrode is disposed on a third interlayer of the multilayer body located between the first interlayer and the second interlayer, faces an input-stage first resonant electrode of the plurality of first resonant electrodes, over more than half of an entire longitudinal area thereof for electromagnetic-field coupling, faces an input-stage second resonant electrode of the 2n+1 second resonant electrodes, over more than half of an entire longitudinal area thereof for electromagnetic-field coupling, and has an electric signal input point for receiving input of an electric signal. The first output coupling electrode is disposed on an interlayer of the multilayer body different from the first interlayer, faces an output-stage first resonant electrode of the plurality of first resonant electrodes, over more than half of an entire longitudinal area thereof for electromagnetic-field coupling, and has a first electric signal output point for producing output of an electric signal. The second output coupling electrode is disposed on the third interlayer of the multilayer body, faces an output-stage second resonant electrode of the 2n+1 second resonant electrodes, over more than half of an entire longitudinal area thereof for electromagnetic-field coupling, and has a second electric signal output point for producing output of an electric signal. The third resonant electrode is disposed, on the first interlayer of the multilayer body, faces the second output coupling electrode for electromagnetic-field coupling, with its one end connected to a ground potential so as to serve as a quarter-wavelength resonator that resonates at a same frequency as a frequency of the first resonant electrodes. The resonant electrode coupling conductor is disposed on a fourth interlayer of the multilayer body located on a side opposite the third interlayer with the first interlayer interposed therebetween, has its one end connected to a ground potential close to the one end of the input-stage first resonant electrode, has its another end connected to a ground potential close to the one end of the third resonant electrode, and has a region facing the one end of the input-stage first resonant electrode for electromagnetic-field coupling and a region facing the one end of the third resonant electrode for electromagnetic-field coupling. The one end of the input-stage first resonant electrode and the one end of the input-stage second resonant electrode are located on a same side. The one end of the output-stage second resonant electrode and the one end of the third resonant electrode are located on opposite sides. The first output coupling electrode and the second output coupling electrode in a plan view are located on opposite sides with the input coupling electrode interposed therebetween. The electric signal input point is located, on the input coupling electrode, closer to another end of the input-stage first resonant electrode than a center of a part facing the input-stage first resonant electrode, and closer to another end of the input-stage second resonant electrode than a center of a part facing the input-stage second resonant electrode. The first electric signal output point is located, on the first output coupling electrode, closer to another end of the output-stage first resonant electrode than a center of a part facing the output-stage first resonant electrode. The second electric signal output point is located, on the second output coupling electrode, closer to another end of the output-stage second resonant electrode than a center of a part facing the output-stage second resonant electrode.

A diplexer of claim the invention comprises a multilayer body, a first ground electrode, a second ground electrode, four or more strip-like first resonant electrodes, a plurality of strip-like second resonant electrodes, a strip-like input coupling electrode, a strip-like first output coupling electrode, a strip-like second output coupling electrode, and a first resonant electrode coupling conductor. The multilayer body has a stack of a plurality of dielectric layers on top of each other. The first ground electrode is disposed on a lower face of the multilayer body. The second ground electrode is disposed on an upper face of the multilayer body. The four or more first resonant electrodes are arranged side by side on a first interlayer of the multilayer body, with their one ends as well as their other ends displaced in relation to each other in a staggered manner, have their one ends connected to a ground potential so as to serve as a quarter-wavelength resonator, and make electromagnetic-field coupling with each other. The plurality of second resonant electrodes are arranged side by side on a second interlayer of the multilayer body different from the first interlayer for mutual electromagnetic-field coupling, with their one ends connected to a ground potential so as to serve as a quarter-wavelength resonator that resonates at a frequency higher than a frequency of the first resonant electrodes. The input coupling electrode is disposed on a third interlayer of the multilayer body located between the first interlayer and the second interlayer, faces an input-stage first resonant electrode of the four or more first resonant electrodes, over more than half of an entire longitudinal area thereof for electromagnetic-field coupling, faces an input-stage second resonant electrode of the plurality of second resonant electrodes, over more than half of an entire longitudinal area thereof for electromagnetic-field coupling, and has an electric signal input point for receiving input of an electric signal. The first output coupling electrode is disposed on an interlayer of the multilayer body different from the first interlayer, faces an output-stage first resonant electrode of the four or more first resonant electrodes, over more than half of an entire longitudinal area thereof for electromagnetic-field coupling, and has a first electric signal output point for producing output of an electric signal. The second output coupling electrode is disposed on an interlayer of the multilayer body different from the second interlayer, faces an output-stage second resonant electrode of the plurality of second resonant electrodes, over more than half of an entire longitudinal area thereof for electromagnetic-field coupling, and has a second electric signal output point for producing output of an electric signal. The first resonant electrode coupling conductor is disposed on a fourth interlayer of the multilayer body located on a side opposite the third interlayer with the first interlayer interposed therebetween, has its one end connected to a ground potential close to one end of a frontmost-stage first resonant electrode forming a first resonant electrode group including an even number of the four or more first resonant electrodes adjacent to each other, has its other end connected to a ground potential close to one end of a rearmost-stage first resonant electrode forming the first resonant electrode group, and has a region facing the one end of the frontmost-stage first resonant electrode for electromagnetic-field coupling and a region facing the one end of the rearmost-stage first resonant electrode for electromagnetic-field coupling. The one end of the input-stage first resonant electrode and the one end of the input-stage second resonant electrode are located on a same side. The first output coupling electrode and the second output coupling electrode in a plan view are located on opposite sides with the input coupling electrode interposed therebetween. The electric signal input point is located, on the input coupling electrode, closer to another end of the input-stage first resonant electrode than a center of a part facing the input-stage first resonant electrode, and closer to another end of the input-stage second resonant electrode than a center of a part facing the input-stage second resonant electrode. The first electric signal output point is located, on the first output coupling electrode, closer to another end of the output-stage first resonant electrode than a center of a part facing the output-stage first resonant electrode. The second electric signal output point is located, on the second output coupling electrode, closer to another end of the output-stage second resonant electrode than a center of a part facing the output-stage second resonant electrode.

Further, a diplexer of the invention comprises a multilayer body, a first ground electrode, a second ground electrode, a plurality of strip-like first resonant electrodes, four or more strip-like second resonant electrodes, a strip-like input coupling electrode, a strip-like first output coupling electrode, a strip-like second output coupling electrode, and a second resonant electrode coupling conductor. The multilayer body has a stack of a plurality of dielectric layers on top of each other. The first ground electrode is disposed on a lower face of the multilayer body. The second ground electrode is disposed on an upper face of the multilayer body. The plurality of first resonant electrodes are arranged side by side on a first interlayer of the multilayer body for mutual electromagnetic-field coupling, with their one ends connected to a ground potential so as to serve as a quarter-wavelength resonator. The four or more second resonant electrodes are arranged side by side on a second interlayer of the multilayer body different from the first interlayer, with their one ends as well as their other ends displaced in relation to each other in a staggered manner, have their one ends connected to a ground potential so as to serve as a quarter-wavelength resonator that resonates at a frequency higher than a frequency of the first resonant electrodes, and make electromagnetic-field coupling with each other. The input coupling electrode is disposed on a third interlayer of the multilayer body located between the first interlayer and the second interlayer, faces an input-stage first resonant electrode of the plurality of first resonant electrodes, over more than half of an entire longitudinal area thereof for electromagnetic-field coupling, faces an input-stage second resonant electrode of the four or more second resonant electrodes, over more than half of an entire longitudinal area thereof for electromagnetic-field coupling, and has an electric signal input point for receiving input of an electric signal. The first output coupling electrode is disposed on an interlayer of the multilayer body different from the first interlayer, faces an output-stage first resonant electrode of the plurality of first resonant electrodes, over more than half of an entire longitudinal area thereof for electromagnetic-field coupling, and has a first electric signal output point for producing output of an electric signal. The second output coupling electrode is disposed on an interlayer of the multilayer body different from the second interlayer, faces an output-stage second resonant electrode of the four or more second resonant electrodes, over more than half of an entire longitudinal area thereof for electromagnetic-field coupling, and has a second electric signal output point for producing output of an electric signal. The second resonant electrode coupling conductor is disposed on a fifth interlayer of the multilayer body located on a side opposite the third interlayer with the second interlayer interposed therebetween, has its one end connected to a ground potential close to one end of a frontmost-stage second resonant electrode forming a second resonant electrode group including an even number of the four or more second resonant electrodes adjacent to each other, has its another end connected to a ground potential close to one end of a rearmost-stage second resonant electrode forming the second resonant electrode group, and has a region facing the one end of the frontmost-stage second resonant electrode for electromagnetic-field coupling and a region facing the one end of the rearmost-stage second resonant electrode for electromagnetic-field coupling. The one end of the input-stage first resonant electrode and the one end of the input-stage second resonant electrode are located on a same side. The first output coupling electrode and the second output coupling electrode in a plan view are located on opposite sides with the input coupling electrode interposed therebetween. The electric signal input point is located, on the input coupling electrode, closer to another end of the input-stage first resonant electrode than a center of a part facing the input-stage first resonant electrode, and closer to another end of the input-stage second resonant electrode than a center of a part facing the input-stage second resonant electrode. The first electric signal output point is located, on the first output coupling electrode, closer to another end of the output-stage first resonant electrode than a center of a part facing the output-stage first resonant electrode. The second electric signal output point is located, on the second output coupling electrode, closer to another end of the output-stage second resonant electrode than a center of a part facing the output-stage second resonant electrode.

Furthermore, a diplexer of the invention comprises a multilayer body, a first ground electrode, a second ground electrode, four or more strip-like first resonant electrodes, four or more strip-like second resonant electrodes, a strip-like input coupling electrode, a strip-like first output coupling electrode, a strip-like second output coupling electrode, a first resonant electrode coupling conductor, and a second resonant electrode coupling conductor. The multilayer body has a stack of a plurality of dielectric layers on top of each other. The first ground electrode is disposed on a lower, face of the multilayer body. The second ground electrode is disposed on an upper face of the multilayer body. The four or more first resonant electrodes are arranged side by side on a first interlayer of the multilayer body, with their one ends as well as their other ends displaced in relation to each other in a staggered manner, have their one ends connected to a ground potential so as to serve as a quarter-wavelength resonator, and make electromagnetic-field coupling with each other. The four or more second resonant electrodes are arranged side by side on a second interlayer of the multilayer body different from the first interlayer, with their one ends as well as their other ends displaced in relation to each other in a staggered manner, have their one ends connected to a ground potential so as to serve as a quarter-wavelength resonator that resonates at a frequency higher than a frequency of the first resonant electrodes, and make electromagnetic-field coupling with each other. The input coupling electrode is disposed on a third interlayer of the multilayer body located between the first interlayer and the second interlayer, faces an input-stage first resonant electrode of the four or more first resonant electrodes, over more than half of an entire longitudinal area thereof for electromagnetic-field coupling, faces an input-stage second resonant electrode of the four or more second resonant electrodes, over more than half of an entire longitudinal area thereof for electromagnetic-field coupling, and has an electric signal input point for receiving input of an electric signal. The first output coupling electrode is disposed on an interlayer of the multilayer body different from the first interlayer, faces an output-stage first resonant electrode of the four or more first resonant electrodes, over more than half of an entire longitudinal area thereof for electromagnetic-field coupling, and has a first electric signal output point for producing output of an electric signal. The second output coupling electrode is disposed on an interlayer of the multilayer body different from the second interlayer, faces an output-stage second resonant electrode of the four or more second resonant electrodes, over more than half of an entire longitudinal area thereof for electromagnetic-field coupling, and has a second electric signal output point for producing output of an electric signal. The first resonant electrode coupling conductor is disposed on a fourth interlayer of the multilayer body located on a side opposite the third interlayer with the first interlayer interposed therebetween, has its one end connected to a ground potential close to one end of a frontmost-stage first resonant electrode forming a first resonant electrode group including an even number of the four or more first resonant electrodes adjacent to each other, has its another end connected to a ground potential close to one end of a rearmost-stage first resonant electrode forming the first resonant electrode group, and has a region facing the one end of the frontmost-stage first resonant electrode for electromagnetic-field coupling and a region facing the one end of the rearmost-stage first resonant electrode for electromagnetic-field coupling. The second resonant electrode coupling conductor is disposed on a fifth interlayer of the multilayer body located on a side opposite the third interlayer with the second interlayer interposed therebetween, has its one end connected to a ground potential close to one end of a frontmost-stage second resonant electrode forming a second resonant electrode group including an even number of the four or more second resonant electrodes adjacent to each other, has its another end connected to a ground potential close to one end of a rearmost-stage second resonant electrode forming the second resonant electrode group, and has a region facing the one end of the frontmost-stage second resonant electrode for electromagnetic-field coupling and a region facing the one end of the rearmost-stage second resonant electrode for electromagnetic-field coupling. The one end of the input-stage first resonant electrode and the one end of the input-stage second resonant electrode are located on a same side. The first output coupling electrode and the second output coupling electrode in a plan view are located on opposite sides with the input coupling electrode interposed therebetween. The electric signal input point is located, on the input coupling electrode, closer to another end of the input-stage first resonant electrode than a center of a part facing the input-stage first resonant electrode, and closer to another end of the input-stage second resonant electrode than a center of a part facing the input-stage second resonant electrode. The first electric signal output point is located, on the first output coupling electrode, closer to another end of the output-stage first resonant electrode than a center of a part facing the output-stage first resonant electrode. The second electric signal output point is located, on the second output coupling electrode, closer to another end of the output-stage second resonant electrode than a center of a part facing the output-stage second resonant electrode.

A wireless communication module of the invention comprises the diplexer of the invention according to any one of the above-mentioned structures.

A wireless communication apparatus of the invention comprises a RF portion that includes the diplexer according to any one of the above-mentioned structures; a baseband portion that is connected to the RF portion; and an antenna that is connected to the RF portion.

Here, an “interlayer different from the first interlayer” refers to an interlayer other than the first interlayer, and may be one interlayer or may be a plurality of interlayers. Thus, an “electrode that is disposed on an interlayer different from the first interlayer” may be disposed on one interlayer other than the first interlayer, or may be disposed such that portions thereof separately arranged on a plurality of interlayers other than the first interlayer are connected to each other. In a similar manner, an “interlayer located on a same side as the composite input coupling electrode with respect to the first interlayer” may be one interlayer or may be a plurality of interlayers. An “interlayer located on a same side as the input coupling electrode with respect to the first interlayer” may be one interlayer or may be a plurality of interlayers. Furthermore, “located, on the first output coupling electrode, closer to another end of the output-stage first resonant electrode than a center of a part facing the output-stage first resonant electrode” refers to a state in which a region is located on the side containing the part closest to the other end of the output-stage first resonant electrode, when the first output coupling electrode is divided at the center of the part facing the output-stage first resonant electrode, into two longitudinal regions.

BRIEF DESCRIPTION OF DRAWINGS

Other and further objects, features, and advantages of the invention will be more explicit from the following detailed description taken with reference to the drawings wherein.

BEST MODE FOR CARRYING OUT THE INVENTION

Hereinafter, preferable embodiments of the invention will be described in detail with reference to the drawings.

Hereinafter, a diplexer, and a wireless communication module and a wireless communication apparatus using the same of the invention will be described in detail with reference to the appended drawings.

First Embodiment

Figure 1:
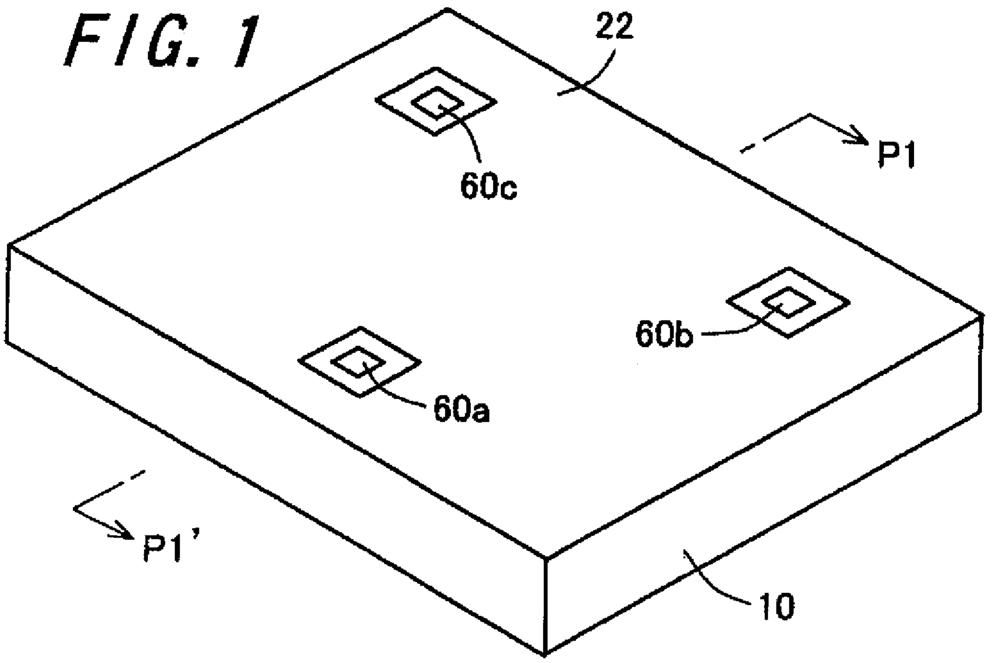
FIG. 1 is an external perspective view schematically showing a diplexer according to a first embodiment of the invention.
Figure 2:
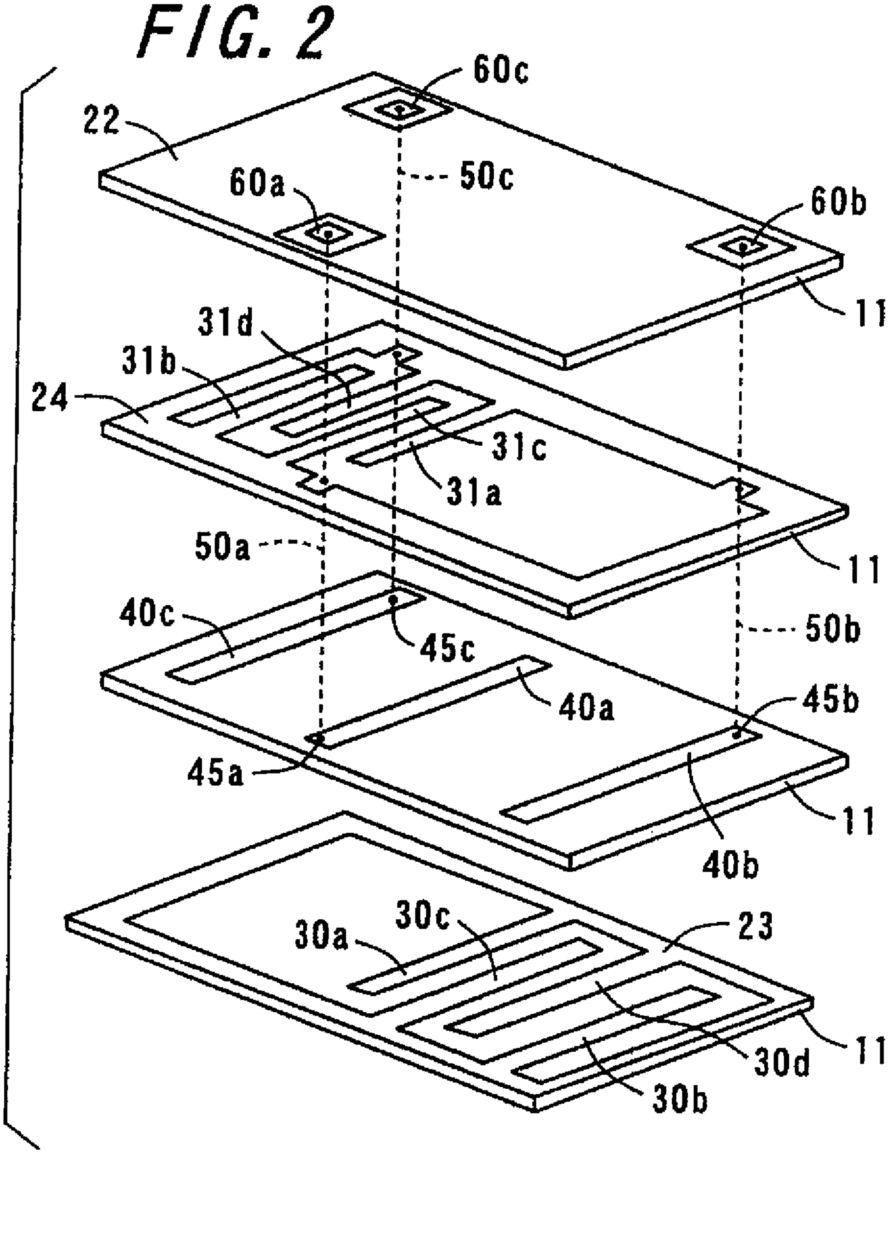
FIG. 2 is a schematic exploded perspective view of the diplexer shown in FIG. 1.
Figure 3:
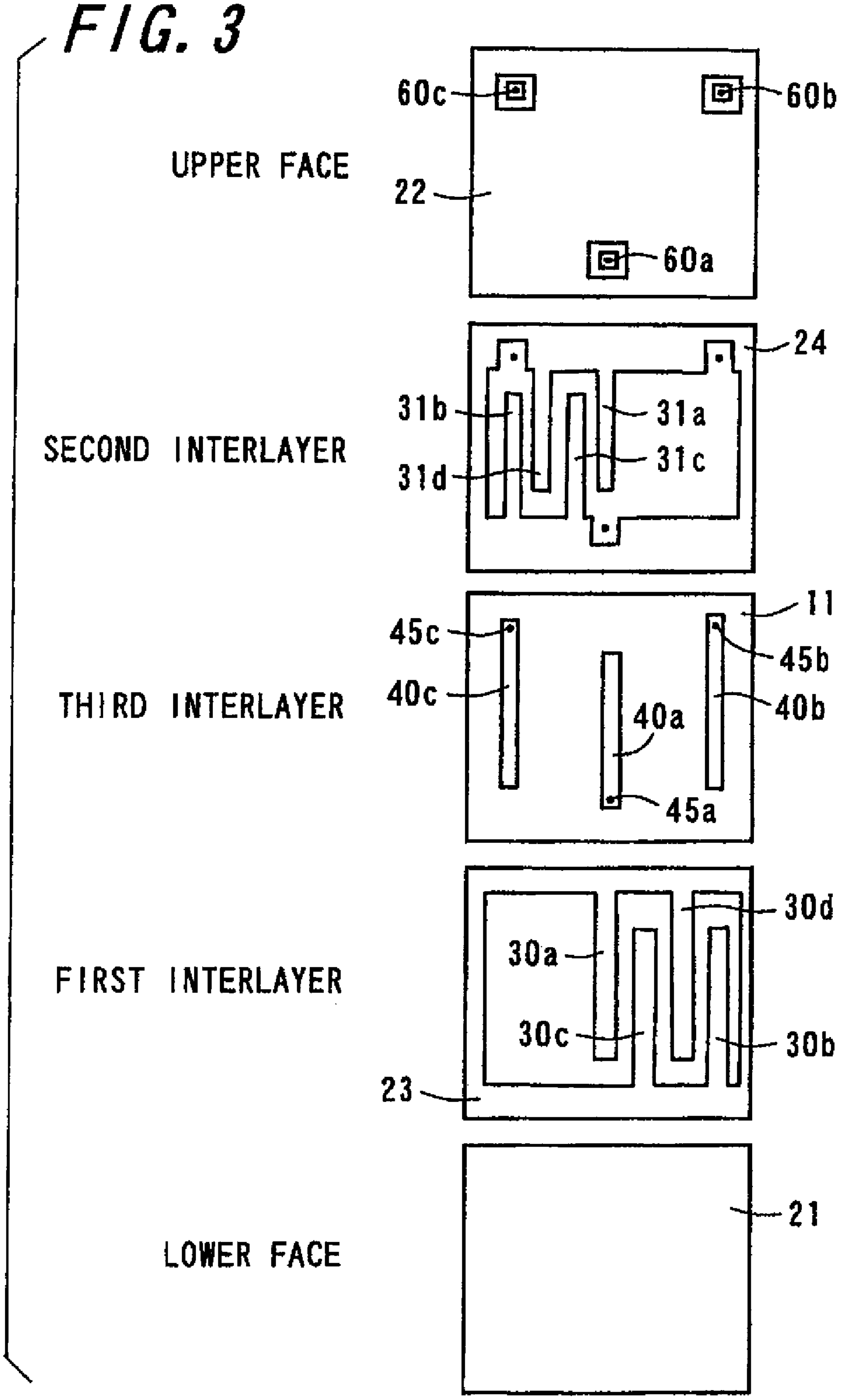
FIG. 3 is a plan view schematically showing upper and lower faces and interlayers of the diplexer shown in FIG. 1.
Figure 4:
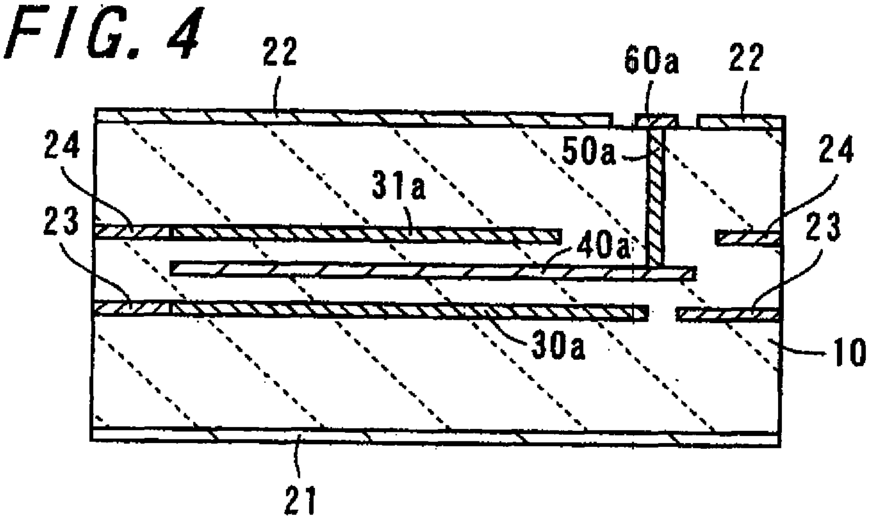
FIG. 4 is a cross-sectional view taken along line P1-P1' of FIG. 1.

FIG. 1 is an external perspective view schematically showing a diplexer according to a first embodiment of the invention. FIG. 2 is a schematic exploded perspective view of the diplexer shown in FIG. 1. FIG. 3 is a plan view schematically showing upper and lower faces and interlayers of the diplexer shown in FIG. 1. FIG. 4 is a cross-sectional view taken along line P1-P1' of FIG. 1.

As shown in FIGS. 1 to 4, the diplexer of this embodiment includes a multilayer body 10, a first ground electrode 21, a second ground electrode 22, a plurality of strip-like first resonant electrodes 30*a*, 30*b*, 30*c*, and 30*d*, and a plurality of strip-like second resonant electrodes 31*a*, 31*b*, 31*c*, and 31*d*. The multilayer body 10 has a stack of a plurality of dielectric layers 11 on top of each other. The first ground electrode 21 is disposed on the lower face of the multilayer body 10. The second ground electrode 22 is disposed on the upper face of the multilayer body 10. The plurality of first resonant electrodes 30*a*, 30*b*, 30*c*, and 30*d* are arranged side by side on a first interlayer of the multilayer body 10, with their one ends as well as their other ends displaced in relation to each other in a staggered manner, have their one ends connected to a ground potential so as to serve as a quarter-wavelength resonator, and make electromagnetic-field coupling with each other. The plurality of second resonant electrodes 31*a*, 31*b*, 31*c*, and 31*d* are arranged side by side on a second interlayer of the multilayer body 10 different from the first interlayer, with their one ends as well as their other ends displaced in relation to each other in a staggered manner, have their one ends connected to a ground potential so as to serve as a quarter-wavelength resonator that resonates at a frequency higher than a frequency of the first resonant electrodes, and make electromagnetical-field coupling with each other.

The diplexer of this embodiment further includes a strip-like input coupling electrode 40*a*, a strip-like first output coupling electrode 40*b*, and a strip-like second output coupling electrode 40*c*. The input coupling electrode 40*a* is disposed on a third interlayer of the multilayer body 10 located between the first interlayer and the second interlayer, faces the input-stage first resonant electrode 30*a* of the plurality of first resonant electrodes 30*a*, 30*b*, 30*c*, and 30*d*, over more than half of an entire longitudinal area thereof for electromagnetic-field coupling, faces the input-stage second resonant electrode 31*a* of the plurality of second resonant electrodes 31*a*, 31*b*, 31*c*, and 31*d*, over more than half of an entire longitudinal area thereof for electromagnetic-filed coupling, and has an electric signal input point 45*a* for receiving input of an electric signal from an external circuit. The first output coupling electrode 40*b* is disposed on the third interlayer of the multilayer body 10, faces the output-stage first resonant electrode 30*b* of the plurality of first resonant electrodes 30*a*, 30*b*, 30*c*, and 30*d*, over more than half of an entire longitudinal area thereof for electromagnetic-field coupling, and has a first electric signal output point 45*b* for producing output of an electric signal toward an external circuit. The second output coupling electrode 40*c* is disposed on the third interlayer of the multilayer body 10, faces the output-stage second resonant electrode 31*b* of the plurality of second resonant electrodes 31*a*, 31*b*, 31*c*, and 31*d*, over more than half of an entire longitudinal area thereof for electromagnetic-field coupling, and has a second electric signal output point 45*c* for producing output of an electric signal toward an external circuit.

The diplexer of this embodiment further includes a first annular ground electrode 23 and a second annular ground electrode 24. On the first interlayer of the multilayer body 10, the first annular ground electrode 23 is formed in an annular shape so as to surround the plurality of first resonant electrodes 30*a*, 30*b*, 30*c*, and 30*d*, and is connected to the one ends, respectively, of the plurality of first resonant electrodes 30*a*, 30*b*, 30*c*, and 30*d*. On the second interlayer of the multilayer body 10, the second annular ground electrode 24 is formed in an annular shape so as to surround the plurality of second resonant electrodes 31*a*, 31*b*, 31*c*, and 31*d*, and is connected to the one ends, respectively, of the plurality of second resonant electrodes 31*a*, 31*b*, 31*c*, and 31*d*.

Furthermore, in the diplexer of this embodiment, the one end of the input-stage first resonant electrode 30*a* and the one end of the input-stage second resonant electrode 31*a* are located on the same side. The first output coupling electrode 40*b* and the second output coupling electrode 40*c* in a plan view are located on the opposite sides with the input coupling electrode 40*a* interposed therebetween. In the input coupling electrode 40*a*, the electric signal input point 45*a* is located closer to the other end of the input-stage first resonant electrode 30*a* than a center of a part facing the input-stage first resonant electrode 30*a*, and closer to the other end of the input-stage second resonant electrode 31*a* than a center of a part facing the input-stage second resonant electrode 31*a*. In the first output coupling electrode 40*b*, the first electric signal output point 45*b* is located closer to the other end of the output-stage first resonant electrode 30*b* than a center of a part facing the output-stage first resonant electrode 30*b*. In the second output coupling electrode 40*c*, the second electric signal output point 45*c* is located closer to the other end of the output-stage second resonant electrode 31*b* than a center of a part facing the output-stage second resonant electrode 31*b*.

Furthermore, in the diplexer of this embodiment; the input coupling electrode 40*a* is connected via a through conductor 50*a* to an input terminal electrode 60*a* disposed on the upper face of the multilayer body 10, the first output coupling electrode 40*b* is connected via a through conductor 50*b* to a first output terminal electrode 60*b* disposed on the upper face of the multilayer body 10, and the second output coupling electrode 40*c* is connected via a through conductor 50*c* to a second output terminal electrode 60*c* disposed on the upper face of the multilayer body 10. Thus, a point that connects the input coupling electrode 40*a* and the through conductor 50*a* is the electric signal input point 45*a*, a point that connects the first output coupling electrode 40*b* and the through conductor 50*b* is the first electric signal output point 45*b*, and a point that connects the second output coupling electrode 40*c* and the through conductor 50*c* is the second electric signal output point 45*c*.

In the thus configured diplexer of this embodiment, when an electric signal from an external circuit is inputted via the input terminal electrode 60*a* and the through conductor 50*a* to the electric signal input point 45*a* of the input coupling electrode 40*a*, the input-stage first resonant electrode 30*a* that makes electromagnetic-field coupling with the input coupling electrode 40*a* is excited, and, thus, the plurality of first resonant electrodes 30*a*, 30*b*, 30*c*, and 30*d* that make electromagnetic-field coupling with each other resonate, and an electric signal is outputted from the first electric signal output point 45*b* of the first output coupling electrode 40*b* that makes electromagnetic-field coupling with the output-stage first resonant electrode 30*b*, via the through conductor 50*b* and the first output terminal electrode 60*b*, toward an external circuit. In this manner, a signal in a first frequency band containing a frequency at which the plurality of first resonant electrodes 30*a*, 30*b*, 30*c*, and 30*d* resonate is selectively outputted from the first output terminal electrode 60*b*.

Furthermore, in the diplexer of this embodiment, when an electric signal from an external circuit is inputted via the input terminal electrode 60*a* and the through conductor 50*a* to the electric signal input point 45*a* of the input coupling electrode 40*a*, the input-stage second resonant electrode 31*a* that makes electromagnet-field coupling with the input coupling electrode 40*a* is excited, and, thus, the plurality of second resonant electrodes 31*a*, 31*b*, 31*c*, and 31*d* that make electromagnet-field coupling with each other resonate, and an electric signal is outputted from the second electric signal output point 45*c* of the second output coupling electrode 40*c* that makes electromagnetic-field coupling with the output-stage second resonant electrode 31*b*, via the through conductor 50*c* and the second output terminal electrode 60*c*, toward an external circuit. In this manner, a signal in a second frequency band containing a frequency at which the plurality of second resonant electrodes 31*a*, 31*b*, 31*c*, and 31*d* resonate is selectively outputted from the second output terminal electrode 60*c*.

In this manner, the diplexer of this embodiment serves as a diplexer that demultiplexes a signal inputted from the input terminal electrode 60*a* according to the frequency, and that outputs resulting signals from the first output terminal electrode 60*b* and the second output terminal electrode 60*c*.

In the diplexer of this embodiment, the first ground electrode 21 is disposed on the entire lower face of the multilayer body 10, the second ground electrode 22 is disposed on substantially the entire upper face of the multilayer body 10 excluding portions around the input terminal electrode 60*a*, the first output terminal electrode 60*b*, and the second output terminal electrode 60*c*, and both electrodes are connected to a ground potential and form a stripline resonator together with the plurality of first resonant electrodes 30*a*, 30*b*, 30*c*, and 30*d* and the plurality of second resonant electrodes 31*a*, 31*b*, 31*c*, and 31*d*.

Furthermore, in the diplexer of this embodiment, the plurality of strip-like first resonant electrodes 30*a*, 30*b*, 30*c*, and 30*d* respectively have one ends that are connected to the first annular ground electrode 23 and connected to a ground potential so as to serve as a quarter-wavelength resonator. Furthermore, the electrical lengths thereof are set to approximately ¼ the wavelength at the center frequency of a pass band formed by the plurality of first resonant electrodes 30*a*, 30*b*, 30*c*, and 30*d*. In a similar manner, the plurality of strip-like second resonant electrodes 31*a*, 31*b*, 31*c*, and 31*d* respectively have one ends that are connected to the second annular ground, electrode 24 and connected to a ground potential so as to serve as a quarter-wavelength resonator. Furthermore, the electrical lengths thereof are set to approximately ¼ the wavelength at the center frequency of a pass band formed by the plurality of second resonant electrodes 31*a*, 31*b*, 31*c*, and 31*d*.

Furthermore, the plurality of first resonant electrodes 30*a*, 30*b*, 30*c*, and 30*d* are arranged side by side on the first interlayer of the multilayer body 10, and edge-coupled to each other, and the plurality of second resonant electrodes 31*a*, 31*b*, 31*c*, and 31*d* are arranged side by side on the second interlayer of the multilayer body 10, and edge-coupled to each other. The gap between the plurality of first resonant electrodes 30*a*, 30*b*, 30*c*, and 30*d* arranged side by side, and the gap between the plurality of second resonant electrodes 31*a*, 31*b*, 31*c*, and 31*d* arranged side by side are set to, for example, approximately 0.05 to 0.5 mm, because a smaller gap realizes a more intense coupling but too small a gap makes the production difficult.

Moreover, the plurality of first resonant electrodes 30*a*, 30*b*, 30*c*, and 30*d* arranged side by side are arranged with their one ends as well as their other ends displaced in relation to each other in a staggered manner. Since the resonant electrodes are coupled to each other in an interdigital form, a magnetic-field coupling and an electric-field coupling are added, and a more intense coupling than a comb-line coupling is generated. Accordingly, in a pass band formed by the plurality of first resonant electrodes 30*a*, 30*b*, 30*c*, and 30*d*, the frequency interval between the resonance frequencies in each resonance mode can be set so as to be suitable for obtaining a very wide pass bandwidth in which the fractional bandwidth is approximately 40% to 50%, which is much wider than a region that can be realized by a conventional filter using a quarter-wavelength resonator.

In a similar manner, the plurality of second resonant electrodes 31*a*, 31*b*, 31*c*, and 31*d* arranged side by side are arranged with their one ends as well as their other ends displaced in relation to each other in a staggered manner. Since the resonant electrodes are coupled to each other in an interdigital form, in a pass band formed by the plurality of second resonant electrodes 31*a*, 31*b*, 31*c*, and 31*d*, the frequency interval between the resonance frequencies in each resonance mode can be set so as to be suitable for obtaining a very wide pass bandwidth in which the fractional bandwidth is approximately 40% to 50%, which is much wider than a region that can be realized by a conventional filter using a quarter-wavelength resonator.

Here, it was seen from investigations that, in the case where a plurality of resonant electrodes forming one pass band are broadside-coupled and interdigitally-coupled to each other, the coupling is too intense, which is not preferable for obtaining a pass bandwidth in which the fractional bandwidth is approximately 40% to 50%.

Furthermore, in the diplexer of this embodiment, the input coupling electrode 40*a* is disposed on a third interlayer of the multilayer body 10 located between the first interlayer and the second interlayer, and faces the input-stage first resonant electrode 30*a* of the plurality of first resonant electrodes 30*a*, 30*b*, 30*c*, and 30*d*, over more than half of an entire longitudinal area thereof for electromagnetic-field coupling. Moreover, in the input coupling electrode 40*a*, the electric signal input point 45*a* for receiving input of an electric signal from an external circuit is located closer to the other end of the input-stage first resonant electrode 30*a* than the center of the part facing the input-stage first resonant electrode 30*a*. Furthermore, the first output coupling electrode 40*b* is disposed on the third interlayer of the multilayer body 10, and faces the output-stage first resonant electrode 30*b* of the plurality of first resonant electrodes 30*a*, 30*b*, 30*c*, and 30*d*, over more than half of an entire longitudinal area thereof for electromagnetic-field coupling. Moreover, in the first output coupling electrode 40*b*, the first electric signal output point 45*b* for producing output of an electric signal toward an external circuit is located closer to the other end of the output-stage first resonant electrode 30*b* than the center of the part facing the output-stage first resonant electrode 30*b*. With this configuration, the input coupling electrode 40*a* and the input-stage first resonant electrode 30*a* make electromagnetic-field coupling intensively by a broadside coupling through the dielectric layers 11, and are coupled to each other in an interdigital form, and, thus, a magnetic-field coupling and an electric-field coupling are added, and the electromagnetic coupling becomes more intense. Furthermore, the first output coupling electrode 40*b* and the output-stage first resonant electrode 30*b* make electromagnetic-field coupling intensively by a broadside coupling through the dielectric layers 11, and are coupled to each other in an interdigital form, and, thus, a magnetic-field coupling and an electric-field coupling are added, and the electromagnetic coupling becomes more intense. In this manner, according to the diplexer of the invention, the input coupling electrode 40*a* and the input-stage first resonant electrode 30*a* make electromagnetic-field coupling intensively by a broadside coupling through the dielectric layers 11 and make electromagnetic-field coupling more intensively by an interdigital coupling, and the first output coupling electrode 40*b* and the output-stage first resonant electrode 30*b* make electromagnetic-field coupling intensively by a broadside coupling through the dielectric layers 11 and make electromagnetic-field coupling more intensively by an interdigital coupling. Accordingly, in a pass band formed by the plurality of first resonant electrodes 30*a*, 30*b*, 30*c*, and 30*d*, even in a pass band much wider than a region that can be realized by a conventional filter using a quarter-wavelength resonator, a pass characteristic can be obtained in which the form is flat and the loss is low throughout the entire wide pass band, and in which the insertion loss at a frequency located between the resonance frequencies in each resonance mode does not significantly increase.

Moreover, according to the diplexer of this embodiment, the input coupling electrode 40*a* is disposed on a third interlayer of the multilayer body 10 located between the first interlayer and the second interlayer, and faces the input-stage second resonant electrode 31*a* of the plurality of second resonant electrodes 31*a*, 31*b*, 31*c*, and 31*d*, over more than half of an entire longitudinal area thereof for electromagnetic field coupling. Moreover, in the input coupling electrode 40*a*, the electric signal input point 45*a* for receiving input of an electric signal from an external circuit is located closer to the other end of the input-stage second resonant electrode 31*a* than the center of the part facing the input-stage second resonant electrode 31*a*. Furthermore, the second output coupling electrode 40*c* is disposed on the third interlayer of the multilayer body 10, and faces the output-stage second resonant electrode 31*b* of the plurality of second resonant electrodes 31*a*, 31*b*, 31*c*, and 31*d*, over more than half of an entire longitudinal area thereof for electromagnetic-field coupling. Moreover, in the second output coupling electrode 40*c*, the second electric signal output point 45*c* for producing output of an electric signal toward an external circuit is located closer to the other end of the output-stage second resonant electrode 31*b* than the center of the part facing the output-stage second resonant electrode 31*b*. With this configuration, the input coupling electrode 40*a* and the input-stage second resonant electrode 31*a* make electromagnetic-field coupling intensively by a broadside coupling through the dielectric layers 11, and are coupled to each other in an interdigital form, and, thus, a magnetic-field coupling and an electric-field coupling are added, and the electromagnetic coupling becomes more intense. Furthermore, the second output coupling electrode 40*c* and the output-stage second resonant electrode 31*b* make electromagnetic-field coupling intensively by a broadside coupling through the dielectric layers 11, and are coupled to each other in an interdigital form, and, thus, a magnetic-field coupling and an electric-field coupling are added, and the electromagnetic coupling becomes more intense. In this manner, according to the diplexer of the invention, the input coupling electrode 40*a* and the input-stage second resonant electrode 31*a* make electromagnetic-field coupling intensively by a broadside coupling through the dielectric layers 11 and make electromagnetic-field coupling more intensively by an interdigital coupling, and the second output coupling electrode 40*c* and the output-stage second resonant electrode 31*b* make electromagnetic-field coupling intensively by a broadside coupling through the dielectric layers 11 and make electromagnetic-field coupling more intensively by an interdigital coupling. Accordingly, in a pass band formed by the plurality of second resonant electrodes 31*a*, 31*b*, 31*c*, and 31*d*, even in a pass band much wider than a region that can be realized by a conventional filter using a quarter-wavelength resonator, a pass characteristic can be obtained in which the form is flat and the loss is low throughout the entire wide pass band, and in which the insertion loss at a frequency located between the resonance frequencies in each resonance mode does not significantly increase.

In this manner, according to the diplexer of this embodiment, the input coupling electrode 40*a*, and the input-stage first resonant electrode 30*a* and the input-stage second resonant electrode 31*a* make electromagnetic-field coupling intensively by a broadside coupling through the dielectric layers 11 and electromagnetically coupled more intensively by an interdigital coupling. In a similar manner, the first output coupling electrode 40*b* and the output-stage first resonant electrode 30*b*, and the second output coupling electrode 40*c* and the output-stage second resonant electrode 31*b* respectively make electromagnetic-field coupling intensively by a broadside coupling through the dielectric layers 11 and make electromagnetic-field coupling more intensively by an interdigital coupling. Accordingly, in both of a pass band formed by the plurality of first resonant electrodes 30*a*, 30*b*, 30*c*, and 30*d* and a pass band formed by the plurality of second resonant electrodes 31*a*, 31*b*, 31*c*, and 31*d*, even in a pass band much wider than a region that can be realized by a conventional filter using a quarter-wavelength resonator, a pass characteristic can be obtained in which the form is flat and the loss is low throughout the entire wide pass band, and in which the insertion loss at a frequency located between the resonance frequencies in each resonance mode does not significantly increase.

Furthermore, according to the diplexer of this embodiment, the one end of the input-stage first resonant electrode 30*a* and the one end of the input-stage second resonant electrode 31*a* are located on the same side. Thus, in this manner, the input coupling electrode 40*a*, and the input-stage first resonant electrode 30*a* and the input-stage second resonant electrode 31*a* can be broadside-coupled and interdigitally-coupled to each other.

Moreover, according to the diplexer of this embodiment, the first output coupling electrode 40*b* and the second output coupling electrode 40*c* in a plan view are located on the opposite sides with the input coupling electrode 40*a* interposed therebetween. Accordingly, the electromagnetic coupling between the plurality of first resonant electrodes 30*a*, 30*b*, 30*c*, and 30*d* and the plurality of second resonant electrodes 31*a*, 31*b*, 31*c*, and 31*d* can be attenuated, and, thus, the isolation between the plurality of first resonant electrodes 30*a*, 30*b*, 30*c*, and 30*d* and the plurality of second resonant electrodes 31*a*, 31*b*, 31*c*, and 31*d* can be secured.

Moreover, according to the diplexer of this embodiment, in the plurality of first resonant electrodes 30*a*, 30*b*, 30*c*, and 30*d* and the plurality of second resonant electrodes 31*a*, 31*b*, 31*c*, and 31*d*, the input-stage first resonant electrode 30*a* and the input-stage second resonant electrode 31*a* face each other with the input coupling electrode 40*a* interposed therebetween, and the first resonant electrodes 30*b*, 30*c*, and 30*d* and the second resonant electrodes 31*b*, 31*c*, and 31*d* other than the first resonant electrode 30*a* and the second resonant electrode 31*a* are arranged so as to be sequentially away therefrom. Thus, the input coupling electrode 40*a*, and the input-stage first resonant electrode 30*a* and the input-stage second resonant electrode 31*a* are broadside-coupled, and the isolation between the plurality of first resonant electrodes 30*a*, 30*b*, 30*c*, and 30*d* and the plurality of second resonant electrodes 31*a*, 31*b*, 31*c*, and 31*d* can be secured at a maximum. Accordingly, a diplexer can be obtained in which both of two wide pass bands have a flat and low-loss pass characteristic, and in which the isolation between the first output terminal electrode 60*b* and the second output terminal electrode 60*c* is sufficiently secured.

Here, the shape and the size of the input coupling electrode 40*a*, the first output coupling electrode 40*b*, and the second output coupling electrode 40*c* are preferably set so as to be similar to those of the input-stage first resonant electrode 30*a* and the output-stage first resonant electrode 30*b*. Furthermore, the gap between the input coupling electrode 40*a*, and the input-stage first resonant electrode 30*a* and the input-stage second resonant electrode 31*a*, the gap between the first output coupling electrode 40*b* and the output-stage first resonant electrode 30*b*, and the gap between the second output coupling electrode 40*c* and the output-stage second resonant electrode 31*b* are set to, for example, approximately 0.01 to 0.5 mm, because a smaller gap realizes a more intense coupling but too small a gap makes the production difficult.

Furthermore, according to the diplexer of this embodiment, on the first interlayer, the first annular ground electrode 23 is formed in the annular shape so as to surround the plurality of first resonant electrodes 30*a*, 30*b*, 30*c*, and 30*d*, and is connected to the one ends of the plurality of first resonant electrodes 30*a*, 30*b*, 30*c*, and 30*d*. Furthermore, on the second interlayer, the second annular ground electrode 24 is formed in the annular shape so as to surround the plurality of second resonant electrodes 31*a*, 31*b*, 31*c*, and 31*d*, and is connected to the one ends of the plurality of second resonant electrodes 31*a*, 31*b*, 31*c*, and 31*d*. With this configuration, there are electrodes that are connected to a ground potential on both sides in the longitudinal direction of both of the plurality of first resonant electrodes 30*a*, 30*b*, 30*c*, and 30*d* and the plurality of second resonant electrodes 31*a*, 31*b*, 31*c*, and 31*d*, and, thus, the one ends of the resonant electrodes that are arranged in a staggered manner can be easily connected to a ground potential. Furthermore, the first annular ground electrode 23 in the annular shape surrounds the plurality of first resonant electrodes 30*a*, 30*b*, 30*c*, and 30*d*, and the second annular ground electrode 24 in the annular shape surrounds the plurality of second resonant electrodes 31*a*, 31*b*, 31*c*, and 31*d*, and, thus, outside leakage of electromagnetic waves generated by the plurality of first resonant electrodes 30*a*, 30*b*, 30*c*, and 30*d* and the plurality of second resonant electrodes 31*a*, 31*b*, 31*c*, and 31*d* can be reduced. These effects are particularly useful in the case where a diplexer is formed in a partial region on a module substrate.

Second Embodiment

Figure 5:
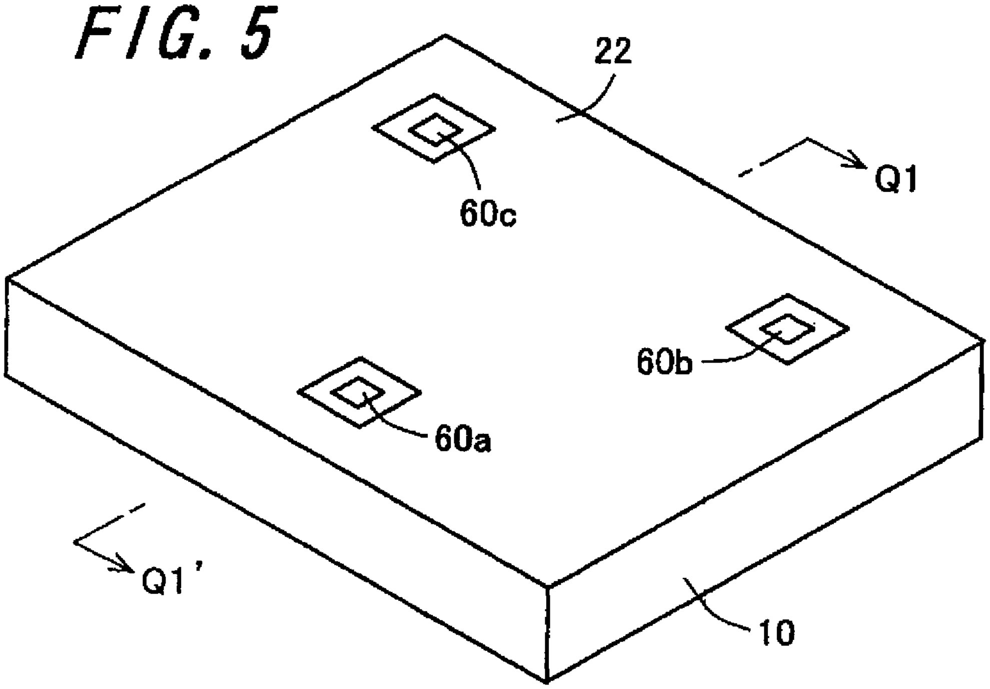
FIG. 5 is an external perspective view schematically showing a diplexer according to a second embodiment of the invention.
Figure 6:
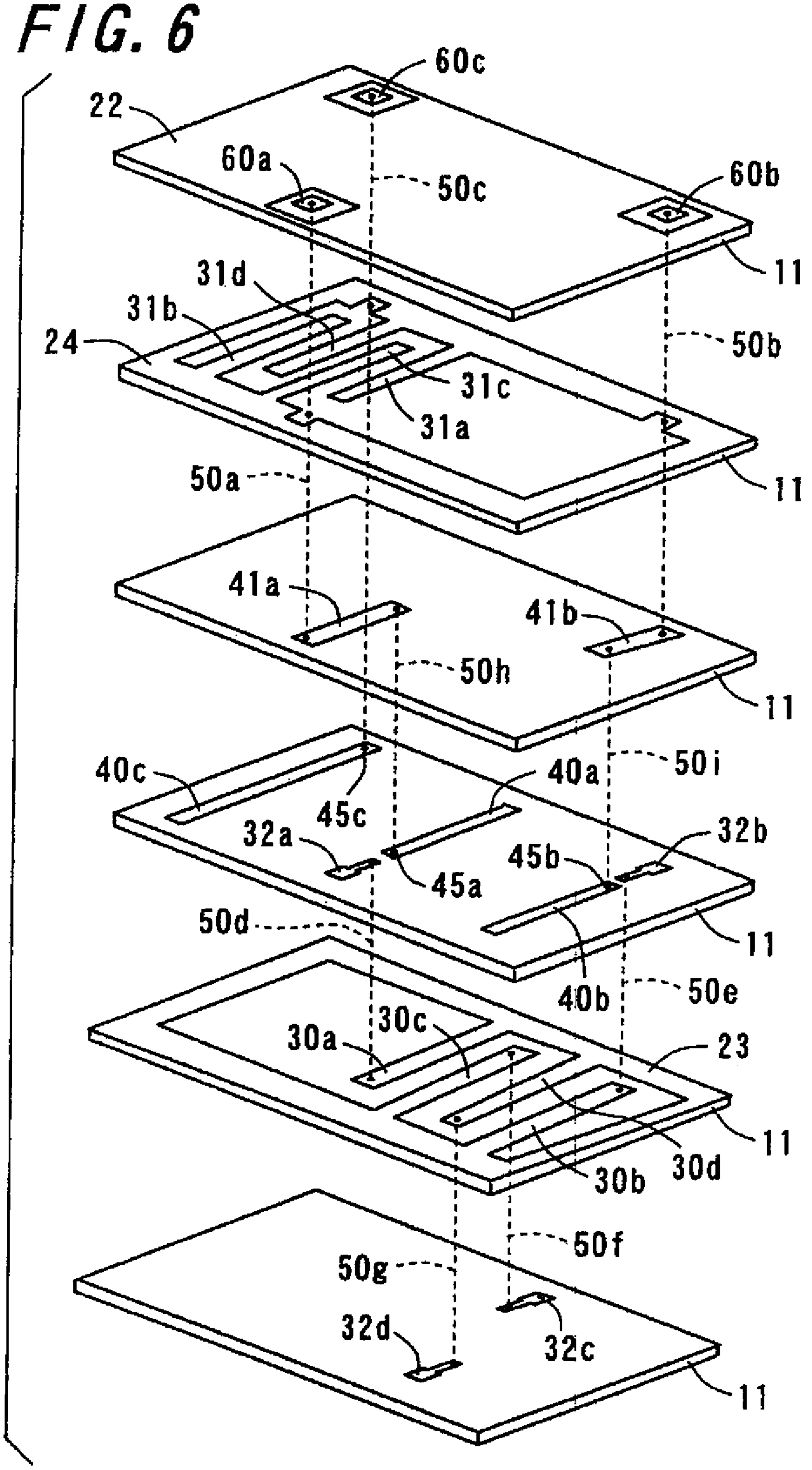
FIG. 6 is a schematic exploded perspective view of the diplexer shown in FIG. 5.
Figure 7:
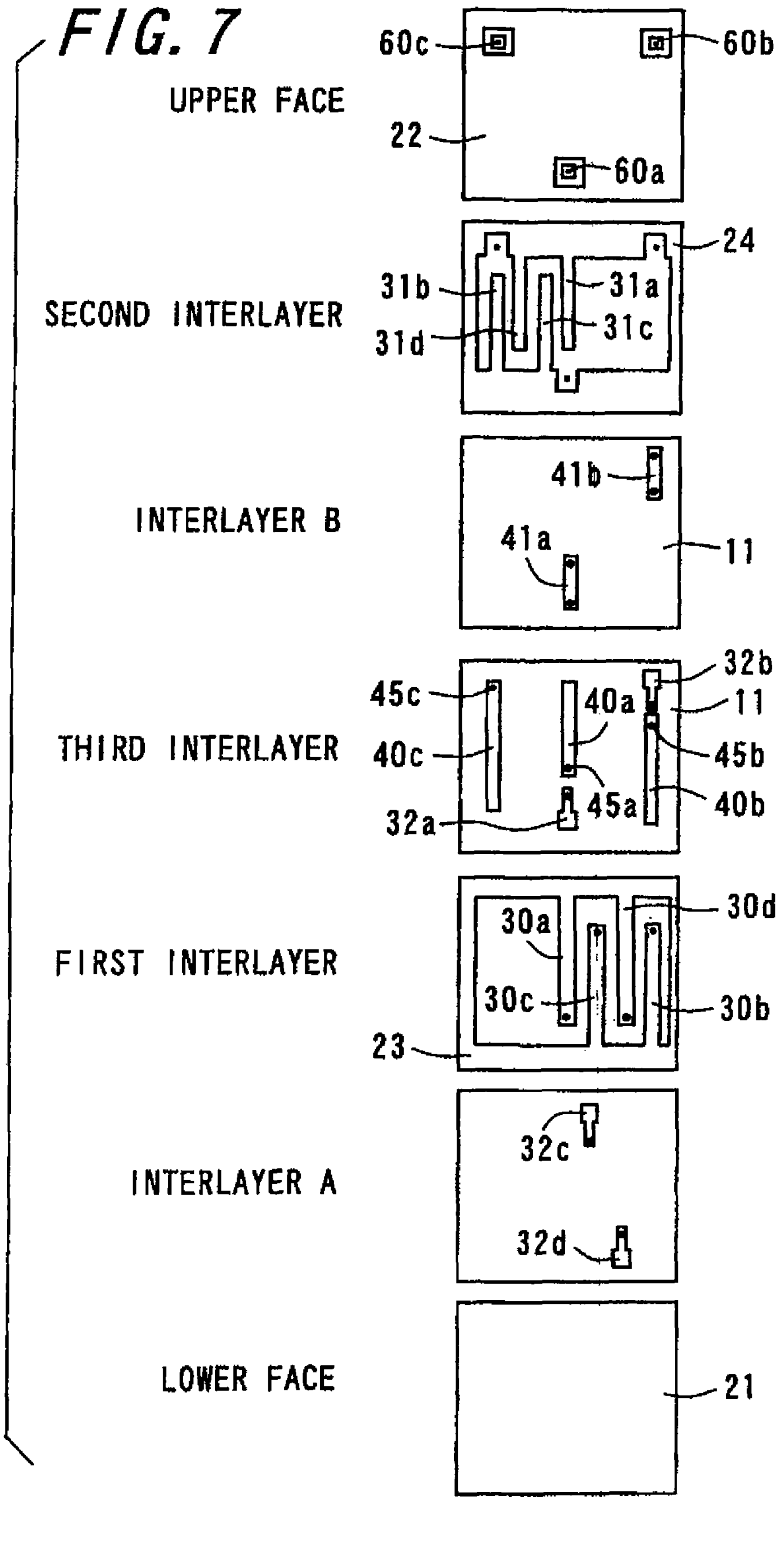
FIG. 7 is a plan view schematically showing upper and lower faces and interlayers of the diplexer shown in FIG. 5.
Figure 8:
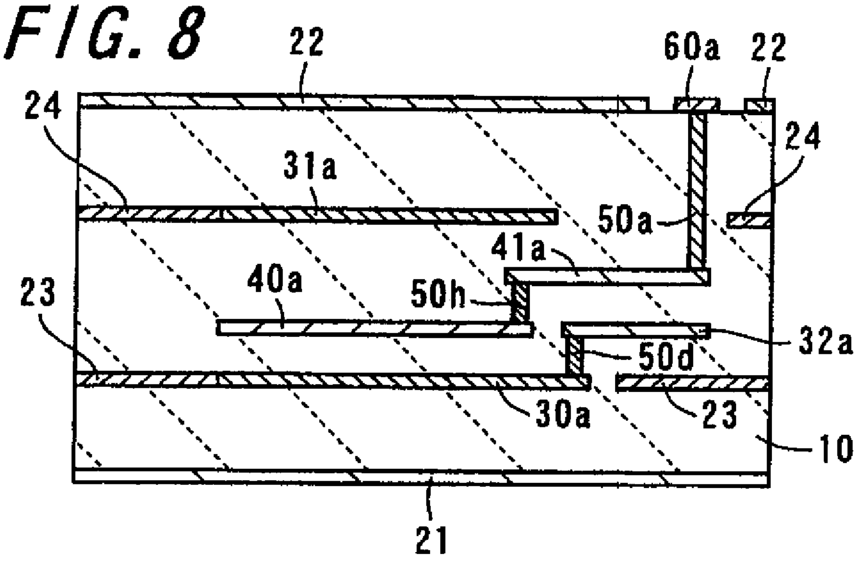
FIG. 8 is a cross-sectional view taken along line Q1-Q1' of FIG. 5.

FIG. 5 is an external perspective view schematically showing a diplexer according to a second embodiment of the invention. FIG. 6 is a schematic exploded perspective view of the diplexer shown in FIG. 5. FIG. 7 is a plan view schematically showing upper and lower faces and interlayers of the diplexer shown in FIG. 5. FIG. 8 is a cross-sectional view taken along line Q1-Q1' of FIG. 5. Note that the following description deals with in what way this embodiment differs from the above-mentioned first embodiment, and the constituent components thereof that play the same or corresponding roles as in the preceding embodiment will be denoted by the same reference numerals and overlapping descriptions will be omitted.

As shown in FIGS. 5 to 8, the diplexer of this embodiment comprises, on the third interlayer of the multilayer body 10, auxiliary resonant electrodes 32*a* and 32*b* that are arranged so as to have a region facing the first annular ground electrode 23, and are connected via through conductors 50*d* and 50*e* to the other ends of the first resonant electrodes 30*a* and 30*b*, the auxiliary resonant electrodes 32*a* and 32*b* being arranged respectively corresponding to the plurality of first resonant electrodes 30*a* and 30*b*. Furthermore, the diplexer of this embodiment comprises, on an interlayer A of the multilayer body 10 located on the side opposite the third interlayer with the first interlayer interposed therebetween, auxiliary resonant electrodes 32*c* and 32*d* that are arranged so as to have a region facing the first annular ground electrode 23, and are connected via through conductors 50*f* and 50*g* to the other ends of the first resonant electrodes 30*c* and 30*d*, the auxiliary resonant electrodes 32*c* and 32*d* being arranged respectively corresponding to the plurality of first resonant electrodes 30*c* and 30*d*.

Furthermore, the diplexer of this embodiment comprises, on an interlayer B of the multilayer body 10 located between the second interlayer and the third interlayer, a strip-like auxiliary input coupling electrode 41*a* that is disposed so as to have a region facing the input-stage auxiliary resonant electrode 32*a*, and has one end connected via a through conductor 50*h* to the electric signal input point 45*a* of the input coupling electrode 40*a*; and a strip-like auxiliary output coupling electrode 41*b* that is disposed so as to have a region facing the output-stage auxiliary resonant electrode 32*b*, and has one end connected via a through conductor 50*i* to the first electric signal output point 45*b* of the first output coupling electrode 40*b*. Furthermore, another end of the auxiliary input coupling electrode 41*a* is connected via the through conductor 50*a* to the input terminal electrode 60*a*, and another end of the auxiliary output coupling electrode 41*b* is connected via the through conductor 50*b* to the first output terminal electrode 60*b*.

According to the diplexer of this embodiment as described above, the auxiliary resonant electrodes 32*a*, 32*b*, 32*c*, and 32*d* that are arranged so as to have a region facing the first annular ground electrode 23, and are connected via the through conductors 50*d*, 50*e*, 50*f*, and 50*g* to the other ends of the first resonant electrodes, are arranged respectively corresponding to the plurality of first resonant electrodes 30*a*, 30*b*, 30*c*, and 30*d*. With this configuration, in a part in which the auxiliary resonant electrodes 32*a*, 32*b*, 32*c*, and 32*d*, and the first annular ground electrode 23 face each other, an electrostatic capacitance is generated between these electrodes, and, thus, the lengths of the first resonant electrodes 30*a*, 30*b*, 30*c*, and 30*d* can be reduced, and a small diplexer can be obtained.

Here, an area of the part in which the auxiliary resonant electrodes 32*a*, 32*b*, 32*c*, and 32*d*, and the first annular ground electrode 23 face each other is set to, for example, approximately 0.01 to 3 $mm^2$, in view of the balance between a necessary size and an obtained electrostatic capacitance. The gap between the auxiliary resonant electrodes 32*a*, 32*b*, 32*c*, and 32*d*, and the first annular ground electrode 23 that face each other is set to, for example, approximately 0.01 to 0.5 mm, because a smaller gap realizes a larger electrostatic capacitance but too small a gap makes the production difficult.

Furthermore, the diplexer of this embodiment comprises, on the interlayer B of the multilayer body 10 between the second interlayer and the third interlayer, the auxiliary input coupling electrode 41*a* that is disposed so as to have a region facing the input-stage auxiliary resonant electrode 32*a*, and connected via the through conductor 50*h* to the electric signal input point 45*a* of the input coupling electrode 40*a*, and the auxiliary output coupling electrode 41*b* that is disposed so as to have a region facing the output-stage auxiliary resonant electrode 32*b*, and connected via the through conductor 50*i* to the first electric signal output point 45*b* of the first output coupling electrode 40*b*. With this configuration, an electromagnetic coupling is generated between the input-stage auxiliary resonant electrode 32*a* and the auxiliary input coupling electrode 41*a*, and is added to the electromagnetic coupling between the input-stage first resonant electrode 30*a* and the input coupling electrode 40*a*. In a similar manner, an electromagnetic coupling is generated between the output-stage auxiliary resonant electrode 32*b* and the auxiliary output coupling electrode 41*b*, and is added to the electromagnetic coupling between the output-stage first resonant electrode 30*b* and the first output coupling electrode 40*b*. Accordingly, the electromagnetic coupling between the input coupling electrode 40*a* and the input-stage first resonant electrode 30*a*, and the electromagnetic coupling between the first output coupling electrode 40*b* and the output-stage first resonant electrode 30*b* become more intense. Thus, in a pass band formed by the plurality of first resonant electrodes 30*a*, 30*b*, 30*c*, and 30*d*, even in a very wide pass bandwidth, a pass characteristic can be obtained in which the form is flatter and the loss is lower throughout the entire wide pass band, and in which an increase in the insertion loss at a frequency located between the resonance frequencies in each resonance mode is further reduced.

Here, the input-stage auxiliary resonant electrode 32*a* and the output-stage auxiliary resonant electrode 32*b* are respectively connected to the other ends of the input-stage first resonant electrode 30*a* and the output-stage first resonant electrode 30*b*, and extend to sides opposite the one ends of the input-stage first resonant electrode 30a and the output-stage first resonant electrode 30b. With this configuration, it is possible to increase the region in which a coupling body composed of the input-stage first resonant electrode 30a and the input-stage auxiliary resonant electrode 32a connected thereto and a coupling body composed of the input coupling electrode 40a and the auxiliary input coupling electrode 41a connected thereto face each other. In a similar manner, it is possible to increase the region in which a coupling body composed of the output-stage first resonant electrode 30b and the output-stage auxiliary resonant electrode 32b connected thereto and a coupling body composed of the first output coupling electrode 40b and the auxiliary output coupling electrode 41b connected thereto face each other. Accordingly, the coupling body composed of the input-stage first resonant electrode 30a and the input-stage auxiliary resonant electrode 32a connected thereto and the coupling body composed of the input coupling electrode 40a and the auxiliary input coupling electrode 41a connected thereto can intensively make electromagnetic-field coupling in a wide region. In a similar manner, the coupling body composed of the output-stage first resonant electrode 30b and the output-stage auxiliary resonant electrode 32b connected thereto and the coupling body composed of the first output coupling electrode 40b and the auxiliary output coupling electrode 41b connected thereto can intensively make electromagnetic-field coupling in a wide region.

Moreover, according to the diplexer of this embodiment, in the input coupling electrode 40a, the electric signal input point 45a of the input coupling electrode 40a that is connected via the through conductor 50h to the auxiliary input coupling electrode 41a, is located closer to the other end of the input-stage first resonant electrode 30a than the center of the part facing the input-stage first resonant electrode 30a, and closer to the other end of the input-stage second resonant electrode 31a than the center of the part facing the input-stage second resonant electrode 31a. In the first output coupling electrode 40b, the first electric signal output point 45b of the first output coupling electrode 40b that is connected via the through conductor 50i to the auxiliary output coupling electrode 41b, is located closer to the other end of the output-stage first resonant electrode 30b than the center of the part facing the output-stage first resonant electrode 30b. Accordingly, even in the case where an electric signal from an external circuit is inputted via the auxiliary input coupling electrode 41a to the input coupling electrode 40a, and an electric signal is outputted from the first output coupling electrode 40b via the auxiliary output coupling electrode 41b toward an external circuit, the input coupling electrode 40a, and the input-stage first resonant electrode 30a and the input-stage second resonant electrode 31a are coupled to each other in an interdigital form, and the first output coupling electrode 40b and the output-stage first resonant electrode 30b are coupled to each other in an interdigital form, and, thus, an intense coupling in which a magnetic-field coupling and an electric-field coupling are added can be generated.

Moreover, according to the diplexer of this embodiment, an end portion of the auxiliary input coupling electrode 41a on the side opposite the side that is connected via the through conductor 50h to the input coupling electrode 40a, is connected via the through conductor 50a to the input terminal electrode 60a. With this configuration, the coupling body composed of the input-stage first resonant electrode 30a and the input-stage auxiliary resonant electrode 32a connected thereto and the coupling body composed of the input coupling electrode 40a and the auxiliary input coupling electrode 41a connected thereto are coupled to each other in an interdigital form as a whole, and, thus, an intense coupling in which a magnetic-field coupling and an electric-field coupling are added can be generated. Thus, the coupling that can be realized is more intense than in the case where the end portion of the auxiliary input coupling electrode 41a on the same side in the longitudinal direction as the side that is connected to the input coupling electrode 40a is connected to the input terminal electrode 60a.

In a similar manner, according to the diplexer of this embodiment, an end portion of the auxiliary output coupling electrode 41b on the side opposite the side that is connected via the through conductor 50i to the first output coupling electrode 40b, is connected via the through conductor 50b to the first output terminal electrode 60b. With this configuration, the coupling body composed of the output-stage first resonant electrode 30b and the output-stage auxiliary resonant electrode 32b connected thereto and the coupling body composed of the first output coupling electrode 40b and the auxiliary output coupling electrode 41b connected thereto are coupled to each other in an interdigital form as a whole, and, thus, an intense coupling in which a magnetic-field coupling and an electric-field coupling are added can be generated. Thus, the coupling that can be realized is more intense than in the case where the end portion of the auxiliary output coupling electrode 41b on the same side in the longitudinal direction as the side that is connected to the first output coupling electrode 40b is connected to the first output terminal electrode 60b.

In this manner, the coupling body composed of the input-stage first resonant electrode 30a and the input-stage auxiliary resonant electrode 32a connected thereto and the coupling body composed of the input coupling electrode 40a and the auxiliary input coupling electrode 41a connected thereto are very intensively coupled to each other by the broadside coupling and the interdigital coupling as a whole. In a similar manner, the coupling body composed of the output-stage first resonant electrode 30b and the output-stage auxiliary resonant electrode 32b connected thereto and the coupling body composed of the first output coupling electrode 40b and the auxiliary output coupling electrode 41b connected thereto are very intensively coupled to each other by the broadside coupling and the interdigital coupling as a whole. Thus, in a pass band formed by the plurality of first resonant electrodes 30a, 30b, 30c, and 30d, even in a very wide pass band, a pass characteristic can be obtained in which the form is flatter and the loss is lower throughout the entire wide pass band, and in which an increase in the insertion loss at a frequency located between the resonance frequencies in each resonance mode is further reduced.

Here, the widths of the auxiliary input coupling electrode 41a and the auxiliary output coupling electrode 41b are set, for example, so as to be similar to those of the input coupling electrode 40a and the first output coupling electrode 40b, and the lengths of the auxiliary input coupling electrode 41a and the auxiliary output coupling electrode 41b are set, for example, so as to be slightly longer than those of the input-stage auxiliary resonant electrode 32a and the output-stage auxiliary resonant electrode 32b. The gap between the auxiliary input coupling electrode 41a and the auxiliary output coupling electrode 41b, and the input-stage auxiliary resonant electrode 32a and the output-stage auxiliary resonant electrode 32b is set to, for example, approximately 0.01 to 0.5 mm, because a smaller gap realizes an intense coupling, which is desirable, but too small a gap makes the production difficult.

Third Embodiment

Figure 9:
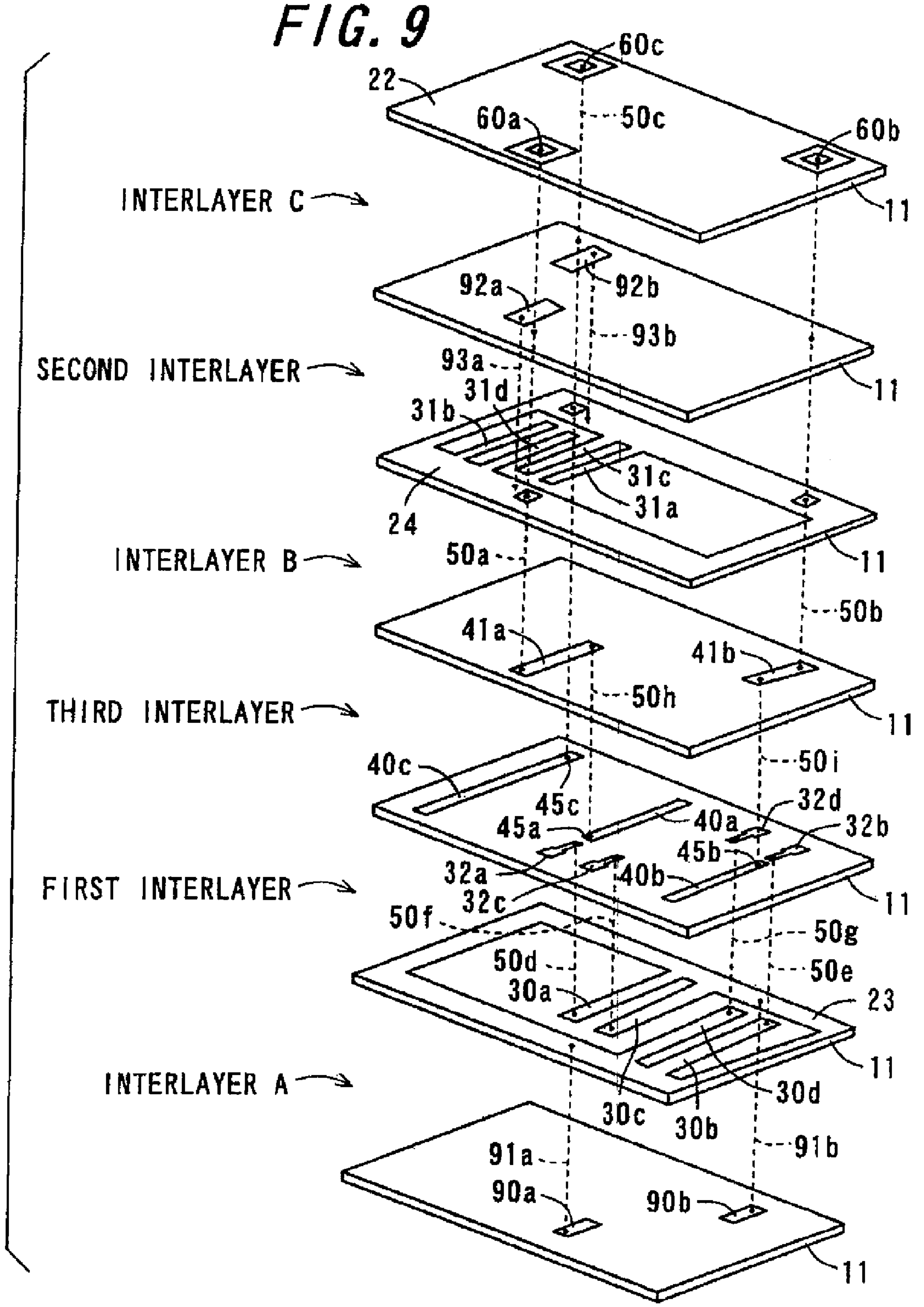
FIG. 9 is a schematic exploded perspective view of a diplexer according to a third embodiment of the invention.

FIG. 9 is a schematic exploded perspective view of a diplexer according to a third embodiment of the invention.

Note that the following description deals with in what way this embodiment differs from the above-mentioned second embodiment, and the constituent components thereof that play the same or corresponding roles as in the preceding embodiments will be denoted by the same reference numerals and overlapping descriptions will be omitted.

In the diplexer of this embodiment, as shown in FIG. 9, on the first interlayer, the first resonant electrodes 30*a* and 30*c* are so arranged that their one ends are located on the same side. The first resonant electrodes, 30*c* and 30*d* are so arranged that their one ends are displaced in relation to each other in a staggered manner. The first resonant electrodes 30*d* and 30*b* are so arranged that their one ends are located on the same side. Moreover, on the second interlayer, the second resonant electrodes 31*a* and 31*c* are so arranged that their one ends are located on the same side. The second resonant electrodes 31*c* and 31*d* are so arranged that their one ends are displaced in relation to each other in a staggered manner. The second resonant electrodes 31*d* and 31*b* are so arranged that their one ends are located on the same side.

In the diplexer of this embodiment, the first resonant electrodes 30*a* and 30*c* are coupled to each other in a comb-line form. The first resonant electrodes 30*c* and 30*d* are coupled to each other in an interdigital form. The first resonant electrodes 30*d* and 30*b* are coupled to each other in a comb-line form. Moreover, the second resonant electrodes 31*a* and 31*c* are coupled to each other in a comb-line form. The second resonant electrodes 31*c* and 31*d* are coupled to each other in an interdigital form. The second resonant electrodes 31*d* and 31*b* are coupled to each other in a comb-line form.

Moreover, in the diplexer of this embodiment, just like the auxiliary resonant electrodes 32*a* and 32*b*, the auxiliary resonant electrodes 32*c* and 32*d* are also arranged on the third interlayer.

Further, in the diplexer of this embodiment, on an interlayer A of the multilayer body 10 located below the first interlayer, there is disposed a first coupling electrode 90*a* connected via a through conductor 91*a* to the first annular ground electrode 23 so as to face the other ends of, respectively, the first resonant electrodes 30*a* and 30*c*. Also disposed on the interlayer A is a second coupling electrode 90*b* connected via a through conductor 91*b* to the first annular ground electrode 23 so as to face the other ends of, respectively, the first resonant electrodes 30*d* and 30*b*.

Still further, in the diplexer of this embodiment, on an interlayer C of the multilayer body 10 located above the second interlayer, there is disposed a third coupling electrode 92*a* connected via a through conductor 93*a* to the second annular ground electrode 24 so as to face the other ends of, respectively, the second resonant electrodes 31*a* and 31*c*. Also disposed on the interlayer C is a fourth coupling electrode 92*b* connected via a through conductor 93*b* to the second annular ground electrode 24 so as to face the other ends of, respectively, the second resonant electrodes 31*d* and 31*b*.

According to the diplexer of this embodiment, the first coupling electrode 90*a* helps increase electrostatic capacitance between each of the first resonant electrodes 30*a* and 30*c* and the ground potential. In a similar manner, the second coupling electrode 90*b* helps increase electrostatic capacitance between each of the first resonant electrodes 30*d* and 30*b* and the ground potential, the third coupling electrode 92*a* helps increase electrostatic capacitance between each of the second resonant electrodes 31*a* and 31*c* and the ground potential, and the fourth coupling electrode 92*b* helps increase electrostatic capacitance between each of the second resonant electrodes 31*d* and 31*b* and the ground potential. This makes it possible to reduce the lengths of, respectively, the first resonant electrodes 30*a*, 30*b*, 30*c*, and 30*d* and the lengths of, respectively, the second resonant electrodes 31*a*, 31*b*, 31*c*, and 31*d*, and thereby obtain a more compact diplexer.

Moreover, according to the diplexer of this embodiment, the first coupling electrode 90*a* helps intensify the electromagnetic coupling between the adjacent first resonant electrodes 30*a* and 30*c*. In a similar manner, the second coupling electrode 90*b* helps intensify the electromagnetic coupling between the adjacent first resonant electrodes 30*d* and 30*b*, the third coupling electrode 92*a* helps intensify the electromagnetic coupling between the adjacent second resonant electrodes 31*a* and 31*c*, and the fourth coupling electrode 92*b* helps intensify the electromagnetic coupling between the adjacent second resonant electrodes 31*d* and 31*b*. Hence, just as in the case where all the first resonant electrodes 30*a*, 30*b*, 30*c*, and 30*d* make electromagnetic-field coupling with each other in an interdigital form and all the second resonant electrodes 31*a*, 31*b*, 31*c*, and 31*d* make electromagnetic-field coupling with each other in an interdigital form, it is possible to obtain a diplexer having a wide pass band.

Fourth Embodiment

Figure 10:
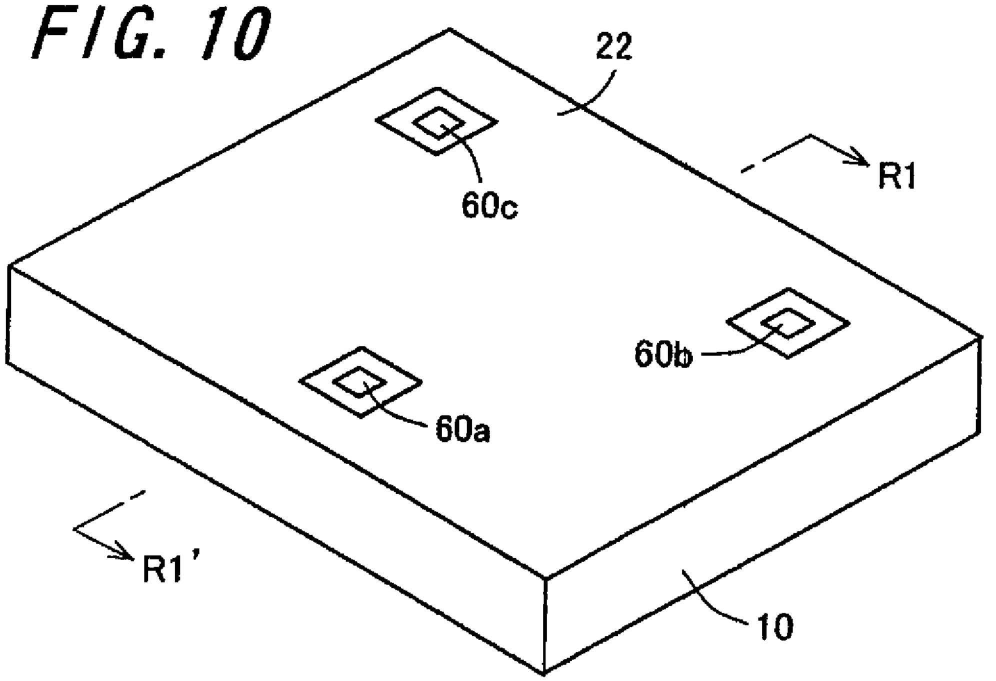
FIG. 10 is an external perspective view schematically showing a diplexer according to a fourth embodiment of the invention.
Figure 11:
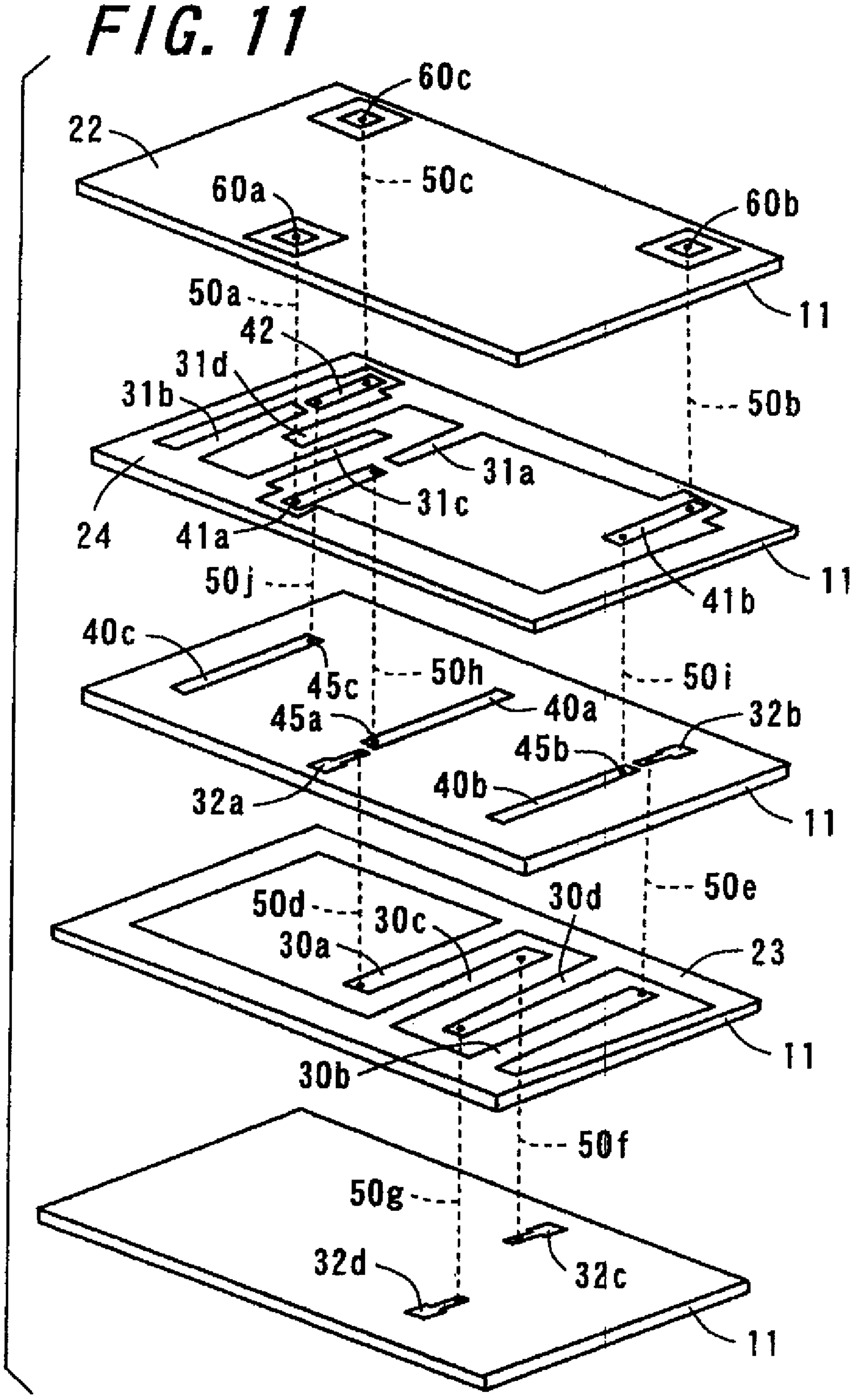
FIG. 11 is a schematic exploded perspective view of the diplexer shown in FIG. 10.
Figure 12:
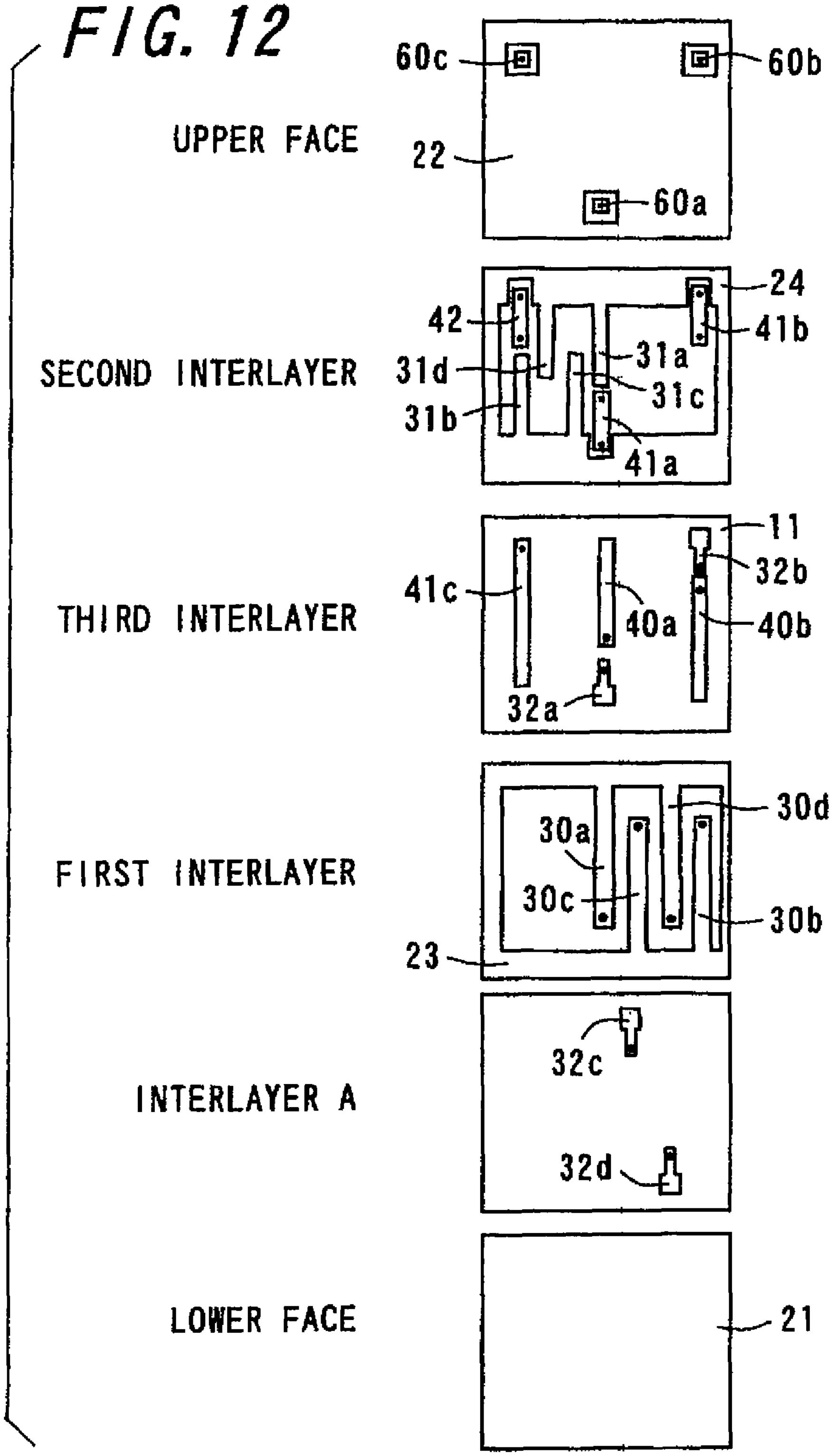
FIG. 12 is a plan view schematically showing upper and lower faces and interlayers of the diplexer shown in FIG. 10.
Figure 13:
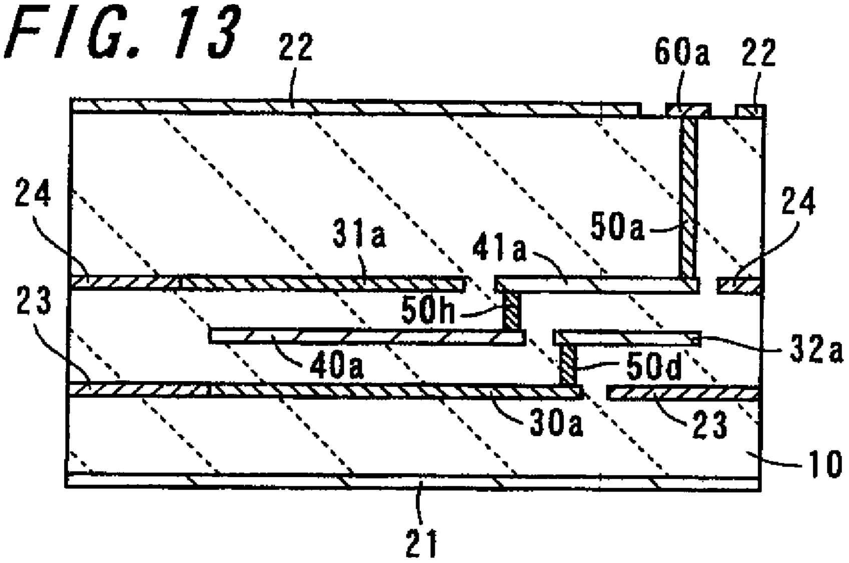
FIG. 13 is a cross-sectional view taken along line R1-R1' of FIG. 10.

FIG. 10 is an external perspective view schematically showing a diplexer according to a fourth embodiment of the invention. FIG. 11 is a schematic exploded perspective view of the diplexer shown in FIG. 10. FIG. 12 is a plan view schematically showing upper and lower faces and interlayers of the diplexer shown in FIG. 10. FIG. 13 is a cross-sectional view taken along line R1-R1' of FIG. 10. Note that the following description deals with in what way this embodiment differs from the above-mentioned second embodiment, and the constituent components thereof that play the same or corresponding roles as in the preceding embodiments will be denoted by the same reference numerals and overlapping descriptions will be omitted.

In the diplexer of this embodiment, as shown in FIGS. 10 to 13, the auxiliary input coupling electrode 41*a* and the auxiliary output coupling electrode 41*b* are arranged between the second interlayer of the multilayer body 10. Also, on the second interlayer, arranged is an additional electrode 42 having its one end connected via a through conductor 50*j* to the second output coupling electrode 40*c* and its another end connected via the through conductor 50*c* to the second output terminal electrode 60*c*.

According to the diplexer of this embodiment, in comparison with the diplexer according to the above-mentioned second embodiment, it is possible to easily reduce a gap between the input coupling electrode 40*a* and the first output coupling electrode 40*b*, and the input-stage second resonant electrode 31*a* and the output-stage second resonant electrode 31*b*. Accordingly, it is possible to easily intensify electromagnetic coupling between the input coupling electrode 40*a* and the first output coupling electrode 40*b* and electromagnetic coupling between the input-stage second resonant electrode 31*a* and the output-stage second resonant electrode 31*b*.

Further, according to the diplexer of this embodiment, the shape of the additional electrode 42 corresponds to the shape of the auxiliary input coupling electrode 41*a*, and thereby in the bandpass filter formed between the input terminal electrode 60*a* and the second output terminal electrode 60*c*, it is possible to easily realize a symmetrical circuit arrangement by identical input-side and output-side pattern configurations.

Fifth Embodiment

Figure 14:
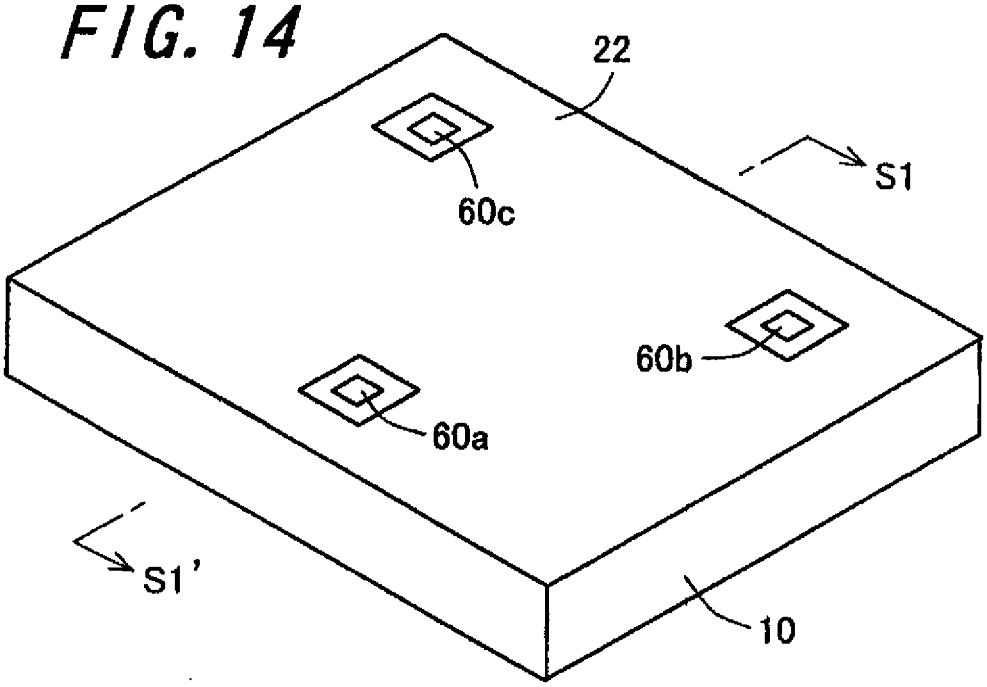
FIG. 14 is an external perspective view schematically showing a diplexer according to a fifth embodiment of the invention.
Figure 15:
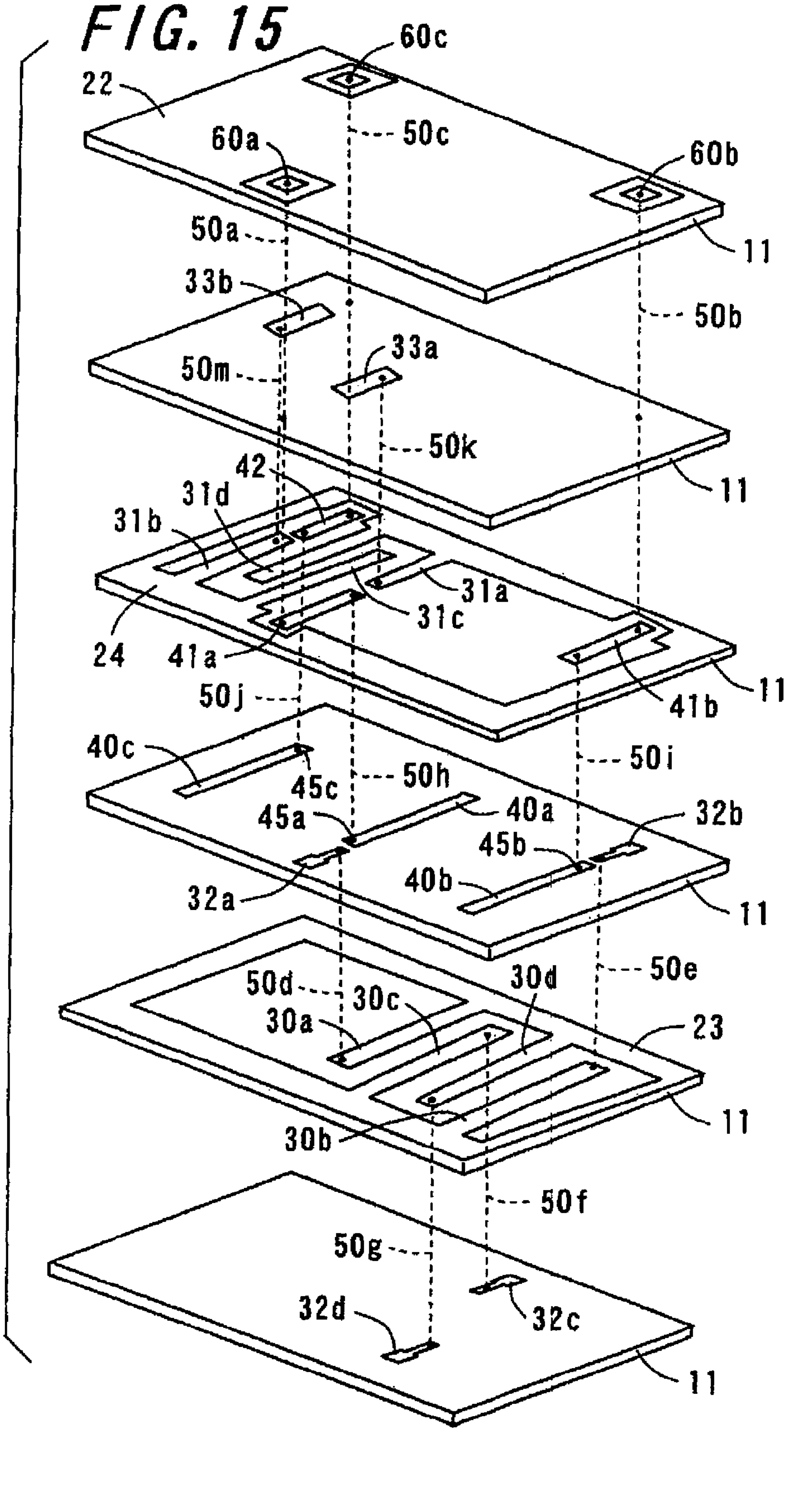
FIG. 15 is a schematic exploded perspective view of the diplexer shown in FIG. 14.
Figure 16:
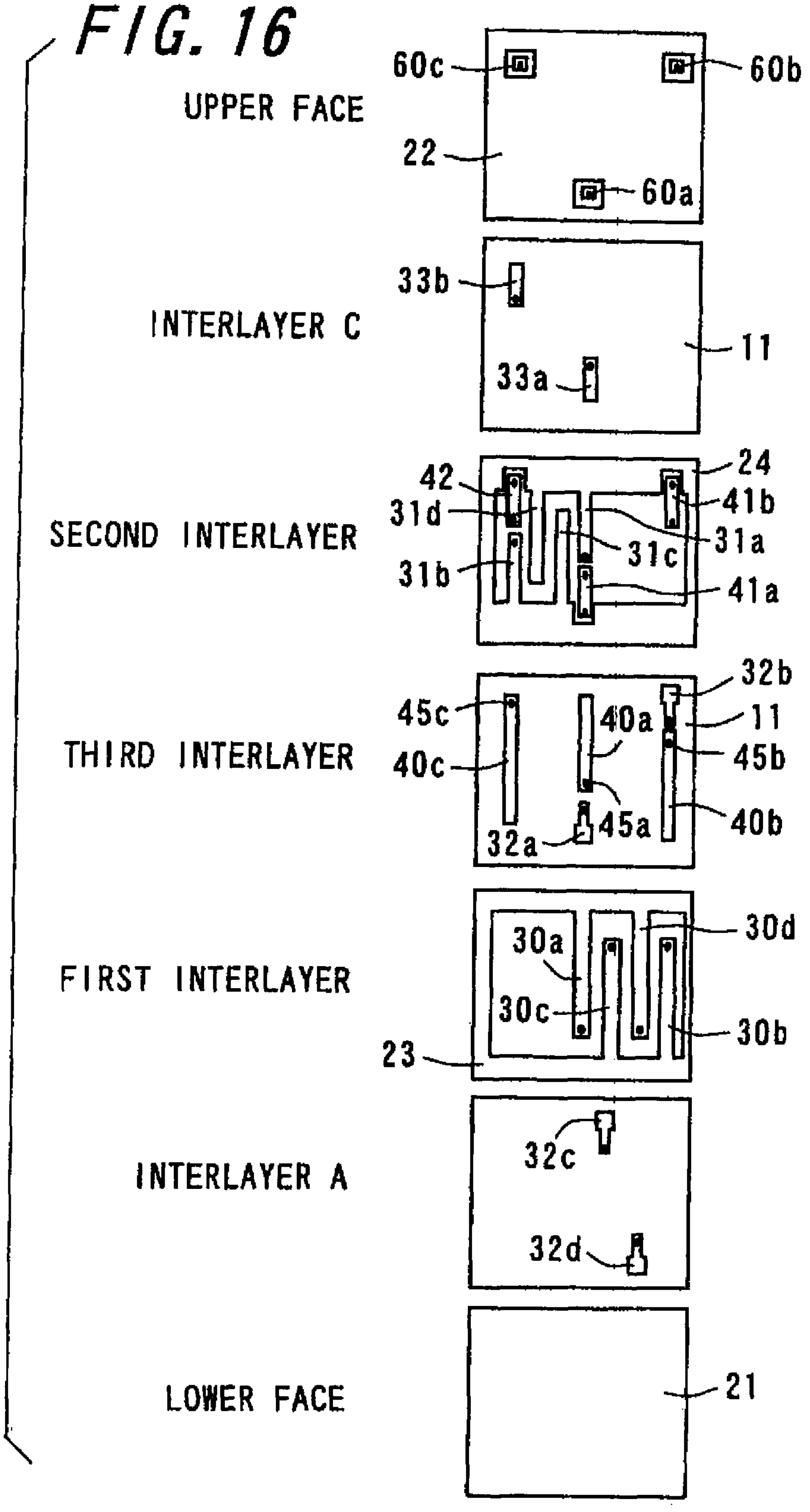
FIG. 16 is a plan view schematically showing upper and lower faces and interlayers of the diplexer shown in FIG. 14.
Figure 17:
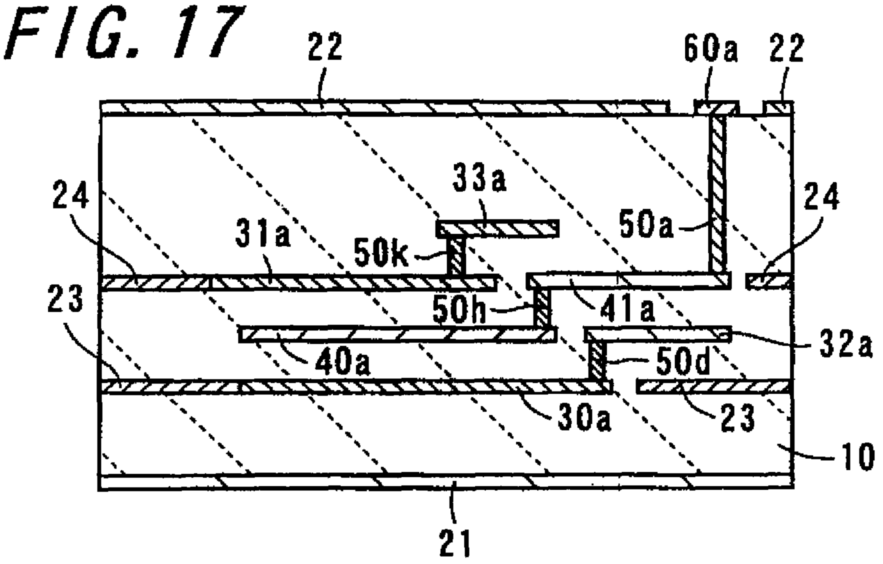
FIG. 17 is a cross-sectional view taken along line S1-S1' of FIG. 14.

FIG. 14 is an external perspective view schematically showing a diplexer according to a fifth embodiment of the invention. FIG. 15 is a schematic exploded perspective view of the diplexer shown in FIG. 14. FIG. 16 is a plan view schematically showing upper and lower faces and interlayers of the diplexer shown in FIG. 14. FIG. 17 is a cross-sectional view taken along line S1-S1' of FIG. 14. Note that the following description deals with in what way this embodiment differs from the above-mentioned fourth embodiment, and the constituent components thereof that play the same or corresponding roles as in the preceding embodiments will be denoted by the same reference numerals and overlapping descriptions will be omitted.

The diplexer of this embodiment, as shown in FIGS. 14 to 17, comprises, on an interlayer C of the multilayer body 10 located on a side opposite the third interlayer with the second interlayer of the multilayer body 10 interposed therebetween, a strip-like input-side auxiliary resonant coupling electrode 33*a* that is arranged so as to have its one end facing the input coupling electrode 40*a* and its another end facing the auxiliary input coupling electrode, with its one end connected via a through conductor 50*k* to the input-stage second resonant electrode 31*a*; and a strip-like output-side auxiliary resonant coupling electrode 33*b* that is arranged so as to have its one end facing the second output coupling electrode 40*c* and its another end facing the additional electrode 42, with its one end connected via a through conductor 50*m* to the output-stage second resonant electrode 31*b*.

According to the thus configured diplexer of this embodiment, intense electromagnetic-field coupling between the input-side auxiliary resonant coupling electrode 33*a* and the auxiliary input coupling electrode 41*a* by a broadside coupling is generated, and is added to electromagnetic-field coupling between the input-stage second resonant electrode 31*a* and the input coupling electrode 40*a*. In a similar manner, intense electromagnetic-field coupling between the output-side auxiliary resonant coupling electrode 33*b* and the additional electrode 42 by a broadside coupling is generated, and is added to electromagnetic-field coupling between the output-stage second resonant electrode 31*b* and the second output coupling electrode 40*c*. Therefore, it is possible to further intensify the electromagnetic-field coupling between the input coupling electrode 40*a* and the input-stage second resonant electrode 31*a*, and the electromagnetic-field coupling between the second output coupling electrode 40*c* and the output-stage second resonant electrode 31*b*. Furthermore, the input-side auxiliary resonant coupling electrode 33*a* is arranged so as to be in parallel with the auxiliary input coupling electrode 41*a*, and the output-side auxiliary resonant coupling electrode 33*b* is arranged so as to be in parallel with the additional electrode 42. With this configuration, a coupling body composed of the input-stage second resonant electrode 31*a* and the input-side auxiliary resonant coupling electrode 33*a* connected thereto and a coupling body composed of the input coupling electrode 40*a* and the auxiliary input coupling electrode 41*a* connected thereto are coupled to each other in an interdigital form as a whole, thus, an intense coupling in which a magnetic-field coupling and an electric-field coupling are added is generated. In a similar manner, a coupling body composed of the output-stage second resonant electrode 31*b* and the output-side auxiliary resonant coupling electrode 33*b* connected thereto and a coupling body composed of the first output coupling electrode 40*b* and the additional electrode 42 connected thereto are coupled to each other in an interdigital form as a whole, thus, an intense coupling in which a magnetic-field coupling and an electric-field coupling are added is generated. Thus, in a pass band formed by the plurality of second resonant electrodes 31*a*, 31*b*, 31*c*, and 31*d*, even in a very wide pass bandwidth, a pass characteristic can be obtained in which the form is flatter and the loss is lower throughout the entire wide pass band, and in which an increase in insertion loss at a frequency located between the resonance frequencies in each resonance mode further decreases.

Sixth Embodiment

Figure 18:
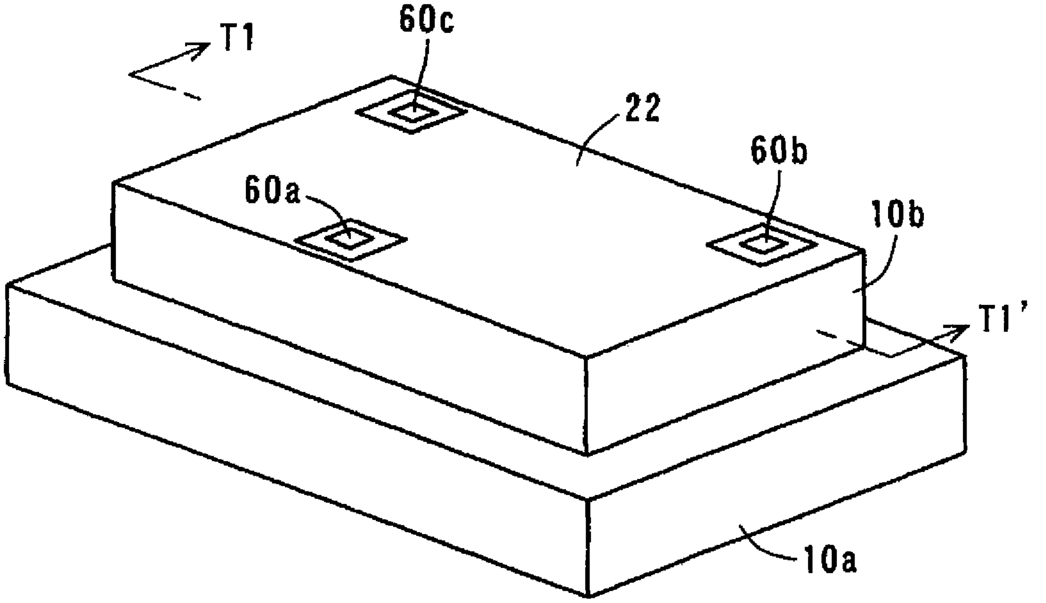
FIG. 18 is an external perspective view schematically showing a diplexer according to a sixth embodiment of the invention.
Figure 19:
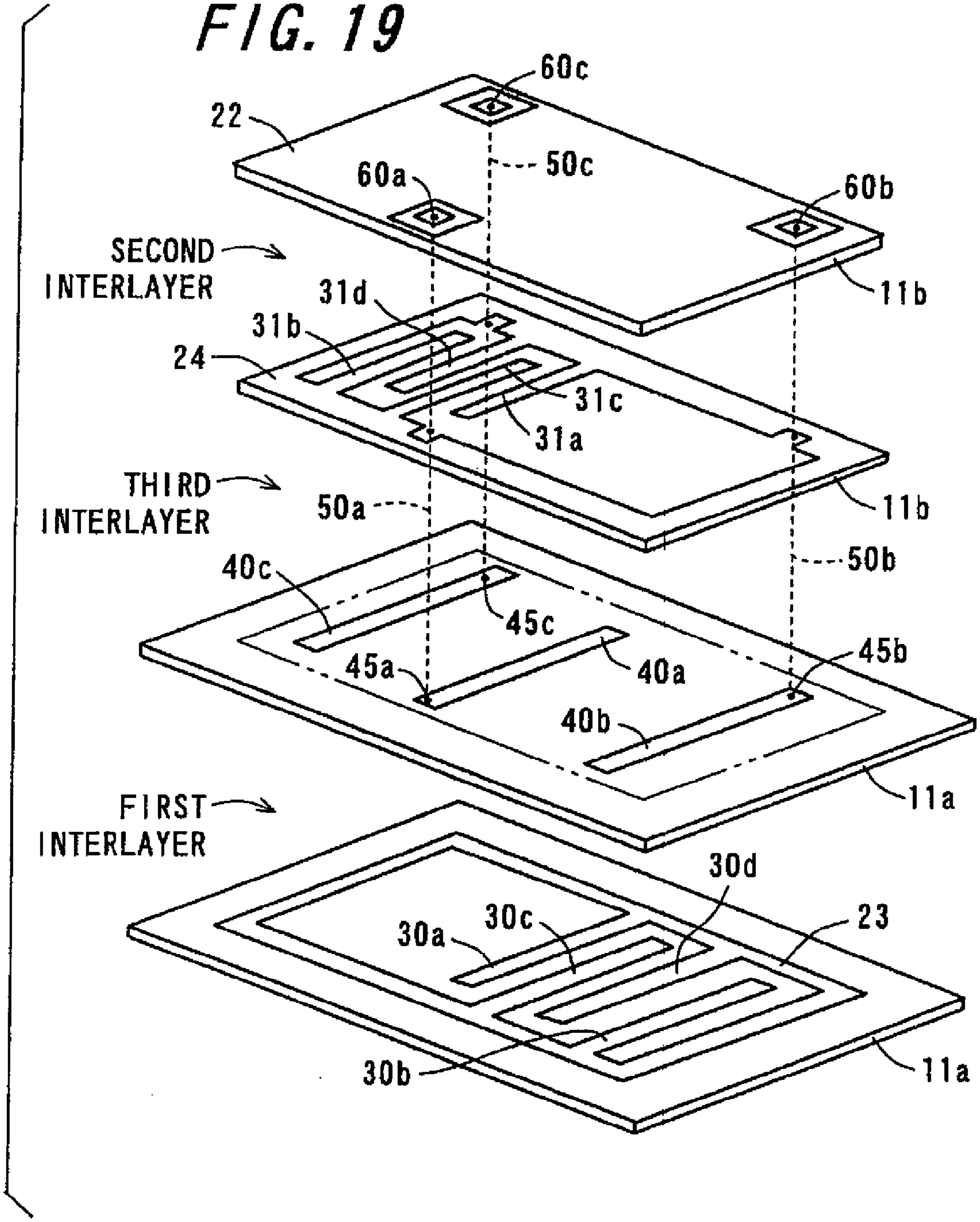
FIG. 19 is a schematic exploded perspective view of the diplexer shown in FIG. 18.
Figure 20:
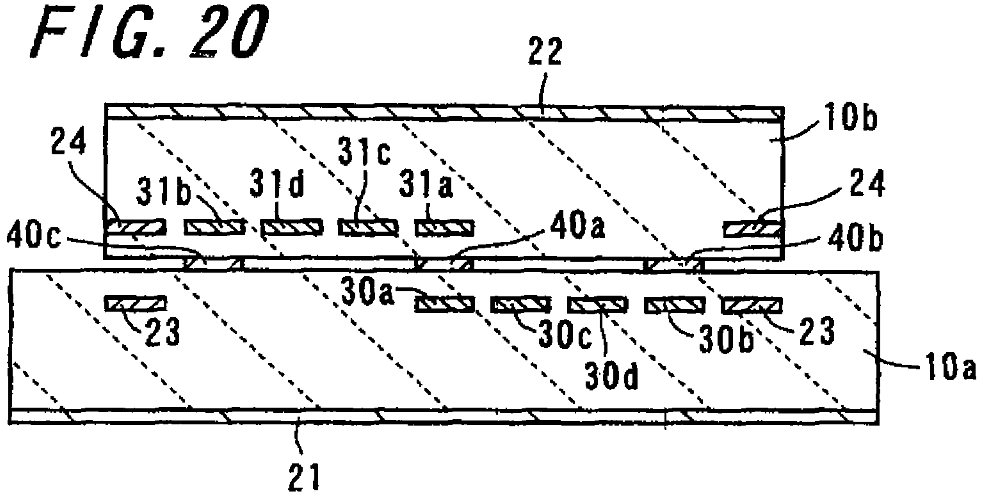
FIG. 20 is a cross-sectional view taken along line T1-T1' of FIG. 18.

FIG. 18 is an external perspective view schematically showing a diplexer according to a sixth embodiment of the invention. FIG. 19 is a schematic exploded perspective view of the diplexer shown in FIG. 18. FIG. 20 is a cross-sectional view taken along line T1-T1' of FIG. 18. Note that the following description deals with in what way this embodiment differs from the above-mentioned first embodiment, and the constituent components thereof that play the same or corresponding roles as in the preceding embodiments will be denoted by the same reference numerals and overlapping descriptions will be omitted.

In the diplexer of this embodiment, as shown in FIGS. 18 to 20, the multilayer body comprises a first multilayer body 10*a* and a second multilayer body 10*b* placed thereon. The first ground electrode 21 is disposed on a lower face of the first multilayer body 10*a*. The second ground electrode 22 is disposed on an upper face of the second multilayer body 10*b*. The first resonant electrodes 30*a*, 30*b*, 30*c*, and 30*d* and the first annular ground electrode 23 are located within the first multilayer body 10*a*. The second resonant electrodes 31*a*, 31*b*, 31*c*, and 31*d* and the second annular ground electrode 24 are located within the second multilayer body 10*b*. The input coupling electrode 40*a*, the first output coupling electrode 40*b* and the second output coupling electrode 40*c* are located between the first multilayer body 10*a* and the second multilayer body 10*b*. Note that the first multilayer body 10*a* has a stack of a plurality of dielectric layers 11*a* on top of each other, and the second multilayer body 10*b* has a stack of a plurality of dielectric layers 11*b* on top of each other.

According to the thus configured diplexer of this embodiment, the region bearing the first resonant electrodes 30*a*, 30*b*, 30*c*, and 30*d* and the region bearing the second resonant electrodes 31*a*, 31*b*, 31*c*, and 31*d* that differ in resonance frequency from each other, are separated into the first and second multilayer bodies 10*a* and 10*b*, by the interlayer bearing the input coupling electrode 40*a*, the first output coupling electrode 40*b* and the second output coupling electrode 40*c* serving as a boundary. In this construction, by designing the dielectric layer constituting the first multilayer body 10*a* and the dielectric layer constituting the second multilayer body 10*b* to have different electrical characteristics, it is possible to obtain desired electrical characteristics with ease. For example, the dielectric constant of the dielectric layer 11*a* constituting the first multilayer body 10*a*, in which are arranged the first resonant electrodes 30*a*, 30*b*, 30*c*, and 30*d* that are made longer than the second resonant electrodes 31*a*, 31*b*, 31*c*, and 31*d* because of having lower resonance frequencies, is set to be higher than the dielectric constant of the dielectric layer 11*b* constituting the second multilayer body 10*b*. This makes it possible to reduce the lengths of, respectively, the first resonant electrodes 30*a*, 30*b*, 30*c*, and 30*d*, and thereby eliminate wasted space inside the diplexer with consequent miniaturization of the diplexer. Moreover, in the diplexer of this embodiment, there is no need to establish electromagnetic-field coupling between the upper and lower electrode components separated by the interlayer, which bears the input coupling electrode 40*a*, the first output coupling electrode 40*b* and the second output coupling electrode 40*c*, interposed therebetween. That is, the interlayer bearing the input coupling electrode 40*a*, the first output coupling electrode 40*b* and the second output coupling electrode 40*c* serves as a boundary to separate the first multilayer body 10*a* and the second multilayer body 10*b*. In this construction, for example, even if the first multilayer body 10*a* and the second multilayer body 10*b* are positionally displaced with respect to each other, or an air layer exists at the boundary between the first multilayer body 10*a* and the second multilayer body 10*b*, the risk of consequent deterioration in electrical characteristics can be kept to the minimum. Further, for example, in a case where the first multilayer body 10*a* is designed as a module substrate for mounting another electronic component or the like on the face of the region thereof other than the region constituting the diplexer, by disposing part of the diplexer within the second multilayer body 10*b*, the thickness of the module substrate can be reduced. Accordingly, it is possible to obtain a diplexer-equipped substrate in which the module can be made smaller in thickness as a whole.

Seventh Embodiment

Figure 21:
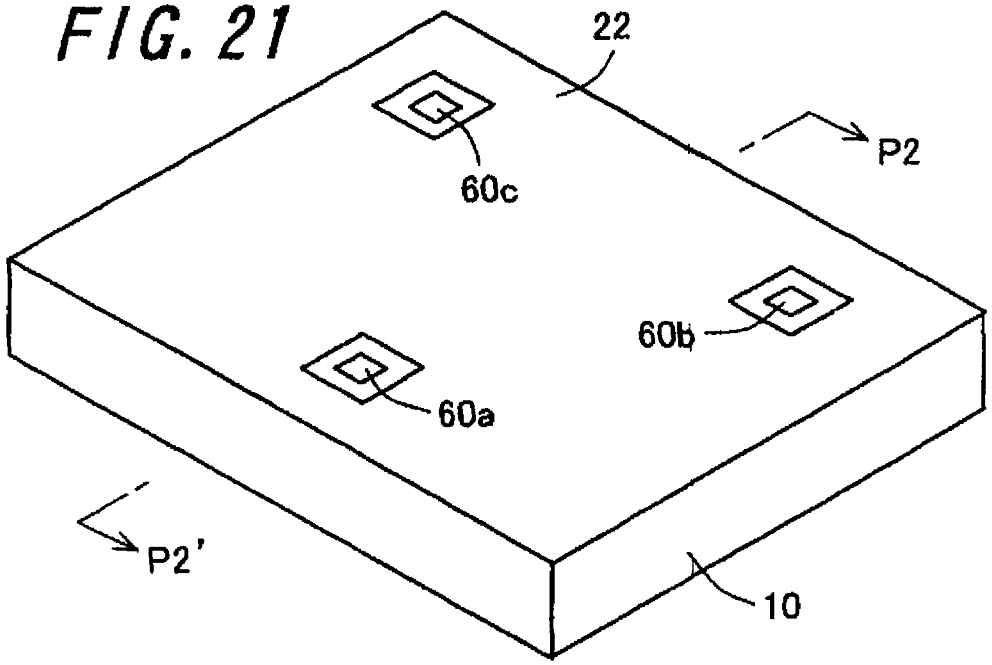
FIG. 21 is an external perspective view schematically showing a diplexer according to a seventh embodiment the invention.
Figure 22:
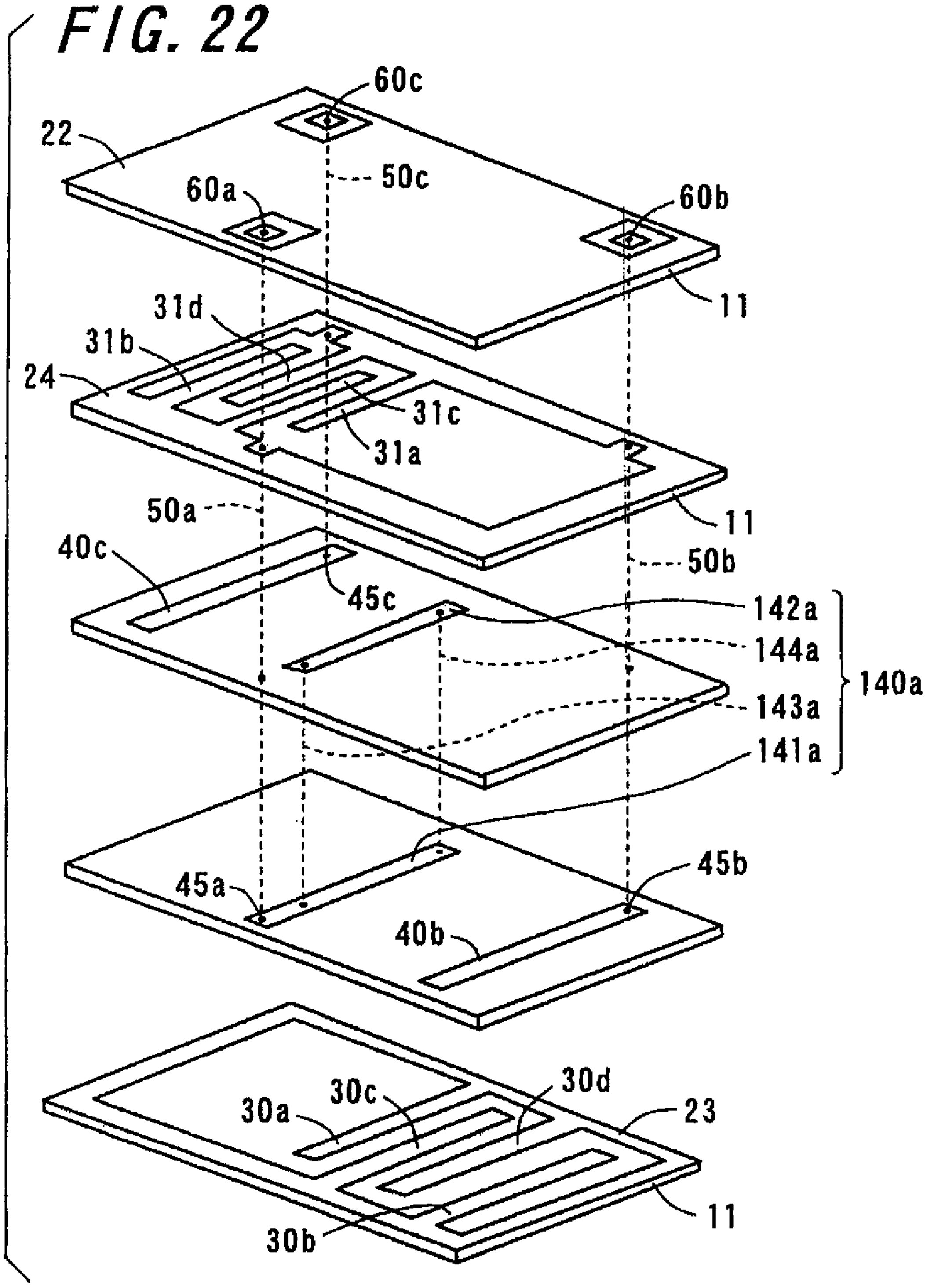
FIG. 22 is a schematic exploded perspective view of the diplexer shown in FIG. 21.
Figure 23:
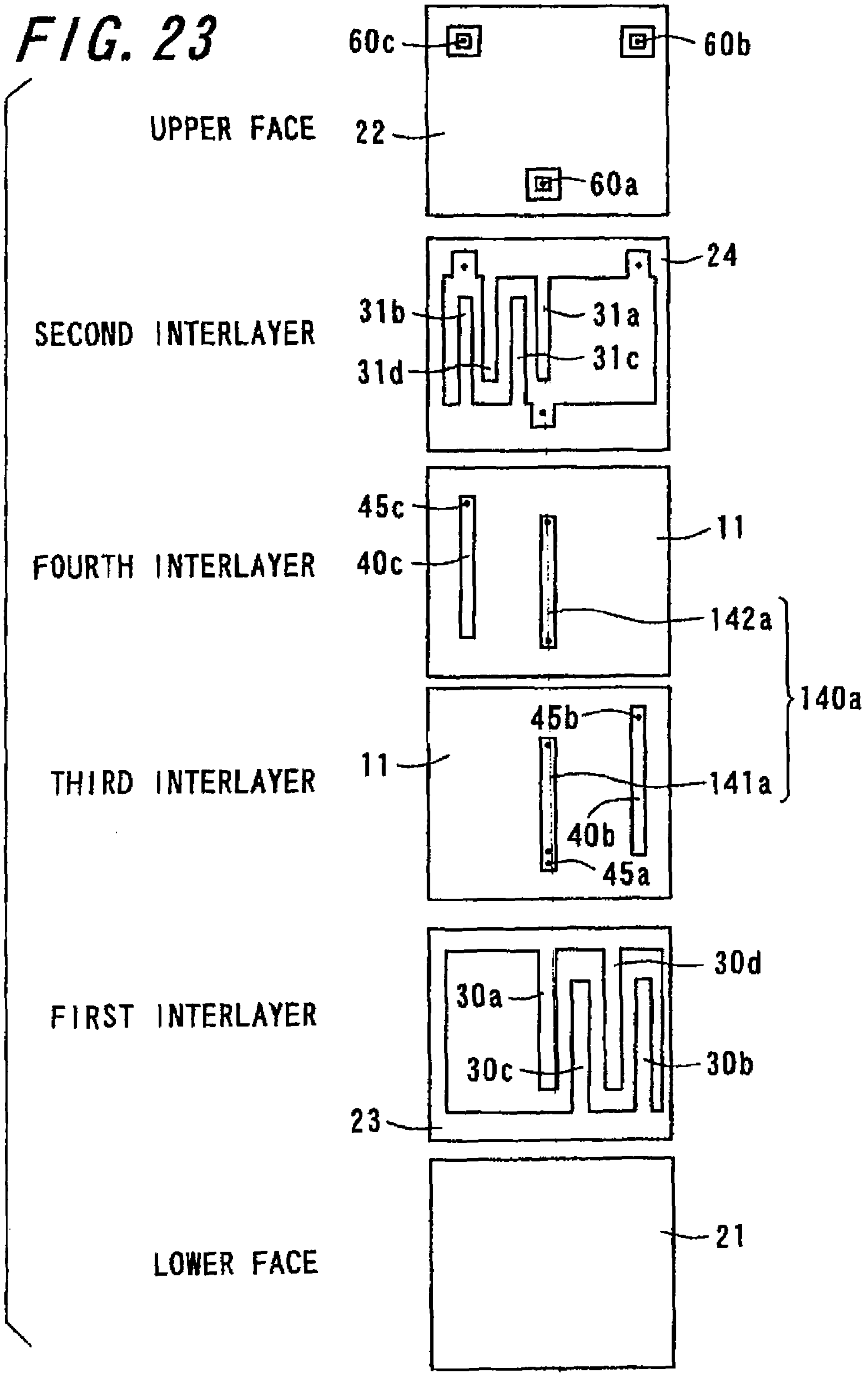
FIG. 23 is a plan view schematically showing upper and lower faces and interlayers of the diplexer shown in FIG. 21.
Figure 24:
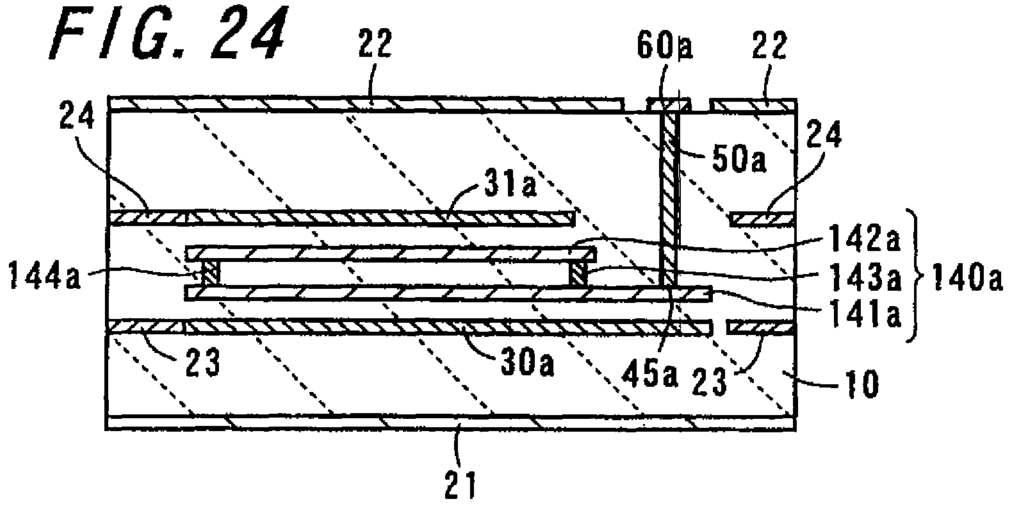
FIG. 24 is a cross-sectional view taken along line P2-P2' of FIG. 21.

FIG. 21 is an external perspective view schematically showing a diplexer according to a seventh embodiment the invention. FIG. 22 is a schematic exploded perspective view of the diplexer shown in FIG. 21. FIG. 23 is a plan view schematically showing upper and lower faces and interlayers of the diplexer shown in FIG. 21. FIG. 24 is a cross-sectional view taken along line P2-P2' of FIG. 21.

As shown in FIGS. 21 to 24, the diplexer of this embodiment includes the multilayer body 10, the first ground electrode 21, the second ground electrode 22, the plurality of strip-like first resonant electrodes 30*a*, 30*b*, 30*c*, and 30*d*, and the plurality of strip-like second resonant electrodes 31*a*, 31*b*, 31*c*, and 31*d*. The multilayer body 10 has a stack of a plurality of dielectric layers 11 on top of each other. The first ground electrode 21 is disposed on the lower face of the multilayer body 10. The second ground electrode 22 is disposed on the upper face of the multilayer body 10. The plurality of first resonant electrodes 30*a*, 30*b*, 30*c*, and 30*d* are arranged side by side on a first interlayer of the multilayer body 10, with their one ends as well as their other ends displaced in relation to each other in a staggered manner, have their one ends connected to a ground potential so as to serve as a quarter-wavelength resonator, and make electromagnetic-field coupling with each other. The plurality of second resonant electrodes 31*a*, 31*b*, 31*c*, and 31*d* are arranged side by side on a second interlayer of the multilayer body 10 different from the first interlayer, with their one ends as well as their other ends displaced in relation to each other in a staggered manner, have their one ends connected to a ground potential so as to serve as a quarter-wavelength resonator that resonates at a frequency higher than a frequency of the first resonant electrodes, and make electromagnetic-field coupling with each other.

The diplexer of this embodiment further includes a composite input coupling electrode 140*a*, the strip-like first output coupling electrode 40*b*, and the strip-like second output coupling electrode 40*c*. The composite input coupling electrode 140*a* includes a strip-like first input coupling electrode 141*a* that is disposed on a third interlayer of the multilayer body 10 located between the first interlayer and the second interlayer, and faces the input-stage first resonant electrode 30*a* of the plurality of first resonant electrodes 30*a*, 30*b*, 30*c*, and 30*d*, over more than half of an entire longitudinal area thereof, a strip-like second input coupling electrode 142*a* that is disposed on a fourth interlayer of the multilayer body 10 located between the second interlayer and the third interlayer, and faces the input-stage second resonant electrode 31*a* of the plurality of second resonant electrodes 31*a*, 31*b*, 31*c*, and 31*d*, over more than half of an entire longitudinal area thereof, and an input-side connection conductor 143*a* that connects the first input coupling electrode 141*a* and the second input coupling electrode 142*a*. The composite input coupling electrode makes electromagnetic-field coupling with the input-stage first resonant electrode 30*a* and the input-stage second resonant electrode 31*a*, and has the electric signal input point 45*a* for receiving input of an electric signal from an external circuit. The first output coupling electrode 40*b* is disposed on a third interlayer of the multilayer body 10 different from the first interlayer, faces the output-stage first resonant electrode 30*b* of the plurality of first resonant electrodes 30*a*, 30*b*, 30*c*, and 30*d*, over more than half of an entire longitudinal area thereof for electromagnetic-field coupling, and has the first electric signal output point 45*b* for producing output of an electric signal toward an external circuit. The second output coupling electrode 40*c* is disposed on a fourth interlayer of the multilayer body 10 different from the second interlayer, faces the output-stage second resonant electrode 31*b* of the plurality of second resonant electrodes 31*a*, 31*b*, 31*c*, and 31*d*, over more than half of an entire longitudinal area thereof for electromagnetic-field coupling, and has the second electric signal output point 45*c* for producing output of an electric signal toward an external circuit.

The diplexer of this embodiment further includes an input-side auxiliary connection conductor 144*a* that is disposed on the side opposite the input-side connection conductor 143*a* with respect to the center of the region where the first input coupling electrode 141*a* and the second input coupling electrode 142*a* face each other, and connects the first input coupling electrode 141*a* and the second input coupling electrode 142*a*.

The diplexer of this embodiment further includes the first annular ground electrode 23 and the second annular ground electrode 24. On the first interlayer of the multilayer body 10, the first annular ground electrode 23 is formed in the annular shape so as to surround the plurality of first resonant electrodes 30*a*, 30*b*, 30*c*, and 30*d*, and is connected to the one ends, respectively, of the plurality of first resonant electrodes 30*a*, 30*b*, 30*c*, and 30*d*. On the second interlayer, the second annular ground electrode 24 is formed in the annular shape so as to surround the plurality of second resonant electrodes 31*a*, 31*b*, 31*c*, and 31*d*, and is connected to the one ends, respectively, of the plurality of second resonant electrodes 31*a*, 31*b*, 31*c*, and 31*d*.

Furthermore, in the diplexer of this embodiment, the one end of the input-stage first resonant electrode 30*a* and the one end of the input-stage second resonant electrode 31*a* are located on the same side. The first output coupling electrode 40*b* and the second output coupling electrode 40*c* in a plan view are located on the opposite sides with the input coupling electrodes interposed therebetween. In the composite input coupling electrode 140*a*, the electric signal input point 45*a* and the input-side connection conductor 143*a* are located closer to the other end of the input-stage first resonant electrode 30*a* than the center of the part facing the input-stage first resonant electrode 30*a*, and closer to the other end of the input-stage second resonant electrode 31*a* than the center of the part facing the input-stage second resonant electrode 31*a*. In the first output coupling electrode 40*b*, the first electric signal output point 45*b* is located closer to the other end of the output-stage first resonant electrode 30*b* than the center of the part facing the output-stage first resonant electrode 30*b*. In the second output coupling electrode 40*c*, the second electric signal output point 45*c* is located closer to the other end of the output-stage second resonant electrode 31*b* than the center of the part facing the output-stage second resonant electrode 31*b*.

Furthermore, in the diplexer of this embodiment, the composite input coupling electrode 140*a* is connected via the through conductor 50*a* to the input terminal electrode 60*a* disposed on the upper face of the multilayer body 10, the first output coupling electrode 40*b* is connected via the through conductor 50*b* to the first output terminal electrode 60*b* disposed on the upper face of the multilayer body 10, and the second output coupling electrode 40*c* is connected via the through conductor 50*c* to the second output terminal electrode 60*c* disposed on the upper face of the multilayer body 10. Thus, a point that connects the composite input coupling electrode 140*a* and the through conductor 50*a* is the electric signal input point 45*a*, a point that connects the first output coupling electrode 40*b* and the through conductor 50*b* is the first electric signal output point 45*b*, and a point that connects the second output coupling electrode 40*c* and the through conductor 50*c* is the second electric signal output point 45*c*.

In the thus configured diplexer of this embodiment, when an electric signal from an external circuit is inputted via the input terminal electrode 60*a* and the through conductor 50*a* to the electric signal input point 45*a* of the composite input coupling electrode 140*a*, the input-stage first resonant electrode 30*a* that makes electromagnetic-field coupling with the composite input coupling electrode 140*a* is excited, and, thus, the plurality of first resonant electrodes 30*a*, 30*b*, 30*c*, and 30*d* that make electromagnetic-field coupling with each other resonate, and an electric signal is outputted from the first electric signal output point 45*b* of the first output coupling electrode 40*b* that makes electromagnetic-field coupling with the output-stage first resonant electrode 30*b* via the through conductor 50*b* and the first output terminal electrode 60*b* toward an external circuit. At that time, a signal in a first frequency band containing a frequency at which the plurality of first resonant electrodes 30*a*, 30*b*, 30*c*, and 30*d* resonate is selectively allowed to pass, and, thus, a first pass band is formed.

Furthermore, in the diplexer of this embodiment, when an electric signal from an external circuit is inputted via the input terminal electrode 60*a* and the through conductor 50*a* to the electric signal input point 45*a* of the composite input coupling electrode 140*a*, the input-stage second resonant electrode 31*a* that makes electromagnetic-field coupling with the composite input coupling electrode 140*a* is excited, and, thus, the plurality of second resonant electrodes 31*a*, 31*b*, 31*c*, and 31*d* that make electromagnetic-field coupling with each other resonate, and an electric signal is outputted from the second electric signal output point 45*c* of the second output coupling electrode 40*c* that makes electromagnetic-field coupling with the output-stage second resonant electrode 31*b* via the through conductor 50*c* and the second output terminal electrode 60*c* toward an external circuit. At that time, a signal in a second frequency band containing a frequency at which the plurality of second resonant electrodes 31*a*, 31*b*, 31*c*, and 31*d* resonate is selectively allowed to pass, and, thus, a second pass band is formed.

In this manner, the diplexer of this embodiment serves as a diplexer that demultiplexes a signal inputted from the input terminal electrode 60*a* according to the frequency, and that outputs resulting signals from the first output terminal electrode 60*b* and the second output terminal electrode 60*c*.

In the diplexer of this embodiment, the first ground electrode 21 is disposed on the entire lower face of the multilayer body 10, the second ground electrode 22 is disposed on substantially the entire upper face of the multilayer body 10 excluding portions around the input terminal electrode 60*a*, the first output terminal electrode 60*b*, and the second output terminal electrode 60*c*, and both electrodes are connected to a ground potential and form a stripline resonator together with the plurality of first resonant electrodes 30*a*, 30*b*, 30*c*, and 30*d* and the plurality of second resonant electrodes 31*a*, 31*b*, 31*c*, and 31*d*.

Furthermore, in the diplexer of this embodiment, the plurality of strip-like first resonant electrodes 30*a*, 30*b*, 30*c*, and 30*d* respectively have one ends that are connected to the first annular ground electrode 23 and connected to a ground potential so as to serve as a quarter-wavelength resonator. Furthermore, the electrical lengths thereof are set to approximately ¼ the wavelength at the center frequency of a pass band formed by the plurality of first resonant electrodes 30*a*, 30*b*, 30*c*, and 30*d*. In a similar manner, the plurality of strip-like second resonant electrodes 31*a*, 31*b*, 31*c*, and 31*d* respectively have one ends that are connected to the second annular ground electrode 24 and connected to a ground potential so as to serve as a quarter-wavelength resonator. Furthermore, the electrical lengths thereof are set to approximately ¼ the wavelength at the center frequency of a pass band formed by the plurality of second resonant electrodes 31*a*, 31*b*, 31*c*, and 31*d*.

Furthermore, the plurality of first resonant electrodes 30*a*, 30*b*, 30*c*, and 30*d* are arranged side by side on the first interlayer of the multilayer body 10, and edge-coupled to each other, and the plurality of second resonant electrodes 31*a*, 31*b*, 31*c*, and 31*d* are arranged side by side on the second interlayer of the multilayer body 10, and edge-coupled to each other. The gap between the plurality of first resonant electrodes 30*a*, 30*b*, 30*c*, and 30*d* arranged side by side, and the gap between the plurality of second resonant electrodes 31*a*, 31*b*, 31*c*, and 31*d* arranged side by side are set to, for example, approximately 0.05 to 0.5 mm, because a smaller gap realizes a more intense coupling but too small a gap makes the production difficult.

Moreover, the plurality of first resonant electrodes 30*a*, 30*b*, 30*c*, and 30*d* arranged side by side are arranged with their one ends as well as their other ends displaced in relation to each other in a staggered manner. Since the resonant electrodes are coupled to each other in an interdigital form, a magnetic-field coupling and an electric-field coupling are added, and a more intense coupling than a comb-line coupling is generated. Accordingly, in a pass band formed by the plurality of first resonant electrodes 30*a*, 30*b*, 30*c*, and 30*d*, the frequency interval between the resonance frequencies in each resonance mode can be set so as to be suitable for obtaining a very wide pass bandwidth in which the fractional bandwidth is approximately 40% to 50%, which is much wider than a region that can be realized by a conventional filter using a quarter-wavelength resonator.

In a similar manner, the plurality of second resonant electrodes 31*a*, 31*b*, 31*c*, and 31*d* arranged side by side are arranged with their one ends as well as their other ends displaced in relation to each other in a staggered manner. Since the resonant electrodes are coupled to each other in an interdigital form, in a pass band formed by the plurality of second resonant electrodes 31*a*, 31*b*, 31*c*, and 31*d*, the frequency interval between the resonance frequencies in each resonance mode can be set so as to be suitable for obtaining a very wide pass bandwidth in which the fractional bandwidth is approximately 40% to 50%, which is much wider than a region that can be realized by a conventional filter using a quarter-wavelength resonator.

Here, it was seen from investigations that, in the case where a plurality of resonant electrodes forming one pass band are broadside-coupled and interdigitally-coupled to each other, the coupling is too intense, which is not preferable for obtaining a pass bandwidth in which the fractional bandwidth is approximately 40% to 50%.

Furthermore, in the diplexer of this embodiment, the composite input coupling electrode 140*a* includes the strip-like first input coupling electrode 141*a* that is disposed on a third interlayer of the multilayer body 10 located between the first interlayer and the second interlayer, and faces the input-stage first resonant electrode 30*a* of the plurality of first resonant electrodes 30*a*, 30*b*, 30*c*, and 30*d*, over more than half of an entire longitudinal area thereof, the strip-like second input coupling electrode 142*a* that is disposed on a fourth interlayer of the multilayer body 10 located between the second interlayer and the third interlayer, and faces the input-stage second resonant electrode 31*a* of the plurality of second resonant electrodes 31*a*, 31*b*, 31*c*, and 31*d*, over more than half of an entire longitudinal area thereof, and the input-side connection conductor 143*a* and the input-side auxiliary connection conductor 144*a* that connect the first input coupling electrode 141*a* and the second input coupling electrode 142*a*, the composite input coupling electrode making electromagnetic-field coupling with the input-stage first resonant electrode 30*a* and the input-stage second resonant electrode 31*a*, and, having the electric signal input point 45*a* for receiving input of an electric signal from an external circuit. In the longitudinal direction of the composite input coupling electrode 140*a*, the input-side connection conductor 143*a* is located closer to the other end of the input-stage first resonant electrode 30*a* than the center of the part facing the input-stage first resonant electrode 30*a*, and closer to the other end of the input-stage second resonant electrode 31*a* than the center of the part facing the input-stage second resonant electrode 31*a*. With this configuration, the composite input coupling electrode 140*a* is broadside-coupled and interdigitally-coupled to the input-stage first resonant electrode 30*a* and the input-stage second resonant electrode 31*a*. Thus, these electrodes make electromagnetic-field coupling intensively by a broadside coupling, and make electromagnetic-field coupling more intensively by an interdigital coupling in which an electric-field coupling and a magnetic-field coupling are added. Accordingly, the composite input coupling electrode 140*a*, and the input-stage first resonant electrode 30*a* and the input-stage second resonant electrode 31*a* can be very intensively coupled. Moreover, with this configuration, compared with the case in which the composite input coupling electrode 140*a* is a single layered electrode, the gap between the input-stage first resonant electrode 30*a* and the input-stage second resonant electrode 31*a* can be increased while maintaining the gap between the composite input coupling electrode 140*a*, and the input-stage first resonant electrode 30*a* and the input-stage second resonant electrode 31*a*. Thus, the direct electromagnetic coupling between the input-stage first resonant electrode 30*a* and the input-stage second resonant electrode 31*a* can be attenuated without attenuating the electromagnetic coupling between the composite input coupling electrode 140*a*, and the input-stage first resonant electrode 30*a* and the input-stage second resonant electrode 31*a*. Accordingly, the electromagnetic coupling between the composite input coupling electrode 140*a*, and the input-stage first resonant electrode 30*a* and the input-stage second resonant electrode 31*a* can be further intensified.

Furthermore, in the diplexer of this embodiment, the first output coupling electrode 40*b* is disposed on a third interlayer of the multilayer body 10 different from the first interlayer, and faces the output-stage first resonant electrode 30*b* of the plurality of first resonant electrodes 30*a*, 30*b*, 30*c*, and 30*d*, over more than half of an entire longitudinal area thereof for electromagnetic-field coupling. Furthermore, in the first output coupling electrode 40*b*, the first electric signal output point 45*b* for producing output of an electric signal toward an external circuit is located closer to the other end of the output-stage first resonant electrode 30*b* than the center of the part facing the output-stage first resonant electrode 30*b*. With this configuration, the first output coupling electrode 40*b* and the output-stage first resonant electrode 30*b* make electromagnetic-field coupling intensively by a broadside coupling through the dielectric layers 11, and are coupled to each other in an interdigital form, and, thus, a magnetic-field coupling and an electric-field coupling are added, and the electromagnetic coupling becomes more intense.

Moreover, in the diplexer of this embodiment, the second output coupling electrode 40*c* is disposed on a fourth interlayer of the multilayer body 10 different from the second interlayer, and faces the output-stage second resonant electrode 31*b* of the plurality of second resonant electrodes 31*a*, 31*b*, 31*c*, and 31*d*, over more than half of an entire longitudinal area thereof for electromagnetic-field coupling. Moreover, in the second output coupling electrode 40*c*, the second electric signal output point 45*c* for producing output of an electric signal toward an external circuit is located closer to the other end of the output-stage second resonant electrode 31*b* than the center of the part facing the output-stage second resonant electrode 31*b*. With this configuration, the second output coupling electrode 40*c* and the output-stage second resonant electrode 31*b* make electromagnetic-field coupling intensively by a broadside coupling through the dielectric layers 11, and are coupled to each other in an interdigital form, and, thus, a magnetic-field coupling and an electric-field coupling are added, and the electromagnetic coupling becomes more intense.

Moreover, according to the diplexer of this embodiment, the first input coupling electrode 141*a* is disposed on the side opposite the input-side connection conductor 143*a* with respect to the center of the region where the first input coupling electrode 141*a* and the second input coupling electrode 142*a* face each other. With this configuration, the first input coupling electrode 141*a* and the second input coupling electrode 142*a* are connected via the input-side auxiliary connection conductor 144*a*, and, thus, the potential difference between the first input coupling electrode 141*a* and the second input coupling electrode 142*a* is reduced near an open end of the composite input coupling electrode 140*a*. Thus, the electromagnetic coupling between the first input coupling electrode 141*a* and the second input coupling electrode 142*a* is reduced. Accordingly, it is assumed that the electromagnetic coupling between the first input coupling electrode 141*a* and the input-stage first resonant electrode 30*a* becomes intense, and the electromagnetic coupling between the second input coupling electrode 142*a* and the input-stage second resonant electrode 31*a* becomes intense. With this mechanism, the electromagnetic coupling between the composite input coupling electrode 140*a*, and the input-stage first resonant electrode 30*a* and the input-stage second resonant electrode 31*a* can be further intensified.

Furthermore, according to the diplexer of this embodiment, the input-side auxiliary connection conductor 144*a* is disposed at the end portion on the side opposite the electric signal input point 45*a* and the input-side connection conductor 143*a* with respect to the center of the region where the first input coupling electrode 141*a* and the second input coupling electrode 142*a* face each other. With this configuration, the potential difference between the first input Coupling electrode 141*a* and the second input coupling electrode 142*a* can be minimized near an open end of the composite input coupling electrode 140*a*, and, thus, the electromagnetic coupling between the composite input coupling electrode 140*a*, and the input-stage first resonant electrode 30*a* and the input-stage second resonant electrode 31*a* can be further intensified.

Moreover, according to the diplexer of this embodiment, the input-side connection conductor 143*a* and the input-side auxiliary connection conductor 144*a* are arranged at both end portions of the region where the first input coupling electrode 141*a* and the second input coupling electrode 142*a* face each other. With this configuration, the potentials of the first input coupling electrode 141*a* and the second input coupling electrode 142*a* can be made closer to each other throughout the entire region where the first input coupling electrode 141*a* and the second input coupling electrode 142*a* face each other, and, thus, the electromagnetic coupling between the composite input coupling electrode 140*a*, and the input-stage first resonant electrode 30*a* and the input-stage second resonant electrode 31*a* can be further intensified.

In this manner, according to the diplexer of this embodiment, the composite input coupling electrode 140*a*, and the input-stage first resonant electrode 30*a* and the input-stage second resonant electrode 31*a* make electromagnetic-field coupling very intensively, the first output coupling electrode 40*b* and the output-stage first resonant electrode 30*b* make electromagnetic-field coupling very intensively, and the second output coupling electrode 40*c* and the output-stage second resonant electrode 31*b* make electromagnetic-field coupling very intensively. Accordingly, throughout two entire very wide pass bands formed by the plurality of first resonant electrodes 30*a*, 30*b*, 30*c*, and 30*d* and the plurality of second resonant electrodes 31*a*, 31*b*, 31*c*, and 31*d*, a pass characteristic can be obtained in which the form is flat and the loss is low, and in which a reduction in the return loss or an increase in the insertion loss due to mismatching of the input impedance is small even at a frequency located between the resonance frequencies in each resonance mode.

Here, in the diplexer of this embodiment, the one end of the input-stage first resonant electrode 30*a* and the one end of the input-stage second resonant electrode 31*a* are located on the same side. Thus, in this manner, the composite input coupling electrode 140*a*, and the input-stage first resonant electrode 30*a* and the input-stage second resonant electrode 31*a* can be broadside-coupled and interdigitally-coupled to each other.

Moreover, according to the diplexer of this embodiment, the first output coupling electrode 40*b* and the second output coupling electrode 40*c* in a plan view are located on the opposite sides with the composite input coupling electrode 140*a* interposed therebetween. Accordingly, the electromagnetic coupling between the plurality of first resonant electrodes 30*a*, 30*b*, 30*c*, and 30*d* and the plurality of second resonant electrodes 31*a*, 31*b*, 31*c*, and 31*d* can be attenuated, and, thus, good isolation between the plurality of first resonant electrodes 30*a*, 30*b*, 30*c*, and 30*d* and the plurality of second resonant electrodes 31*a*, 31*b*, 31*c*, and 31*d* can be secured.

Moreover, according to the diplexer of this embodiment, in the plurality of first resonant electrodes 30*a*, 30*b*, 30*c*, and 30*d* and the plurality of second resonant electrodes 31*a*, 31*b*, 31*c*, and 31*d*, the input-stage first resonant electrode 30*a* and the input-stage second resonant electrode 31*a* face each other with the composite input coupling electrode 140*a* interposed therebetween, and the first resonant electrodes 30*b*, 30*c*, and 30*d* and the second resonant electrodes 31*b*, 31*c*, and 31*d* other than the first resonant electrode 30*a* and the second resonant electrode 31*a* are arranged so as to be sequentially away therefrom. Thus, the composite input coupling electrode 140*a*, and the input-stage first resonant electrode 30*a* and the input-stage second resonant electrode 31*a* are broadside-coupled, and the isolation between the plurality of first resonant electrodes 30*a*, 30*b*, 30*c*, and 30*d* and the plurality of second resonant electrodes 31*a*, 31*b*, 31*c*, and 31*d* can be secured at a maximum. Accordingly, a diplexer can be obtained in which both of two wide pass bands have a flat and low-loss pass characteristic, and in which the isolation between the first output terminal electrode 60*b* and the second output terminal electrode 60*c* is sufficiently secured.

Here, the gap between the composite input coupling electrode 140*a*, and the input-stage first resonant electrode 30*a* and the input-stage second resonant electrode 31*a*, the gap between the first output coupling electrode 40*b* and the output-stage first resonant electrode 30*b*, and the gap between the second output coupling electrode 40*c* and the output-stage second resonant electrode 31*b* are set to, for example, approximately 0.01 to 0.5 mm, because a smaller gap realizes a more intense coupling but too small a gap makes the production difficult.

Furthermore, according to the diplexer of this embodiment, on the first interlayer, the first annular ground electrode 23 is formed in the annular shape so as to surround the plurality of first resonant electrodes 30*a*, 30*b*, 30*c*, and 30*d*, and is connected to the one ends, respectively, of the plurality of first resonant electrodes 30*a*, 30*b*, 30*c*, and 30*d*. Furthermore, on the second interlayer, the second annular ground electrode 24 is formed in the annular shape so as to surround the plurality of second resonant electrodes 31*a*, 31*b*, 31*c*, and 31*d*, and is connected to the one ends, respectively, of the plurality of second resonant electrodes 31*a*, 31*b*, 31*c*, and 31*d*. With this configuration, electrodes are provided that are connected to a ground potential on both sides in the longitudinal direction of both of the plurality of first resonant electrodes 30*a*, 30*b*, 30*c*, and 30*d* and the plurality of second resonant electrodes 31*a*, 31*b*, 31*c*, and 31*d*, and, thus, the one ends of the resonant electrodes that are displaced in relation to each other in a staggered manner can be easily connected to a ground potential. Furthermore, the first annular ground electrode 23 in the annular shape surrounds the plurality of first resonant electrodes 30*a*, 30*b*, 30*c*, and 30*d*, and the second annular ground electrode 24 in the annular shape surrounds the plurality of second resonant electrodes 31*a*, 31*b*, 31*c*, and 31*d*, and, thus, outside leakage of electromagnetic waves generated by the plurality of first resonant electrodes 30*a*, 30*b*, 30*c*, and 30*d* and the plurality of second resonant electrodes 31*a*, 31*b*, 31*c*, and 31*d* can be reduced. These effects are particularly useful in the case where a diplexer is formed in a partial region on a module substrate.

Eighth Embodiment

Figure 25:
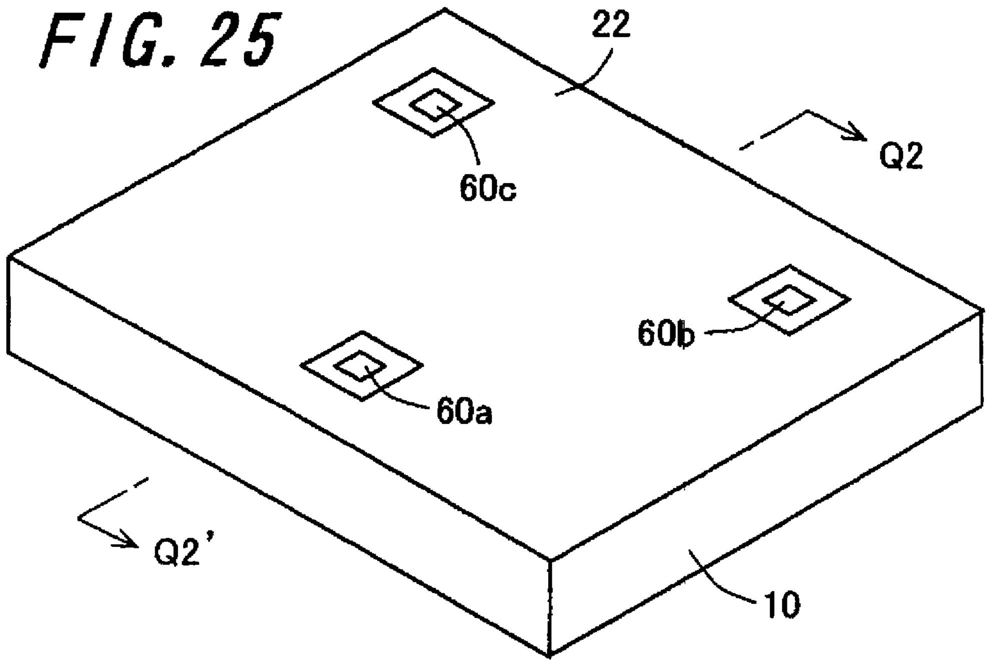
FIG. 25 is an external perspective view schematically showing a diplexer according to an eighth embodiment of the invention.
Figure 26:
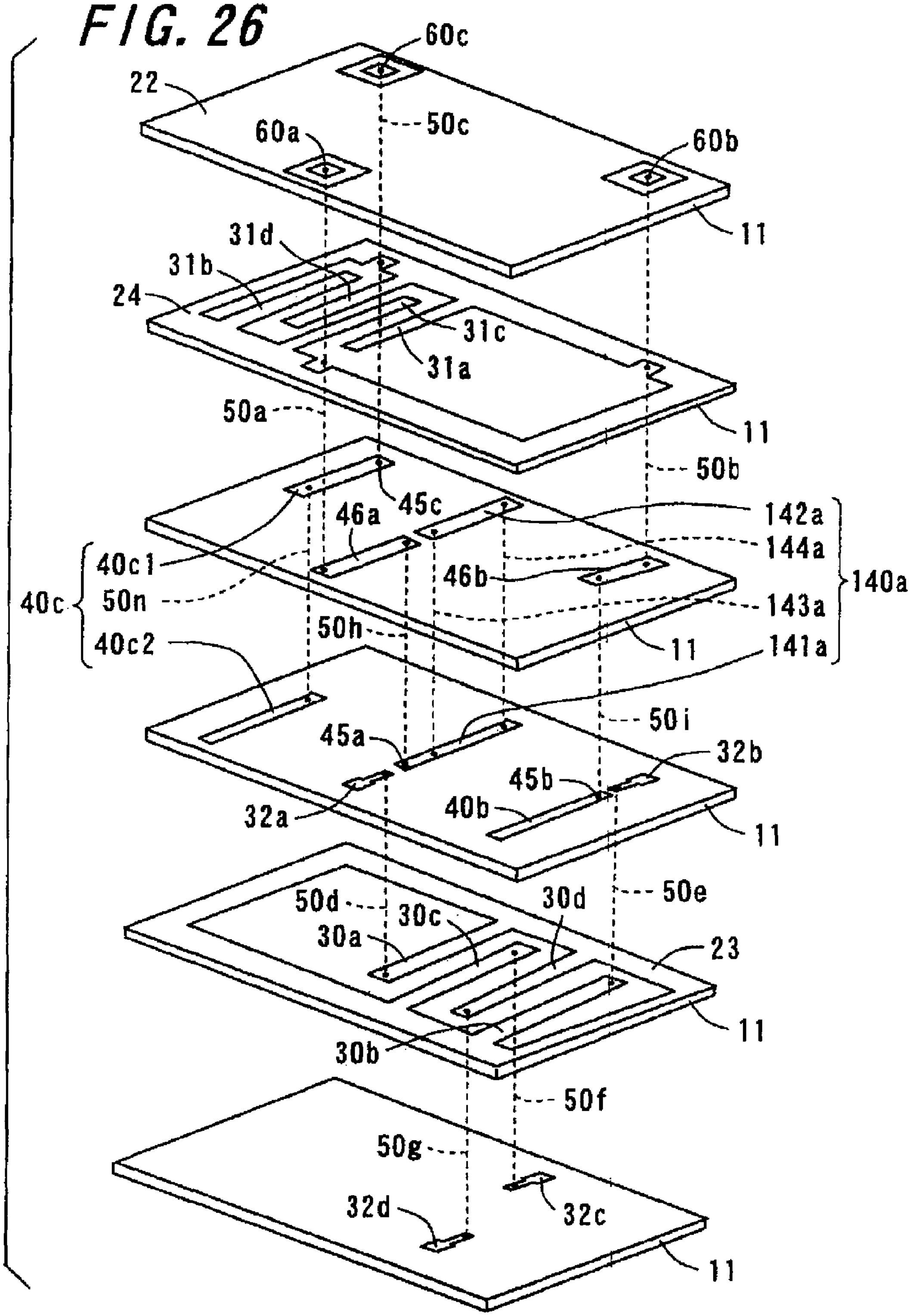
FIG. 26 is a schematic exploded perspective view of the diplexer shown in FIG. 25.
Figure 27:
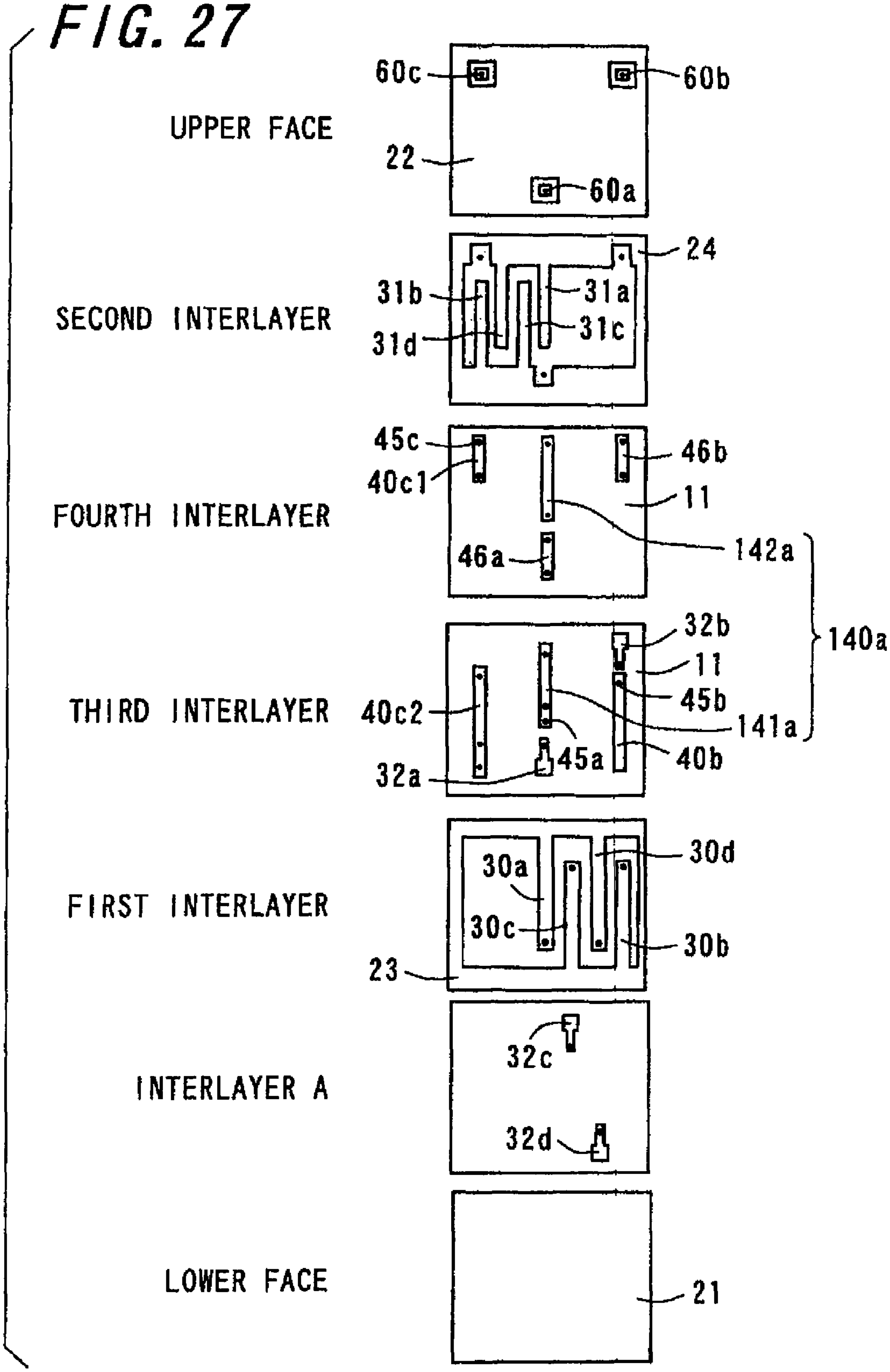
FIG. 27 is a plan view schematically showing upper and lower faces and interlayers of the diplexer shown in FIG. 25.
Figure 28:
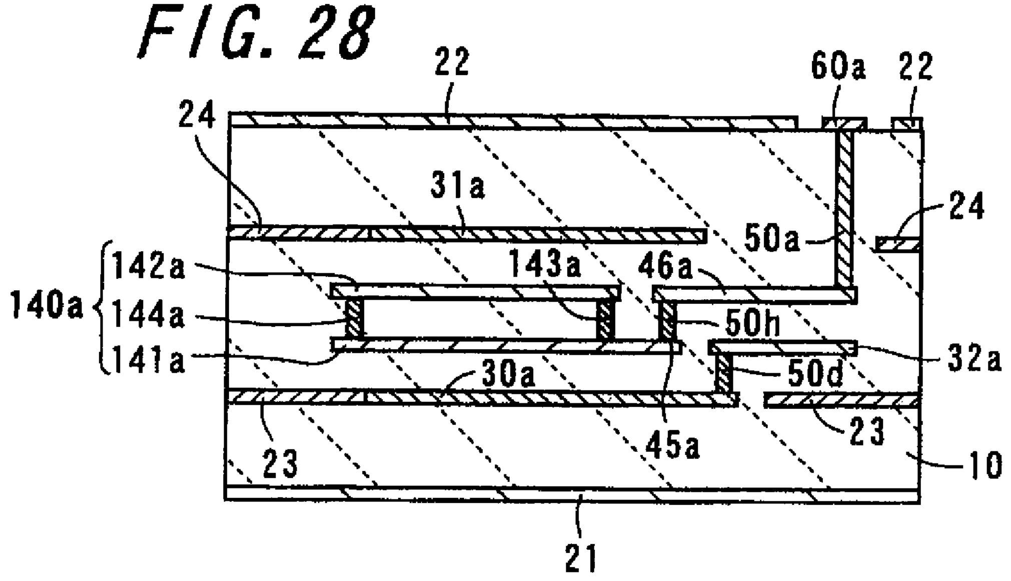
FIG. 28 is a cross-sectional view taken along line Q2-Q2' of FIG. 25.

FIG. 25 is an external perspective view schematically showing a diplexer according to an eighth embodiment of the invention. FIG. 26 is a schematic exploded perspective view of the diplexer shown in FIG. 25. FIG. 27 is a plan view schematically showing upper and lower faces and interlayers of the diplexer shown in FIG. 25. FIG. 28 is a cross-sectional view taken along line Q2-Q2' of FIG. 25. Note that the following description deals with in what way this embodiment differs from the above-mentioned first embodiment, and the constituent components thereof that play the same or corresponding roles as in the preceding embodiments will be denoted by the same reference numerals and overlapping descriptions will be omitted.

As shown in FIGS. 25 to 28, according to the diplexer of this embodiment, on a third interlayer of the multilayer body

10 that is located above the first interlayer and that has the first input coupling electrode 141*a* and the first output coupling electrode 40*b*, the input-stage auxiliary resonant electrode 32*a* is disposed so as to have a region facing the first annular ground electrode 23, and is connected via the through conductor 50*d* to an open end of the input-stage first resonant electrode 30*a*, and the output-stage auxiliary resonant electrode 32*b* is disposed so as to have a region facing the first annular ground electrode 23, and is connected via the through conductor 50*e* to an open end of the output-stage first resonant electrode 30*b*. Furthermore, on an interlayer A of the multilayer body 10 located below the first interlayer, the auxiliary resonant electrodes 32*c* and 32*d* are arranged so as to have a region facing the first annular ground electrode 23, and are respectively connected via the through conductors 50*f* and 50*g* to the other ends of the first resonant electrodes 30*c* and 30*d*.

Furthermore, according to the diplexer of this embodiment, on a fourth interlayer of the multilayer body 10 located above the third interlayer, an auxiliary input coupling electrode 46*a* is disposed so as to have a region facing the input-stage auxiliary resonant electrode 32*a*, and is connected via the through conductor 50*h* to the electric signal input point 45*a* of the composite input coupling electrode 140*a*, and an auxiliary output coupling electrode 46*b* is disposed so as to have a region facing the output-stage auxiliary resonant electrode 32*b*, and is connected via the through conductor 50*i* to the first electric signal output point 45*b* of the first output coupling electrode 40*b*. Furthermore, the composite input coupling electrode 140*a* is connected, via the through conductor 50*h* to the auxiliary input coupling electrode 46*a*, which is connected via the through conductor 50*a* to the input terminal electrode 60*a*, and the first output coupling electrode 40*b* is connected via the through conductor 50*i* to the auxiliary output coupling electrode 46, which is connected via the through conductor 50*b* to the first output terminal electrode 60*b*.

Furthermore, in the diplexer of this embodiment, the second output coupling electrode 40*c* has portions separately arranged as a first portion 40*c*1 that is disposed on the fourth interlayer of the multilayer body 10 and a second portion 40*c*2 that is disposed on the third interlayer. These portions are connected via a through conductor 50*n* that passes through the dielectric layers 11, and form the second output coupling electrode 40*c*. In the case where portions of the second output coupling electrode 40*c* are separately arranged on a plurality of interlayers in this manner, the electromagnetic-field coupling state with the output-stage second resonant electrode 31*b* can be finely controlled.

According to the thus configured diplexer of this embodiment, on the third interlayer and the interlayer A of the multilayer body 10 that are different from the first interlayer, the auxiliary resonant electrodes 32*a*, 32*b*, 32*c*, and 32*d* respectively connected via the through conductors 50*d*, 50*e*, 50*f*, and 50*g* to the other ends of the first resonant electrodes 30*a*, 30*b*, 30*c*, and 30*d* are arranged so as to have a region facing the first annular ground electrode 23. With this configuration, in the portion in which the auxiliary resonant electrodes 32*a*, 32*b*, 32*c*, and 32*d* and the first annular ground electrode 23 face each other, an electrostatic capacitance is generated between these electrodes and is added to the electrostatic capacitance between the first resonant electrodes 30*a*, 30*b*, 30*c*, and 30*d* respectively connected to the auxiliary resonant electrodes 32*a*, 32*b*, 32*c*, and 32*d* and the ground potential, and, thus, the lengths of the first resonant electrodes 30*a*, 30*b*, 30*c*, and 30*d* can be reduced, and a small diplexer can be obtained.

Here, the area of the part in which the auxiliary resonant electrodes 32*a*, 32*b*, 32*c*, and 32*d*, and the first annular ground electrode 23 face each other is set to, for example, approximately 0.01 to 3 $mm^2$, in view of the balance between a necessary size and an obtained electrostatic capacitance. The gap between the auxiliary resonant electrodes 32*a*, 32*b*, 32*c*, and 32*d*, and the first annular ground electrode 23 that face each other is set to, for example, approximately 0.01 to 0.5 mm, because a smaller gap realizes a larger electrostatic capacitance but too small a gap makes the production difficult.

Furthermore, according to the diplexer of this embodiment, on the fourth interlayer of the multilayer body 10 different from the first interlayer, the third interlayer, and the interlayer bearing the input-stage auxiliary resonant electrode 32*a*, the auxiliary input coupling electrode 46*a* is disposed so as to have a region facing the input-stage auxiliary resonant electrode 32*a*, and is connected via the through conductor 50*h* to the electric signal input point 45*a* of the composite input coupling electrode 140*a*. Furthermore, on the fourth interlayer of the multilayer body 10 different from the first interlayer, the interlayer bearing the first output coupling electrode 40*b*, and the interlayer bearing the output-stage auxiliary resonant electrode 32*b*, the auxiliary output coupling electrode 46*b* is disposed so as to have a region facing the output-stage auxiliary resonant electrode 32*b*, and is connected via the through conductor 50*i* to the first electric signal output point 45*b* of the first output coupling electrode 40*b*. Accordingly, an electromagnetic coupling is generated between the input-stage auxiliary resonant electrode 32*a* and the auxiliary input coupling electrode 46*a*, and is added to the electromagnetic coupling between the input-stage first resonant electrode 30*a* and the composite input coupling electrode 140*a*. In a similar manner, an electromagnetic coupling is generated between the output-stage auxiliary resonant electrode 32*b* and the auxiliary output coupling electrode 46*b*, and is added to the electromagnetic coupling between the output-stage first resonant electrode 30*b* and the first output coupling electrode 40*b*. Accordingly, the electromagnetic coupling between the composite input coupling electrode 140*a* and the input-stage first resonant electrode 30*a*, and the electromagnetic coupling between the first output coupling electrode 40*b* and the output-stage first resonant electrode 30*b* become more intense. Thus, in a pass band formed by the plurality of first resonant electrodes 30*a*, 30*b*, 30*c*, and 30*d*, even in a very wide pass bandwidth, a pass characteristic can be obtained in which the form is flatter and the loss is lower throughout the entire wide pass band, and in which an increase in the insertion loss at a frequency located between the resonance frequencies in each resonance mode is further reduced.

Moreover, according to the diplexer of this embodiment, the auxiliary resonant electrodes 32*a*, 32*b*, 32*c*, and 32*d* are respectively connected to the other ends of the first resonant electrodes 30*a*, 30*b*, 30*c*, and 30*d*, and extend to sides opposite the one ends of the first resonant electrodes 30*a*, 30*b*, 30*c*, and 30*d*. With this configuration, the coupling body composed of the input-stage first resonant electrode 30*a* and the input-stage auxiliary resonant electrode 32*a* connected thereto and a coupling body composed of the composite input coupling electrode 140*a* and the auxiliary input coupling electrode 46*a* connected thereto are broadside-coupled to each other as a whole, and the coupling body composed of the output-stage first resonant electrode 30*b* and the output-stage auxiliary resonant electrode 32*b* connected thereto and a coupling body composed of the first output coupling electrode 40*b* and the auxiliary output coupling electrode 46*b* connected thereto are broadside-coupled to each other as a whole, and, thus, the coupling bodies can be very intensively coupled to each other.

Moreover, according to the diplexer of this embodiment, in the composite input coupling electrode 140*a*, the electric signal input point 45*a* of the composite input coupling electrode 140*a* that is connected via the through conductor 50*h* to the auxiliary input coupling electrode 46*a* is located closer to the other end of the input-stage first resonant electrode 30*a* than the center of the part facing the input-stage first resonant electrode 30*a*, and closer to the other end of the input-stage second resonant electrode 31*a* than the center of the part facing the input-stage second resonant electrode 31*a*. Furthermore, in the first output coupling electrode 40*b*, the first electric signal output point 45*b* of the first output coupling electrode 40*b* that is connected via the through conductor 50*i* to the auxiliary output coupling electrode 46*b* is located closer to the other end of the output-stage first resonant electrode 30*b* than the center of the part facing the output-stage first resonant electrode 30*b*. Thus, even in the case where an electric signal from an external circuit is inputted via the auxiliary input coupling electrode 46*a* to the composite input coupling electrode 140*a*, and an electric signal is outputted from the first output coupling electrode 40*b* via the auxiliary output coupling electrode 46*b* toward an external circuit, the composite input coupling electrode 140*a*, and the input-stage first resonant electrode 30*a* and the input-stage second resonant electrode 31*a* are coupled to each other in an interdigital form, the first output coupling electrode 40*b* and the output-stage first resonant electrode 30*b* are coupled to each other in an interdigital form, and, thus, an intense coupling in which a magnetic-field coupling and an electric-field coupling are added can be generated.

Furthermore, according to the diplexer of this embodiment, an end portion of the auxiliary input coupling electrode 46*a* on the side in the longitudinal direction opposite the side that is connected via the through conductor 50*h* to the composite input coupling electrode 140*a* is connected via the through conductor 50*a* to the input terminal electrode 60*a*. With this configuration, the coupling body composed of the input-stage first resonant electrode 30*a* and the input-stage auxiliary resonant electrode 32*a* connected thereto and the coupling body composed of the composite input coupling electrode 140*a* and the auxiliary input coupling electrode 46*a* connected thereto are coupled to each other in an interdigital form as a whole, and, thus, an intense coupling in which a magnetic-field coupling and an electric-field coupling are added can be generated. Thus, the coupling that can be realized is more intense than in the case where the end portion of the auxiliary input coupling electrode 46*a* on the same side in the longitudinal direction as the side that is connected to the composite input coupling electrode 140*a* is connected to the input terminal electrode 60*a*.

In a similar manner, according to the diplexer of this embodiment, an end portion of the auxiliary output coupling electrode 46*b* on the side in the longitudinal direction opposite the side that is connected via the through conductor 50*i* to the first output coupling electrode 40*b* is connected via the through conductor 50*b* to the first output terminal electrode 60*b*. With this configuration, the coupling body composed of the output-stage first resonant electrode 30*b* and the output-stage auxiliary resonant electrode 32*b* connected thereto and the coupling body composed of the first output coupling electrode 40*b* and the auxiliary output coupling electrode 46*b* connected thereto are coupled to each other in an interdigital form as a whole, and, thus, an intense coupling in which a magnetic-field coupling and an electric-field coupling are added can be generated. Thus, the coupling that can be realized is more intense than in the case where the end portion of the auxiliary output coupling electrode 46*b* on the same side in the length direction as the side that is connected to the first output coupling electrode 40*b* is connected to the first output terminal electrode 60*b*.

In this manner, the coupling body composed of the input-stage first resonant electrode 30*a* and the input-stage auxiliary resonant electrode 32*a* connected thereto and the coupling body composed of the composite input coupling electrode 140*a* and the auxiliary input coupling electrode 46*a* connected thereto are very intensively coupled to each other by the broadside coupling and the interdigital coupling as a whole. In a similar manner, the coupling body composed of the output-stage first resonant electrode 30*b* and the output-stage auxiliary resonant electrode 32*b* connected thereto and the coupling body composed of the first output coupling electrode 40*b* and the auxiliary output coupling electrode 46*b* connected thereto are very intensively coupled to each other by the broadside coupling and the interdigital coupling as a whole. Accordingly, in a pass band formed by the plurality of first resonant electrodes 30*a*, 30*b*, 30*c*, and 30*d*, even in a very wide pass band, a pass characteristic can be obtained in which the form is flatter and the loss is lower throughout the entire wide pass band, and in which an increase in the insertion loss at a frequency located between the resonance frequencies in each resonance mode is further reduced.

Here, the widths of the auxiliary input coupling electrode 46*a* and the auxiliary output coupling electrode 46*b* are set, for example, so as to be similar to those of the composite input coupling electrode 140*a* and the first output coupling electrode 40*b*. The gap between the auxiliary input coupling electrode 46*a* and the auxiliary output coupling electrode 46*b*, and the auxiliary resonant electrodes 32*a* and 32*b* is set to, for example, approximately 0.01 to 0.5 mm, because a smaller gap realizes an intense coupling, which is desirable, but too small a gap makes the production difficult.

Ninth Embodiment

Figure 29:
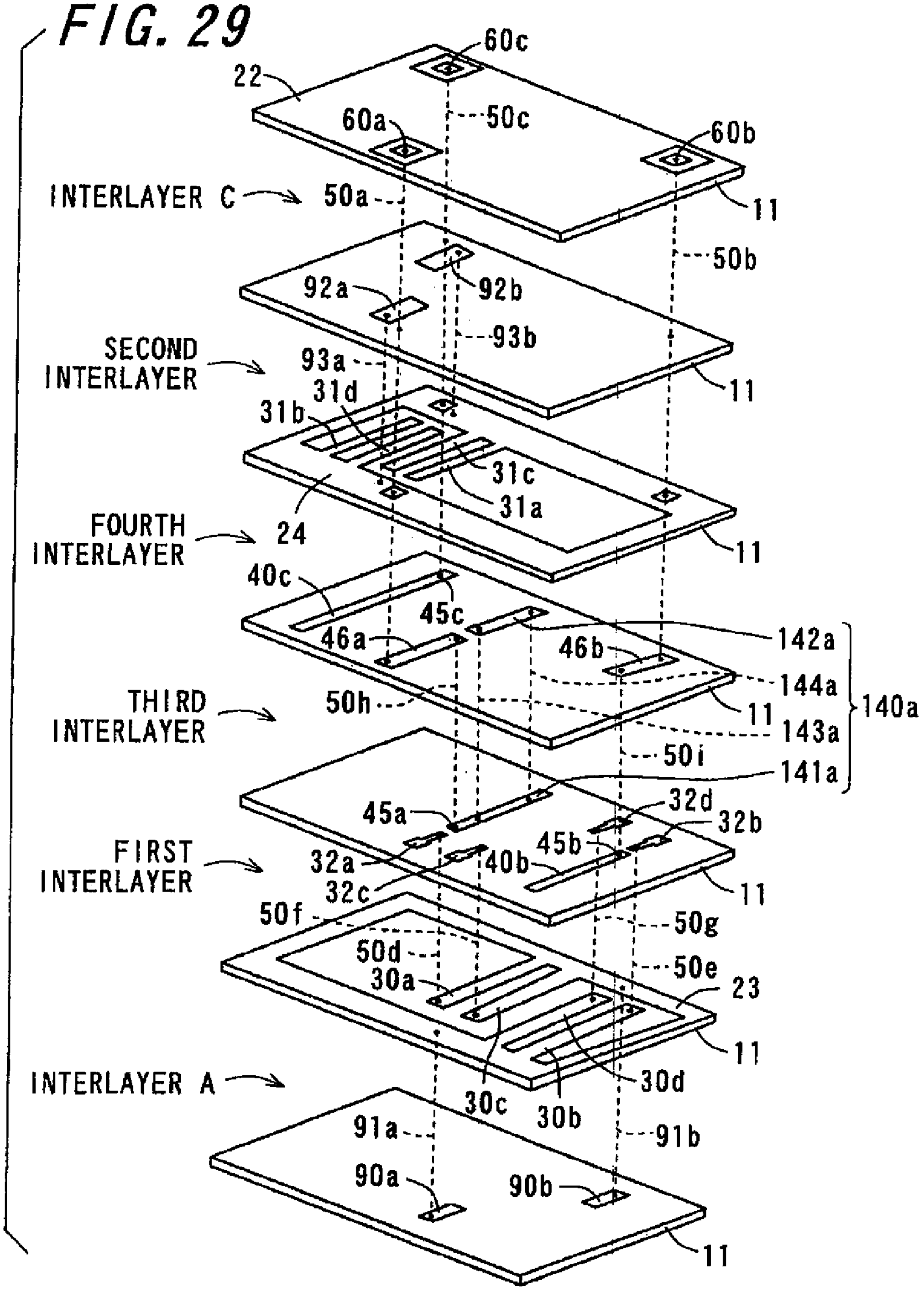
FIG. 29 is a schematic exploded perspective view of a diplexer according to a ninth embodiment of the invention.

FIG. 29 is a schematic exploded perspective view of a diplexer according to a ninth embodiment of the invention. Note that the following description deals with in what way this embodiment differs from the above-mentioned eighth embodiment, and the constituent components thereof that play the same or corresponding roles as in the preceding embodiments will be denoted by the same reference numerals and overlapping descriptions will be omitted.

In the diplexer of this embodiment, as shown in FIG. 29, on the first interlayer, the first resonant electrodes 30*a* and 30*c* are so arranged that their one ends are located on the same side. The first resonant electrodes 30*c* and 30*d* are so arranged that their one ends are displaced in relation to each other in a staggered manner. The first resonant electrodes 30*d* and 30*b* are so, arranged that their one ends are located on the same side. Moreover, on the second interlayer, the first resonant electrodes 31*a* and 31*c* are so arranged that their one ends are located on the same side. The first resonant electrodes 31*c* and 31*d* are so arranged that their one ends are displaced in relation to each other in a staggered manner. The first resonant electrodes 31*d* and 31*b* are so arranged that their one ends are located on the same side. Moreover, just like the auxiliary resonant electrodes 32*a* and 32*b*, the auxiliary resonant electrodes 32*c* and 32*d* are also arranged on the third interlayer. In the diplexer of this embodiment, the first resonant electrodes 30*a* and 30*c* are coupled to each other in a comb-line form. The first resonant electrodes 30*c* and 30*d* are coupled to each other in an interdigital form. The first resonant electrodes 30*d* and 30*b* are coupled to each other in a comb-line form. Moreover, the second resonant electrodes 31*a* and 31*c* are coupled to each other in a comb-line form. The second resonant electrodes 31*c* and 31*d* are coupled to each other in an interdigital form. The second resonant electrodes 31*d* and 31*b* are coupled to each other in a comb-line form.

Moreover, in the diplexer of this embodiment, the second output coupling electrodes 40*c* is not separated into two pieces, but is arranged on a fourth interlayer located between the second interlayer and the third interlayer.

Further, in the diplexer of this embodiment, on an interlayer A of the multilayer body 10 located below the first interlayer, there is disposed a first coupling electrode 90*a* connected via a through conductor 91*a* to the first annular ground electrode 23 so as to face the other ends of, respectively, the first resonant electrodes 30*a* and 30*c*. Also disposed on the interlayer A is a second coupling electrode 90*b* connected via a through conductor 91*b* to the first annular ground electrode 23 so as to face the other ends of, respectively, the first resonant electrodes 30*d* and 30*b*.

Still further, in the diplexer of this embodiment, on an interlayer C of the multilayer body 10 located above the second interlayer, there is disposed a third coupling electrode 92*a* connected via a through conductor 93*a* to the second annular ground electrode 24 so as to face the other ends of, respectively, the second resonant electrodes 31*a* and 31*c*. Also disposed on the interlayer C is a fourth coupling electrode 92*b* connected via a through conductor 93*b* to the second annular ground electrode 24 so as to face the other ends of, respectively, the second resonant electrodes 31*d* and 31*b*.

According to the diplexer of this embodiment, the first coupling electrode 90*a* helps increase electrostatic capacitance between each of the first resonant electrodes 30*a* and 30*c* and the ground potential. In a similar manner, the second coupling electrode 90*b* helps increase electrostatic capacitance between each of the first resonant electrodes 30*d* and 30*b* and the ground potential, the third coupling electrode 92*a* helps increase electrostatic capacitance between each of the second resonant electrodes 31*a* and 31*c* and the ground potential, and the fourth coupling electrode 92*b* helps increase electrostatic capacitance between each of the second resonant electrodes 31*d* and 31*b* and the ground potential. This makes it possible to reduce the lengths of, respectively, the first resonant electrodes 30*a*, 30*b*, 30*c*, and 30*d* and the lengths of, respectively, the second resonant electrodes 31*a*, 31*b*, 31*c*, and 31*d*, and thereby obtain a more compact diplexer.

Moreover, according to the diplexer of this embodiment, the first coupling electrode 90*a* helps intensify the electromagnetic coupling between the adjacent first resonant electrodes 30*a* and 30*c*. In a similar manner, the second coupling electrode 90*b* helps intensify the electromagnetic coupling between the adjacent first resonant electrodes 30*d* and 30*b*, the third coupling electrode 92*a* helps intensify the electromagnetic coupling between the adjacent second resonant electrodes 31*a* and 31*c*, and the fourth coupling electrode 92*b* helps intensify the electromagnetic coupling between the adjacent second resonant electrodes 31*d* and 31*b*. Hence, just as in the case where all the first resonant electrodes 30*a*, 30*b*, 30*c*, and 30*d* make electromagnetic-field coupling with each other in an interdigital form and all the second resonant electrodes 31*a*, 31*b*, 31*c*, and 31*d* make electromagnetic-field coupling with each other in an interdigital form, it is possible to obtain a diplexer having a wide pass band.

Tenth Embodiment

Figure 30:
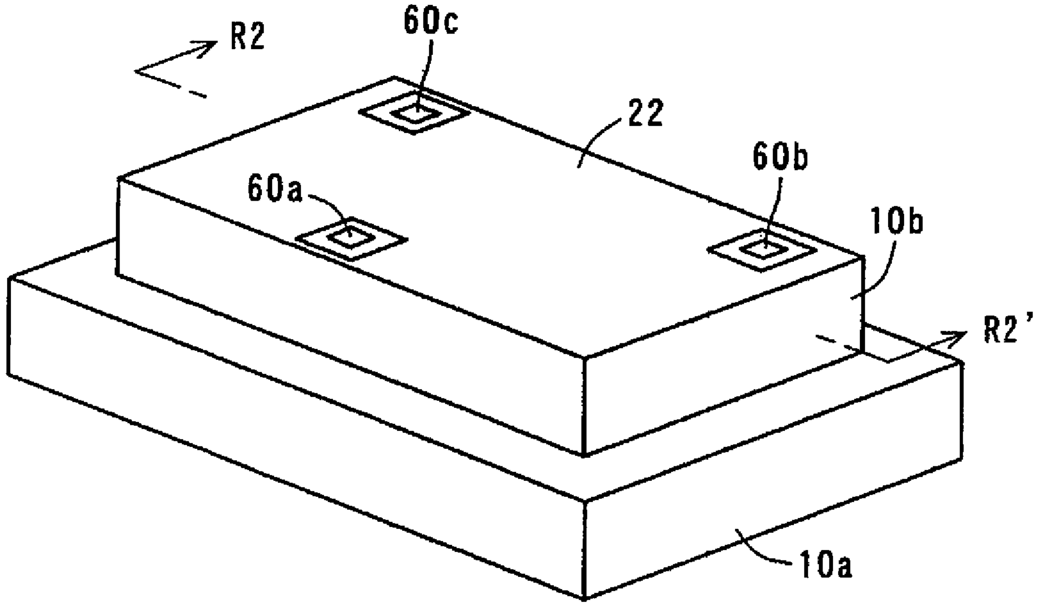
FIG. 30 is an external perspective view schematically showing a diplexer according to a tenth embodiment of the invention.
Figure 31:
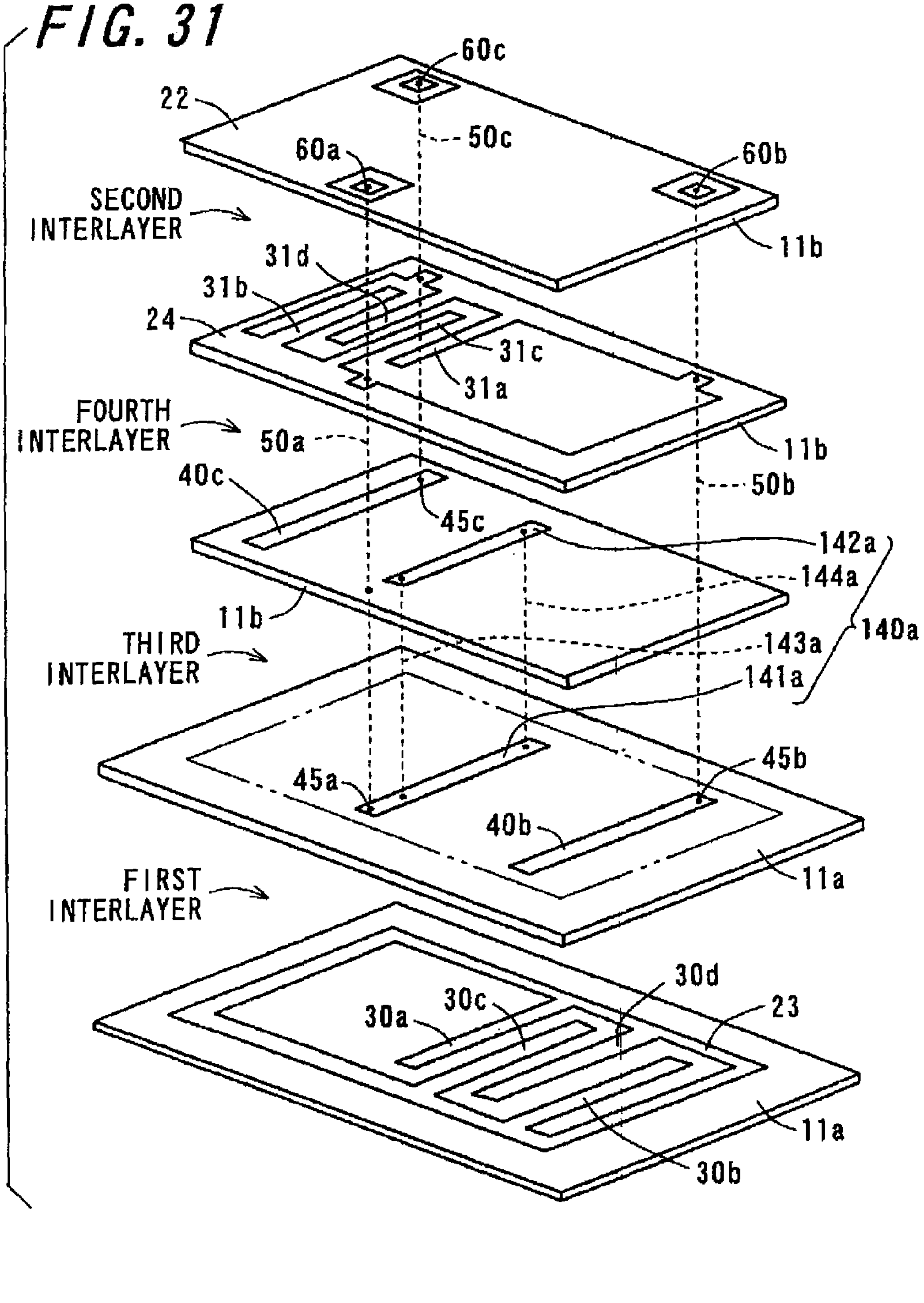
FIG. 31 is a schematic exploded perspective view of the diplexer shown in FIG. 30.
Figure 32:
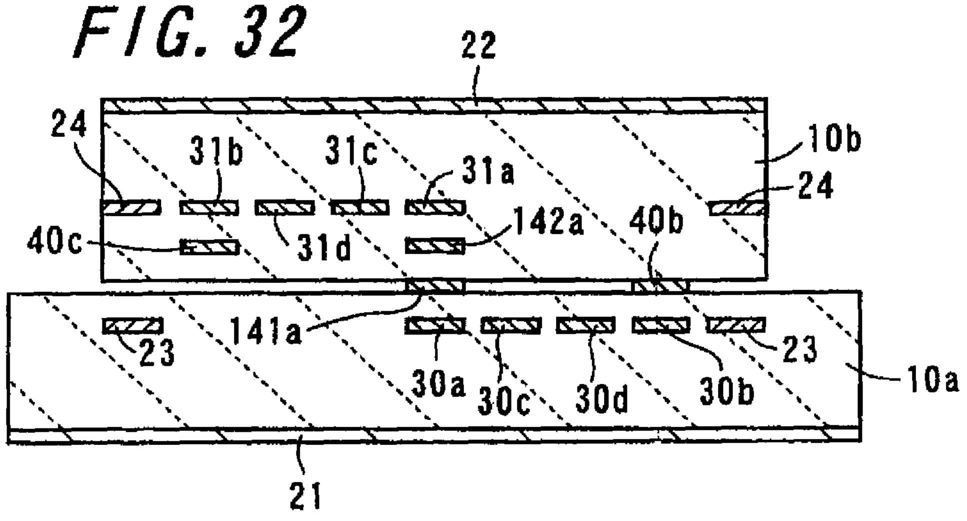
FIG. 32 is a cross-sectional view taken along line R2-R2' of FIG. 30.

FIG. 30 is an external perspective view schematically showing a diplexer according to a tenth embodiment of the invention. FIG. 31 is a schematic exploded perspective view of the diplexer shown in FIG. 30. FIG. 32 is a cross-sectional view taken along line R2-R2' of FIG. 30. Note that the following description deals with in what way this embodiment differs from the above-mentioned seventh embodiment, and the constituent components thereof that play the same or corresponding roles as in the preceding embodiments will be denoted by the same reference numerals and overlapping descriptions will be omitted.

In the diplexer of this embodiment, as shown in FIGS. 30 to 32, the multilayer body comprises a first multilayer body 10*a* and a second multilayer body 10*b* placed thereon. The first ground electrode 21 is disposed on a lower face of the first multilayer body 10*a*. The second ground electrode 22 is disposed on an upper face of the second multilayer body 10*b*. The first interlayer, which bears the first resonant electrodes 30*a*, 30*b*, 30*c*, and 30*d* and the first annular ground electrode 23, is located within the first multilayer body 10*a*. The second interlayer, which bears the second resonant electrodes 31*a*, 31*b*, 31*c*, and 31*d* and the second annular ground electrode 24, and the fourth interlayer, which bears the second input coupling electrode 142*a* and the second output coupling electrode 40*c*, are located within the second multilayer body 10*b*. The third interlayer, which bears the first input coupling electrode 141*a* and the first output coupling electrode 40*b*, is located between the first multilayer body 10*a* and the second multilayer body 10*b*. Note that the first multilayer body 10*a* has a stack of a plurality of dielectric layers 11*a* on top of each other, and the second multilayer body 10*b* has a stack of a plurality of dielectric layers 11*b* on top of each other.

According to the thus configured diplexer of this embodiment, the region bearing the first resonant electrodes 30*a*, 30*b*, 30*c*, and 30*d* and the region bearing the second resonant electrodes 31*a*, 31*b*, 31*c*, and 31*d* that differ in resonance frequency from each other, are separated into the first and second multilayer bodies 10*a* and 10*b*, by the third interlayer serving as a boundary. In this construction, by designing the dielectric layer constituting the first multilayer body 10*a* and the dielectric layer constituting the second multilayer body 10*b* to have different electrical characteristics, it is possible to obtain desired electrical characteristics with ease. For example, the dielectric constant of the dielectric layer 11*a* constituting the first multilayer body 10*a*, in which are arranged the first resonant electrodes 30*a*, 30*b*, 30*c*, and 30*d* that are made longer than the second resonant electrodes 31*a*, 31*b*, 31*c*, and 31*d* because of having lower resonance frequencies, is set to be higher than the dielectric constant of the dielectric layer 11*b* constituting the second multilayer body lob. This makes it possible to reduce the lengths of, respectively, the first resonant electrodes 30*a*, 30*b*, 30*c*, and 30*d*, and thereby eliminate wasted space inside the diplexer with consequent miniaturization of the diplexer. Moreover, in the diplexer of this embodiment, there is no need to establish electromagnetic-field coupling between the upper and lower electrode components separated by the third interlayer and the fourth interlayer interposed therebetween. That is, the third interlayer serves as a boundary to separate the first multilayer body 10*a* and the second multilayer body 10*b*. In this construction, for example, even if the first multilayer body 10*a* and the second multilayer body 10*b* are positionally displaced with respect to each other, or an air layer exists at the boundary between the first multilayer body 10*a* and the second multilayer body 10*b*, the risk of consequent deterioration in electrical characteristics can be kept to the minimum. Further, for example, in a case where the first multilayer body 10*a* is designed as a module substrate for mounting another electronic component or the like on the face of the region thereof other than the region constituting the diplexer, by disposing part of the diplexer within the second multilayer body 10*b*, the thickness of the module substrate can be reduced. Accordingly, it is possible to obtain a diplexer-equipped substrate in which the module can be made smaller in thickness as a whole.

Eleventh Embodiment

Figure 33:
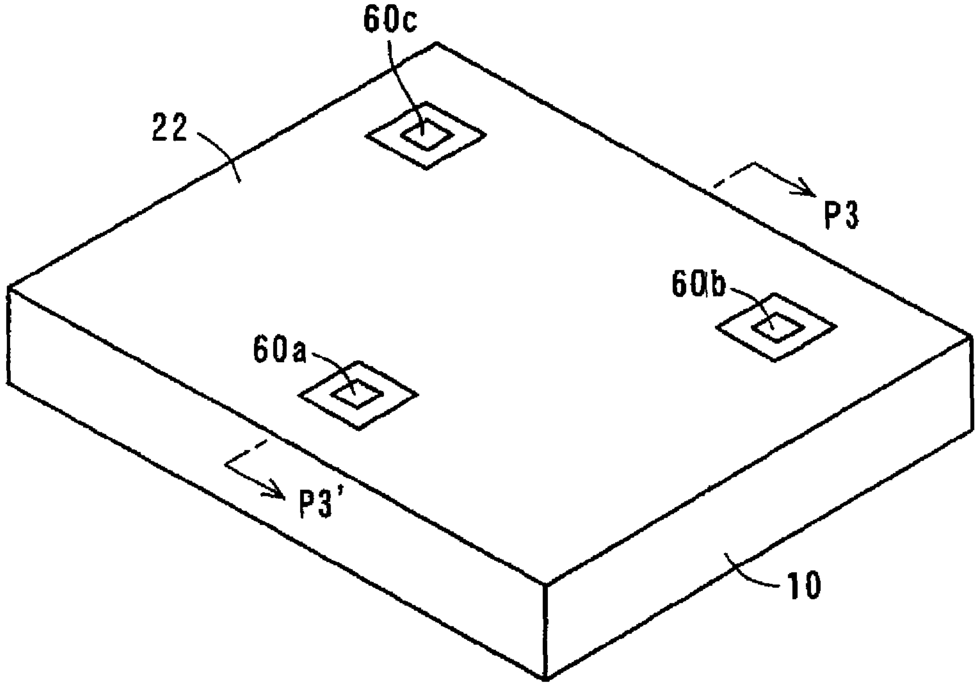
FIG. 33 is an external perspective view schematically showing a diplexer according to an eleventh embodiment of the invention.
Figure 34:
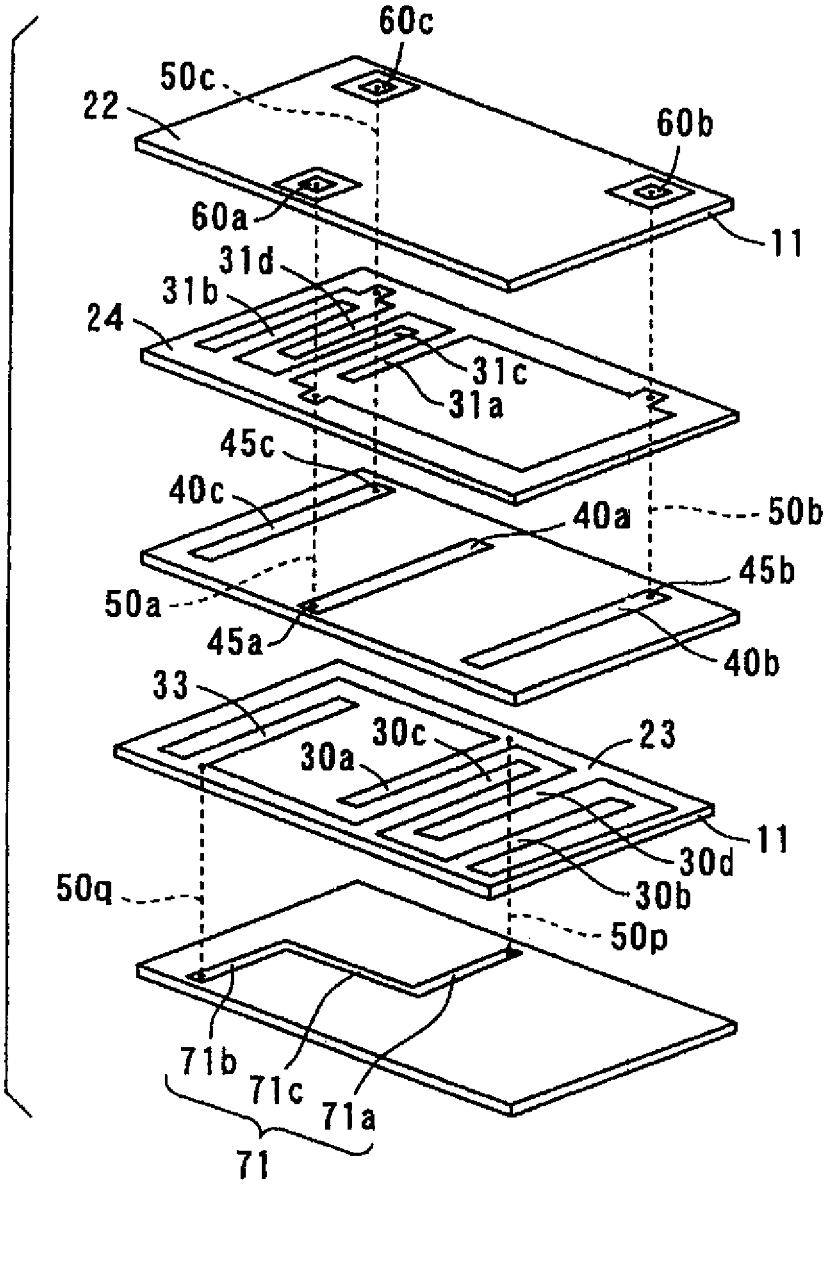
FIG. 34 is a schematic exploded perspective view of the diplexer shown in FIG. 33.
Figure 35:
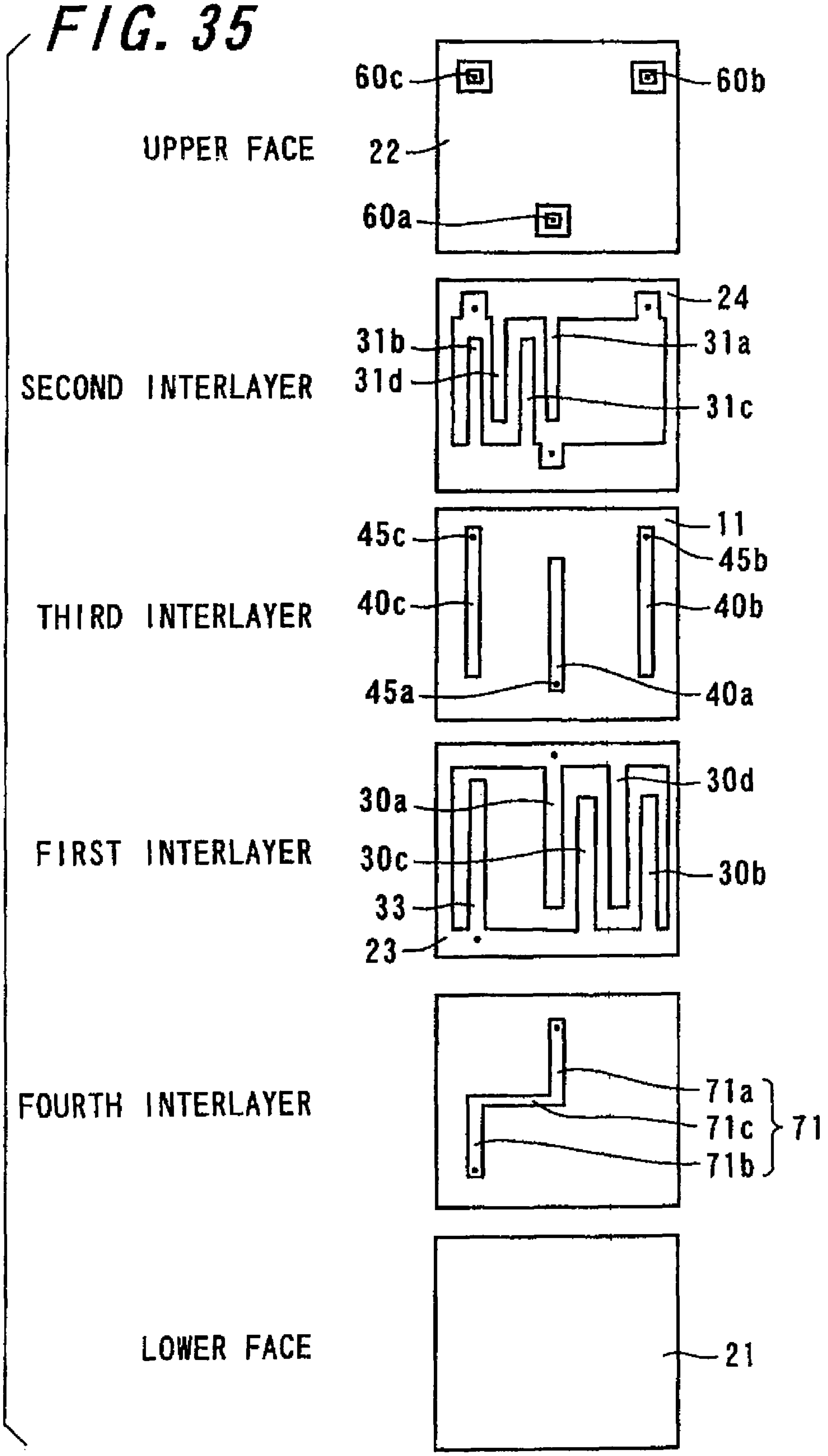
FIG. 35 is a plan view schematically showing upper and lower faces and interlayers of the diplexer shown in FIG. 33.
Figure 36:
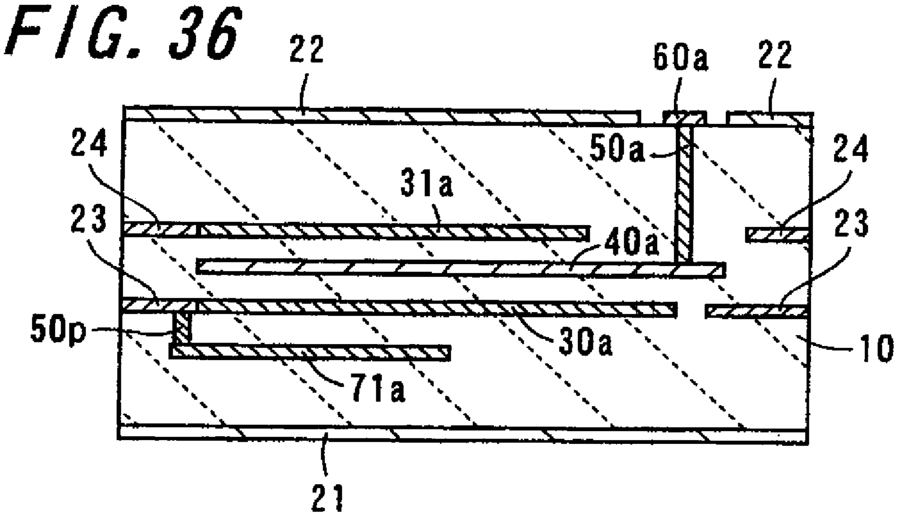
FIG. 36 is a cross-sectional view taken along line P3-P3' of FIG. 33.

FIG. 33 is an external perspective view schematically showing a diplexer according to an eleventh embodiment of the invention. FIG. 34 is a schematic exploded perspective view of the diplexer shown in FIG. 33. FIG. 35 is a plan view schematically showing upper and lower faces and interlayers of the diplexer shown in FIG. 33. FIG. 36 is a cross-sectional view taken along line P3-P3' of FIG. 33.

As shown in FIGS. 33 to 36, the diplexer of this embodiment includes the multilayer body 10, the first ground electrode 21, the second ground electrode 22, the plurality of strip-like first resonant electrodes 30*a*, 30*b*, 30*c*, and 30*d*, and the plurality of strip-like second resonant electrodes 31*a*, 31*b*, 31*c*, and 31*d*. The multilayer body 10 has a stack of a plurality of dielectric layers 11 on top of each other. The first ground electrode 21 is disposed on the lower face of the multilayer body 10. The second ground electrode 22 is disposed on the upper face of the multilayer body 10. The plurality of first resonant electrodes 30*a*, 30*b*, 30*c*, and 30*d* are arranged side by side on a first interlayer of the multilayer body 10, with their one ends as well as their other ends displaced in relation to each other in a staggered manner, have their one ends connected to a ground potential so as to serve as a quarter-wavelength resonator, and make electromagnetic-field coupling with each other. The plurality of second resonant electrodes 31*a*, 31*b*, 31*c*, and 31*d* are arranged side by side on a second interlayer of the multilayer body 10 different from the first interlayer, with their one ends as well as their other ends displaced in relation to each other in a staggered manner, have their one ends connected to a ground potential so as to serve as a quarter-wavelength resonator that resonates at a frequency higher than a frequency of the first resonant electrodes, and make electromagnetic-field coupling with each other.

The diplexer of this embodiment further includes the strip-like input coupling electrode 40*a*, the strip-like first output coupling electrode 40*b*, and the strip-like second output coupling electrode 40*c*. The input coupling electrode 40*a* is disposed on a third interlayer of the multilayer body 10 located between the first interlayer and the second interlayer, faces the input-stage first resonant electrode 30*a* of the first resonant electrodes 30*a*, 30*b*, 30*c*, and 30*d*, over more than half of an entire longitudinal area thereof for electromagnetic-field coupling, faces the input-stage second resonant electrode 31*a* of the second resonant electrodes 31*a*, 31*b*, 31*c*, and 31*d*, over more than half of an entire longitudinal area thereof for electromagnetic-field coupling, and has the electric signal input point 45*a* for receiving input of an electric signal. The first output coupling electrode 40*b* is disposed on the third interlayer of the multilayer body 10, faces the output-stage first resonant electrode 30*b* of the first resonant electrodes 30*a*, 30*b*, 30*c*, and 30*d*, over more than half of an entire longitudinal area thereof for electromagnetic-field coupling, and has the first electric signal output point 45*b* for producing output of an electric signal. The second output coupling electrode 40*c* is disposed on the third interlayer of the multilayer body 10, faces the output-stage second resonant electrode 31*b* of the second resonant electrodes 31*a*, 31*b*, 31*c*, and 31*d*, over more than half of an entire longitudinal area thereof for electromagnetic-field coupling, and has the second electric signal output point 45*c* for producing output of an electric signal.

The diplexer of this embodiment further includes a third resonant electrode 33 and a resonant electrode coupling conductor 71. On the first interlayer of the multilayer body 10, the third resonant electrode 33 faces the second output coupling electrode 40*c* for electromagnetic-field coupling, and has its one end connected to a ground potential so as to serve as a quarter-wavelength resonator that resonates at the same frequency as a frequency of the first resonant electrodes 30*a*, 30*b*, 30*c*, and 30*d*. The resonant electrode coupling conductor 71 is disposed on a fourth interlayer of the multilayer body 10 located on the side opposite the third interlayer with the first interlayer interposed therebetween, has its one end connected to a ground potential close to the one end of the input-stage first resonant electrode 30*a*, has its another end connected to a ground potential close to the one end of the third resonant electrode 33, and has a region facing the one end of the input-stage first resonant electrode 30*a* for electromagnetic-field coupling and a region facing the one end of the third resonant electrode 33 for electromagnetic-field coupling.

The diplexer of this embodiment further includes the first annular ground electrode 23 and the second annular ground electrode 24. On the first interlayer of the multilayer body 10, the first annular ground electrode 23 is formed in the annular shape so as to surround the first resonant electrodes 30*a*, 30*b*, 30*c*, and 30*d* and the third resonant electrode 33, and is connected to the one ends of the first resonant electrodes 30*a*, 30*b*, 30*c*, and 30*d* and the third resonant electrode 33. On the second interlayer, the second annular ground electrode 24 is formed in the annular shape so as to surround the second resonant electrodes 31*a*, 31*b*, 31*c*, and 31*d*, and is connected to the one ends of the second resonant electrodes 31*a*, 31*b*, 31*c*, and 31*d*.

Furthermore, in the diplexer of this embodiment, the resonant electrode coupling conductor 71 includes a strip-like front-stage side coupling region 71*a* that faces the input-stage first resonant electrode 30*a* in parallel, a strip-like rear-stage side coupling region 71*b* that faces the third resonant electrode 33 in parallel, and a connecting region 71*c* formed so as to be perpendicular to each of the front-stage side coupling region 71*a* and the rear-stage side coupling region 71*b*, for providing connection between these regions. Here, both end portions of the resonant electrode coupling conductor 71 are respectively connected via the through conductors 50*p* and 50*q* to the first annular ground electrode 23.

Furthermore, in the diplexer of this embodiment, the one end of the input-stage first resonant electrode 30*a* and the one end of the input-stage second resonant electrode 31*a* are located on the same side. The one end of the output-stage second resonant electrode 31*b* and the one end of the third resonant electrode 33 are located on the same side. The first output coupling electrode 40*b* and the second output coupling electrode 40*c* in a plan view are located on the opposite sides with the input coupling electrode interposed therebetween. In the input coupling electrode 40*a*, the electric signal input point 45*a* is located closer to the other end of the input-stage first resonant electrode 30*a* than the center of the part facing the input-stage first resonant electrode 30*a*, and closer to the other end of the input-stage second resonant electrode 31*a* than the center of the part facing the input-stage second resonant electrode 31*a*. In the first output coupling electrode 40*b*, the first electric signal output point 45*b* is located closer to the other end of the output-stage first resonant electrode 30*b* than the center of the part facing the output-stage first resonant electrode 30*b*. In the second output coupling electrode 40*c*, the second electric signal output point 45*c* is located closer to the other end of the output-stage second resonant electrode 31*b* than the center of the part facing the output-stage second resonant electrode 31*b*.

Furthermore, in the diplexer of this embodiment, the input coupling electrode 40*a* is connected via the through conductor 50*a* to the input terminal electrode 60*a* disposed on the upper face of the multilayer body 10, the first output coupling electrode 40*b* is connected via the through conductor 50*b* to the first output terminal electrode 60*b* disposed on the upper face of the multilayer body 10, and the second output coupling electrode 40*c* is connected via the through conductor 50*c* to the second output terminal electrode 60*c* disposed on the upper face of the multilayer body 10. Thus, the electric signal input point 45*a* for receiving input of an electric signal to the input coupling electrode 40*a* is a point that connects the input coupling electrode 40*a* and the through conductor 50*a*, the first electric signal output point 45*b* for producing output of an electric signal from the first output coupling electrode 40*b* is a point that connects the first output coupling electrode 40*b* and the through conductor 50*b*, and the second electric signal output point 45*c* for producing output of an electric signal from the second output coupling electrode 40*c* is a point that connects the second output coupling electrode 40*c* and the through conductor 50*c*.

In the thus configured diplexer of this embodiment, when an electric signal from an external circuit is inputted via the input terminal electrode 60*a* and the through conductor 50*a* to the electric signal input point 45*a* of the input coupling electrode 40*a*, the input-stage first resonant electrode 30*a* that makes electromagnetic-field coupling with the input coupling electrode 40*a* is excited, and, thus, the first resonant electrodes 30*a*, 30*b*, 30*c*, and 30*d* that make electromagnetic-field coupling with each other resonate, and an electric signal is outputted from the first electric signal output point 45*b* of the first output coupling electrode 40*b* that makes electromagnetic-field coupling with the output-stage first resonant electrode 30*b* via the through conductor 50*b* and the first output terminal electrode 60*b* toward an external circuit. At that time, a signal in a first frequency band containing a frequency at which the first resonant electrodes 30*a*, 30*b*, 30*c*, and 30*d* resonate is selectively allowed to pass, and, thus, a first pass band is formed.

Furthermore, in the diplexer of this embodiment, when an electric signal from an external circuit is inputted via the input terminal electrode 60*a* and the through conductor 50*a* to the electric signal input point 45*a* of the input coupling electrode 40*a*, the input-stage second resonant electrode 31*a* that makes electromagnetic-field coupling with the input coupling electrode 40*a* is excited, and, thus, the second resonant electrodes 31*a*, 31*b*, 31*c*, and 31*d* that make electromagnetic-field coupling with each other resonate, and an electric signal is outputted from the second electric signal output point 45*c* of the second output coupling electrode 40*c* that makes electromagnetic-field coupling with the output-stage second resonant electrode 31*b* via the through conductor 50*c* and the second output terminal electrode 60*c* toward an external circuit. At that time, a signal in a second frequency band containing a frequency at which the second resonant electrodes 31*a*, 31*b*, 31*c*, and 31*d* resonate is selectively allowed to pass, and, thus, a second pass band is formed.

In this manner, the diplexer of this embodiment serves as a diplexer that demultiplexes a signal inputted from the input terminal electrode 60*a* according to the frequency, and that outputs resulting signals from the first output terminal electrode 60*b* and the second output terminal electrode 60*c*.

In the diplexer of this embodiment, the first ground electrode 21 is disposed on the entire lower face of the multilayer body 10, the second ground electrode 22 is disposed on substantially the entire upper face of the multilayer body 10 excluding portions around the input terminal electrode 60*a*, the first output terminal electrode 60*b*, and the second output terminal electrode 60*c*, and both electrodes are connected to a ground potential and form a stripline resonator together with the plurality of first resonant electrodes 30*a*, 30*b*, 30*c*, and 30*d* and the second resonant electrodes 31*a*, 31*b*, 31*c*, and 31*d*.

Furthermore, in the diplexer of this embodiment, the strip-like first resonant electrodes 30*a*, 30*b*, 30*c*, and 30*d* respectively have one ends that are connected to the first annular ground electrode 23 and connected to a ground potential so as to serve as a quarter-wavelength resonator. Furthermore, the electrical lengths thereof are set to approximately ¼ the wavelength at the center frequency of a pass band formed by the first resonant electrodes 30*a*, 30*b*, 30*c*, and 30*d*. In a similar manner, the strip-like second resonant electrodes 31*a*, 31*b*, 31*c*, and 31*d* respectively have one ends that are connected to the second annular ground electrode 24 and connected to a ground potential so as to serve as a quarter-wavelength resonator. Furthermore, the electrical lengths thereof are set to approximately ¼ the wavelength at the center frequency of a pass band formed by the second resonant electrodes 31*a*, 31*b*, 31*c*, and 31*d*.

Furthermore, the first resonant electrodes 30*a*, 30*b*, 30*c*, and 30*d* are arranged side by side on the first interlayer of the multilayer body 10, and edge-coupled to each other, and the second resonant electrodes 31*a*, 31*b*, 31*c*, and 31*d* are arranged side by side on the second interlayer of the multilayer body 10, and edge-coupled to each other. The gap between the first resonant electrodes 30*a*, 30*b*, 30*c*, and 30*d* arranged side by side, and the gap between the second resonant electrodes 31*a*, 31*b*, 31*c*, and 31*d* arranged side by side are set to, for example, approximately 0.05 to 0.5 mm, because a smaller gap realizes a more intense coupling but too small a gap makes the production difficult.

Moreover, the first resonant electrodes 30*a*, 30*b*, 30*c*, and 30*d* arranged side by side are arranged with their one ends as well as their other ends displaced in relation to each other in a staggered manner. Since the resonant electrodes are coupled to each other in an interdigital form, a magnetic-field coupling and an electric-field coupling are added, and a more intense coupling than a comb-line coupling is generated. Accordingly, in a pass band formed by the first resonant electrodes 30*a*, 30*b*, 30*c*, and 30*d*, the frequency interval between the resonance frequencies in each resonance mode can be set so as to be suitable for obtaining a very wide pass bandwidth in which the fractional bandwidth is approximately 40% to 50%, which is much wider than a region that can be realized by a conventional filter using a quarter-wavelength resonator.

In a similar manner, the second resonant electrodes 31*a*, 31*b*, 31*c*, and 31*d* arranged side by side are arranged with their one ends as well as their other ends displaced in relation to each other in a staggered manner. Since the resonant electrodes are coupled to each other in an interdigital form, in a pass band formed by the second resonant electrodes 31*a*, 31*b*, 31*c*, and 31*d*, the frequency interval between the resonance frequencies in each resonance mode can be set so as to be suitable for obtaining a very wide pass bandwidth in which the fractional bandwidth is approximately 40% to 50%, which is much wider than a region that can be realized by a conventional filter using a quarter-wavelength resonator.

Here, it was seen from investigations that, in the case where resonant electrodes forming one pass band are broadside-coupled and interdigitally-coupled to each other, the coupling is too intense, which is not preferable for obtaining a pass bandwidth in which the fractional bandwidth is approximately 40% to 50%.

Furthermore, in the diplexer of this embodiment, the input coupling electrode 40*a* is disposed on a third interlayer of the multilayer body 10 located between the first interlayer and the second interlayer, faces the input-stage first resonant electrode 30*a* of the first resonant electrodes 30*a*, 30*b*, 30*c*, and 30*d*, over more than half of an entire longitudinal area thereof for electromagnetic-field coupling, and faces the input-stage second resonant electrode 31*a*, over more than half of an entire longitudinal area thereof for electromagnetic-field coupling. Moreover, in the longitudinal direction of the input coupling electrode 40*a*, the electric signal input point 45*a* for receiving input of an electric signal from an external circuit is located closer to the other end of the input-stage first resonant electrode 30*a* than the center of the part facing the input-stage first resonant electrode 30*a*, and closer to the other end of the input-stage second resonant electrode 31*a* than the center of the part facing the input-stage second resonant electrode 31*a*. With this configuration, the input coupling electrode 40*a* is broadside-coupled and interdigitally-coupled to the input-stage first resonant electrode 30*a* and the input-stage second resonant electrode 31*a*. Thus, these electrodes make electromagnetic-field coupling intensively by a broadside coupling, and make electromagnetic-field coupling more intensively by an interdigital coupling in which an electric-field coupling and a magnetic-field coupling are added. Accordingly, the input coupling electrode 40*a*, and the input-stage first resonant electrode 30*a* and the input-stage second resonant electrode 31*a* can be very intensively coupled.

Furthermore, in the diplexer of this embodiment, the first output coupling electrode 40*b* is disposed on a third interlayer of the multilayer body 10 different from the first interlayer, and faces the output-stage first resonant electrode 30*b*, over more than half of an entire longitudinal area thereof for electromagnetic-field coupling. Furthermore, in the first output coupling electrode 40*b*, the first electric signal output point 45*b* for producing output of an electric signal toward an external circuit is located closer to the other end of the output-stage first resonant electrode 30*b* than the center of the part facing the output-stage first resonant electrode 30*b*. With this configuration, the first output coupling electrode 40*b* and the output-stage first resonant electrode 30*b* make electromagnetic-field coupling intensively by a broadside coupling through the dielectric layers 11, and are coupled to each other in an interdigital form, and, thus, a magnetic-field coupling and an electric-field coupling are added, and the electromagnetic coupling becomes more intense.

Moreover, in the diplexer of this embodiment, the second output coupling electrode 40*c* is disposed on a third interlayer of the multilayer body 10 located between the first interlayer and the second interlayer, and faces the output-stage second resonant electrode 31*b*, over more than half of an entire longitudinal area thereof for electromagnetic-field coupling. Furthermore, in the second output coupling electrode 40*c*, the second electric signal output point 45*c* for producing output of an electric signal toward an external circuit is located closer to the other end of the output-stage second resonant electrode 31*b* than the center of the part facing the output-stage second resonant electrode 31*b*. With this configuration, the second output coupling electrode 40*c* and the output-stage second resonant electrode 31*b* make electromagnetic-field coupling intensively by a broadside coupling through the dielectric layers 11, and are coupled to each other in an interdigital form, and, thus, a magnetic-field coupling and an electric-field coupling are added, and the electromagnetic coupling becomes more intense.

In this manner, according to the diplexer of this embodiment, the input coupling electrode 40*a*, and the input-stage first resonant electrode 30*a* and the input-stage second resonant electrode 31*a* make electromagnetic-field coupling very intensively, the first output coupling electrode 40*b* and the output-stage first resonant electrode 30*b* make electromagnetic-field coupling very intensively, and the second output coupling electrode 40*c* and the output-stage second resonant electrode 31*b* make electromagnetic-field coupling very intensively. Accordingly, throughout two entire very wide pass bands respectively formed by the first resonant electrodes 30*a*, 30*b*, 30*c*, and 30*d* and the second resonant electrodes 31*a*, 31*b*, 31*c*, and 31*d*, a pass characteristic can be obtained in which the form is flat and the loss is low, and in which an increase in the insertion loss at a frequency located between the resonance frequencies in each resonance mode is small.

Here, in the diplexer of this embodiment, the one end of the input-stage first resonant electrode 30*a* and the one end of the input-stage second resonant electrode 31*a* are located on the same side. Thus, in this manner, the input coupling electrode 40*a*, and the input-stage first resonant electrode 30*a* and the input-stage second resonant electrode 31*a* can be broadside-coupled and interdigitally-coupled to each other.

Moreover, according to the diplexer of this embodiment, the first output coupling electrode 40*b* and the second output coupling electrode 40*c* in a plan view are located on the opposite sides with the input coupling electrode 40*a* interposed therebetween. Accordingly, the electromagnetic coupling between the first resonant electrodes 30*a*, 30*b*, 30*c*, and 30*d* and the second resonant electrodes 31*a*, 31*b*, 31*c*, and 31*d* can be attenuated, and, thus, good isolation between the first resonant electrodes 30*a*, 30*b*, 30*c*, and 30*d* and the second resonant electrodes 31*a*, 31*b*, 31*c*, and 31*d* can be secured.

Moreover, according to the diplexer of this embodiment, in the first resonant electrodes 30*a*, 30*b*, 30*c*, and 30*d* and the second resonant electrodes 31*a*, 31*b*, 31*c*, and 31*d*, the input-stage first resonant electrode 30*a* and the input-stage second resonant electrode 31*a* face each other with the input coupling electrode 40*a* interposed therebetween, and the first resonant electrodes 30*b*, 30*c*, and 30*d* and the second resonant electrodes 31*b*, 31*c*, and 31*d* other than the first resonant electrode 30*a* and the second resonant electrode 31*a* are arranged so as to be sequentially away therefrom. Thus, the input coupling electrode 40*a*, and the input-stage first resonant electrode 30*a* and the input-stage second resonant electrode 31*a* are broadside-coupled, and the isolation between the first resonant electrodes 30*a*, 30*b*, 30*c*, and 30*d* and the second resonant electrodes 31*a*, 31*b*, 31*c*, and 31*d* can be secured at a maximum. Accordingly, a diplexer can be obtained in which both of two wide pass bands have a flat and low-loss pass characteristic, and in which the isolation between the first output terminal electrode 60*b* and the second output terminal electrode 60*c* is sufficiently secured.

Here, the gap between the input coupling electrode 40*a*, and the input-stage first resonant electrode 30*a* and the input-stage second resonant electrode 31*a*, the gap between the first output coupling electrode 40*b* and the output-stage first resonant electrode 30*b*, and the gap between the second output coupling electrode 40*c* and the output-stage second resonant electrode 31*b* are set to, for example, approximately 0.01 to 0.5 mm, because a smaller gap realizes a more intense coupling but too small a gap makes the production difficult.

Furthermore, in the diplexer of this embodiment, on the first interlayer of the multilayer body 10, the first annular ground electrode 23 is formed in the annular shape so as to surround the first resonant electrodes 30*a*, 30*b*, 30*c*, and 30*d* and the third resonant electrode 33, and is connected to the one ends, respectively, of the first resonant electrodes 30*a*, 30*b*, 30*c*, and 30*d* and the third resonant electrode 33. On the second interlayer, the second annular ground electrode 24 is formed in the annular shape so as to surround the second resonant electrodes 31*a*, 31*b*, 31*c*, and 31*d*, and is connected the one ends, respectively, of the second resonant electrodes 31*a*, 31*b*, 31*c*, and 31*d*. With this configuration, electrodes are provided that are connected to a ground potential on both sides in the longitudinal direction of the first resonant electrodes 30*a*, 30*b*, 30*c*, and 30*d*, the second resonant electrodes 31*a*, 31*b*, 31*c*, and 31*d*, and the third resonant electrode 33, and, thus, the one ends of the resonant electrodes that are displaced in relation to each other in a staggered manner can be easily connected to a ground potential. Furthermore, the first annular ground electrode 23 in the annular shape surrounds the first resonant electrodes 30*a*, 30*b*, 30*c*, and 30*d* and the third resonant electrode 33, and the second annular ground electrode 24 in the annular shape surrounds the second resonant electrodes 31*a*, 31*b*, 31*c*, and 31*d*, and, thus, outside leakage of electromagnetic waves generated by the first resonant electrodes 30*a*, 30*b*, 30*c*, and 30*d*, the second resonant electrodes 31*a*, 31*b*, 31*c*, and 31*d*, and the third resonant electrode 33 can be reduced. These effects are particularly useful in the case where a diplexer is formed in a partial region on a module substrate, in order to prevent the other regions of the module substrate from being negatively influenced.

Moreover, according to the diplexer of this embodiment, the number of second resonant electrodes is four. On the first interlayer of the multilayer body 10, the third resonant electrode 33 faces the second output coupling electrode 40*c* for electromagnetic-field coupling, and has its one end connected to a ground potential so as to serve as a quarter-wavelength resonator that resonates at the same frequency as a frequency of the first resonant electrodes 30*a*, 30*b*, 30*c*, and 30*d*. The resonant electrode coupling conductor 71 is disposed on a fourth interlayer of the multilayer body 10 located on the side opposite the third interlayer with the first interlayer interposed therebetween, has its one end connected to a ground potential close to the one end of the input-stage first resonant electrode 30*a*, has its another end connected to a ground potential close to the one end of the third resonant electrode 33, and has a region facing the one end of the input-stage first resonant electrode 30*a* for electromagnetic-field coupling and a region facing the one end of the third resonant electrode 33 for electromagnetic-field coupling. The one end of the output-stage second resonant electrode 31*b* and the one end of the third resonant electrode 33 are located on the same side. With this configuration, in the signal transfer between the first output coupling electrode 40*b* and the second output coupling electrode 40*c*, the phase of signals that pass through a path in which transfer is performed through the electromagnetic coupling between the adjacent second resonant electrodes 31*a*, 31*b*, 31*c*, and 31*d*, and the phase of signals that pass through a path in which transfer is performed through the electromagnetic coupling between the input-stage first resonant electrode 30*a* and the third resonant electrode 33 via the resonant electrode coupling conductor 71 can be substantially inverted at the frequency of a pass band formed by the first resonant electrodes 30*a*, 30*b*, 30*c*, and 30*d* to cancel each other, and, thus, the isolation characteristic at the frequency of the pass band formed by the first resonant electrodes 30*a*, 30*b*, 30*c*, and 30*d* can be improved.

Moreover, according to the diplexer of this embodiment, the resonant electrode coupling conductor 71 includes the strip-like front-stage side coupling region 71*a* that faces the input-stage first resonant electrode 30*a* in parallel, the strip-like rear-stage side coupling region 71*b* that faces the third resonant electrode 33 in parallel, and the connecting region 71*c* formed so as to be perpendicular to each of the front-stage side coupling region 71*a* and the rear-stage side coupling region 71*b*, for providing connection between these regions. With this configuration, the magnetic-field coupling between the front stage side coupling region 71*a* and the input-stage first resonant electrode 30*a* and the magnetic-field coupling between the rear-stage side coupling region 71*b* and the third resonant electrode 33 can be intensified, and the magnetic-field coupling between the connecting region 71*c* of the resonant electrode coupling conductor 71 and the second resonant electrodes 31*a*, 31*b*, 31*c*, and 31*d* can be minimized, and, thus, an unintended deterioration of the electrical properties due to the electromagnetic coupling between the second resonant electrodes 31*a*, 31*b*, 31*c*, and 31*d* via the connecting region 71*c* of the resonant electrode coupling conductor 71 can be minimized.

Furthermore, according to the diplexer of this embodiment, the resonant electrode coupling conductor 71 has one end that is connected via the through conductor 50*p* to the first annular ground electrode 23 near the one end of the input-stage first resonant electrode 30*a*, and has another end that is connected via the through conductor 50*q* to the first annular ground electrode 23 near the one end of the third resonant electrode 33, and, thus, the electromagnetic coupling between the input-stage first resonant electrode 30*a* and the third resonant electrode 33 via the resonant electrode coupling conductor 71 can be intensified.

Twelfth Embodiment

Figure 37:
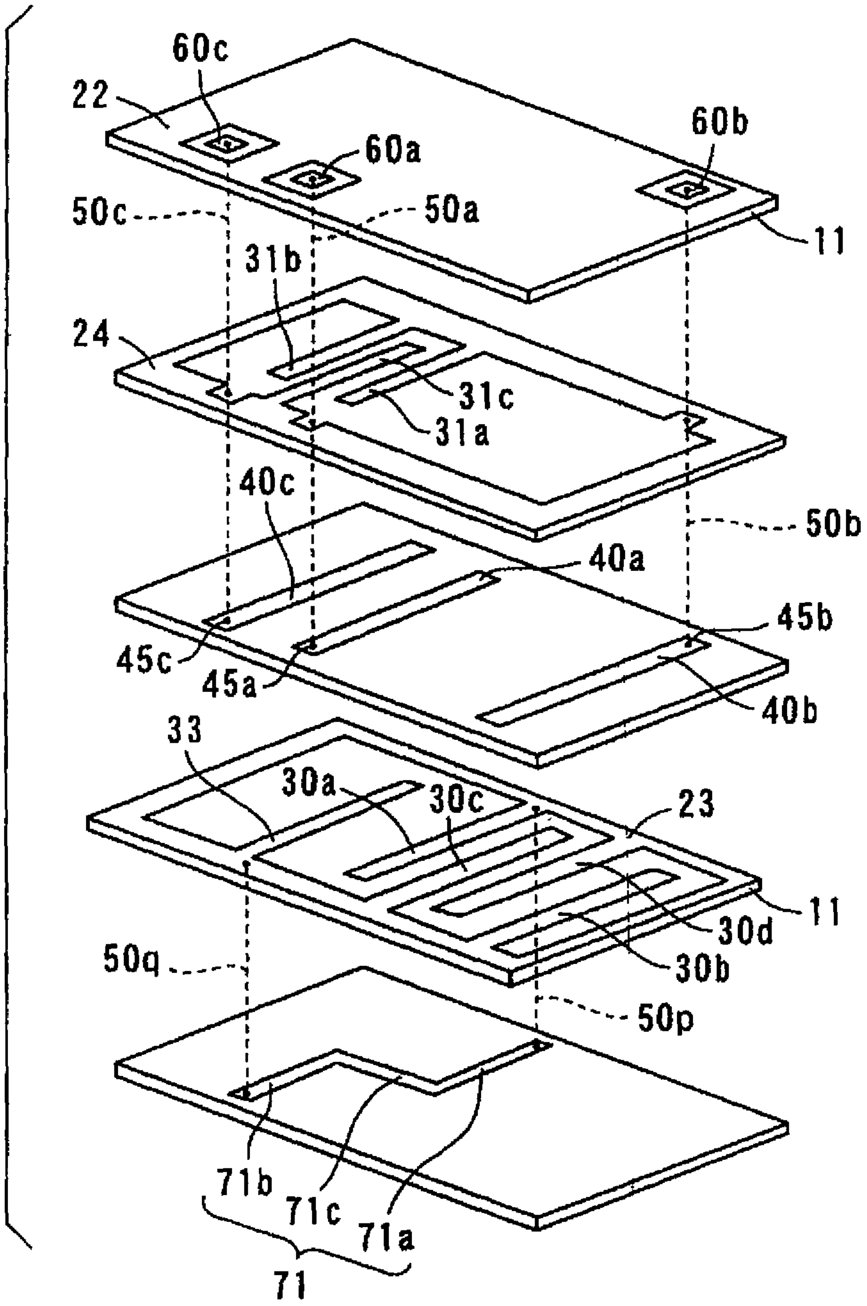
FIG. 37 is an exploded perspective view schematically showing a diplexer according to a twelfth embodiment of the invention.
Figure 38:
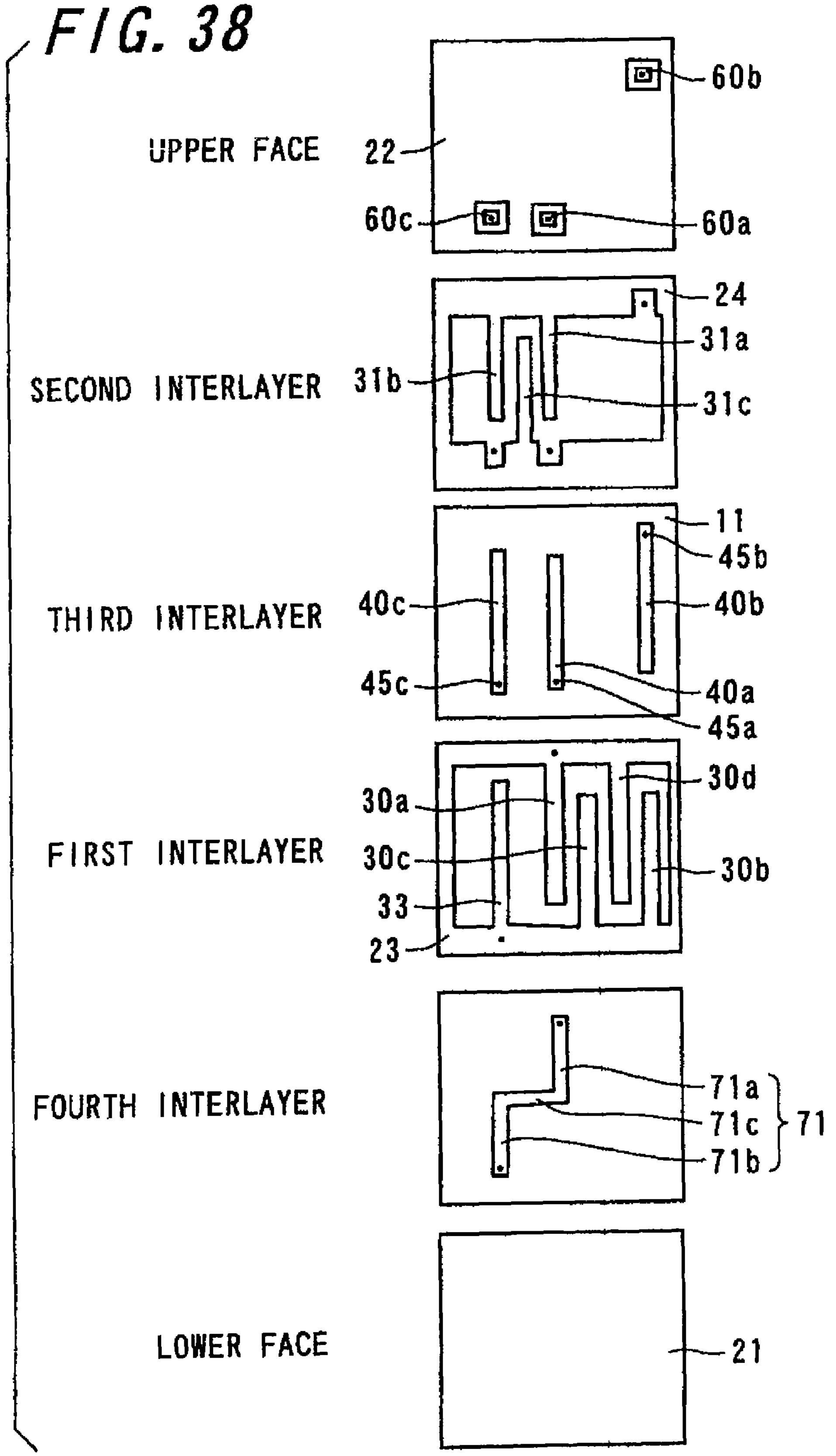
FIG. 38 is a plan view schematically showing upper and lower faces and interlayers of the diplexer shown in FIG. 37.

FIG. 37 is an exploded perspective view schematically showing a diplexer according to a twelfth embodiment of the invention. FIG. 38 is a plan view schematically showing upper and lower faces and interlayers of the diplexer shown in FIG. 37. Note that the following description deals with in what way this embodiment differs from the above-mentioned eleventh embodiment, and the constituent components thereof that play the same or corresponding roles as in the preceding embodiment will be denoted by the same reference numerals and overlapping descriptions will be omitted.

In the diplexer of this embodiment, as shown in FIGS. 37 and 38, the number of the second resonant electrodes is three, and the one end of the output-stage second resonant electrode 31*b* and the one end of the third resonant electrode 33 are located on opposite sides.

Even in the thus configured diplexer of this embodiment, in the signal transfer between the first output coupling electrode 40*b* and the second output coupling electrode 40*c*, the phase of signals that pass through a path in which transfer is performed through the electromagnetic coupling between the adjacent second resonant electrodes 31*a*, 31*b*, 31*c*, and 31*d*, and the phase of signals that pass through a path in which transfer is performed through the electromagnetic coupling between the input-stage first resonant electrode 30*a* and the third resonant electrode 33 via the resonant electrode coupling conductor 71 can be substantially inverted at the frequency of a pass band formed by the first resonant electrodes 30*a*, 30*b*, 30*c*, and 30*d* to cancel each other, and, thus, the isolation characteristic at the frequency of the pass band formed by the first resonant electrodes 30*a*, 30*b*, 30*c*, and 30*d* can be improved.

Thirteenth Embodiment

Figure 39:
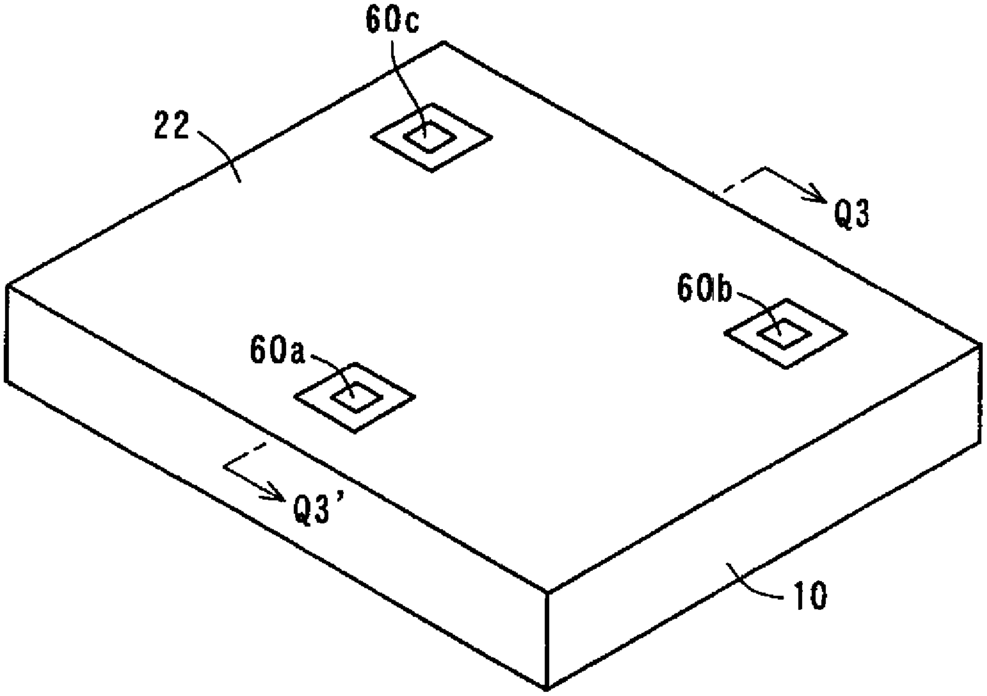
FIG. 39 is an external perspective view schematically showing a diplexer according to a thirteenth embodiment of the invention.
Figure 40:
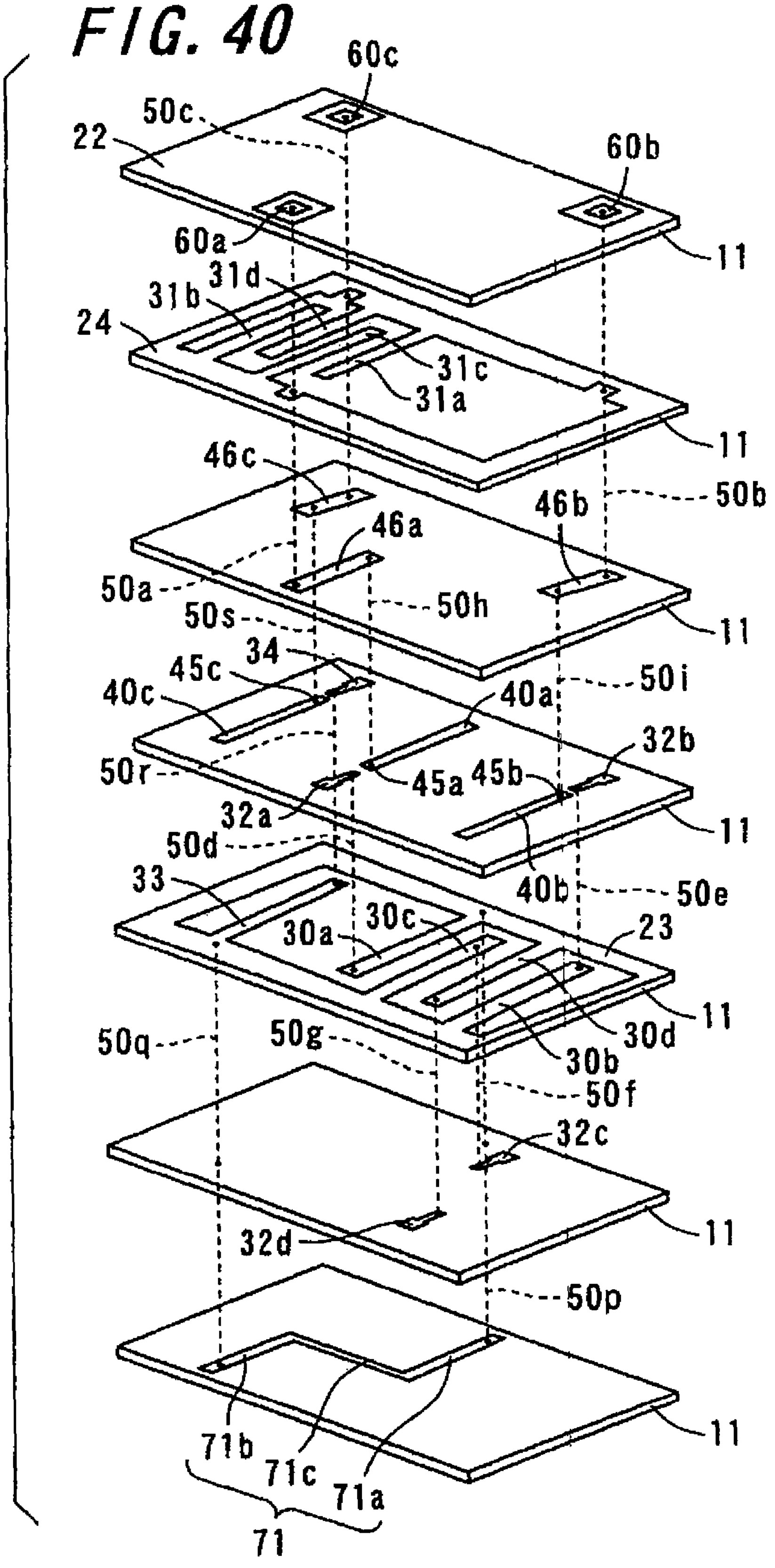
FIG. 40 is a schematic exploded perspective view of the diplexer shown in FIG. 39.
Figure 41:
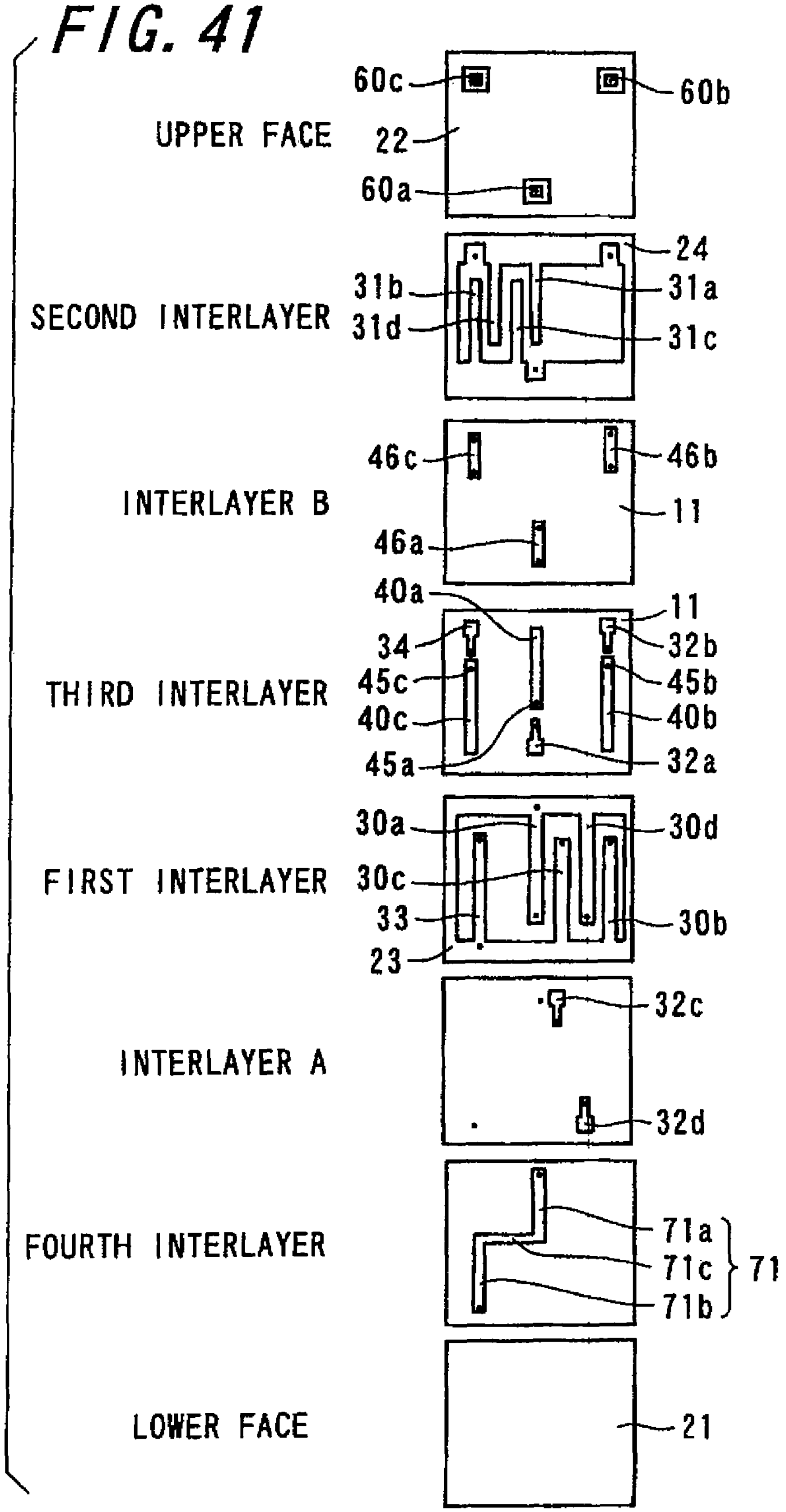
FIG. 41 is a plan view schematically showing upper and lower faces and interlayers of the diplexer shown in FIG. 39.
Figure 42:
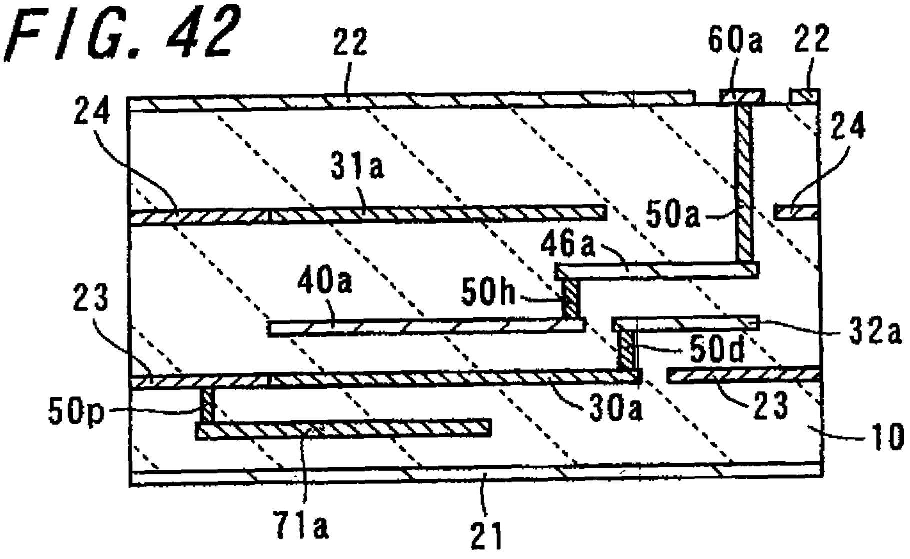
FIG. 42 is a cross-sectional view taken along line Q3-Q3' of FIG. 39.

FIG. 39 is an external perspective view schematically showing a diplexer according to a thirteenth embodiment of the invention. FIG. 40 is a schematic exploded perspective view of the diplexer shown in FIG. 39. FIG. 41 is a plan view schematically showing upper and lower faces and interlayers of the diplexer shown in FIG. 39. FIG. 42 is a cross-sectional view taken along line Q3-Q3' of FIG. 39. Note that the following description deals with in what way this embodiment differs from the above-mentioned eleventh embodiment, and the constituent components thereof that play the same or corresponding roles as in the preceding embodiment will be denoted by the same reference numerals and overlapping descriptions will be omitted.

As shown in FIGS. 39 to 42, the diplexer of this embodiment comprises, on the third interlayer of the multilayer body 10, an input-stage auxiliary resonant electrode 32*a* that is disposed so as to have a region facing the first annular ground electrode 23, and connected via the through conductor 50*d* to an open end of the input-stage first resonant electrode 30*a*, an output-stage auxiliary resonant electrode 32*b* that is disposed so as to have a region facing the first annular ground electrode 23, and connected via the through conductor 50*e* to an open end of the output-stage first resonant electrode 30*b*, and a second auxiliary resonant electrode 34 that is disposed so as to have a region facing the first annular ground electrode 23, and connected via a through conductor 50*r* to an open end of the third resonant electrode 33. Furthermore, the diplexer of this embodiment comprises, on an interlayer A of the multilayer body 10 located between the first interlayer and the fourth interlayer, auxiliary resonant electrodes 32*c* and 32*d* that are disposed so as to have a region facing the first annular ground electrode 23, and connected via through conductors 50*f* and 50*g* to the other ends of the first resonant electrodes 30*c* and 30*d*.

Furthermore, the diplexer of this embodiment comprises, on an interlayer B of the multilayer body 10 located between the second interlayer and the third interlayer, an auxiliary input coupling electrode 46*a* that is disposed so as to have a region facing the input-stage auxiliary resonant electrode 32*a*, and connected via the through conductor 50*h* to the electric signal input point 45*a* of the input coupling electrode 40*a*, an auxiliary output coupling electrode 46*b* that is disposed so as to have a region facing the output-stage auxiliary resonant electrode 32*b*, and connected via the through conductor 50*i* to the first electric signal output point 45*b* of the first output coupling electrode 40*b*, and a second auxiliary output coupling electrode 46*c* that is disposed so as to have a region facing the second auxiliary resonant electrode 34, and connected via a through conductor 50*s* to the second electric signal output point 45*c* of the second output coupling electrode 40*c*. Furthermore, the auxiliary input coupling electrode 46*a* that is connected via the through conductor 50*h* to the input coupling electrode 40*a*, is connected via the through conductor 50*a* to the input terminal electrode 60*a*. The auxiliary output coupling electrode 46*b* that is connected via the through conductor 50*i* to the first output coupling electrode 40*b*, is connected via the through conductor 50*b* to the first output terminal electrode 60*b*. The second auxiliary output coupling electrode 46*c* that is connected via the through conductor 50*s* to the second output coupling electrode 46*b*, is connected via the through conductor 50*c* to the second output terminal electrode 60*c*.

According to the thus configured diplexer of this embodiment, on the third interlayer and the interlayer A of the multilayer body 10 different from the first interlayer, the auxiliary resonant electrodes 32*a*, 32*b*, 32*c*, and 32*d* and the second auxiliary resonant electrode 34 that are respectively connected via the through conductors 50*d*, 50*e*, 50*f*, 50*g*, and 50*r* to the other ends of the first resonant electrodes 30*a*, 30*b*, 30*c*, and 30*d* and the third resonant electrode 33, are arranged so as to have a region facing the first annular ground electrode 23. With this configuration, in a part in which the auxiliary resonant electrodes 32*a*, 32*b*, 32*c*, and 32*d* and the second auxiliary resonant electrode 34, and the first annular ground electrode 23 face each other, an electrostatic capacitance is generated between these electrodes, and, is added to an electrostatic capacitance generated between the ground potential and the first resonant electrodes 30*a*, 30*b*, 30*c*, and 30*d* and the third resonant electrode 33 that are connected to the auxiliary resonant electrodes 32*a*, 32*b*, 32*c*, and 32*d* and the second auxiliary resonant electrode 34, respectively, and thus, the lengths of the first resonant electrodes 30*a*, 30*b*, 30*c*, and 30*d* and the third resonant electrode 33 can be reduced, and a small diplexer can be obtained.

Here, an area of the part in which the auxiliary resonant electrodes 32*a*, 32*b*, 32*c*, and 32*d* and the second auxiliary resonant electrode 34, and the first annular ground electrode 23 face each other is set to, for example, approximately 0.01 to 3 $mm^2$, in view of the balance between a necessary size and an obtained electrostatic capacitance. The gap between the auxiliary resonant electrodes 32*a*, 32*b*, 32*c*, and 32*d*, and the first annular ground electrode 23 that face each other is set to, for example, approximately 0.01 to 0.5 mm, because a smaller gap realizes a larger electrostatic capacitance but too small a gap makes the production difficult.

Furthermore, according to this embodiment, the diplexer comprises, on the interlayer B of the multilayer body 10 between the second interlayer and the third interlayer, the auxiliary input coupling electrode 46*a* that is disposed so as to have a region facing the input-stage auxiliary resonant electrode 32*a*, and connected via the through conductor 50*h* to the electric signal input point 45*a* of the input coupling electrode 40*a*, and the auxiliary output coupling electrode 46*b* that is disposed so as to have a region facing the output-stage auxiliary resonant electrode 32*b*, and connected via the through conductor 50*i* to the first electric signal output point 45*b* of the first output coupling electrode 40*b*. With this configuration, an electromagnetic coupling is generated between the input-stage auxiliary resonant electrode 32*a* and the auxiliary input coupling electrode 46*a*, and is added to the electromagnetic coupling between the input-stage first resonant electrode 30*a* and the input coupling electrode 40*a*. In a similar manner, an electromagnetic coupling is generated between the output-stage auxiliary resonant electrode 32*b* and the auxiliary output coupling electrode 46*b*, and is added to the electromagnetic coupling between the output-stage first resonant electrode 30*b* and the first output coupling electrode 40*b*. Accordingly, the electromagnetic coupling between the input coupling electrode 40*a* and the input-stage first resonant electrode 30*a*, and the electromagnetic coupling between the first output coupling electrode 40*b* and the output-stage first resonant electrode 30*b* become more intense. Thus, in a pass band formed by the plurality of first resonant electrodes 30*a*, 30*b*, 30*c*, and 30*d*, even in a very wide pass bandwidth, a pass characteristic can be obtained in which the form is flatter and the loss is lower throughout the entire wide pass band, and in which an increase in the insertion loss at a frequency located between the resonance frequencies in each resonance mode is further reduced. In a similar manner, the diplexer comprises the second auxiliary output coupling electrode 46*c* that is disposed so as to have a region facing the second auxiliary resonant electrode 34, and connected via the through conductor 50*s* to the second electric signal output point 45*c* of the second output coupling electrode 40*c*. With this configuration, an electromagnetic coupling is generated between the second auxiliary resonant electrode 34 and the second auxiliary output coupling electrode 46*c*, and is added to the electromagnetic coupling between the third resonant electrode 33 and the second output coupling electrode 40*c*. Accordingly, the electromagnetic coupling between the third resonant electrode 33 and the second output coupling electrode 40*c* becomes more intense.

Further, according to the diplexer of this embodiment, the input-stage auxiliary resonant electrode 32*a* and the output-stage auxiliary resonant electrode 32*b* are respectively connected to the other ends of the input-stage first resonant electrode 30*a* and the output-stage first resonant electrode 30*b*, and extend to sides opposite the one ends of the input-stage first resonant electrode 30*a* and the output-stage first resonant electrode 30*b*. With this configuration, it is possible to increase the region in which a coupling body composed of the input-stage first resonant electrode 30*a* and the input-stage auxiliary resonant electrode 32*a* connected thereto and a coupling body composed of the input coupling electrode 40*a* and the auxiliary input coupling electrode 46*a* connected thereto face each other. In a similar manner, it is possible to increase the region in which a coupling body composed of the output-stage first resonant electrode 30*b* and the output-stage auxiliary resonant electrode 32*b* connected thereto and a coupling body composed of the first output coupling electrode 40*b* and the auxiliary output coupling electrode 46*b* connected thereto face each other. Accordingly, the coupling body composed of the input-stage first resonant electrode 30*a* and the input-stage auxiliary resonant electrode 32*a* connected thereto and the coupling body composed of the input coupling electrode 40*a* and the auxiliary input coupling electrode 46*a* connected thereto can intensively make electromagnetic-field coupling by a broadside coupling in a wide region as a whole. In a similar manner, the coupling body composed of the output-stage first resonant electrode 30*b* and the output-stage auxiliary resonant electrode 32*b* connected thereto and the coupling body composed of the first output coupling electrode 40*b* and the auxiliary output coupling electrode 46*b* connected thereto can intensively make electromagnetic-field coupling by a broadside coupling in a wide region as a whole, thereby achieving more intense mutual electromagnetic-field coupling.

Furthermore, according to the diplexer of this embodiment, in the input coupling electrode 40*a*, the electric signal input point 45*a* of the input coupling electrode 40*a* that is connected via the through conductor 50*h* to the auxiliary input coupling electrode 46*a*, is located closer to the other end of the input-stage first resonant electrode 30*a* than the center of the part facing the input-stage first resonant electrode 30*a*, and closer to the other end of the input-stage second resonant electrode 31*a* than the center of the part facing the input-stage second resonant electrode 31*a*. In the first output coupling electrode 40*b*, the first electric signal output point 45*b* of the first output coupling electrode 40*b* that is connected via the through conductor 50*i* to the auxiliary output coupling electrode 46*b*, is located closer to the other end of the output-stage first resonant electrode 30*b* than the center of the part facing the output-stage first resonant electrode 30*b*. Accordingly, even in the case where an electric signal from an external circuit is inputted via the auxiliary input coupling electrode 46*a* to the input coupling electrode 40*a*, and an electric signal is outputted from the first output coupling electrode 40*b* via the auxiliary output coupling electrode 46*b* toward an external circuit, the input coupling electrode 40*a*, and the input-stage first resonant electrode 30*a* and the input-stage second resonant electrode 31*a* are coupled to each other in an interdigital form, and the first output coupling electrode 40*b* and the output-stage first resonant electrode 30*b* are coupled to each other in an interdigital form, and, thus, an intense coupling in which a magnetic-field coupling and an electric-field coupling are added can be generated.

Moreover, according to the diplexer of this embodiment, an end portion of the auxiliary input coupling electrode 46*a* on the side opposite the side that is connected via the through conductor 50*h* to the input coupling electrode 40*a*, is connected via the through conductor 50*a* to the input terminal electrode 60*a*. With this configuration, the coupling body composed of the input-stage first resonant electrode 30*a* and the input-stage auxiliary resonant electrode 32*a* connected thereto and the coupling body composed of the input coupling electrode 40*a* and the auxiliary input coupling electrode 46*a* connected thereto are coupled to each other in an interdigital form as a whole, and, thus, an intense coupling in which a magnetic-field coupling and an electric-field coupling are added can be generated. Thus, the coupling that can be realized is more intense than in the case where the end portion of the auxiliary input coupling electrode 46*a* on the same side in the longitudinal direction as the side that is connected to the input coupling electrode 40*a* is connected to the input terminal electrode 60*a*.

In a similar manner, according to the diplexer of this embodiment, an end portion of the auxiliary output coupling electrode 46*b* on the side opposite the side that is connected via the through conductor 50*i* to the first output coupling electrode 40*b*, is connected via the through conductor 50*b* to the first output terminal electrode 60*b*. With this configuration, the coupling body composed of the output-stage first resonant electrode 30*b* and the output-stage auxiliary resonant electrode 32*b* connected thereto and the coupling body composed of the first output coupling electrode 40*b* and the auxiliary output coupling electrode 46*b* connected thereto are coupled to each other in an interdigital form as a whole, and, thus, an intense coupling in which a magnetic-field coupling and an electric-field coupling are added can be generated. Thus, the coupling that can be realized is more intense than in the case where the end portion of the auxiliary output coupling electrode 46*b* on the same side in the longitudinal direction as the side that is connected to the first output coupling electrode 40*b* is connected to the first output terminal electrode 60*b*.

In this manner, the coupling body composed of the input-stage first resonant electrode 30*a* and the input-stage auxiliary resonant electrode 32*a* connected thereto and the coupling body composed of the input coupling electrode 40*a* and the auxiliary input coupling electrode 46*a* connected thereto are very intensively coupled to each other by the broadside coupling and the interdigital coupling as a whole. In a similar manner, the coupling body composed of the output-stage first resonant electrode 30*b* and the output-stage auxiliary resonant electrode 32*b* connected thereto and the coupling body composed of the first output coupling electrode 40*b* and the auxiliary output coupling electrode 46*b* connected thereto are very intensively coupled to each other by the broadside coupling and the interdigital coupling as a whole. Thus, in a pass band formed by the plurality of first resonant electrodes 30*a*, 30*b*, 30*c*, and 30*d*, even in a very wide pass band, a pass characteristic can be obtained in which the form is flatter and the loss is lower throughout the entire wide pass band, and in which an increase in the insertion loss at a frequency located between the resonance frequencies in each resonance mode is further reduced.

Here, the widths of the auxiliary input coupling electrode 46*a*, the auxiliary output coupling electrode 46*b* and the second auxiliary output coupling electrode 46*c* are set, for example, so as to be similar to those of the input coupling electrode 40*a*, the first output coupling electrode 40*b* and the second output coupling electrode 40*c*, and the lengths of the auxiliary input coupling electrode 46*a*, the auxiliary output coupling electrode 46*b* and the second auxiliary output coupling electrode 46*c* are set, for example, so as to be slightly longer than those of the auxiliary resonant electrodes 32*a* and 32*b* and the second auxiliary resonant electrode 34. The gap between the auxiliary input coupling electrode 46*a*, the auxiliary output coupling electrode 46*b* and the second auxiliary output coupling electrode 46*c*, and the auxiliary resonant electrodes 32*a* and 32*b* and the second auxiliary resonant electrode 34 is set to, for example, approximately 0.01 to 0.5 mm, because a smaller gap realizes an intense coupling, which is desirable, but too small a gap makes the production difficult.

Fourteenth Embodiment

Figure 43:
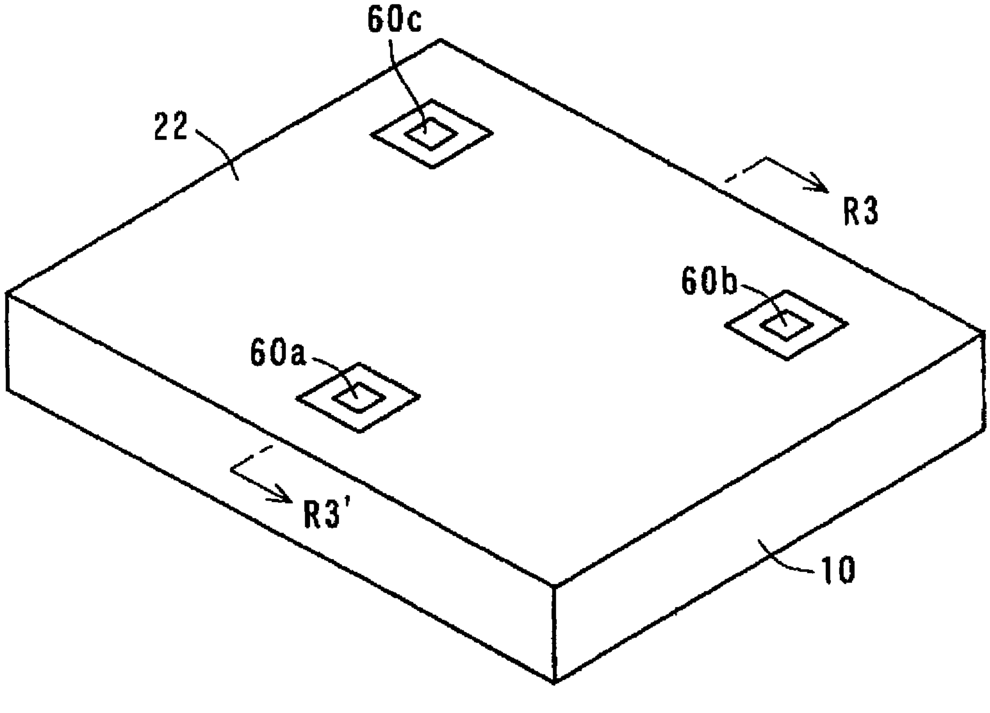
FIG. 43 is an external perspective view schematically showing of a diplexer according to a fourteenth embodiment of the invention.
Figure 44:
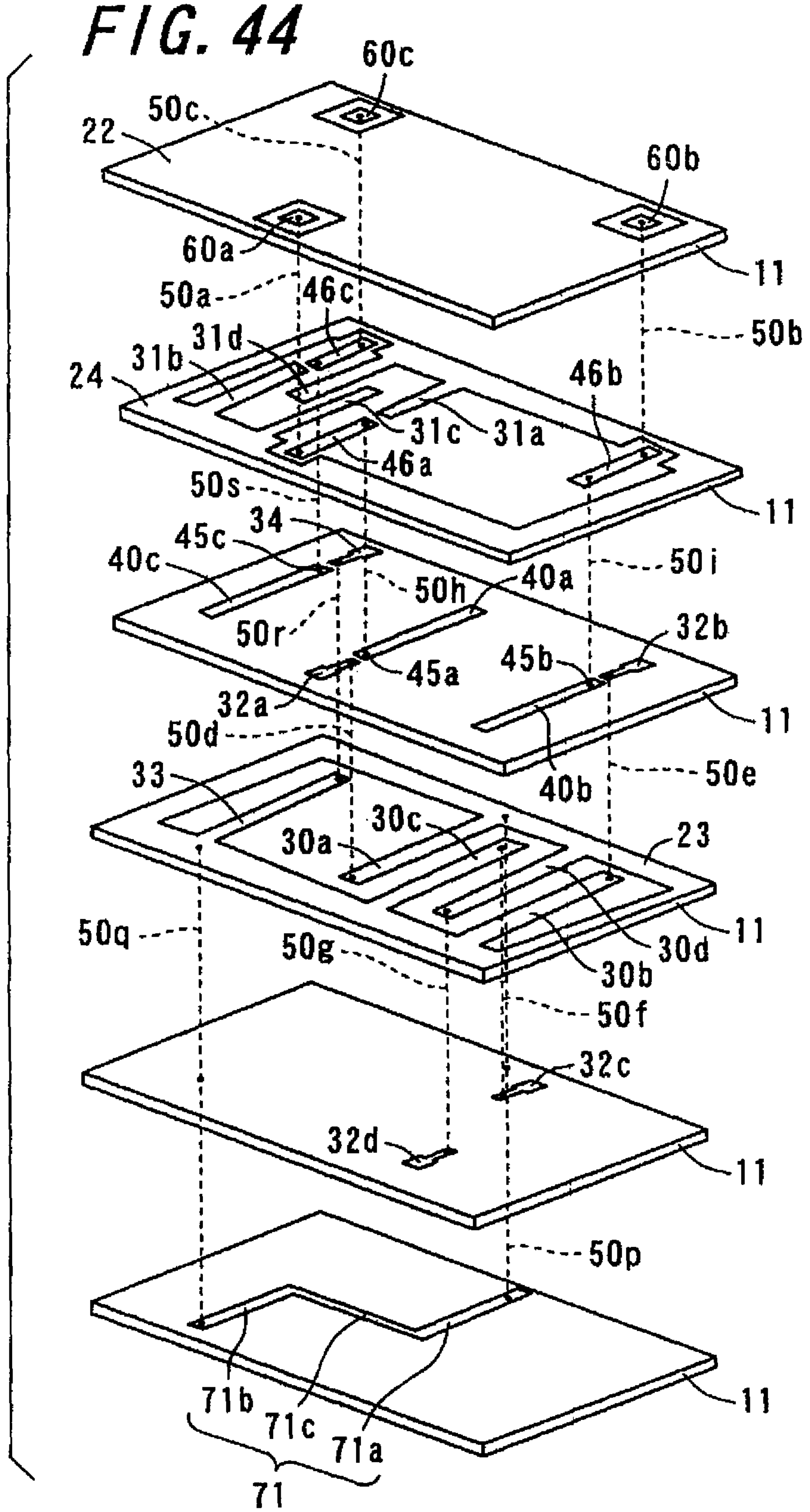
FIG. 44 is a schematic exploded perspective view of the diplexer shown in FIG. 43.
Figure 45:
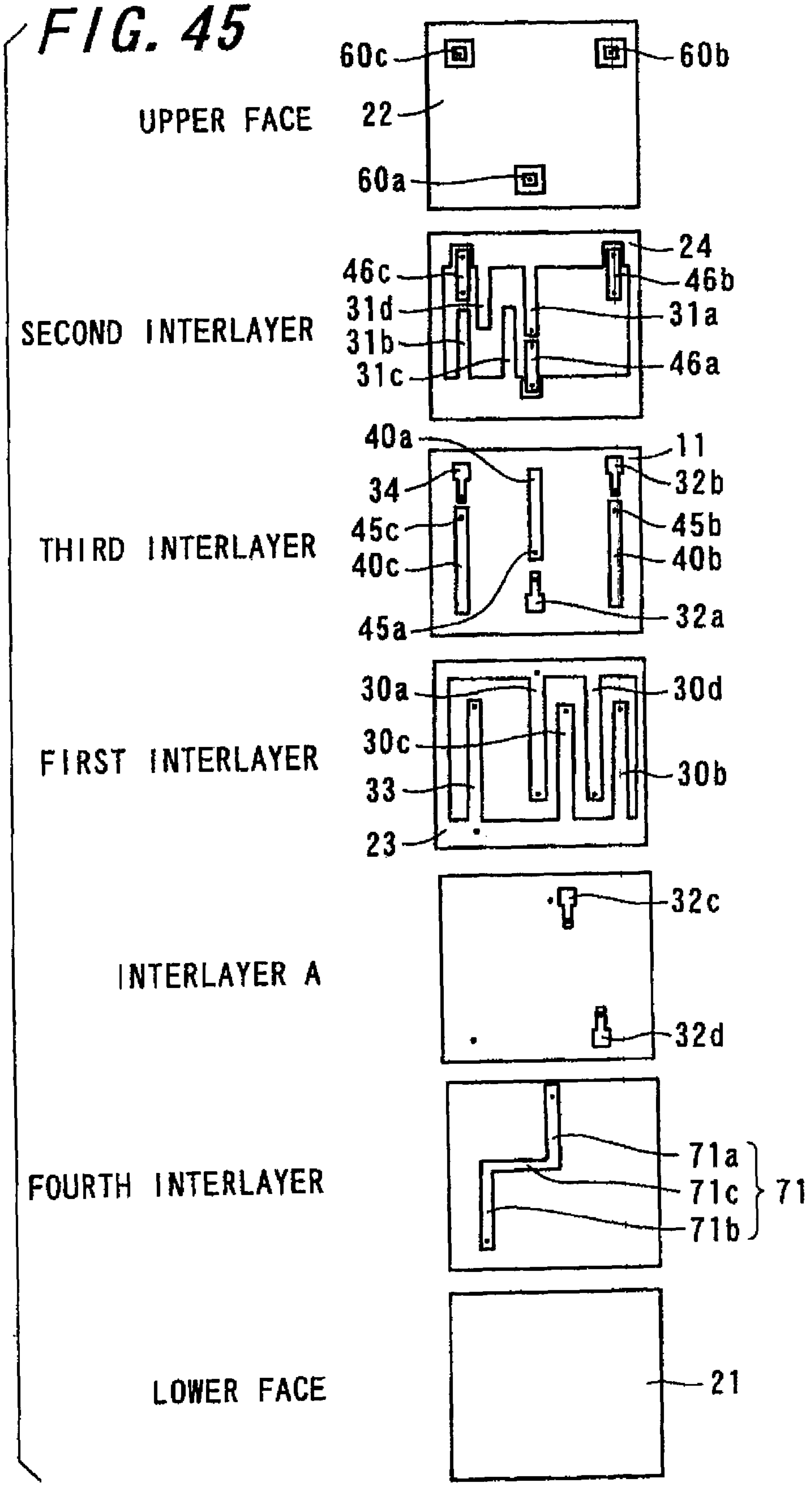
FIG. 45 is a plan view schematically showing upper and lower faces and interlayers of the diplexer shown in FIG. 43.
Figure 46:
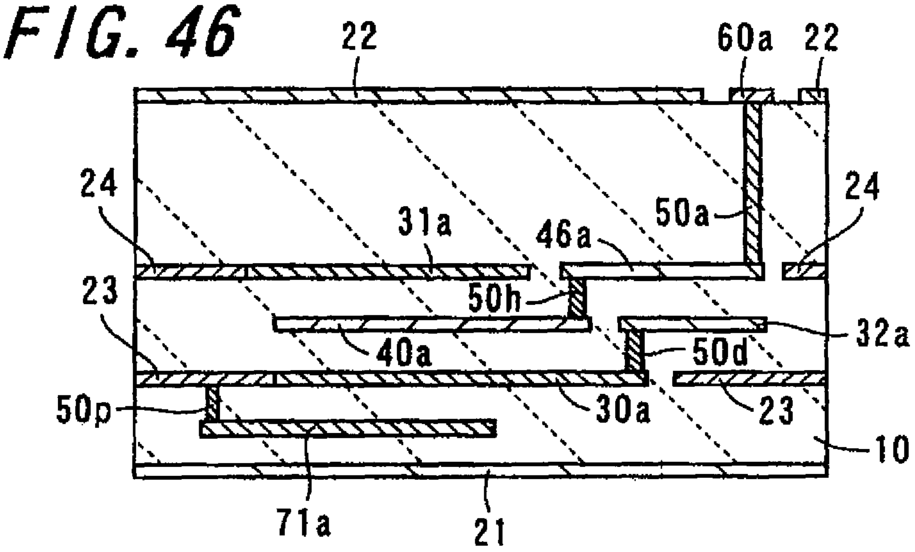
FIG. 46 is a cross-sectional view taken along line R3-R3' of FIG. 43.

FIG. 43 is an external perspective view schematically showing of a diplexer according to a fourteenth embodiment of the invention. FIG. 44 is a schematic exploded perspective view of the diplexer shown in FIG. 43. FIG. 45 is a plan view schematically showing upper and lower faces and interlayers of the diplexer shown in FIG. 43. FIG. 46 is a cross-sectional view taken along line R3-R3' of FIG. 43. Note that the following description deals with in what way this embodiment differs from the above-mentioned thirteenth embodiment, and the constituent components thereof that play the same or corresponding roles as in the preceding embodiment will be denoted by the same reference numerals and overlapping descriptions will be omitted.

In the diplexer of this embodiment, as shown in FIGS. 43 to 46, on the second interlayer of the multilayer body 10 bearing the second resonant electrodes 31*a*, 31*b*, 31*c*, and 31*d* and the second annular ground electrode 24, the auxiliary input coupling electrode 46*a*, the auxiliary output coupling electrode 46*b*, and the second auxiliary output coupling electrode 46*c* are disposed.

According to the thus configured diplexer of this embodiment, in comparison with the diplexer of the above-mentioned thirteenth embodiment, the input coupling electrode 40*a* and the second output coupling electrode 40*c*, and the input-stage second resonant electrode 31*a* and the output-stage second resonant electrode 31*b* are disposed close to each other with ease. Thus, a more intense electromagnetic-field coupling between the input coupling electrode 40*a* and the second output coupling electrode 40*c*, and the input-stage second resonant electrode 31*a* and the output-stage second resonant electrode 31*b* is easily generated. Accordingly, in a pass band formed by the second resonant electrodes 31*a*, 31*b*, 31*c*, and 31*d*, a pass characteristic of the diplexer is easily obtained in which the form is flatter and the loss is lower.

Fifteenth Embodiment

Figure 47:
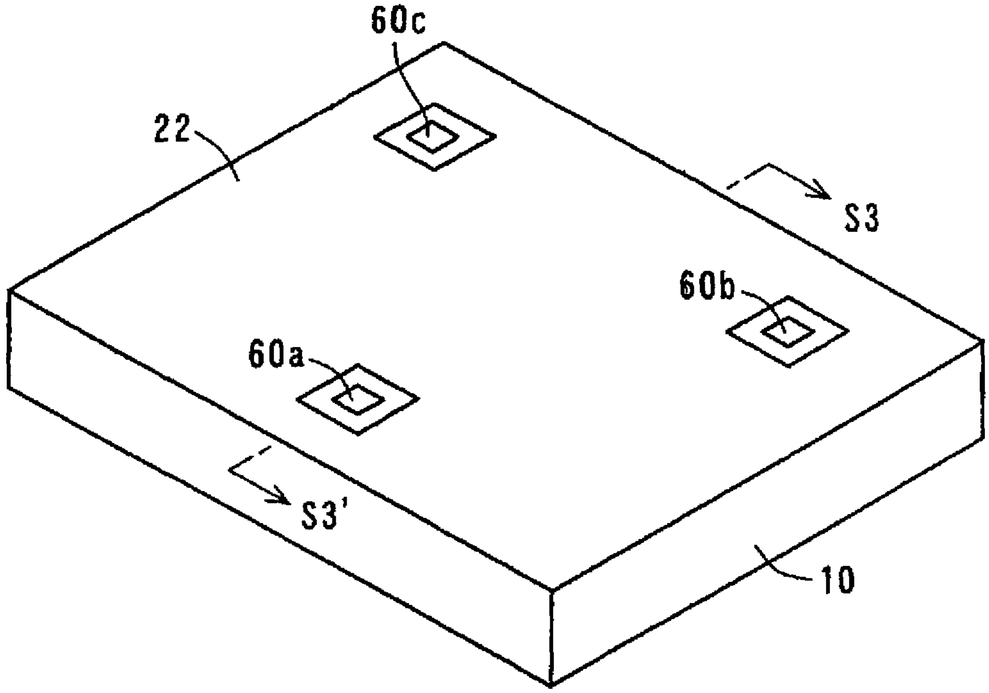
FIG. 47 is an external perspective view schematically showing a diplexer according to a fifteenth embodiment of the invention.
Figure 48:
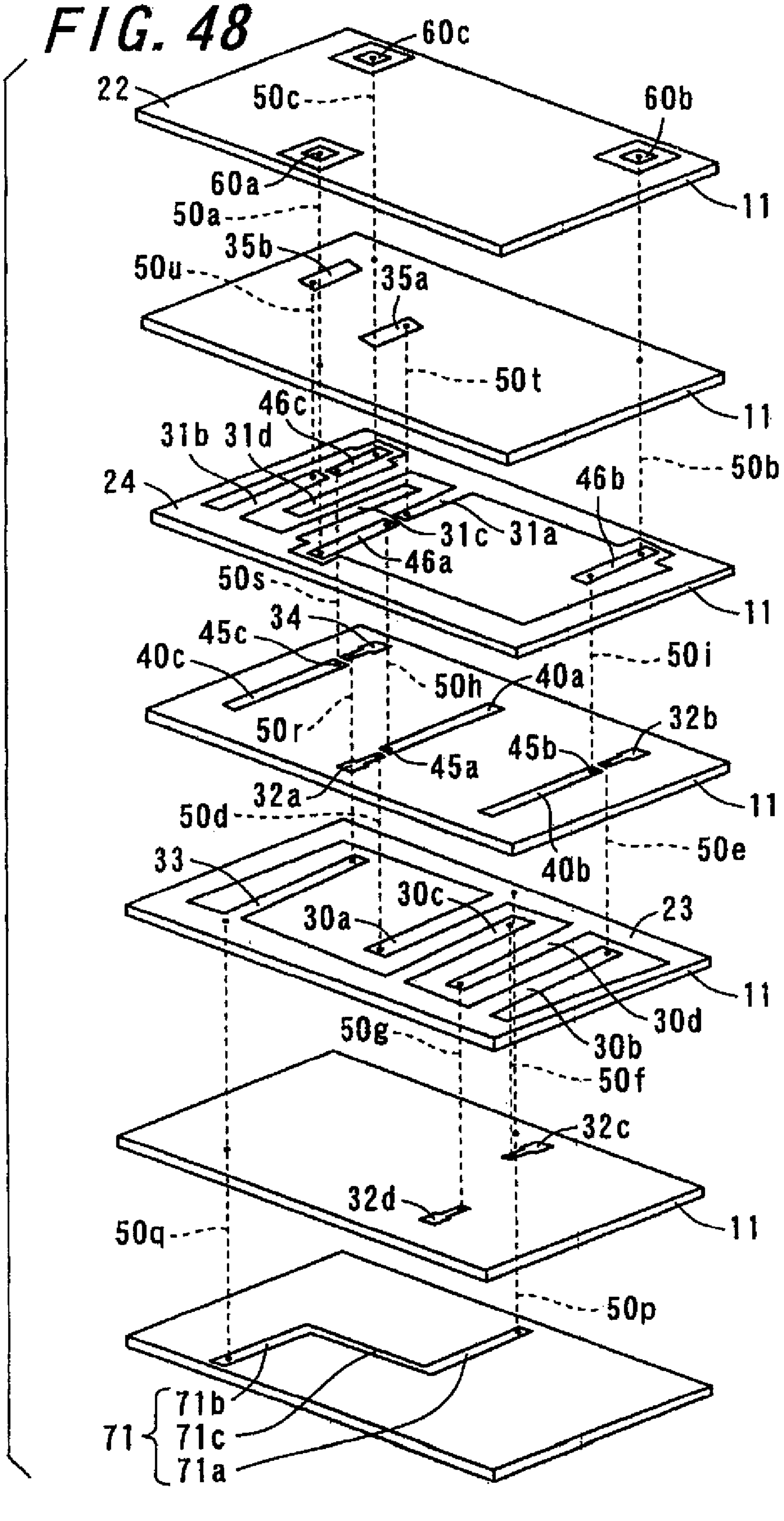
FIG. 48 is a schematic exploded perspective view of the diplexer shown in FIG. 47.
Figure 49:
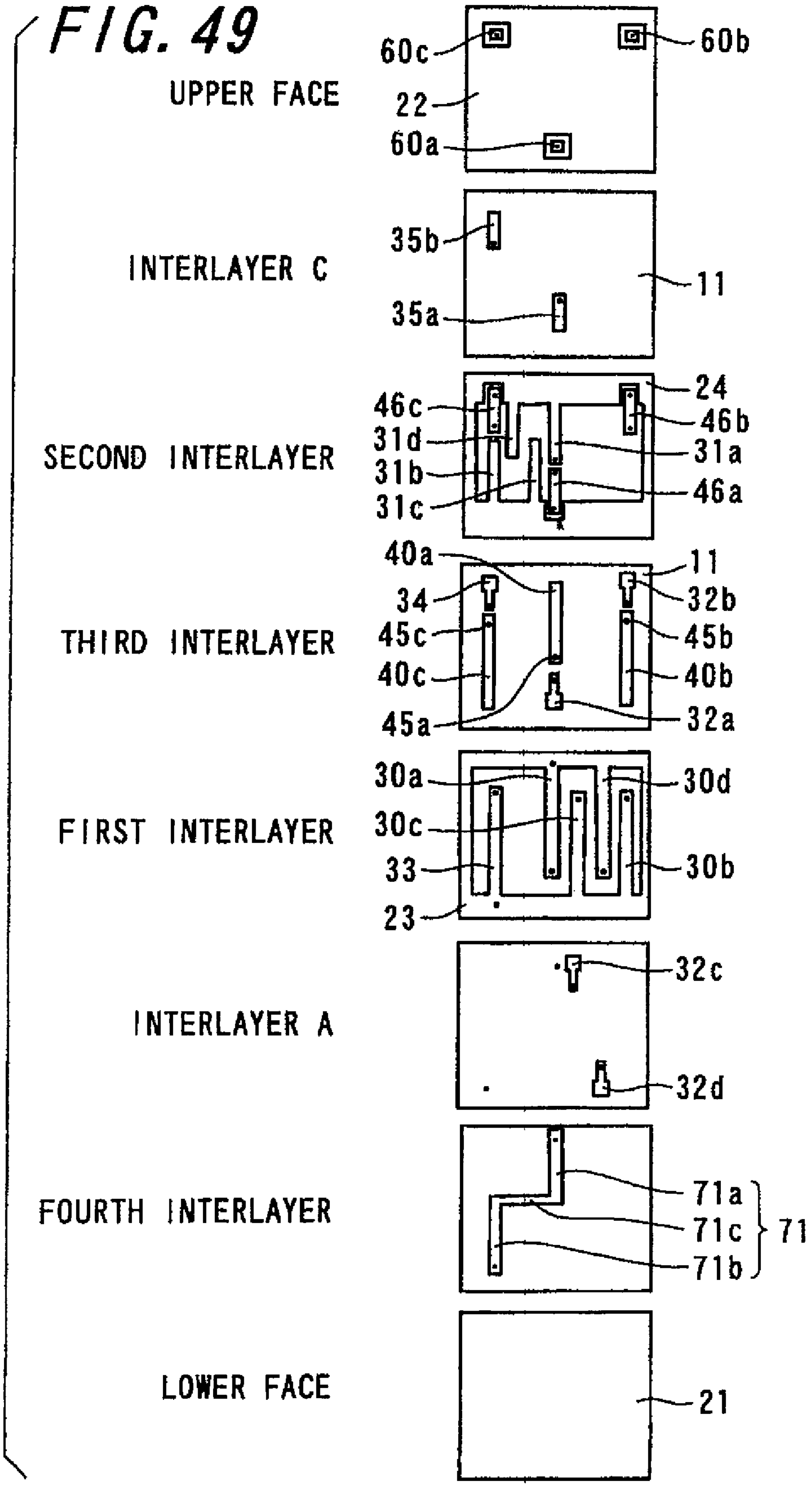
FIG. 49 is a plan view schematically showing upper and lower faces and interlayers of the diplexer shown in FIG. 47.
Figure 50:
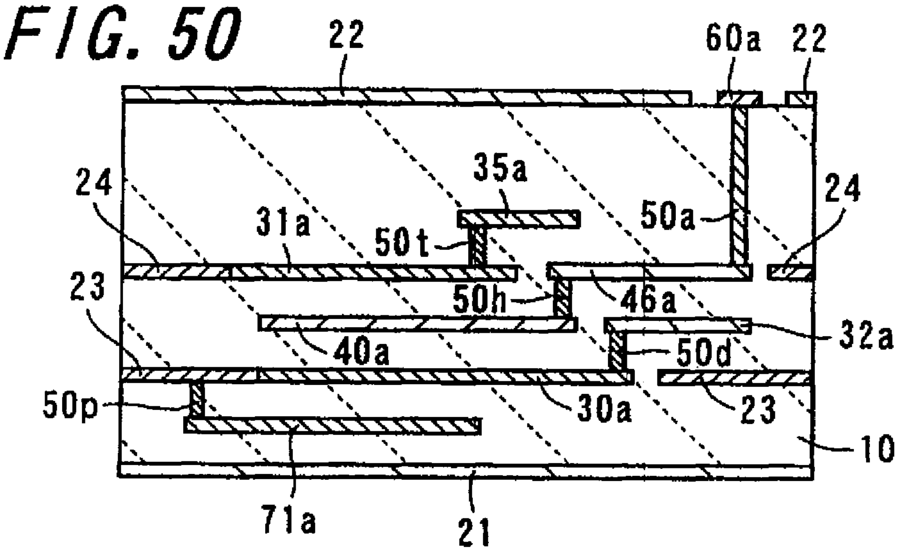
FIG. 50 is a cross-sectional view taken along line S3-S3' of FIG. 47.

FIG. 47 is an external perspective view schematically showing a diplexer according to a fifteenth embodiment of the invention. FIG. 48 is a schematic exploded perspective view of the diplexer shown in FIG. 47. FIG. 49 is a plan view schematically showing upper and lower faces and interlayers of the diplexer shown in FIG. 47. FIG. 50 is a cross-sectional view taken along line S3-S3' of FIG. 47. Note that the following description deals with in what way this embodiment differs from the above-mentioned fourteenth embodiment, and the constituent components thereof that play the same or corresponding roles as in the preceding embodiment will be denoted by the same reference numerals and overlapping descriptions will be omitted.

The diplexer of this embodiment, as shown in FIGS. 47 to 50, comprises, on an interlayer C of the multilayer body 10 located, between the upper face of the multilayer body 10 and the second interlayer, a strip-like first auxiliary resonant coupling electrode 35*a* that is disposed so as to have a region facing the auxiliary input coupling electrode 46*a*, and connected via a through conductor 50*t* to the other end of the input-stage second resonant electrode 31*a*, and a strip-like second auxiliary resonant coupling electrode 35*b* that is disposed so as to have a region facing the second auxiliary output coupling electrode 46*c*, and connected via a through conductor 50*u* to the other end of the output-stage second resonant electrode 31*b*.

According to the thus configured diplexer of this embodiment, intense electromagnetic-field coupling between the first auxiliary resonant coupling electrode 35*a* and the auxiliary input coupling electrode 46*a* by a broadside coupling is generated, and is added to electromagnetic-field coupling between the input-stage second resonant electrode 31*a* and the input coupling electrode 40*a*. In a similar manner, intense electromagnetic-field coupling between the second auxiliary resonant coupling electrode 35*b* and the second auxiliary output coupling electrode 46*c* by a broadside coupling is generated, and is added to electromagnetic-field coupling between the output-stage second resonant electrode 31*b* and the second output coupling electrode 40*c*. Therefore, it is possible to further intensify the electromagnetic-field coupling between the input coupling electrode 40*a* and the input-stage second resonant electrode 31*a*, and the electromagnetic-field coupling between the second output coupling electrode 40*c* and the output-stage second resonant electrode 31*b*.

Further, according to the diplexer of this embodiment, the first auxiliary resonant coupling electrode 35*a* has its one end connected to the other end of the input-stage second resonant electrode 31*a*, and extends to a side opposite the one end of the input-stage second resonant electrode 31*a*. The second auxiliary resonant coupling electrode 35*b* has its one end connected to the other end of the output-stage second resonant electrode 31*b*, and extends to a side opposite the one end of the output-stage second resonant electrode 31*b*. With this configuration, a coupling body composed of the input-stage second resonant electrode 31*a* and the first auxiliary resonant coupling electrode 35*a* connected thereto and a coupling body composed of the input coupling electrode 40*a* and the auxiliary input coupling electrode 46*a* connected thereto are coupled to each other in an interdigital form as a whole. In a similar manner, a coupling body composed of the output-stage second resonant electrode 31*b* and the second auxiliary resonant coupling electrode 35*b* connected thereto and a coupling body composed of the second output coupling electrode 40*c* and the second auxiliary output coupling electrode 46*c* connected thereto are coupled to each other in an interdigital form as a whole. Therefore, a magnetic-filed coupling and an electric-field coupling are added, and a more intense coupling is generated. Thus, in a pass band formed by the plurality of first resonant electrodes 30*a*, 30*b*, 30*c*, and 30*d*, even in a very wide pass bandwidth, a pass characteristic can be obtained in which the form is flatter and the loss is lower throughout the entire wide pass band, and in which an increase in the insertion loss at a frequency located between the resonance frequencies in each resonance mode is further reduced.

Sixteenth Embodiment

Figure 51:
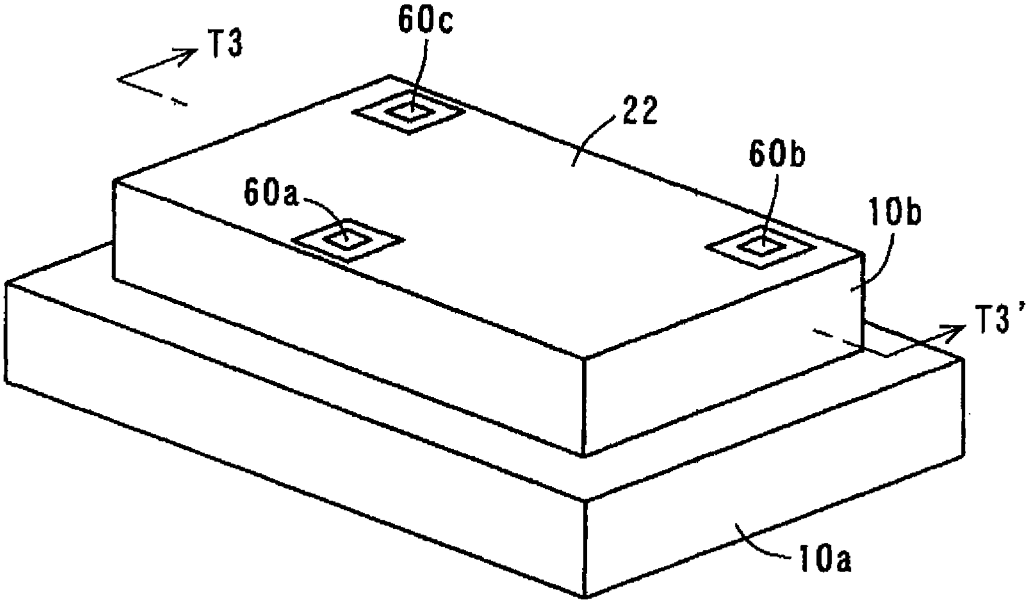
FIG. 51 is an external perspective view schematically showing a diplexer according to a sixteenth embodiment of the invention.
Figure 52:
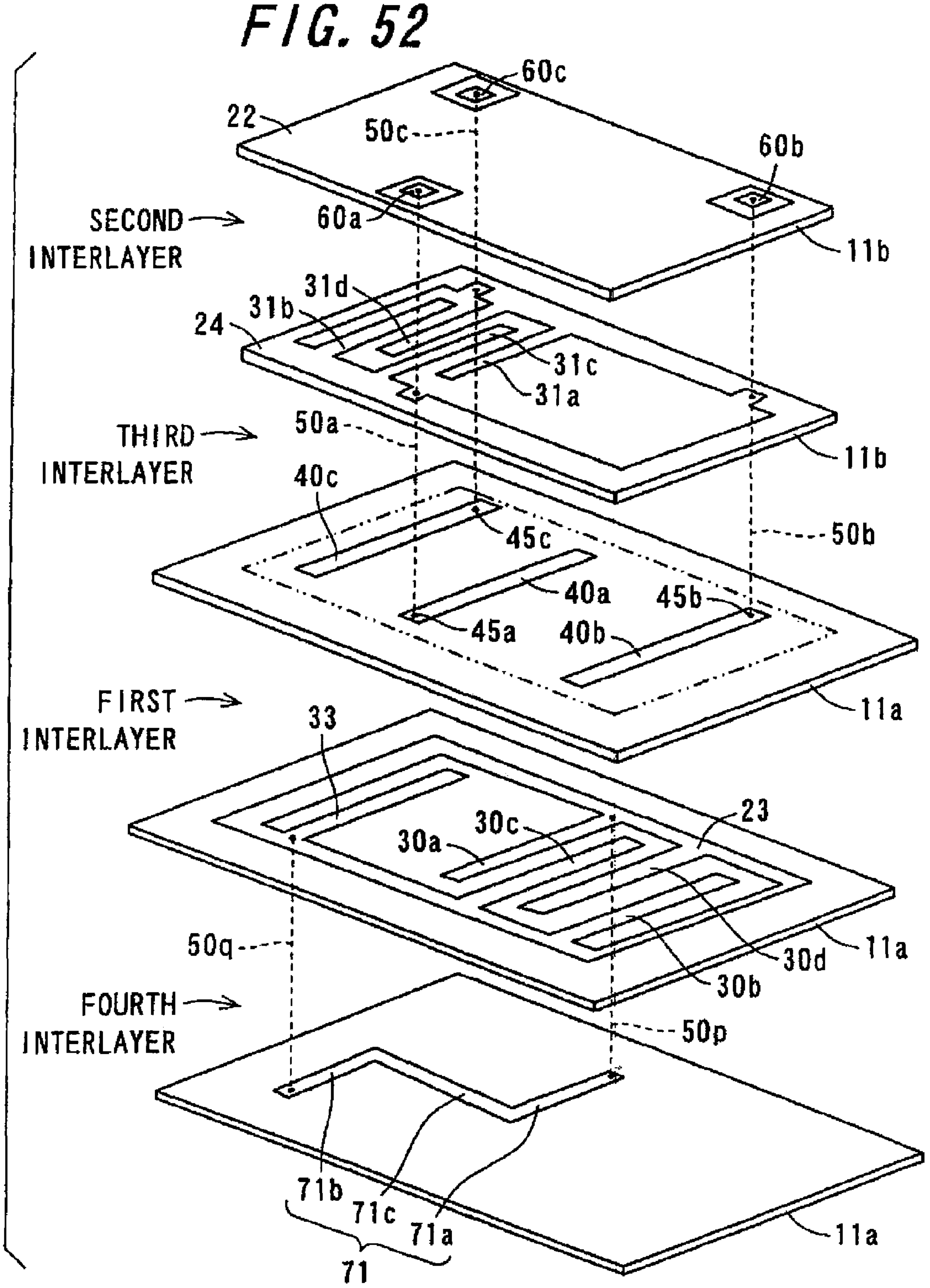
FIG. 52 is a schematic exploded perspective view of the diplexer shown in FIG. 51.
Figure 53:
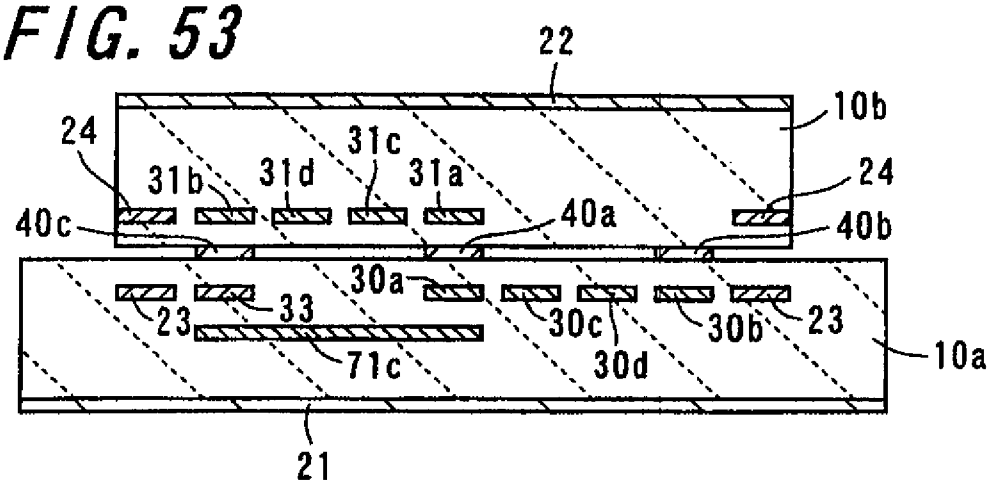
FIG. 53 is a cross-sectional view taken along line T3-T3' of FIG. 51.

FIG. 51 is an external perspective view schematically showing a diplexer according to a sixteenth embodiment of the invention. FIG. 52 is a schematic exploded perspective view of the diplexer shown in FIG. 51. FIG. 53 is a cross-sectional view taken along line T3-T3' of FIG. 51. Note that the following description deals with in what way this embodiment differs from the above-mentioned eleventh embodiment, and the constituent components thereof that play the same or corresponding roles as in the preceding embodiment will be denoted by the same reference numerals and overlapping descriptions will be omitted.

In the diplexer of this embodiment, as shown in FIGS. 51 to 53, the multilayer body comprises a first multilayer body 10*a* and a second multilayer body 10*b* placed thereon. The first ground electrode 21 is disposed on a lower face of the first multilayer body 10*a*. The second ground electrode 22 is disposed on an upper face of the second multilayer body 10*b*. The first interlayer, which bears the first annular ground electrode 23, the third resonant electrode 33 and the first resonant electrodes 30*a*, 30*b*, 30*c*, and 30*d*, and the fourth interlayer bearing the resonant electrode coupling conductor 71, are located within the first multilayer body 10*a*. The second interlayer, which bears the second resonant electrodes 31*a*, 31*b*, 31*c*, and 31*d* and the second annular ground electrode 24 is located within the second multilayer body 10*b*. The third interlayer, which bears the input coupling electrode 40*a*, the first output coupling electrode 40*b* and the second output coupling electrode 40*c*, is located between the first multilayer body 10*a* and the second multilayer body 10*b*. Note that the first multilayer body 10*a* has a stack of a plurality of dielectric layers 11*a* on top of each other, and the second multilayer body 10*b* has a stack of a plurality of dielectric layers 11*b* on top of each other.

According to the thus configured diplexer of this embodiment, the region bearing the first resonant electrodes 30*a*, 30*b*, 30*c*, and 30*d* and the region bearing the second resonant electrodes 31*a*, 31*b*, 31*c*, and 31*d* that differ in resonance frequency from each other, are separated into the first and second multilayer bodies 10*a* and 10*b*, by the third interlayer bearing the input coupling electrode 40*a*, the first output coupling electrode 40*b* and the second output coupling electrode 40*c*, serving as a boundary. In this construction, by designing the dielectric layer constituting the first multilayer body 10*a* and the dielectric layer constituting the second multilayer body 10*b* to have different electrical characteristics, it is possible to obtain desired electrical characteristics with ease. For example, the dielectric constant of the dielectric layer 11*a* constituting the first multilayer body 10*a*, in which are arranged the first resonant electrodes 30*a*, 30*b*, 30*c*, and 30*d* that are made longer than the second resonant electrodes 31*a*, 31*b*, 31*c*, and 31*d* because of having lower resonance frequencies, is set to be higher than the dielectric constant of the dielectric layer 11*b* constituting the second multilayer body 10*b*. This makes it possible to reduce the lengths of, respectively, the first resonant electrodes 30*a*, 30*b*, 30*c*, and 30*d*, and thereby eliminate wasted space inside the diplexer with consequent miniaturization of the diplexer. Moreover, in the diplexer of this embodiment, there is no need to establish electromagnetic-field coupling between the upper and lower electrode components separated by the third interlayer bearing the input coupling electrode 40*a*, the first output coupling electrode 40*b* and the second output coupling electrode 40*c*, interposed therebetween. That is, the third interlayer serves as a boundary to separate the first multilayer body 10*a* and the second multilayer body 10*b*. In this construction, for example, even if the first multilayer body 10*a* and the second multilayer body 10*b* are positionally displaced with respect to each other, or an air layer exists at the boundary between the first multilayer body 10*a* and the second multilayer body 10*b*, the risk of consequent deterioration in electrical characteristics can be kept to the minimum. Further, for example, in a case where the first multilayer body 10*a* is designed as a module substrate for mounting another electronic component or the like on the face of the region thereof other than the region constituting the diplexer, by disposing part of the diplexer within the second multilayer body 10*b*, the thickness of the module substrate can be reduced. Accordingly, it is possible to obtain a diplexer-equipped substrate in which the module can be made smaller in thickness as a whole.

Seventeenth Embodiment

Figure 54:
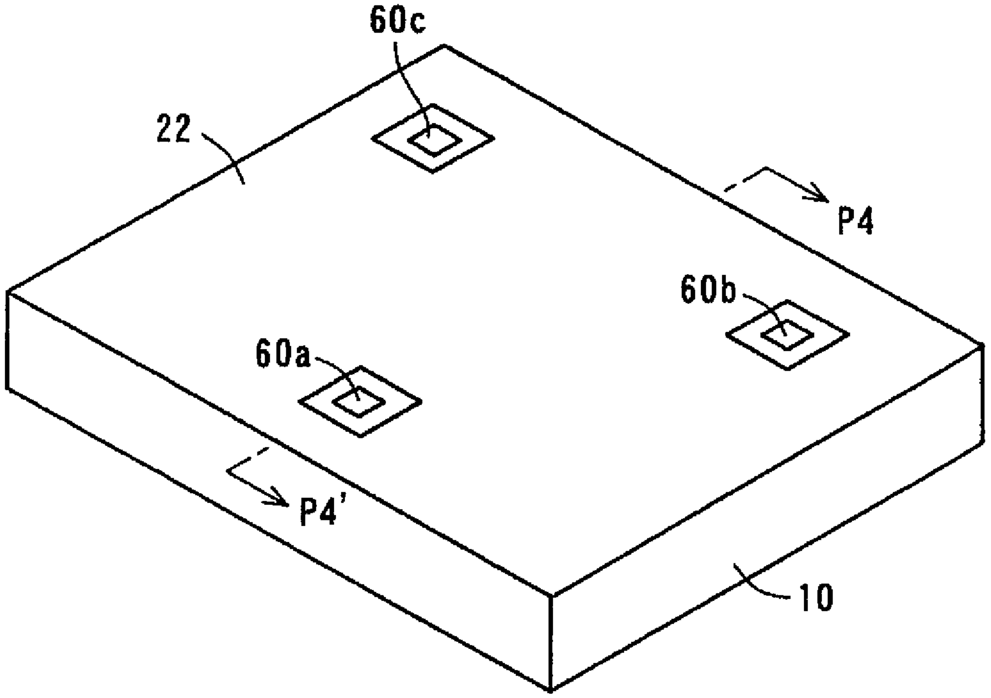
FIG. 54 is an external perspective view schematically showing a diplexer according to a seventeenth embodiment of the invention.
Figure 55:
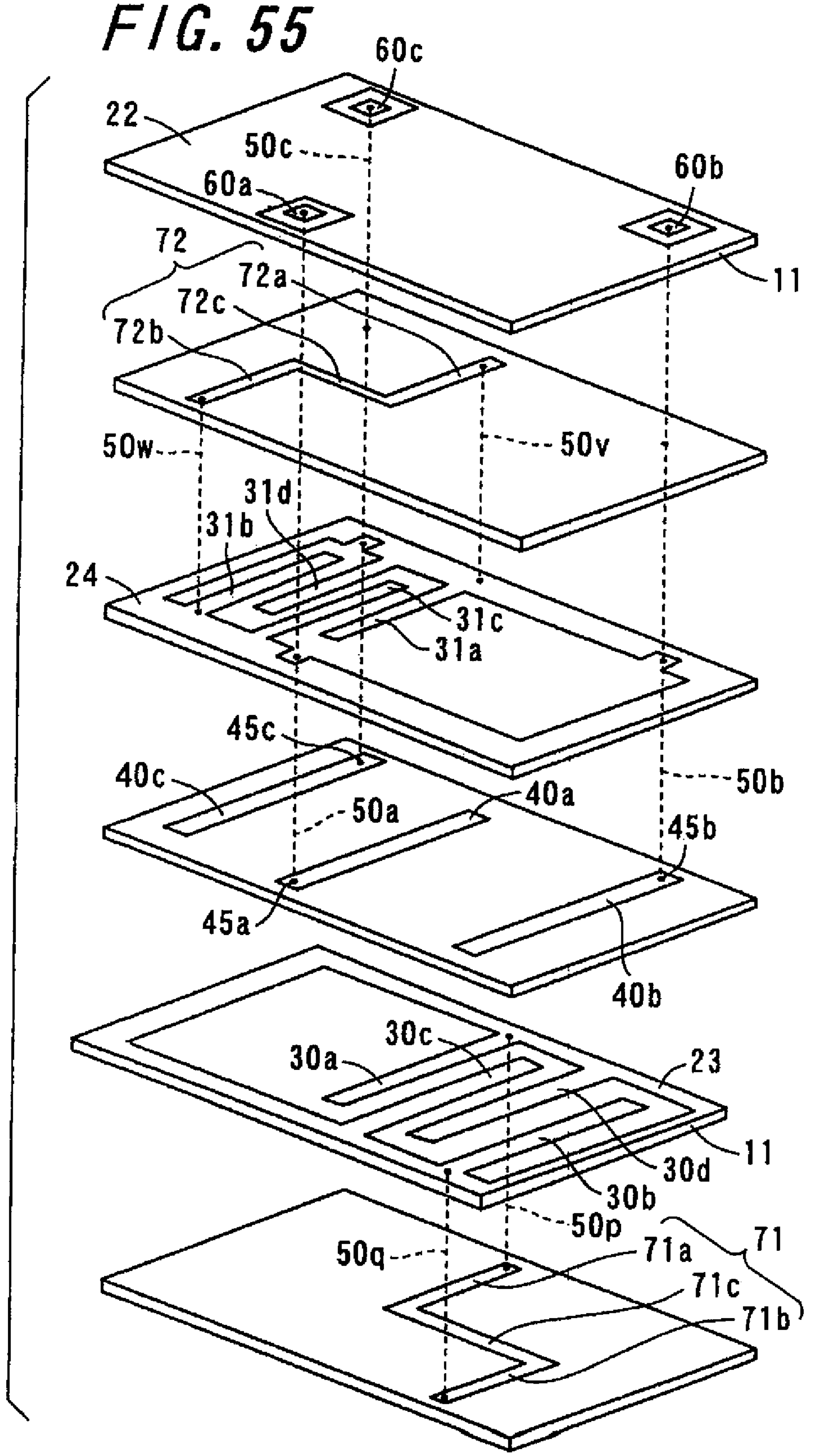
FIG. 55 is a schematic exploded perspective view of the diplexer shown in FIG. 54.
Figure 56:
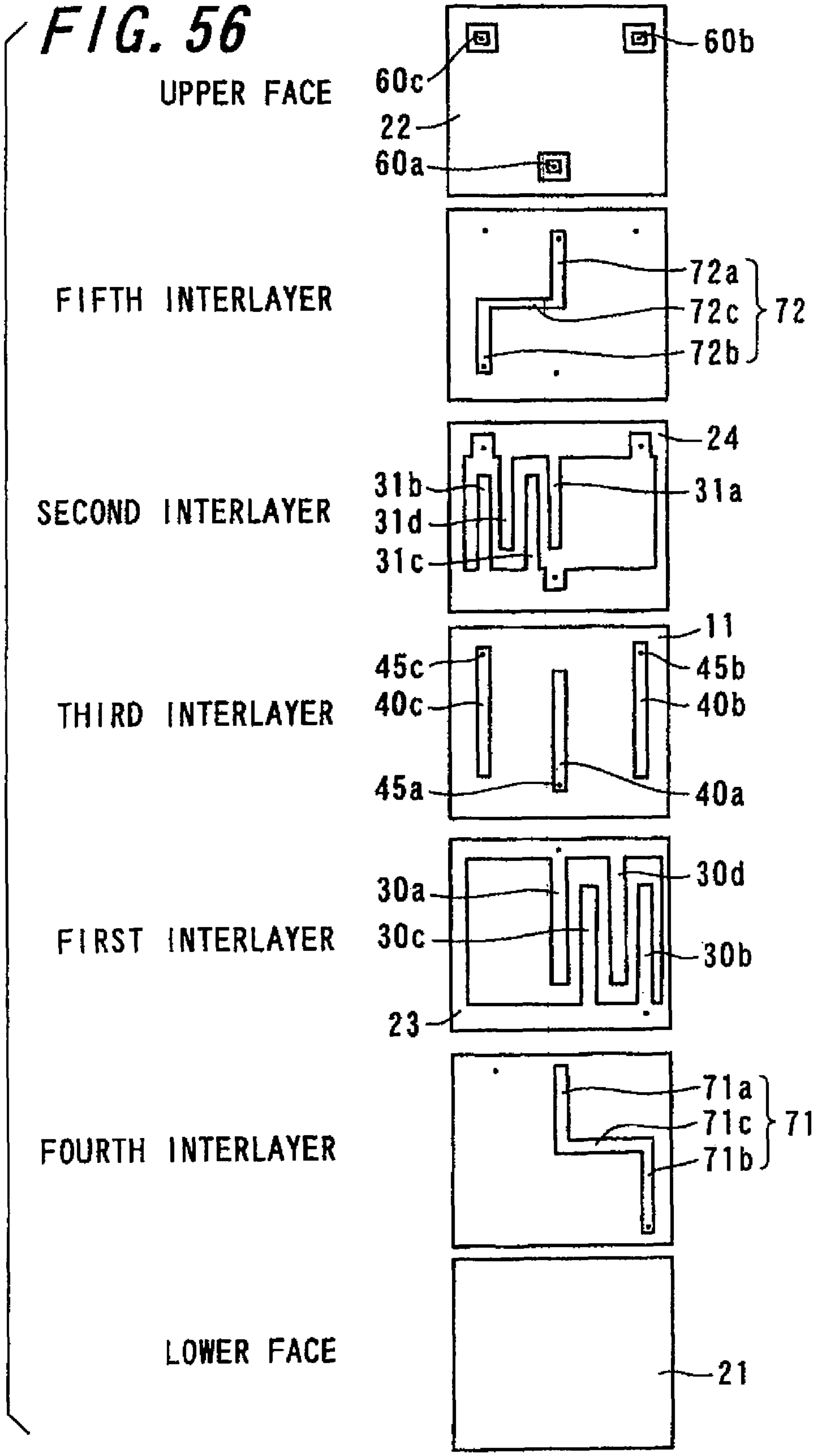
FIG. 56 is a plan view schematically showing upper and lower faces and interlayers of the diplexer shown in FIG. 54.
Figure 57:
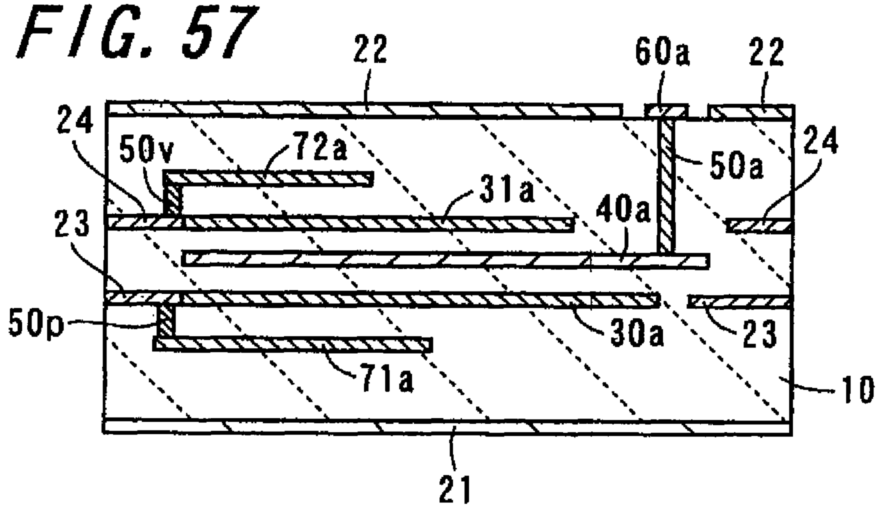
FIG. 57 is a cross-sectional view taken along line P4-P4' of FIG. 54.

FIG. 54 is an external perspective view schematically showing a diplexer according to a seventeenth embodiment of the invention. FIG. 55 is a schematic exploded perspective view of the diplexer shown in FIG. 54. FIG. 56 is a plan view schematically showing upper and lower faces and interlayers of the diplexer shown in FIG. 54. FIG. 57 is a cross-sectional view taken along line P4-P4' of FIG. 54.

As shown in FIGS. 54 to 57, the diplexer of this embodiment includes the multilayer body 10, the first ground electrode 21, the second ground electrode 22, the plurality of strip-like first resonant electrodes 30*a*, 30*b*, 20*c*, and 30*d*, and the plurality of strip-like second resonant electrodes 31*a*, 31*b*, 31*c*, and 31*d*. The multilayer body 10 has a stack of a plurality of dielectric layers 11 on top of each other. The first ground electrode 21 is disposed on the lower face of the multilayer body 10. The second ground electrode 22 is disposed on the upper face of the multilayer body 10. The plurality of first resonant electrodes 30*a*, 30*b*, 30*c*, and 30*d* are arranged side by side on a first interlayer of the multilayer body 10, with their one ends as well as their other ends displaced in relation to each other in a staggered manner, have their one ends connected to a ground potential so as to serve as a quarter-wavelength resonator, and make electromagnetic-field coupling with each other. The plurality of second resonant electrodes 31*a*, 31*b*, 31*c*, and 31*d* are arranged side by side on a second interlayer of the multilayer body 10 different from the first interlayer, with their one ends as well as their other ends displaced in relation to each other in a staggered manner, have their one ends connected to a ground potential so as to serve as a quarter-wavelength resonator that resonates at a frequency higher than a frequency of the first resonant electrodes, and make electromagnetic-field coupling with each other.

The diplexer of this embodiment further includes the strip-like input coupling electrode 40*a*, the strip-like first output coupling electrode 40*b*, and the strip-like second output coupling electrode 40*c*. The input coupling electrode 40*a* is disposed on a third interlayer of the multilayer body 10 located between the first interlayer and the second interlayer, faces the input-stage first resonant electrode 30*a* of the first resonant electrodes 30*a*, 30*b*, 30*c*, and 30*d*, over more than half of an entire longitudinal area thereof for electromagnetic-field coupling, faces the input-stage second resonant electrode 31*a* of the second resonant electrodes 31*a*, 31*b*, 31*c*, and 31*d*, over more than half of an entire longitudinal area thereof for electromagnetic-field coupling, and has the electric signal input point 45*a* for receiving input of an electric signal from an external circuit. The first output coupling electrode 40*b* is disposed on a third interlayer of the multilayer body 10 different from the first interlayer, faces the output-stage first resonant electrode 30*b* of the first resonant electrodes 30*a*, 30*b*, 30*c*, and 30*d*, over more than half of an entire longitudinal area thereof for electromagnetic-field coupling, and has the first electric signal output point 45*b* for producing output of an electric signal toward an external circuit. The second output coupling electrode 40*c* is disposed on a fourth interlayer of the multilayer body 10 different from the second interlayer, faces the output-stage second resonant electrode 31*b* of the second resonant electrodes 31*a*, 31*b*, 31*c*, and 31*d*, over more than half of an entire longitudinal area thereof for electromagnetic-field coupling, and has the second electric signal output point 45*c* for producing output of an electric signal toward an external circuit.

The diplexer of this embodiment further includes a first resonant electrode coupling conductor 71 and a second resonant electrode coupling conductor 72. The first resonant electrode coupling conductor 71 is disposed on a fourth interlayer of the multilayer body 10 located on the side opposite the third interlayer with the first interlayer interposed therebetween, has its one end connected to a ground potential close to the one end of the frontmost-stage first resonant electrode 30*a* forming a first resonant electrode group including four adjacent first resonant electrodes 30*a*, 30*b*, 30*c*, and 30*d*, has its another end connected to a ground potential close to the one end of the rearmost-stage first resonant electrode 30*b* forming the first resonant electrode group, and has a region facing the one end of the frontmost-stage first resonant electrode 30*a* for electromagnetic-field coupling and a region facing the one end of the rearmost-stage first resonant electrode 30*b* for electromagnetic-field coupling. The second resonant electrode coupling conductor 72 is disposed on a fifth interlayer of the multilayer body 10 located on the side opposite the third interlayer with the second interlayer interposed therebetween, has its one end connected to a ground potential close to the one end of the frontmost-stage second resonant electrode 31*a* forming a second resonant electrode group including four adjacent second resonant electrodes 31*a*, 31*b*, 31*c*, and 31*d*, has its another end connected to a ground potential close to the one end of the rearmost-stage second resonant electrode 31*b* forming the second resonant electrode group, and has a region facing the one end of the frontmost-stage second resonant electrode 31*a* for electromagnetic-field coupling and a region facing the one end of the rearmost-stage second resonant electrode 31*b* for electromagnetic-field coupling.

The diplexer of this embodiment further includes the first annular ground electrode 23 and the second annular ground electrode 24. On the first interlayer of the multilayer body 10, the first annular ground electrode 23 is formed in the annular shape so as to surround the first resonant electrodes 30*a*, 30*b*, 30*c*, and 30*d*, and is connected to the one ends, respectively, of the first resonant electrodes 30*a*, 30*b*, 30*c*, and 30*d*. On the second interlayer, the second annular ground electrode 24 is formed in the annular shape so as to surround the second resonant electrodes 31*a*, 31*b*, 31*c*, and 31*d*, and is connected to the one ends, respectively, of the second resonant electrodes 31*a*, 31*b*, 31*c*, and 31*d*.

Furthermore, in the diplexer of this embodiment, the first resonant electrode coupling conductor 71 includes a strip-like first front-stage side coupling region 71*a* that faces the frontmost-stage first resonant electrode 30*a* in parallel, a strip-like first rear-stage side coupling region 71*b* that faces the rearmost-stage first resonant electrode 30*b* in parallel, and a first connecting region 71*c* formed so as to be perpendicular to each of the first front-stage side coupling region 71*a* and the first rear-stage side coupling region 71*b*, for providing connection between these coupling regions. The second resonant electrode coupling conductor 72 includes a strip-like second front-stage side coupling region 72*a* that faces the frontmost-stage second resonant electrode 31*a* in parallel, a strip-like second rear-stage side coupling region 72*b* that faces the rearmost-stage second resonant electrode 31*b* in parallel, and a second connecting region 72*c* formed so as to be perpendicular to each of the second front-stage side coupling region 72*a* and the second rear-stage side coupling region 72*b*, for providing connection between these coupling regions. Here, both end portions of the first resonant electrode coupling conductor 71 are respectively connected via the through conductors 50*p* and 50*q* to the first annular ground electrode 23, and both end portions of the second resonant electrode coupling conductor 72 are respectively connected via through conductors 50*v* and 50*w* to the second annular ground electrode 24.

Furthermore, in the diplexer of this embodiment, the one end of the input-stage first resonant electrode 30*a* and the one end of the input-stage second resonant electrode 31*a* are located on the same side. The first output coupling electrode 40*b* and the second output coupling electrode 40*c* in a plan view are located on the opposite sides with the input coupling electrode interposed therebetween. In the input coupling electrode 40*a*, the electric signal input point 45*a* is located closer to the other end of the input-stage first resonant electrode 30*a* than the center of the part facing the input-stage first resonant electrode 30*a*, and closer to the other end of the input-stage second resonant electrode 31*a* than the center of the part facing the input-stage second resonant electrode 31*a*. In the first output coupling electrode 40*b*, the first electric signal output point 45*b* is located closer to the other end of the output-stage first resonant electrode 30*b* than the center of the part facing the output-stage first resonant electrode 30*b*. In the second output coupling electrode 40*c*, the second electric signal output point 45*c* is located closer to the other end of the output-stage second resonant electrode 31*b* than the center of the part facing the output-stage second resonant electrode 31*b*.

Furthermore, in the diplexer of this embodiment, the input coupling electrode 40*a* is connected via the through conductor 50*a* to the input terminal electrode 60*a* disposed on the upper face of the multilayer body 10, the first output coupling electrode 40*b* is connected via the through conductor 50*b* to the first output terminal electrode 60*b* disposed on the upper face of the multilayer body 10, and the second output coupling electrode 40*c* is connected via the through conductor 50*c* to the second output terminal electrode 60*c* disposed on the upper face of the multilayer body 10. Thus, a point that connects the input coupling electrode 40*a* and the through conductor 50*a* is the electric signal input point 45*a*, a point that connects the first output coupling electrode 40*b* and the through conductor 50*b* is the first electric signal output point 45*b*, and a point that connects the second output coupling electrode 40*c* and the through conductor 50*c* is the second electric signal output point 45*c*.

In the thus configured diplexer of this embodiment, when an electric signal from an external circuit is inputted via the input terminal electrode 60*a* and the through conductor 50*a* to the electric signal input point 45*a* of the input coupling electrode 40*a*, the input-stage first resonant electrode 30*a* that makes electromagnetic-field coupling with the input coupling electrode 40*a* is excited, and, thus, the first resonant electrodes 30*a*, 30*b*, 30*c*, and 30*d* that make electromagnetic-field coupling with each other resonate, and an electric signal is outputted from the first electric signal output point 45*b* of the first output coupling electrode 40*b* that makes electromagnetic-field coupling with the output-stage first resonant electrode 30*b* via the through conductor 50*b* and the first output terminal electrode 60*b* toward an external circuit. At that time, a signal in a first frequency band containing a frequency at which the first resonant electrodes 30*a*, 30*b*, 30*c*, and 30*d* resonate is selectively allowed to pass, and, thus, a first pass band is formed.

Furthermore, in the diplexer of this embodiment, when an electric signal from an external circuit is inputted via the input terminal electrode 60*a* and the through conductor 50*a* to the electric signal input point 45*a* of the input coupling electrode 40*a*, the input-stage second resonant electrode 31*a* that makes electromagnetic-field coupling with the input coupling electrode 40*a* is excited, and, thus, the second resonant electrodes 31*a*, 31*b*, 31*c*, and 31*d* that make electromagnetic-field coupling with each other resonate, and an electric signal is outputted from the second electric signal output point 45*c* of the second output coupling electrode 40*c* that makes electromagnetic-field coupling with the output-stage second resonant electrode 31*b* via the through conductor 50*c* and the second output terminal electrode 60*c* toward an external circuit. At that time, a signal in a second frequency band containing a frequency at which the second resonant electrodes 31*a*, 31*b*, 31*c*, and 31*d* resonate is selectively allowed to pass, and, thus, a second pass band is formed.

In this manner, the diplexer of this embodiment serves as a diplexer that demultiplexes a signal inputted from the input terminal electrode 60*a* according to the frequency, and that outputs resulting signals from the first output terminal electrode 60*b* and the second output terminal electrode 60*c*.

In the diplexer of this embodiment, the first ground electrode 21 is disposed on the entire lower face of the multilayer body 10, the second ground electrode 22 is disposed on substantially the entire upper face of the multilayer body 10 excluding portions around the input terminal electrode 60*a*, the first output terminal electrode 60*b*, and the second output terminal electrode 60*c*, and both electrodes are connected to a ground potential and form a stripline resonator together with the plurality of first resonant electrodes 30*a*, 30*b*, 30*c*, and 30*d* and the second resonant electrodes 31*a*, 31*b*, 31*c*, and 31*d*.

Furthermore, in the diplexer of this embodiment, the strip-like first resonant electrodes 30*a*, 30*b*, 30*c*, and 30*d* respectively have one ends that are connected to the first annular ground electrode 23 and connected to a ground potential so as to serve as a quarter-wavelength resonator. Furthermore, the electrical lengths thereof are set to approximately, ¼ the wavelength at the center frequency of a pass band formed by the first resonant electrodes 30*a*, 30*b*, 30*c*, and 30*d*. In a similar manner, the strip-like second resonant electrodes 31*a*, 31*b*, 31*c*, and 31*d* respectively have one ends that are connected to the second annular ground electrode 24 and connected to a ground potential so as to serve as a quarter-wavelength resonator. Furthermore, the electrical lengths thereof are set to approximately ¼ the wavelength at the center frequency of a pass band formed by the second resonant electrodes 31*a*, 31*b*, 31*c*, and 31*d*.

Furthermore, the first resonant electrodes 30*a*, 30*b*, 30*c*, and 30*d* are arranged side by side on the first interlayer of the multilayer body 10, and edge-coupled to each other, and the second resonant electrodes 31*a*, 31*b*, 31*c*, and 31*d* are arranged side by side on the second interlayer of the multilayer body 10, and edge-coupled to each other. The gap between the first resonant electrodes 30*a*, 30*b*, 30*c*, and 30*d* arranged side by side, and the gap between the second resonant electrodes 31*a*, 31*b*, 31*c*, and 31*d* arranged side by side are set to, for example, approximately 0.05 to 0.5 mm, because a smaller gap realizes a more intense coupling but too small a gap makes the production difficult.

Moreover, the first resonant electrodes 30*a*, 30*b*, 30*c*, and 30*d* arranged side by side are arranged with their one ends as well as their other ends displaced in relation to each other in a staggered manner. Since the resonant electrodes are coupled to each other in an interdigital form, a magnetic-field coupling and an electric-field coupling are added, and a more intense coupling than a comb-line coupling is generated. Accordingly, in a pass band formed by the first resonant electrodes 30*a*, 30*b*, 30*c*, and 30*d*, the frequency interval between the resonance frequencies in each resonance mode can be made appropriate for obtaining a very wide pass bandwidth in which the fractional bandwidth is approximately 40% to 50%, which is much wider than a region that can be realized by a conventional filter using a quarter-wavelength resonator.

In a similar manner, the second resonant electrodes 31*a*, 31*b*, 31*c*, and 31*d* arranged side by side are arranged with their one ends as well as their other ends displaced in relation to each other in a staggered manner. Since the resonant electrodes are coupled to each other in an interdigital form, in a pass band formed by the second resonant electrodes 31*a*, 31*b*, 31*c*, and 31*d*, the frequency interval between the resonance frequencies in each resonance mode can be set so as to be suitable for obtaining a very wide pass bandwidth in which the fractional bandwidth is approximately 40% to 50%, which is much wider than a region that can be realized by a conventional filter using a quarter-wavelength resonator.

Here, it was seen from investigations that, in the case where resonant electrodes forming one pass band are broadside-coupled and interdigitally-coupled to each other, the coupling is too intense, which is not preferable for obtaining a pass bandwidth in which the fractional bandwidth is approximately 40% to 50%.

Furthermore, in the diplexer of this embodiment, the input coupling electrode 40*a* is disposed on a third interlayer of the multilayer body 10 located between the first interlayer and the second interlayer, faces the input-stage first resonant electrode 30*a* of the first resonant electrodes 30*a*, 30*b*, 30*c*, and 30*d*, over more than half of an entire longitudinal area thereof for electromagnetic-field coupling, and faces the input-stage second resonant electrode 31*a*, over more than half of an entire longitudinal area thereof for electromagnetic-field coupling. Moreover, in the longitudinal direction of the input coupling electrode 40*a*, the electric signal input point 45*a* for receiving input of an electric signal from an external circuit is located closer to the other end of the input-stage first resonant electrode 30*a* than the center of the part facing the input-stage first resonant electrode 30*a*, and closer to the other end of the input-stage second resonant electrode 31*a* than the center of the part facing the input-stage second resonant electrode 31*a*. With this configuration, the input coupling electrode 40*a* is broadside-coupled and interdigitally-coupled to the input-stage first resonant electrode 30*a* and the input-stage second resonant electrode 31*a*. Thus, these electrodes make electromagnetic-field coupling intensively by a broadside coupling, and make electromagnetic-field coupling more intensively by an interdigital coupling in which an electric-field coupling and a magnetic-field coupling are added. Accordingly, the input coupling electrode 40*a*, and the input-stage first resonant electrode 30*a* and the input-stage second resonant electrode 31*a* can be very intensively coupled.

Furthermore, in the diplexer of this embodiment, the first output coupling electrode 40*b* is disposed on a third interlayer of the multilayer body 10 different from the first interlayer, and faces the output-stage first resonant electrode 30*b*, over more than half of an entire longitudinal area thereof for electromagnetic-field coupling. Furthermore, in the first output coupling electrode 40*b*, the first electric signal output point 45*b* for producing output of an electric signal toward an external circuit is located closer to the other end of the output-stage first resonant electrode 30*b* than the center of the part facing the output-stage first resonant electrode 30*b*. With this configuration, the first output coupling electrode 40*b* and the output-stage first resonant electrode 30*b* make electromagnetic-field coupling intensively by a broadside coupling through the dielectric layers 11, and are coupled to each other in an interdigital form, and, thus, a magnetic-field coupling and an electric-field coupling are added, and the electromagnetic coupling becomes more intense.

Moreover, in the diplexer of this embodiment, the second output coupling electrode 40*c* is disposed on a third interlayer of the multilayer body 10 different from the second interlayer, and faces the output-stage second resonant electrode 31*b*, over more than half of an entire longitudinal area thereof for electromagnetic-field coupling. In the second output coupling electrode 40*c*, the second electric signal output point 45*c* for producing output of an electric signal toward an external circuit is located closer to the other end of the output-stage second resonant electrode 31*b* than the center of the part facing the output-stage second resonant electrode 31*b*. With this configuration, the second output coupling electrode 40*c* and the output-stage second resonant electrode 31*b* make electromagnetic-field coupling intensively by a broadside coupling through the dielectric layers 11, and are coupled to each other in an interdigital form, and, thus, a magnetic-field coupling and an electric-field coupling are added, and the electromagnetic coupling becomes more intense.

In this manner, according to the diplexer of this embodiment, the input coupling electrode 40*a*, and the input-stage first resonant electrode 30*a* and the input-stage second resonant electrode 31*a* make electromagnetic-field coupling very intensively, the first output coupling electrode 40*b* and the output-stage first resonant electrode 30*b* make electromagnetic-field coupling very intensively, and the second output coupling electrode 40*c* and the output-stage second resonant electrode 31*b* make electromagnetic-field coupling very intensively. Accordingly, throughout two entire very wide pass bands respectively formed by the first resonant electrodes 30*a*, 30*b*, 30*c*, and 30*d* and the second resonant electrodes 31*a*, 31*b*, 31*c*, and 31*d*, a pass characteristic can be obtained in which the form is flat and the loss is low, and in which an increase in the insertion loss at a frequency located between the resonance frequencies in each resonance mode is small.

Here, in the diplexer of this embodiment, the one end of the input-stage first resonant electrode 30*a* and the one end of the input-stage second resonant electrode 31*a* are located on the same side. Thus, in this manner, the input coupling electrode 40*a*, and the input-stage first resonant electrode 30*a* and the input-stage second resonant electrode 31*a* can be broadside-coupled and interdigitally-coupled to each other.

Moreover, according to the diplexer of this embodiment, the first output coupling electrode 40*b* and the second output coupling electrode 40*c* in a plan view are located on the opposite sides with the input coupling electrode 40*a* interposed therebetween. Accordingly, the electromagnetic coupling between the first resonant electrodes 30*a*, 30*b*, 30*c*, and 30*d* and the second resonant electrodes 31*a*, 31*b*, 31*c*, and 31*d* can be attenuated, and, thus, good isolation between the first resonant electrodes 30*a*, 30*b*, 30*c*, and 30*d* and the second resonant electrodes 31*a*, 31*b*, 31*c*, and 31*d* can be secured.

Moreover, according to the diplexer of this embodiment, in the first resonant electrodes 30*a*, 30*b*, 30*c*, and 30*d* and the second resonant electrodes 31*a*, 31*b*, 31*c*, and 31*d*, the input-stage first resonant electrode 30*a* and the input-stage second resonant electrode 31*a* face each other with the input coupling electrode 40*a* interposed therebetween, and the first resonant electrodes 30*b*, 30*c*, and 30*d* and the second resonant electrodes 31*b*, 31*c*, and 31*d* other than the first resonant electrode 30*a* and the second resonant electrode 31*a* are arranged so as to be sequentially away therefrom. Thus, the input coupling electrode 40*a*, and the input-stage first resonant electrode 30*a* and the input-stage second resonant electrode 31*a* are broadside-coupled, and the isolation between the first resonant electrodes 30*a*, 30*b*, 30*c*, and 30*d* and the second resonant electrodes 31*a*, 31*b*, 31*c*, and 31*d* can be secured at a maximum. Accordingly, a diplexer can be obtained in which both of two wide pass bands have a flat and low-loss pass characteristic, and in which the isolation between the first output terminal electrode 60*b* and the second output terminal electrode 60*c* is sufficiently secured.

Here, the gap between the input coupling electrode 40*a*, and the input-stage first resonant electrode 30*a* and the input-stage second resonant electrode 31*a*, the gap between the first output coupling electrode 40*b* and the output-stage first resonant electrode 30*b*, and the gap between the second output coupling electrode 40*c* and the output-stage second resonant electrode 31*b* are set to, for example, approximately 0.01 to 0.5 mm, because a smaller gap realizes a more intense coupling but too small a gap makes the production difficult.

Furthermore, in the diplexer of this embodiment, on the first interlayer of the multilayer body 10, the first annular ground electrode 23 is formed in the annular shape so as to surround the first resonant electrodes 30*a*, 30*b*, 30*c*, and 30*d*, and is connected to the one ends, respectively, of the first resonant electrodes 30*a*, 30*b*, 30*c*, and 30*d*. Furthermore, on the second interlayer, the second annular ground electrode 24 is formed in the annular shape so as to surround the second resonant electrodes 31*a*, 31*b*, 31*c*, and 31*d*, and is connected to the one ends, respectively, of the second resonant electrodes 31*a*, 31*b*, 31*c*, and 31*d*. With this configuration, electrodes are provided that are connected to a ground potential on both sides in the longitudinal direction of both of the first resonant electrodes 30*a*, 30*b*, 30*c*, and 30*d* and the second resonant electrodes 31*a*, 31*b*, 31*c*, and 31*d*, and, thus, the one ends of the resonant electrodes that are displaced in relation to each other in a staggered manner can be easily connected to a ground potential. Furthermore, the first annular ground electrode 23 in the annular shape surrounds the first resonant electrodes 30*a*, 30*b*, 30*c*, and 30*d*, and the second annular ground electrode 24 in the annular shape surrounds the second resonant electrodes 31*a*, 31*b*, 31*c*, and 31*d*, and, thus, outside leakage of electromagnetic waves generated by the first resonant electrodes 30*a*, 30*b*, 30*c*, and 30*d* and the second resonant electrodes 31*a*, 31*b*, 31*c*, and 31*d* can be reduced. These effects are particularly useful in the case where a diplexer is formed in a partial region on a module substrate, in order to prevent the other regions of the module substrate from being negatively influenced.

Furthermore, in the diplexer of this embodiment, the first resonant electrode coupling conductor 71 is disposed on a fourth interlayer of the multilayer body 10 located on the side opposite the third interlayer with the first interlayer interposed therebetween, has its one end connected to a ground potential close to the one end of the frontmost-stage first resonant electrode 30*a* forming a first resonant electrode group including four adjacent first resonant electrodes 30*a*, 30*b*, 30*c*, and 30*d*, has its another end connected to a ground potential close to the one end of the rearmost-stage first resonant electrode 30*b* forming the first resonant electrode group, and has a region facing the one end of the frontmost-stage first resonant electrode 30*a* for electromagnetic-field coupling and a region facing the one end of the rearmost-stage first resonant electrode 30*b* for electromagnetic-field coupling. The second resonant electrode coupling conductor 72 is disposed on a fifth interlayer of the multilayer body 10 located on the side opposite the third interlayer with the second interlayer interposed therebetween, has its one end connected to a ground potential close to the one end of the frontmost-stage second resonant electrode 31*a* forming a second resonant electrode group including four adjacent second resonant electrodes 31*a*, 31*b*, 31*c*, and 31*d*, has its another end connected to a ground potential close to the one end of the rearmost-stage second resonant electrode 31*b* forming the second resonant electrode group, and has a region facing the one end of the frontmost-stage second resonant electrode 31*a* for electromagnetic-field coupling and a region facing the one end of the rearmost-stage second resonant electrode 31*b* for electromagnetic-field coupling. With this configuration, a phenomenon in which signals transferred through an inductive coupling between the frontmost-stage first resonant electrode 30*a* and the rearmost-stage first resonant electrode 30*b* of the first resonant electrode group via the first resonant electrode coupling conductor 71, and signals transferred through a capacitive coupling between adjacent first resonant electrodes have a phase difference of 180° and cancel each other occurs at a frequency near both ends of a pass band formed by the first resonant electrodes 30*a*, 30*b*, 30*c*, and 30*d*, and a phenomenon in which signals transferred through an inductive coupling between the frontmost-stage second resonant electrode 31*a* and the rearmost-stage second resonant electrode 31*b* of the second resonant electrode group via the second resonant electrode coupling conductor 72, and signals transferred through a capacitive coupling between adjacent second resonant electrodes have a phase difference of 180° and cancel each other occurs at a frequency near both ends of a pass band formed by the second resonant electrodes 31*a*, 31*b*, 31*c*, and 31*d*. Thus, in the pass characteristic of the diplexer, attenuation poles in which signals are hardly transferred can be formed near both ends of two pass bands formed by the first resonant electrodes and the second resonant electrodes.

Moreover, according to the diplexer of this embodiment, the first resonant electrode coupling conductor 71 includes the strip-like first front-stage side coupling region 71*a* that faces the frontmost-stage first resonant electrode 30*a* in parallel, the strip-like first rear-stage side coupling region 71*b* that faces the rearmost-stage first resonant electrode 30*b* in parallel, and the first connecting region 71*c* formed so as to be perpendicular to each of the first front-stage side coupling region 71*a* and the first rear-stage side coupling region 71*b*, for providing connection between these coupling regions. Furthermore, the second resonant electrode coupling conductor 72 includes the strip-like second front-stage side coupling region 72*a* that faces the frontmost-stage second resonant electrode 31*a* in parallel, the strip-like second rear-stage side coupling region 72*b* that faces the rearmost-stage second resonant electrode 31*b* in parallel, and the second connecting region 72*c* formed so as to be perpendicular to each of the second front-stage side coupling region 72*a* and the second rear-stage side coupling region 72*b*, for providing connection between these coupling regions. With this configuration, the following effects can be obtained. First, the magnetic-field coupling between the first front-stage side coupling region 71*a* and the frontmost-stage first resonant electrode 30*a*, the magnetic-field coupling between the first rear-stage side coupling region 71*b* and the rearmost-stage first resonant electrode 30*b*, the magnetic-field coupling between the second front-stage side coupling region 72*a* and the frontmost-stage second resonant electrode 31*a*, and the magnetic-field coupling between the second rear-stage side coupling region 72*b* and the rearmost-stage second resonant electrode 31*b* can be intensified. Furthermore, the magnetic-field coupling between the frontmost-stage first resonant electrode 30*a* and the rearmost-stage first resonant electrode 30*b*, and the first resonant electrodes and the first connecting region 71*c* located therebetween can be minimized, and, thus, an unintended deterioration of the electrical properties due to the electromagnetic coupling between the first resonant electrodes via the first connecting region 71*c* can be minimized. In a similar manner, the magnetic-field coupling between the frontmost-stage second resonant electrode 31*a* and the rearmost-stage second resonant electrode 31*b*, and the second resonant electrodes and the second connecting region 72*c* located therebetween can be minimized, and, thus, an unintended deterioration of the electrical properties due to the electromagnetic coupling between the second resonant electrodes via the second connecting region 72*c* can be minimized.

Furthermore, according to the diplexer of this embodiment, the first resonant electrode coupling conductor 71 has one end that is connected via the through conductor 50*p* to the first annular ground electrode 23 close to the one end of the frontmost-stage first resonant electrode 30*a* forming the first resonant electrode group, and has another end that is connected via the through conductor 50*q* to the first annular ground electrode 23 close to the one end of the rearmost-stage first resonant electrode 30*b* forming the first resonant electrode group. With this configuration, the electromagnetic coupling between the frontmost-stage first resonant electrode 30*a* forming the first resonant electrode group and the rearmost-stage first resonant electrode 30*b* forming the first resonant electrode group via the first resonant electrode coupling conductor 71 can be further intensified, and, thus, the attenuation poles formed on both sides of a pass band formed by the first resonant electrodes 30*a*, 30*b*, 30*c*, and 30*d* can be made closer to the pass band. Accordingly, the attenuation in a stop band near the pass band can be further increased.

In a similar manner, according to the diplexer of this embodiment, the second resonant electrode coupling conductor 72 has one end that is connected via the through conductor 50*v* to the second annular ground electrode 24 close to the one end of the frontmost-stage second resonant electrode 31*a* forming the second resonant electrode group, and has another end that is connected via the through conductor 50*w* to the second annular ground electrode 24 close to the one end of the rearmost-stage second resonant electrode 31*b* forming the second resonant electrode group. With this configuration, the electromagnetic coupling between the frontmost-stage second resonant electrode 31*a* forming the second resonant electrode group and the rearmost-stage second resonant electrode 31*b* forming the second resonant electrode group via the second resonant electrode coupling conductor 72 can be further intensified, and, thus, the attenuation poles formed on both sides of a pass band formed by the second resonant electrodes 31*a*, 31*b*, 31*c*, and 31*d* can be made closer to the pass band. Accordingly, the attenuation in a stop band near the pass band can be further increased.

Eighteenth Embodiment

Figure 58:
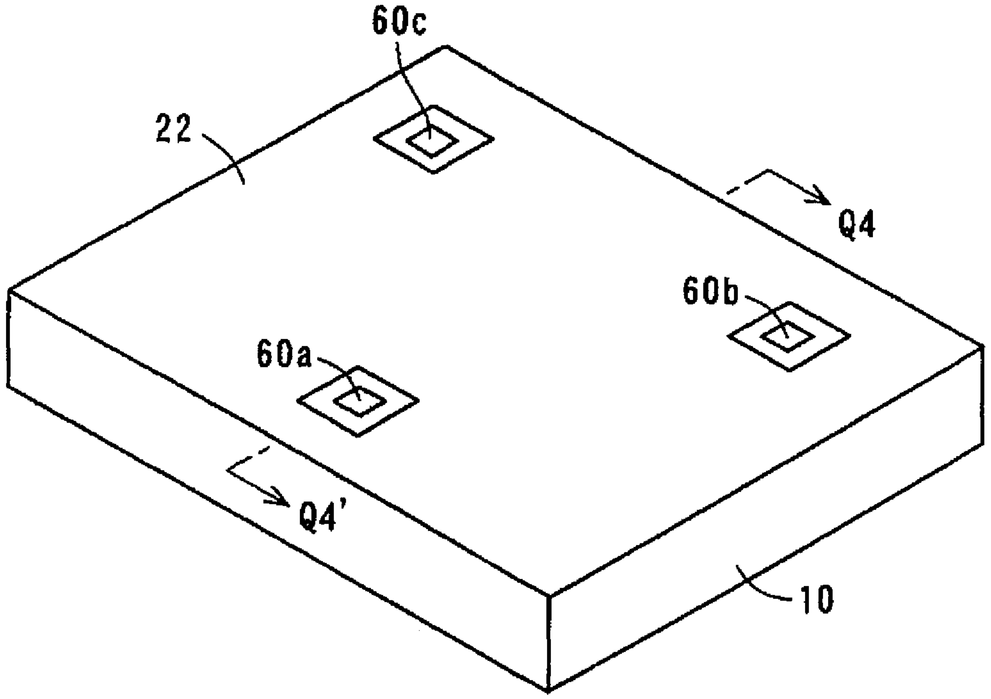
FIG. 58 is an external perspective view schematically showing a diplexer according to an eighteenth embodiment of the invention.
Figure 59:
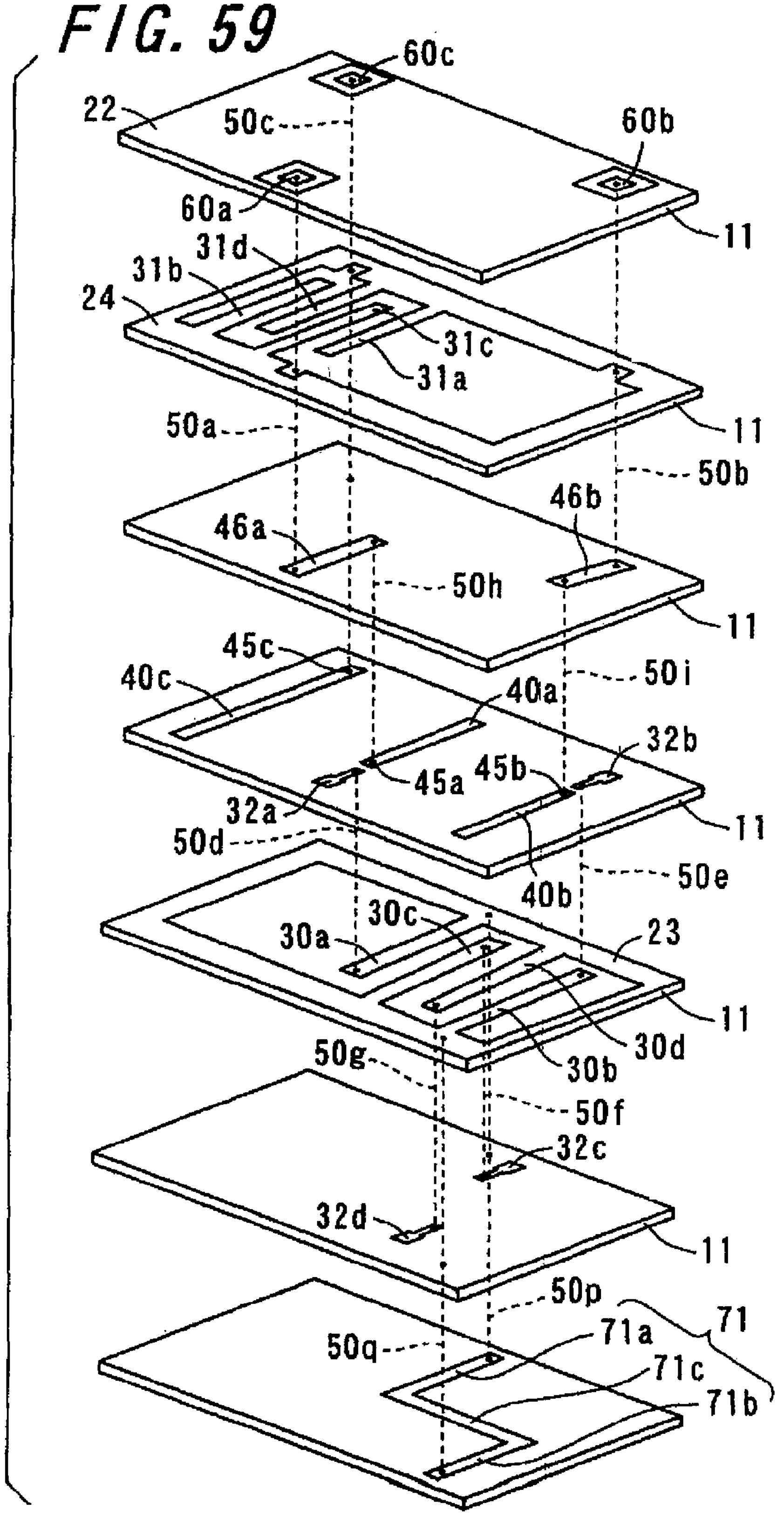
FIG. 59 is a schematic exploded perspective view of the diplexer shown in FIG. 58.
Figure 60:
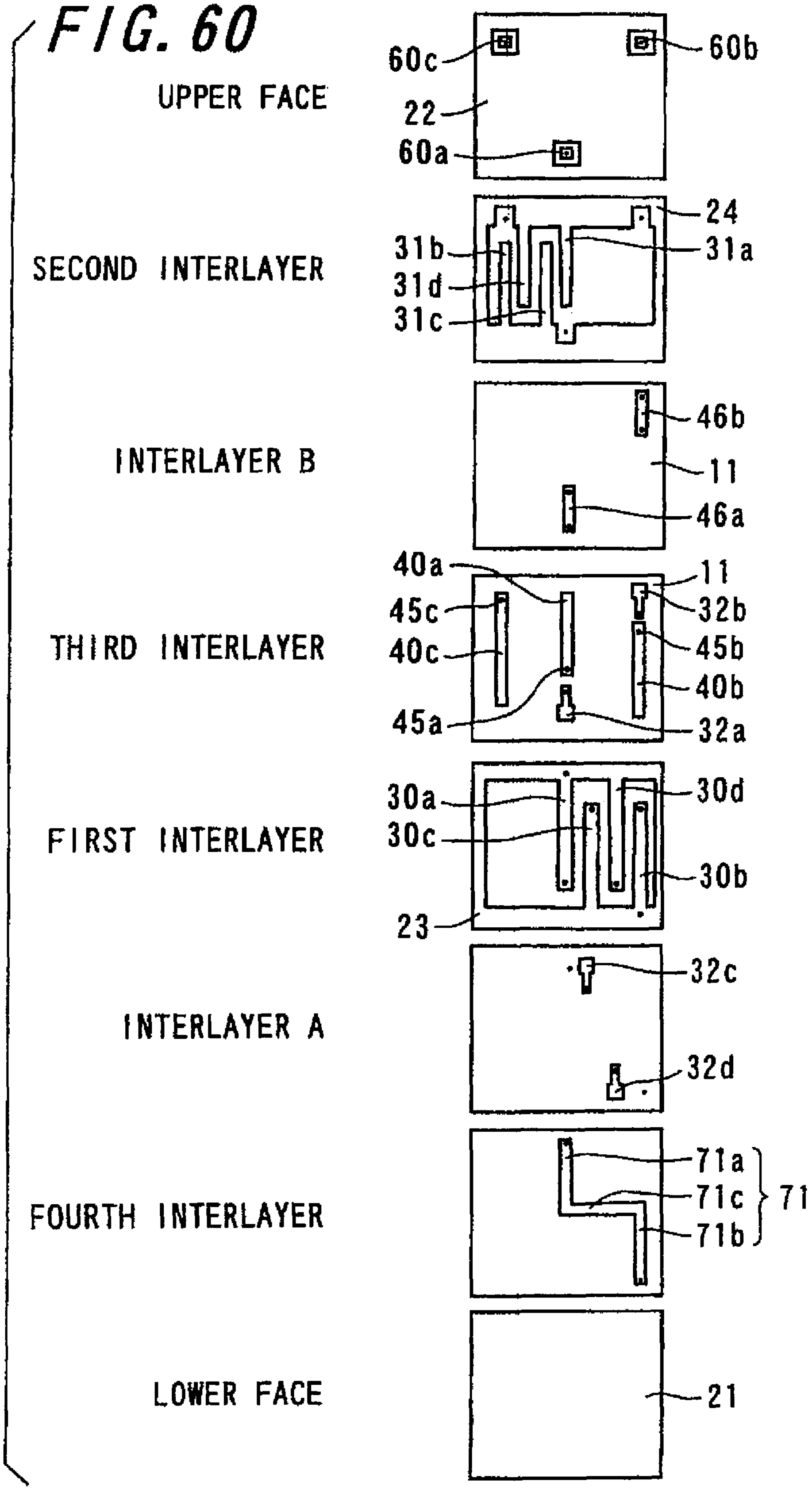
FIG. 60 is a plan view schematically showing upper and lower faces and interlayers of the diplexer shown in FIG. 58.
Figure 61:
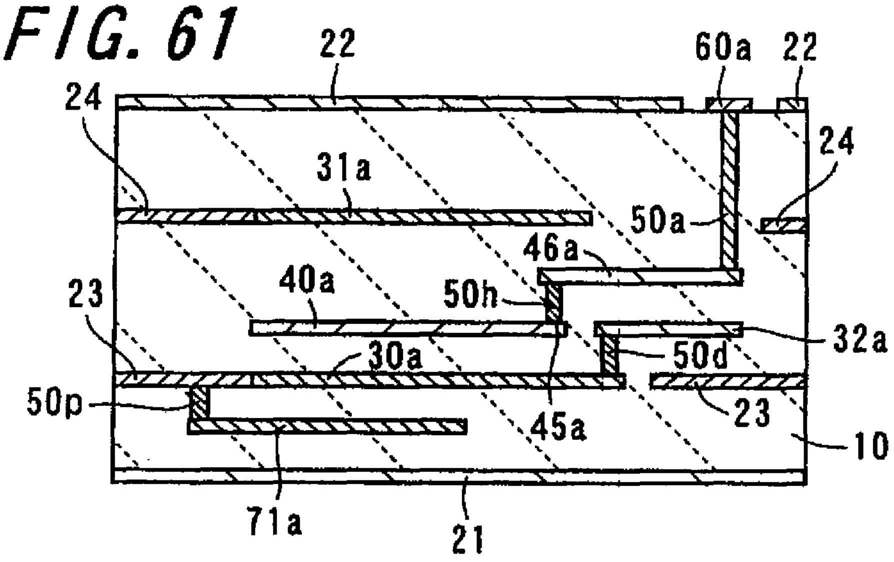
FIG. 61 is a cross-sectional view taken along line Q4-Q4' of FIG. 58.

FIG. 58 is an external perspective view schematically showing a diplexer according to an eighteenth embodiment of the invention. FIG. 59 is a schematic exploded perspective view of the diplexer shown in FIG. 58. FIG. 60 is a plan view schematically showing upper and lower faces and interlayers of the diplexer shown in FIG. 58. FIG. 61 is a cross-sectional view taken along line Q4-Q4' of FIG. 58. Note that the following description deals with in what way this embodiment differs from the above-mentioned seventeenth embodiment, and the constituent components thereof that play the same or corresponding roles as in the preceding embodiment will be denoted by the same reference numerals and overlapping descriptions will be omitted.

As shown in FIGS. 58 to 61, the diplexer of this embodiment comprises, on the third interlayer of the multilayer body 10, an input-stage auxiliary resonant electrode 32*a* that is disposed so as to have a region facing the first annular ground electrode 23, and connected via the through conductor 50*d* to an open end of the input-stage first resonant electrode 30*a*, and an output-stage auxiliary resonant electrode 32*b* that is disposed so as to have a region facing the first annular ground electrode 23, and connected via the through conductor 50*e* to an open end of the output-stage first resonant electrode 30*b*. Further, the diplexer of this embodiment comprises, on an interlayer A of the multilayer body 10 located between the first interlayer and the fourth interlayer, auxiliary resonant electrodes 32*c* and 32*d* that are disposed so as to have a region facing the first annular ground electrode 23, and connected via through conductors 50*f* and 50*g* to the other ends of the first resonant electrodes 30*c* and 30*d*.

Furthermore, the diplexer of this embodiment comprises, on an interlayer B of the multilayer body 10 located between the second interlayer and the third interlayer, an auxiliary input coupling electrode 46*a* that is disposed so as to have a region facing the input-stage auxiliary resonant electrode 32*a*, and connected via the through conductor 50*h* to the electric signal input point 45*a* of the input coupling electrode 40*a*, and an auxiliary output coupling electrode 46*b* that is disposed so as to have a region facing the output-stage auxiliary resonant electrode 32*b*, and connected via the through conductor 50*i* to the first electric signal output point 45*b* of the first output coupling electrode 40*b*. Furthermore, the auxiliary input coupling electrode 46*a* that is connected via the through conductor 50*h* to the input coupling electrode 40*a*, is connected via the through conductor 50*a* to the input terminal electrode 60*a*. The auxiliary output coupling electrode 46*b* that is connected via the through conductor 50*i* to the first output coupling electrode 40*b*, is connected via the through conductor 50*b* to the first output terminal electrode 60*b*. Note that, the diplexer of this embodiment does not comprise the second resonant electrode coupling conductor 72.

According to the thus configured diplexer of this embodiment, on the third interlayer and the interlayer A of the multilayer body 10 different from the first interlayer, the auxiliary resonant electrodes 32*a*, 32*b*, 32*c*, and 32*d* that are respectively connected via the through conductors 50*d*, 50*e*, 50*f*, and 50*g* to the other ends of the first resonant electrodes 30*a*, 30*b*, 30*c*, and 30*d*, are arranged so as to have a region facing the first annular ground electrode 23. With this configuration, in a part in which the auxiliary resonant electrodes 32*a*, 32*b*, 32*c*, and 32*d*, and the first annular ground electrode 23 face each other, an electrostatic capacitance is generated between these electrodes, and, is added to an electrostatic capacitance generated between the ground potential and the first resonant electrodes 30*a*, 30*b*, 30*c*, and 30*d* that are connected to the auxiliary resonant electrodes 32*a*, 32*b*, 32*c*, and 32*d*, respectively, and thus, the lengths of the first resonant electrodes 30*a*, 30*b*, 30*c*, and 30*d* can be reduced, and a small diplexer can be obtained.

Here, an area of the part in which the auxiliary resonant electrodes 32*a*, 32*b*, 32*c*, and 32*d*, and the first annular ground electrode 23 face each other is set to, for example, approximately 0.01 to 3 $mm^2$, in view of the balance between a necessary size and an obtained electrostatic capacitance. The gap between the auxiliary resonant electrodes 32*a*, 32*b*, 32*c*, and 32*d*, and the first annular ground electrode 23 that face each other is set to, for example, approximately 0.01 to 0.5 mm, because a smaller gap realizes a larger electrostatic capacitance but too small a gap makes the production difficult.

Furthermore, according to this embodiment, the diplexer comprises, on the interlayer B of the multilayer body 10 between the second interlayer and the third interlayer, the auxiliary input coupling electrode 46*a* that is disposed so as to have a region facing the input-stage auxiliary resonant electrode 32*a*, and connected via the through conductor 50*h* to the electric signal input point 45*a* of the input coupling electrode 40*a*, and the auxiliary output coupling electrode 46*b* that is disposed so as to have a region facing the output-stage auxiliary resonant electrode 32*b*, and connected via the through conductor 50*i* to the first electric signal output point 45*b* of the first output coupling electrode 40*b*. With this configuration, an electromagnetic coupling is generated between the input-stage auxiliary resonant electrode 32*a* and the auxiliary input coupling electrode 46*a*, and is added to the electromagnetic coupling between the input-stage first resonant electrode 30*a* and the input coupling electrode 40*a*. In a similar manner, an electromagnetic coupling is generated between the output-stage auxiliary resonant electrode 32*b* and the auxiliary output coupling electrode 46*b*, and is added to the electromagnetic coupling between the output-stage first resonant electrode 30*b* and the first output coupling electrode 40*b*. Accordingly, the electromagnetic coupling between the input coupling electrode 40*a* and the input-stage first resonant electrode 30*a*, and the electromagnetic coupling between the first output coupling electrode 40*b* and the output-stage first resonant electrode 30*b* become more intense. Thus, in a pass band formed by the plurality of first resonant electrodes 30*a*, 30*b*, 30*c*, and 30*d*, even in a very wide pass bandwidth, a pass characteristic can be obtained in which the form is flatter and the loss is lower throughout the entire wide pass band, and in which an increase in the insertion loss at a frequency located between the resonance frequencies in each resonance mode is further reduced.

Further, according to the diplexer of this embodiment, the input-stage auxiliary resonant electrode 32*a* and the output-stage auxiliary resonant electrode 32*b* are respectively connected to the other ends of the input-stage first resonant electrode 30*a* and the output-stage first resonant electrode 30*b*, and extend to sides opposite the one ends of the input-stage first resonant electrode 30*a* and the output-stage first resonant electrode 30*b*. With this configuration, it is possible to increase the region in which a coupling body composed of the input-stage first resonant electrode 30*a* and the input-stage auxiliary resonant electrode 32*a* connected thereto and a coupling body composed of the input coupling electrode 40*a* and the auxiliary input coupling electrode 46*a* connected thereto face each other. In a similar manner, it is possible to increase the region in which a coupling body composed of the output-stage first resonant electrode 30*b* and the output-stage auxiliary resonant electrode 32*b* connected thereto and a coupling body composed of the first output coupling electrode 40*b* and the auxiliary output coupling electrode 46*b* connected thereto face each other. Accordingly, the coupling body composed of the input-stage first resonant electrode 30*a* and the input-stage auxiliary resonant electrode 32*a* connected thereto and the coupling body composed of the input coupling electrode 40*a* and the auxiliary input coupling electrode 46*a* connected thereto can intensively make electromagnetic-field coupling by a broadside coupling in a wide region as a whole. In a similar manner, the coupling body composed of the output-stage first resonant electrode 30*b* and the output-stage auxiliary resonant electrode 32*b* connected thereto and the coupling body composed of the first output coupling electrode 40*b* and the auxiliary output coupling electrode 46*b* connected thereto can intensively make electromagnetic-field coupling by a broadside coupling in a Wide region as a whole, thereby achieving more intense mutual electromagnetic-field coupling.

Furthermore, according to the diplexer of this embodiment, in the input coupling electrode 40*a*, the electric signal input point 45*a* of the input coupling electrode 40*a* that is connected via the through conductor 50*h* to the auxiliary input coupling electrode 46*a*, is located closer to the other end of the input-stage first resonant electrode 30*a* than the center of the part facing the input-stage first resonant electrode 30*a*, and closer to the other end of the input-stage second resonant electrode 31*a* than the center of the part facing the input-stage second resonant electrode 31*a*. In the first output coupling electrode 40*b*, the first electric signal output point 45*b* of the first output coupling electrode 40*b* that is connected via the through conductor 50*i* to the auxiliary output coupling electrode 46*b*, is located closer to the other end of the output-stage first resonant electrode 30*b* than the center of the part facing the output-stage first resonant electrode 30*b*. Accordingly, even in the case where an electric signal from an external circuit is inputted via the auxiliary input coupling electrode 46*a* to the input coupling electrode 40*a*, and an electric signal is outputted from the first output coupling electrode 40*b* via the auxiliary output coupling electrode 46*b* toward an external circuit, the input coupling electrode 40*a*, and the input-stage first resonant electrode 30*a* and the input-stage second resonant electrode 31*a* are coupled to each other in an interdigital form, and the first output coupling electrode 40*b* and the output-stage first resonant electrode 30*b* are coupled to each other in an interdigital form, and, thus, an intense coupling in which a magnetic-field coupling and an electric-field coupling are added can be generated.

Moreover, according to the diplexer of this embodiment, an end portion of the auxiliary input coupling electrode 46*a* on the side opposite the side that is connected via the through conductor 50*h* to the input coupling electrode 40*a*, is connected via the through conductor 50*a* to the input terminal electrode 60*a*. With this configuration, the coupling body composed of the input-stage first resonant electrode 30*a* and the input-stage auxiliary resonant electrode 32*a* connected thereto and the coupling body composed of the input coupling electrode 40*a* and the auxiliary input coupling electrode 46*a* connected thereto are coupled to each other in an interdigital form as a whole, and, thus, an intense coupling in which a magnetic-field coupling and an electric-field coupling are added can be generated. Thus, the coupling that can be realized is more intense than in the case where the end portion of the auxiliary input coupling electrode 46*a* on the same side in the longitudinal direction as the side that is connected to the input coupling electrode 40*a* is connected to the input terminal electrode 60*a*.

In a similar manner, according to the diplexer of this embodiment, an end portion of the auxiliary output coupling electrode 46*b* on the side opposite the side that is connected via the through conductor 50*i* to the first output coupling electrode 40*b*, is connected via the through conductor 50*b* to the first output terminal electrode 60*b*. With this configuration, the coupling body composed of the output-stage first resonant electrode 30*b* and the output-stage auxiliary resonant electrode 32*b* connected thereto and the coupling body composed of the first output coupling electrode 40*b* and the auxiliary output coupling electrode 46*b* connected thereto are coupled to each other in an interdigital form as a whole, and, thus, an intense coupling in which a magnetic-field coupling and an electric-field coupling are added can be generated. Thus, the coupling that can be realized is more intense than in the case where the end portion of the auxiliary output coupling electrode 46*b* on the same side in the longitudinal direction as the side that is connected to the first output coupling electrode 40*b* is connected to the first output terminal electrode 60*b*.

In this manner, the coupling body composed of the input-stage first resonant electrode 30*a* and the input-stage auxiliary resonant electrode 32*a* connected thereto and the coupling body composed of the input coupling electrode 40*a* and the auxiliary input coupling electrode 46*a* connected thereto are very intensively coupled to each other by the broadside coupling and the interdigital coupling as a whole. In a similar manner, the coupling body composed of the output-stage first resonant electrode 30*b* and the output-stage auxiliary resonant electrode 32*b* connected thereto and the coupling body composed of the first output coupling electrode 40*b* and the auxiliary output coupling electrode 46*b* connected thereto are very intensively coupled to each other by the broadside coupling and the interdigital coupling as a whole. Thus, in a pass band formed by the plurality of first resonant electrodes 30*a*, 30*b*, 30*c*, and 30*d*, even in a very wide pass band, a pass characteristic can be obtained in which the form is flatter and the loss is lower throughout the entire wide pass band, and in which an increase in the insertion loss at a frequency located between the resonance frequencies in each resonance mode is further reduced.

Here, the widths of the auxiliary input coupling electrode 46*a* and the auxiliary output coupling electrode 46*b* are set, for example, so as to be similar to those of the input coupling electrode 40*a* and the first output coupling electrode 40*b*, and the lengths of the auxiliary input coupling electrode 46*a* and the auxiliary output coupling electrode 46*b* are set, for example, so as to be slightly longer than those of the auxiliary resonant electrodes 32*a* and 32*b*. The gap between the auxiliary input coupling electrode 46*a* and the auxiliary output coupling electrode 46*b*, and the auxiliary resonant electrodes 32*a* and 32*b* is set to, for example, approximately 0.01 to 0.5 mm, because a smaller gap realizes an intense coupling, which is desirable, but too small a gap makes the production difficult.

Nineteenth Embodiment

Figure 62:
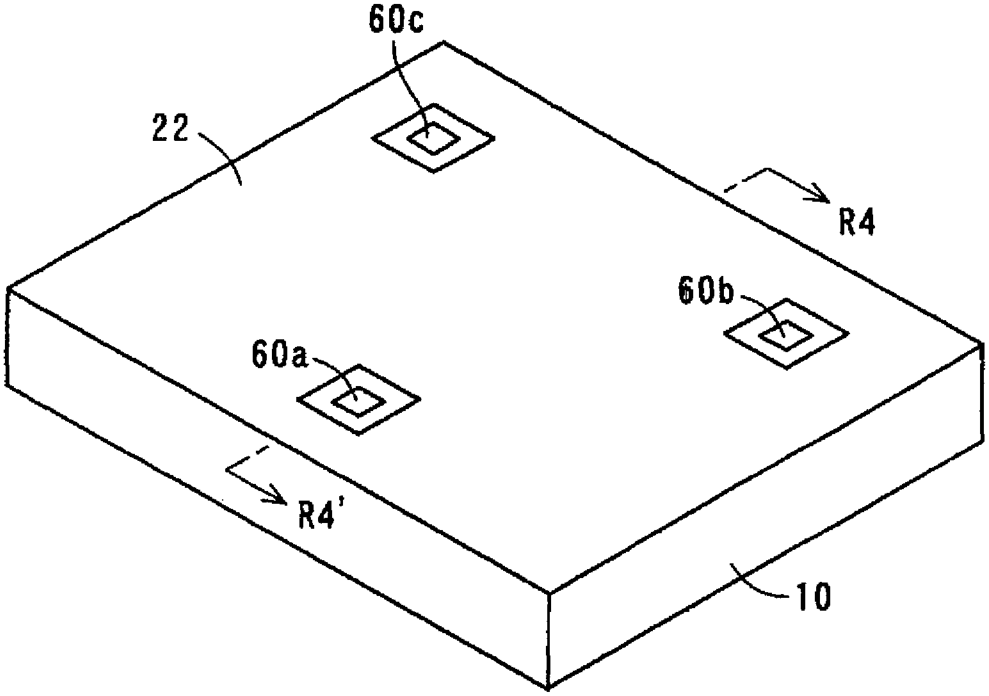
FIG. 62 is an external perspective view schematically showing a diplexer according to a nineteenth embodiment of the invention.
Figure 63:
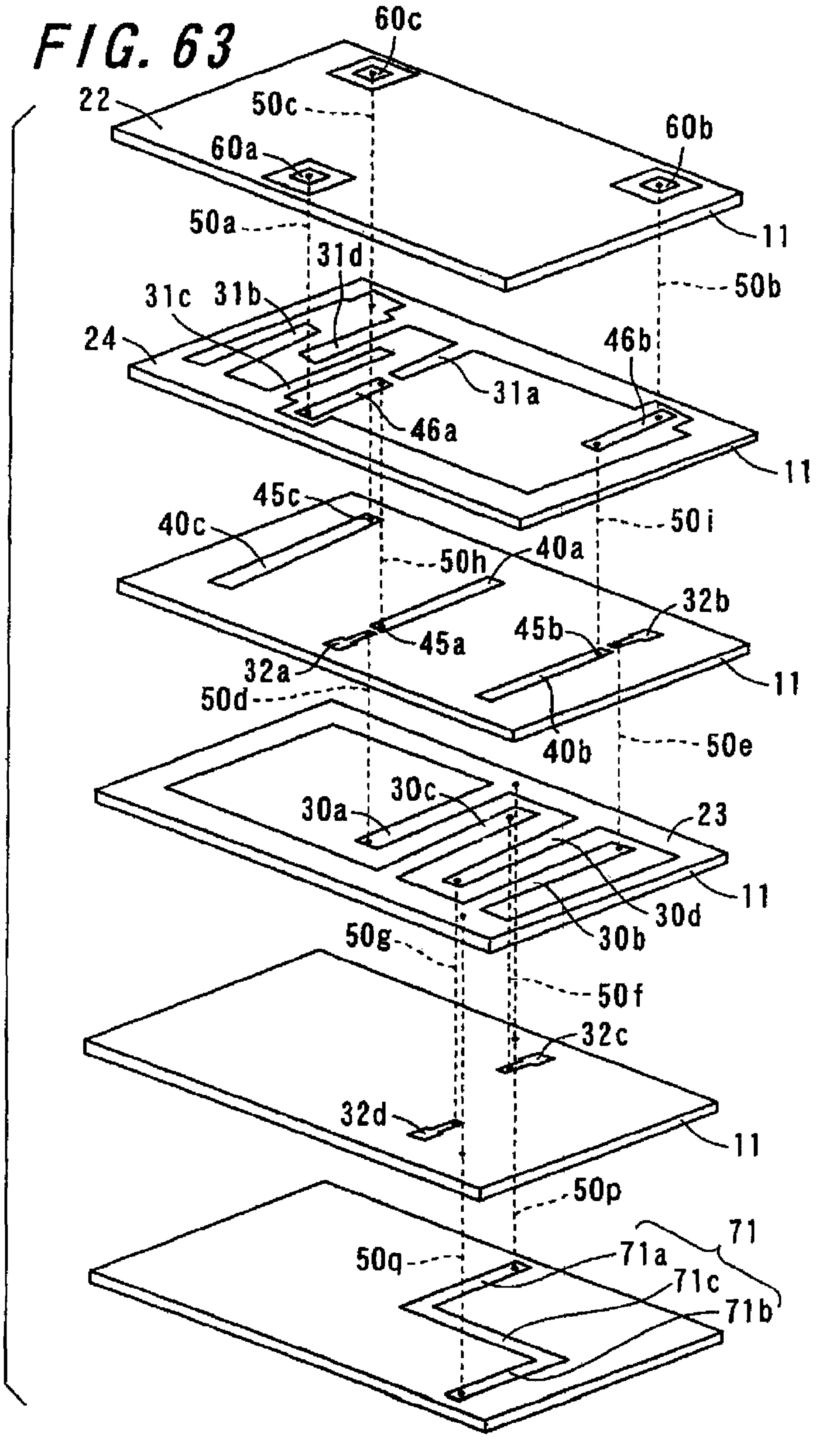
FIG. 63 is a schematic exploded perspective view of the diplexer shown in FIG. 62.
Figure 64:
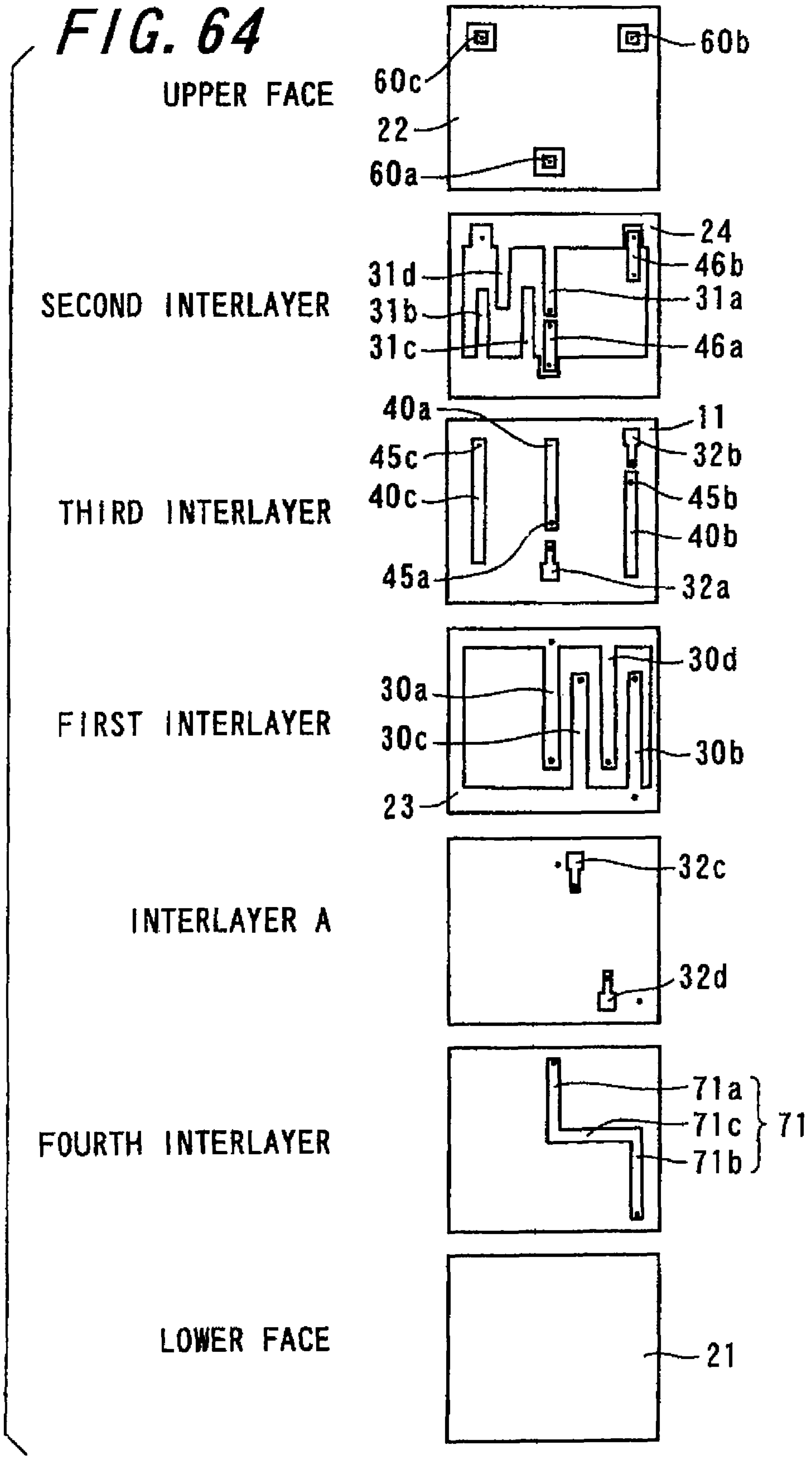
FIG. 64 is a plan view schematically showing upper and lower faces and interlayers of the diplexer shown in FIG. 62.
Figure 65:
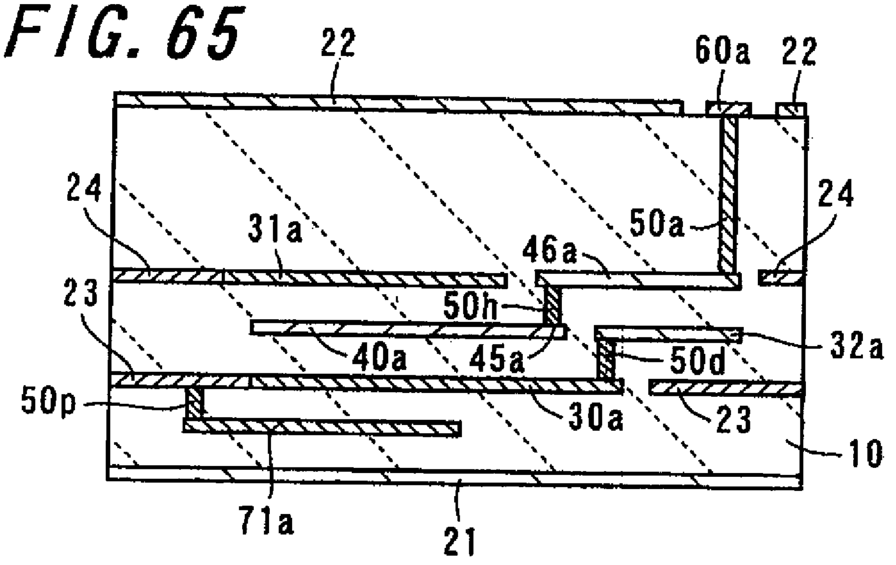
FIG. 65 is a cross-sectional view taken along line R4-R4' of FIG. 62.

FIG. 62 is an external perspective view schematically showing a diplexer according to a nineteenth embodiment of the invention. FIG. 63 is a schematic exploded perspective view of the diplexer shown in FIG. 62. FIG. 64 is a plan view schematically showing upper and lower faces and interlayers of the diplexer shown in FIG. 62. FIG. 65 is a cross-sectional view taken along line R4-R4' of FIG. 62. Note that the following description deals with in what way this embodiment differs from the above-mentioned eighteenth embodiment, and the constituent components thereof that play the same or corresponding roles as in the preceding embodiment will be denoted by the same reference numerals and overlapping descriptions will be omitted.

In the diplexer of this embodiment, as shown in FIGS. 62 to 65, on the second interlayer of the multilayer body 10 bearing the second resonant electrodes 31*a*, 31*b*, 31*c*, and 31*d* and the second annular ground electrode 24, the auxiliary input coupling electrode 46*a* and the auxiliary output coupling electrode 46*b* are disposed.

According to the thus configured diplexer of this embodiment, in comparison with the diplexer of the above-mentioned eighteenth embodiment, the input coupling electrode 40*a* and the second output coupling electrode 40*c*, and the input-stage second resonant electrode 31*a* and the output-stage second resonant electrode 31*b* are disposed close to each other with ease. Thus, a more intense electromagnetic-field coupling between the input coupling electrode 40*a* and the second output coupling electrode 40*c*, and the input-stage second resonant electrode 31*a* and the output-stage second resonant electrode 31*b* is easily generated. Accordingly, in a pass band formed by the second resonant electrodes 31*a*, 31*b*, 31*c*, and 31*d*, a pass characteristic of the diplexer is easily obtained in which the form is flatter and the loss is lower.

Twentieth Embodiment

Figure 66:
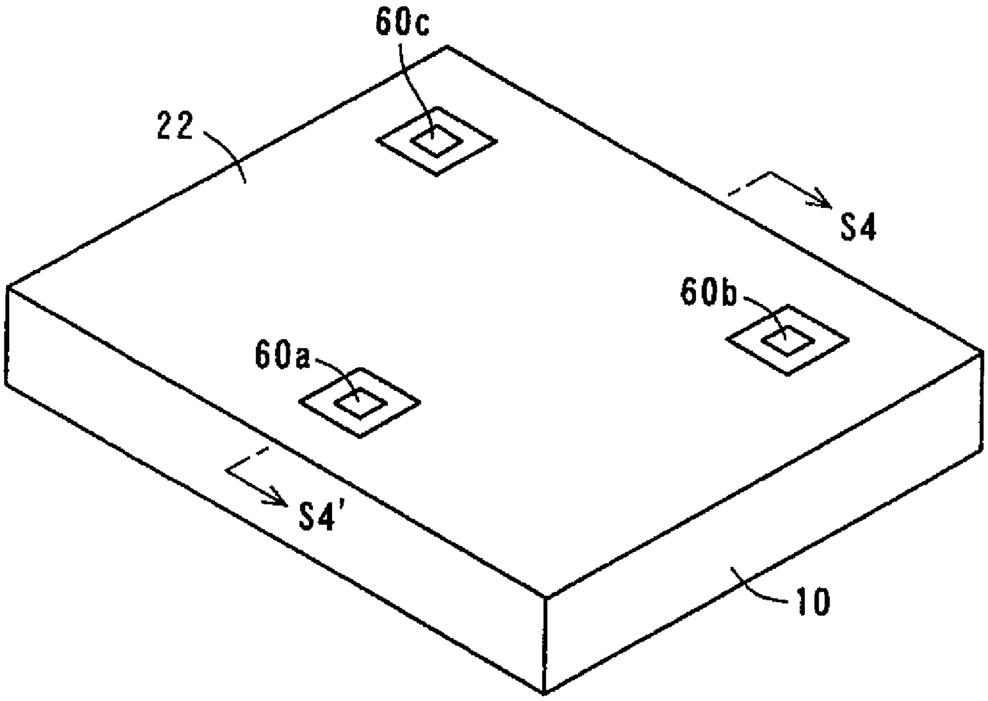
FIG. 66 is an external perspective view schematically showing a diplexer according to a twentieth embodiment of the invention.
Figure 67:
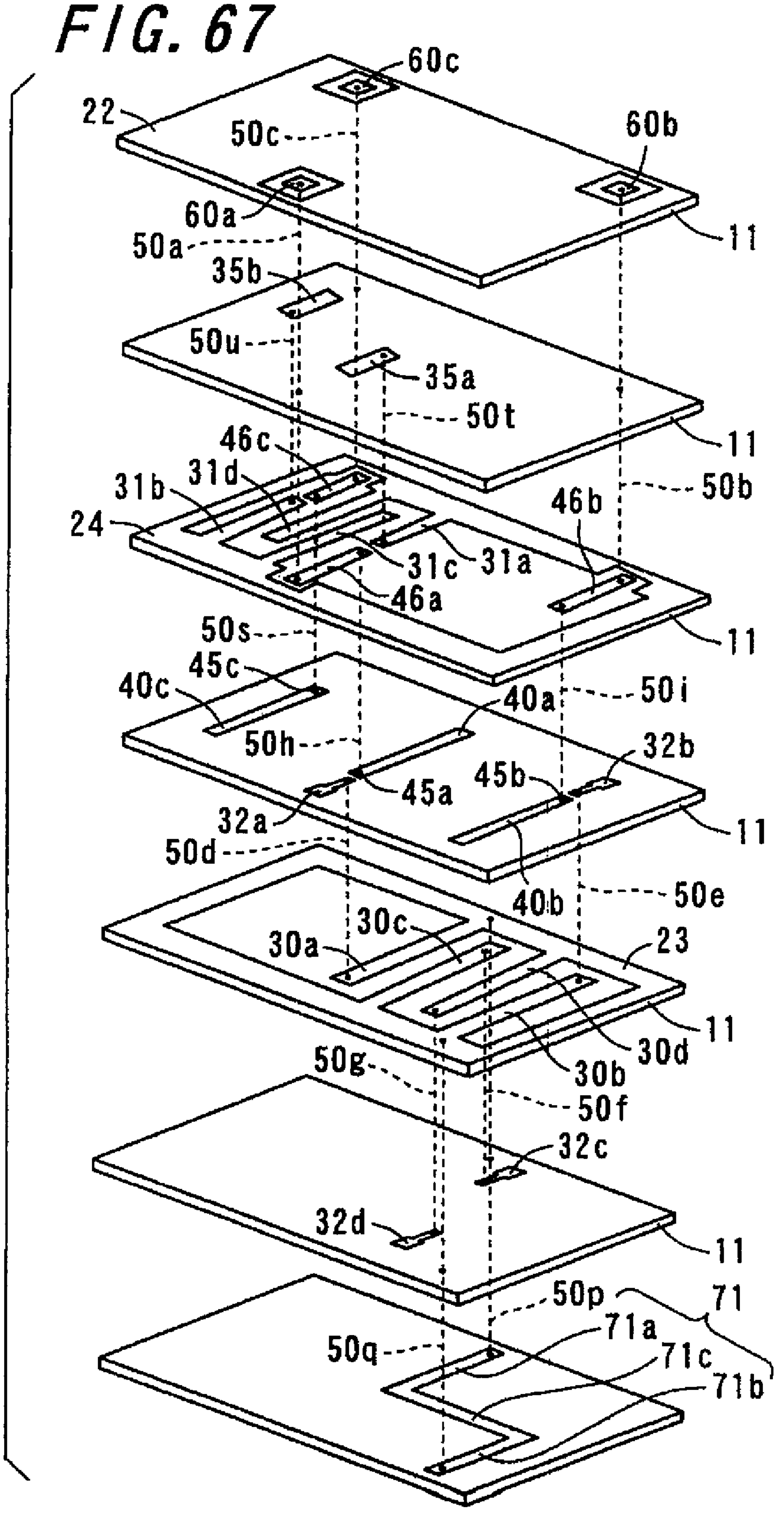
FIG. 67 is a schematic exploded perspective view of the diplexer shown in FIG. 66.
Figure 68:
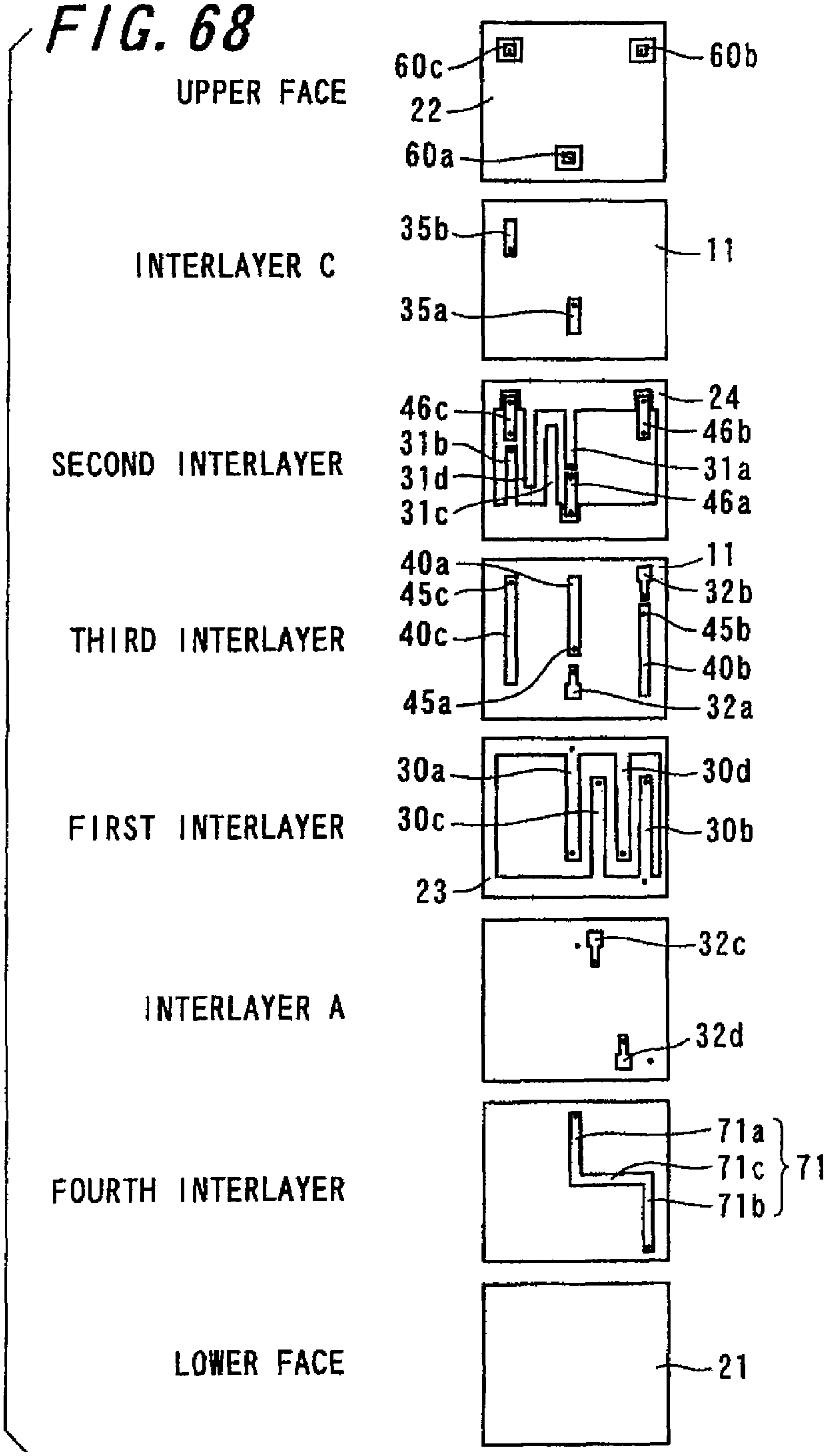
FIG. 68 is a plan view schematically showing upper and lower faces and interlayers of the diplexer shown in FIG. 66.
Figure 69:
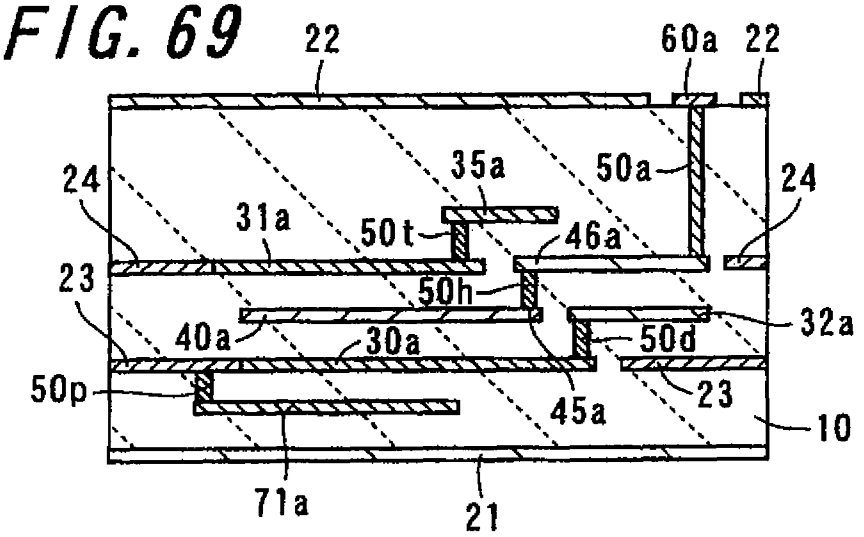
FIG. 69 is a cross-sectional view taken along line S4-S4' of FIG. 66.

FIG. 66 is an external perspective view schematically showing a diplexer according to a twentieth embodiment of the invention. FIG. 67 is a schematic exploded perspective view of the diplexer shown in FIG. 66. FIG. 68 is a plan view schematically showing upper and lower faces and interlayers of the diplexer shown in FIG. 66. FIG. 69 is a cross-sectional view taken along line S4-S4' of FIG. 66. Note that the following description deals with in what way this embodiment differs from the above-mentioned nineteenth embodiment, and the constituent components thereof that play the same or corresponding roles as in the preceding embodiment will be denoted by the same reference numerals and overlapping descriptions will be omitted.

The diplexer of this embodiment, as shown in FIGS. 66 to 69, comprises, a second auxiliary output coupling electrode 46*c* that is disposed between the other end of the output-stage second resonant electrode 31*b* and the second annular ground electrode 24 which are disposed on the second interlayer of the multilayer body 10, has its one end connected via a through conductor 50*s* to the second electric signal output point 45*c* of the second output coupling electrode 40*c*, and has its another end connected via the through conductor 50*c* to the second output terminal electrode 60*c*. Furthermore, the diplexer of this embodiment comprises, on an interlayer C of the multilayer body 10 located between the upper face of the multilayer body 10 and the second interlayer, a strip-like first auxiliary resonant coupling electrode 35*a* that is disposed so as to have a region facing the auxiliary input coupling electrode 46*a*, and connected via a through conductor 50*t* to the other end of the input-stage second resonant electrode 31*a*, and a strip-like second auxiliary resonant coupling electrode 35*b* that is disposed so as to have a region facing the second auxiliary output coupling electrode 46*c*, and connected via a through conductor 50*u* to the other end of the output-stage second resonant electrode 31*b*.

According to the thus configured diplexer of this embodiment, intense electromagnetic-field coupling between the first auxiliary resonant coupling electrode 35*a* and the auxiliary input coupling electrode 46*a* by a broadside coupling is generated, and is added to electromagnetic-field coupling between the input-stage second resonant electrode 31*a* and the input coupling electrode 40*a*. In a similar manner, intense electromagnetic-field coupling between the second auxiliary resonant coupling electrode 35*b* and the second auxiliary output coupling electrode 46*c* by a broadside coupling is generated, and is added to electromagnetic-field coupling between the output-stage second resonant electrode 31*b* and the second output coupling electrode 40*c*. Therefore, it is possible to further intensify the electromagnetic-field coupling between the input coupling electrode 40*a* and the input-stage second resonant electrode 31*a*, and the electromagnetic-field coupling between the second output coupling electrode 40*c* and the output-stage second resonant electrode 31*b*.

Further, according to the diplexer of this embodiment, the first auxiliary resonant coupling electrode 35*a* has its one end connected to the other end of the input-stage second resonant electrode 31*a*, and extends to a side opposite the one end of the input-stage second resonant electrode 31*a*. The second auxiliary resonant coupling electrode 35*b* has its one end connected to the other end of the output-stage second resonant electrode 31*b*, and extends to a side opposite the one end of the output-stage second resonant electrode 31*b*. With this configuration, a coupling body composed of the input-stage second resonant electrode 31*a* and the first auxiliary resonant coupling electrode 35*a* connected thereto and a coupling body composed of the input coupling electrode 40*a* and the auxiliary input coupling electrode 46*a* connected thereto are coupled to each other in an interdigital form as a whole. In a similar, manner, a coupling body composed of the output-stage second resonant electrode 31*b* and the second auxiliary resonant coupling electrode 35*b* connected thereto and a coupling body composed of the second output coupling electrode 40*c* and the second auxiliary output coupling electrode 46*c* connected thereto are coupled to each other in an interdigital form as a whole. Therefore, a magnetic-filed coupling and an electric-field coupling are added, and a more intense coupling is generated. Thus, in a pass band formed by the plurality of first resonant electrodes 30*a*, 30*b*, 30*c*, and 30*d*, even in a very wide pass bandwidth, a pass characteristic can be obtained in which the form is flatter and the loss is lower throughout the entire wide pass band, and in which an increase in the insertion loss at a frequency located between the resonance frequencies in each resonance mode is further reduced.

Twenty-First Embodiment

Figure 70:
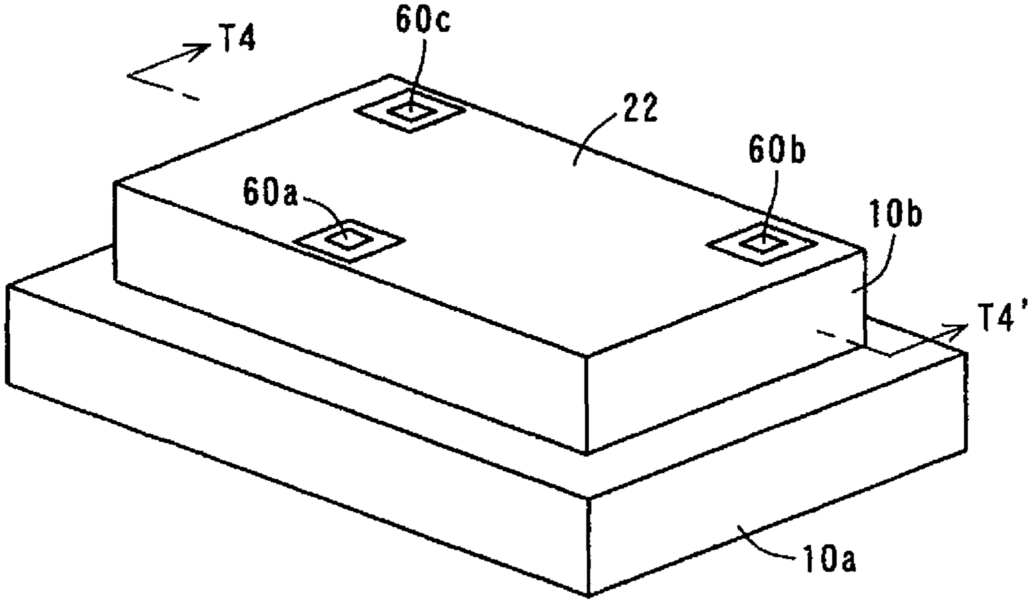
FIG. 70 is an external perspective view schematically showing a diplexer according to a twenty-first embodiment of the invention.
Figure 71:
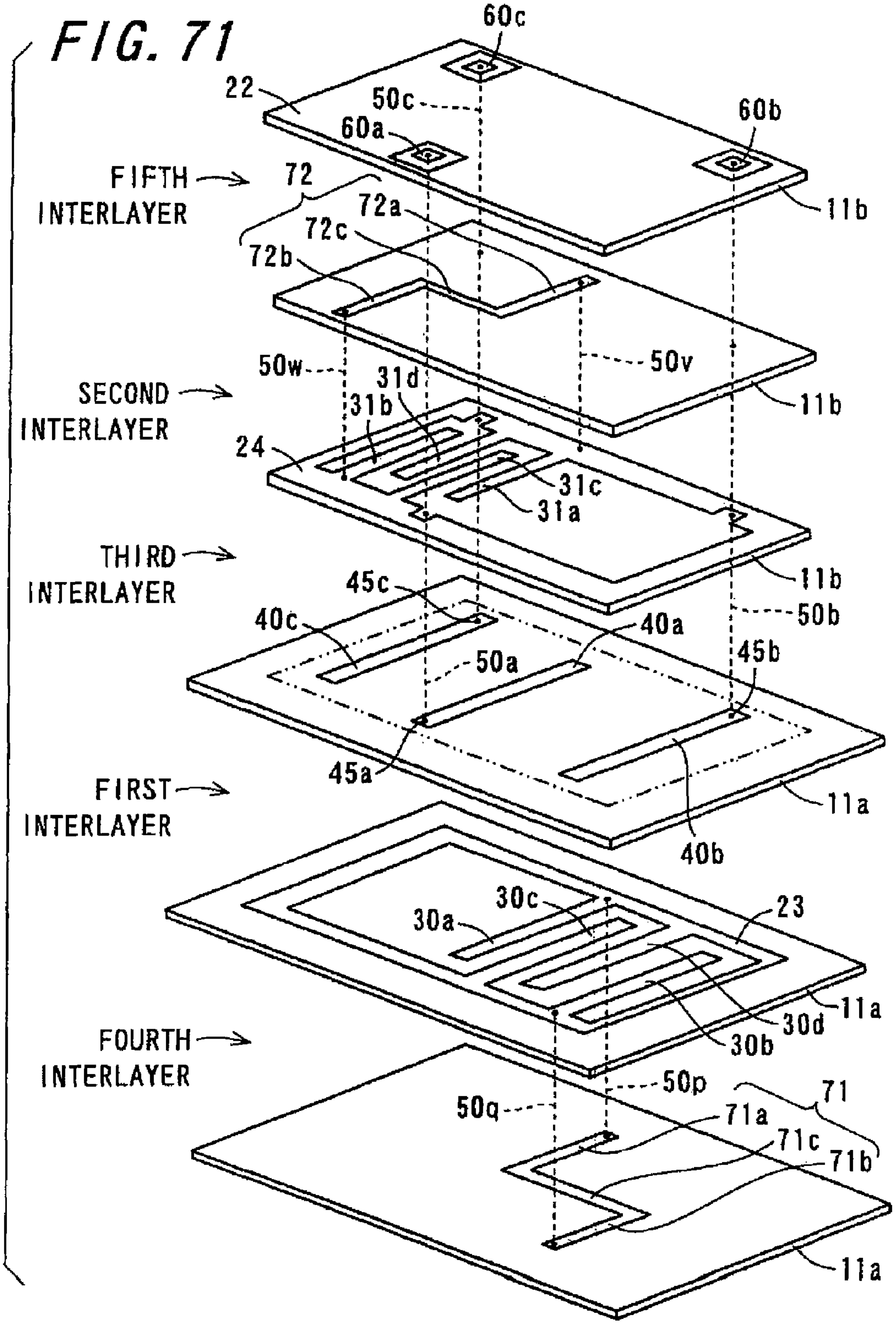
FIG. 71 is a schematic exploded perspective view of the diplexer shown in FIG. 70.
Figure 72:
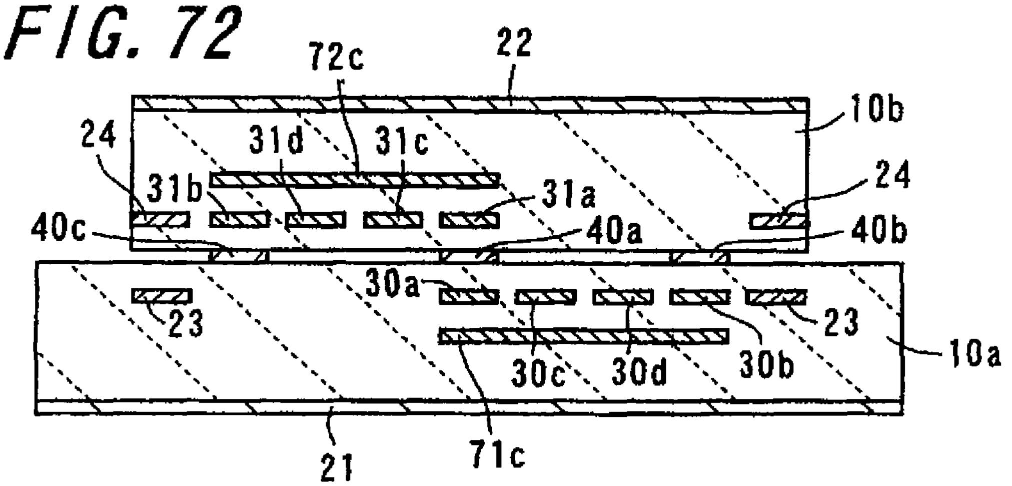
FIG. 72 is a cross-sectional view taken along line T4-T4' of FIG. 70.

FIG. 70 is an external perspective view schematically showing a diplexer according to a twenty-first embodiment of the invention. FIG. 71 is a schematic exploded perspective view of the diplexer shown in FIG. 70. FIG. 72 is a cross-sectional view taken along line T4-T4' of FIG. 70. Note that the following description deals with in what way this embodiment differs from the above-mentioned seventeenth embodiment, and the constituent components thereof that play the same or corresponding roles as in the preceding embodiment will be denoted by the same reference numerals and overlapping descriptions will be omitted.

In the diplexer of this embodiment, as shown in FIGS. 70 to 72, the multilayer body comprises a first multilayer body 10*a* and a second multilayer body 10*b* placed thereon. The first ground electrode 21 is disposed on a lower face of the first multilayer body 10*a*. The second ground electrode 22 is disposed on an upper face of the second multilayer body 10*b*.

The first interlayer, which bears the first resonant electrodes 30*a*, 30*b*, 30*c*, and 30*d* and the first annular ground electrode 23, and the fourth interlayer bearing the first resonant electrode coupling conductor 71, are located within the first multilayer body 10*a*. The second interlayer, which bears the second resonant electrodes 31*a*, 31*b*, 31*c*, and 31*d* and the second annular ground electrode 24, and a fifth interlayer bearing the second resonant electrode coupling conductor 72, are located within the second multilayer body 10*b*. The third interlayer, which bears the input coupling electrode 40*a*, the first output coupling electrode 40*b* and the second output coupling electrode 40*c*, is located between the first multilayer body 10*a* and the second multilayer body 10*b*. Note that the first multilayer body 10*a* has a stack of a plurality of dielectric layers 11*a* on top of each other, and the second multilayer body 10*b* has a stack of a plurality of dielectric layers 11*b* on top of each other.

According to the thus configured diplexer of this embodiment, the region bearing the first resonant electrodes 30*a*, 30*b*, 30*c*, and 30*d* and the region bearing the second resonant electrodes 31*a*, 31*b*, 31*c*, and 31*d* that differ in resonance frequency from each other, are separated into the first and second multilayer bodies 10*a* and 10*b*, by the third interlayer bearing the input coupling electrode 40*a*, the first output coupling electrode 40*b* and the second output coupling electrode 40*c*, serving as a boundary. In this construction, by designing the dielectric layer constituting the first multilayer body 10*a* and the dielectric layer constituting the second multilayer body 10*b* to have different electrical characteristics, it is possible to obtain desired electrical characteristics with ease. For example, the dielectric constant of the dielectric layer 11*a* constituting the first multilayer body 10*a*, in which are arranged the first resonant electrodes 30*a*, 30*b*, 30*c*, and 30*d* that are made longer than the second resonant electrodes 31*a*, 31*b*, 31*c*, and 31*d* because of having lower resonance frequencies, is set to be higher than the dielectric constant of the dielectric layer 11*b* constituting the second multilayer body 10*b*. This makes it possible to reduce the lengths of, respectively, the first resonant electrodes 30*a*, 30*b*, 30*c*, and 30*d*, and thereby eliminate wasted space inside the diplexer with consequent miniaturization of the diplexer. Moreover, in the diplexer of this embodiment, there is no need to establish electromagnetic-field coupling between the upper and lower electrode components separated by the third interlayer bearing the input coupling electrode 40*a*, the first output coupling electrode 40*b* and the second output coupling electrode 40*c*, interposed therebetween. That is, the third interlayer serves as a boundary to separate the first multilayer body 10*a* and the second multilayer body 10*b*. In this construction, for example, even if the first multilayer body 10*a* and the second multilayer body 10*b* are positionally displaced with respect to each other, or an air layer exists at the boundary between the first multilayer body 10*a* and the second multilayer body 10*b*, the risk of consequent deterioration in electrical characteristics can be kept to the minimum. Further, for example, in a case where the first multilayer body 10*a* is designed as a module substrate for mounting another electronic component or the like on the face of the region thereof other than the region constituting the diplexer, by disposing part of the diplexer within the second multilayer body 10*b*, the thickness of the module substrate can be reduced. Accordingly, it is possible to obtain a diplexer-equipped substrate in which the module can be made smaller in thickness as a whole.

Twenty-Second Embodiment

Figure 73:
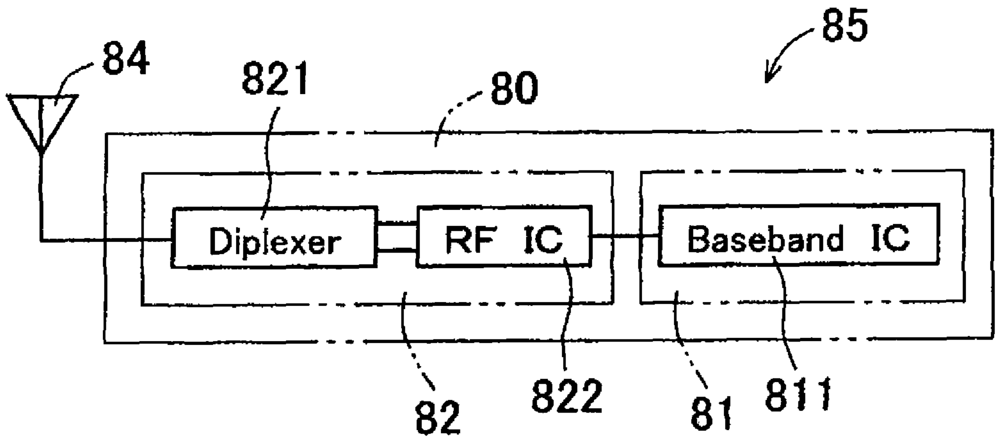
FIG. 73 is a block diagram showing a configuration example of a wireless communication module and a wireless communication apparatus using the diplexer, according to a twenty-second embodiment of the invention.

FIG. 73 is a block diagram showing a configuration example of a wireless communication module 80 and a wireless communication apparatus 85 using the diplexer, according to a twenty-second embodiment of the invention.

For example, the wireless communication module 80 of this embodiment comprises a baseband section 81 for processing a baseband signal and a RF section 82 connected to the baseband section 81, for processing a RF signal which is a consequence of baseband-signal modulation and a RF signal in an undemodulated state as well.

The RF section 82 includes a diplexer 821 which is any one of the diplexers of the first to twenty-first embodiments thus far described. In the RF section 82, of RF signals resulting from baseband-signal modulation or received RF signals, signals which lie outside the communication band are attenuated by the diplexer 821.

More specifically, in this construction, a baseband IC 811 is disposed in the baseband section 81, and, in the RF section 82, a RF IC 822 is so disposed as to lie between the diplexer 821 and the baseband section 81. Note that another circuit may be interposed between these circuits.

With the connection of an antenna 84 to the diplexer 821 of the wireless communication module 80, the construction of the wireless communication apparatus 85 for RF-signal transmission and reception in accordance with this embodiment will be completed.

According to the wireless communication module 80 and the wireless communication apparatus 85 of this embodiment having the diplexer according to any one of the first to the sixth embodiments, the diplexer 821 in which the loss of signals that pass therethrough is small throughout two entire frequency bands used for communications is used for wave filtering of transmitted signals and received signals, and, thus, the attenuation of received signals and transmitted signals that pass through the diplexer 821 is reduced. Accordingly, the receiver sensitivity is improved, and the amplification degree of transmitted signals and received signals can be reduced, and, thus, the power consumption in the amplifier is reduced. Thus, a high-performance wireless communication module 80 and wireless communication apparatus 85 that have high receiver sensitivity and that consume less electric power can be obtained. Moreover, two bandpass filters that respectively pass signals in two communication bands are realized as one diplexer 821, two terminals of the RF IC 822 and the antenna 84 can be directly connected by the diplexer 821, and, thus, a wireless communication module 80 and a wireless communication apparatus 85 that are small and that can be produced at low cost can be obtained.

According to the wireless communication module 80 and the wireless communication apparatus 85 of this embodiment having the diplexer according to any one of the seventh to the tenth embodiments, the diplexer 821 in which good input impedance matching is obtained and the loss of signals that pass therethrough is small throughout two entire frequency bands used for communications is used for wave filtering of transmitted signals and received signals, and, thus, the attenuation of received signals and transmitted signals that pass through the diplexer 821 is reduced. Accordingly, the receiver sensitivity is improved, and the amplification degree of transmitted signals and received signals can be reduced, and, thus, the power consumption in the amplifier is reduced. Thus, a high-performance wireless communication module 80 and wireless communication apparatus 85 that have high receiver sensitivity and that consume less electric power can be obtained. Moreover, two bandpass filters that respectively pass signals in two communication bands are realized as one diplexer 821, two terminals of the RF IC 822 and the antenna 84 can be directly connected by the diplexer 821, and, thus, a wireless communication module 80 and a wireless communication apparatus 85 that are small and that can be produced at low cost can be obtained.

According to the wireless communication module 80 and the wireless communication apparatus 85 of this embodiment having the diplexer according to any one of the eleventh to the sixteenth embodiments, the diplexer 821 in which the loss of signals that pass therethrough is small throughout two entire frequency bands used for communications and that has improved isolation characteristic is used for wave filtering of transmitted signals and received signals, and, thus, the attenuation of received signals and transmitted signals that pass through the diplexer 821 is reduced, and noises are reduced. Accordingly, the receiver sensitivity is improved, and the amplification degree of transmitted signals and received signals can be reduced, and, thus, the power consumption in the amplifier is reduced. Thus, a high-performance wireless communication module 80 and wireless communication apparatus 85 that have high receiver sensitivity and that consume less electric power can be obtained. Moreover, two bandpass filters that respectively pass signals in two communication bands are realized as one diplexer 821, two terminals of the RF IC 822 and the antenna 84 can be directly connected by the diplexer 821, and, thus, a wireless communication module 80 and a wireless communication apparatus 85 that are small and that can be produced at low cost can be obtained.

According to the wireless communication module 80 and the wireless communication apparatus 85 of this embodiment having the diplexer according to any one of the seventeenth to the twenty-first embodiments, the diplexer 821 in which the loss of signals that pass therethrough is small throughout two entire frequency bands used for communications and in which the attenuation of a stop band is sufficiently secured by attenuation poles formed near the pass band is used for wave filtering of transmitted signals and received signals, and, thus, the attenuation of received signals and transmitted signals that pass through the diplexer 821 is reduced, and noises are reduced. Accordingly, the receiver sensitivity is improved, and the amplification degree of transmitted signals and received signals can be reduced, and, thus, the power consumption in the amplifier is reduced. Thus, a high-performance wireless communication module 80 and wireless communication apparatus 85 that have high receiver sensitivity and that consume less electric power can be obtained. Moreover, two bandpass filters that respectively pass signals in two communication bands are realized as one diplexer 821, two terminals of the RF IC 822 and the antenna 84 can be directly connected by the diplexer 821, and, thus, a wireless communication module 80 and a wireless communication apparatus 85 that are small and that can be produced at low cost can be obtained.

In the diplexer of the invention, as the material of the dielectric layers 11, 11*a*, and lib, for example, resin such as epoxy resin, ceramics such as dielectric ceramics, and the like can be used. For example, a glass-ceramic material is preferably used that is composed of a dielectric ceramic material, such as $BaTiO_3$, $Pb_4Fe_2Nb_2O_{12}$, $TiO_2$, and a glass material, such as $B_2O_3$, $SiO_2$, $Al_2O_3$, ZnO, and that can be fired at a comparatively low temperature of approximately 800 to 1200° C. Furthermore, the thickness of the dielectric layers 11, 11*a*, and 11*b* is set to, for example, approximately 0.01 to 0.1 mm.

As the material of the above-described various electrodes and through conductors, for example, a conductive material that contains Ag or an Ag alloy such as Ag—Pd or Ag—Pt as a main component, a Cu-based, W-based, Mo-based, or Pd-based conductive material, and the like are preferably used. The thickness of the various electrodes is set to, for example, 0.001 to 0.2 mm.

The diplexer of the invention can be produced, for example, in the following manner. First, a slurry is formed by adding an appropriate organic solvent and the like to a ceramic material powder and mixing the resulting material, and ceramic green sheets are formed using a doctor blade method. Next, through holes for forming through conductors are formed in the obtained ceramic green sheets using a punching machine or the like, and filled with a conductor paste containing a conductor, such as Ag, Ag—Pd, Au, Cu, or the like. Furthermore, a conductor paste as described above is applied to the surface of the ceramic green sheets using a printing process, and, thus, conductor paste-applied ceramic green sheets are formed. Next, these conductor paste-applied ceramic green sheets are layered, pressed into each other using a hot pressing apparatus, and fired at a peak temperature of approximately 800° C. to 1050° C., and, thus, a diplexer is formed. Here, it is also possible to form a diplexer by separately forming a first multilayer body 10*a* and a second multilayer body 10*b*, and then mounting the second multilayer body 10*b* on the upper face of the first multilayer body 10*a* by soldering or the like.

MODIFIED EXAMPLES

The invention is not limited to the first to the twenty-second embodiments described above, and various modifications and improvements are possible within a range not departing from the gist of the invention.

For example, the first to the twenty-first embodiments described above show an example in which the input terminal electrode 60*a*, the first output terminal electrode 60*b*, and the second output terminal electrode 60*c* are arranged. However, in the case where the diplexer is formed in one region in the module substrate, the input terminal electrode 60*a*, the first output terminal electrode 60*b*, and the second output terminal electrode 60*c* are not absolutely necessary.

That is to say, in the first, the sixth, the eleventh, the twelfth, the sixteenth, the seventeenth, and the twenty-first embodiments, for example, a wiring conductor from an external circuit in the module substrate may be directly connected to the input coupling electrode 40*a*, the first output coupling electrode 40*b*, and the second output coupling electrode 40*c*. In this case, points that connect the input coupling electrode 40*a*, the first output coupling electrode 40*b*, and the second output coupling electrode 40*c*, and the wiring conductor are the electric signal input point 45*a*, the first electric signal output point 45*b*, and the second electric signal output point 45*c*.

Furthermore, in the seventh and the tenth embodiments described above, for example, a wiring conductor from an external circuit in the module substrate may be directly connected to the composite input coupling electrode 140*a*, the first output coupling electrode 40*b*, and the second output coupling electrode 40*c*. In this case, points that connect the composite input coupling electrode 140*a*, the first output coupling electrode 40*b*, and the second output coupling electrode 40*c*, and the wiring conductor are the electric signal input point 45*a*, the first electric signal output point 45*b*, and the second electric signal output point 45*c*.

Furthermore, in the second to the fifth embodiments described above, for example, a wiring conductor from an external circuit in the module substrate may be directly connected to the auxiliary input coupling electrode 41*a* and the auxiliary output coupling electrode 41*b*. In the fourth and the fifth embodiments described above, a wiring conductor from an external circuit in the module substrate may be directly connected to the additional electrode 42.

Moreover, in the eighth, the ninth, the thirteenth to the fifteenth, and the eighteenth to the twentieth embodiments described above, a wiring conductor from an external circuit in the module substrate may be directly connected to the auxiliary input coupling electrode 46*a* and the auxiliary output coupling electrode 46*b*. In the thirteenth to the fifteenth and the twentieth embodiments described above, a wiring conductor from an external circuit in the module substrate may be directly connected to the second auxiliary output coupling electrode 46*c*.

Furthermore, the second to the fifth, the thirteenth to the fifteenth, and the eighteenth to the twentieth embodiments described above show an example in which the input-stage auxiliary resonant electrode 32*a* and the output-stage auxiliary resonant electrode 32*b* are arranged on the third interlayer of the multilayer body 10 together with the input coupling electrode 40*a*, the first output coupling electrode 40*b*, and the second output coupling electrode 40*c*. However, the input-stage auxiliary resonant electrode 32*a* and the output-stage auxiliary resonant electrode 32*b* may be arranged on another interlayer of the multilayer body 10.

Furthermore, the eighth and the ninth embodiments described above show an example in which the input-stage auxiliary resonant electrode 32*a* and the output-stage auxiliary resonant electrode 32*b* are arranged on the third interlayer of the multilayer body 10 together with the first input coupling electrode 141*a* and the first output coupling electrode 40*b*. However, the input-stage auxiliary resonant electrode 32*a* and the output-stage auxiliary resonant electrode 32*b* may be arranged on another interlayer of the multilayer body 10.

Moreover, the thirteenth to the fifteenth embodiments described above show an example in which the input-stage auxiliary resonant electrode 32*a*, the output-stage auxiliary resonant electrode 32*b*, and the second auxiliary resonant electrode 34 are arranged on the third interlayer of the multilayer body 10 together with the input coupling electrode 40*a*, the first output coupling electrode 40*b*, and the second output coupling electrode 40*c*. However, the input-stage auxiliary resonant electrode 32*a*, the output-stage auxiliary resonant electrode 32*b*, and the second auxiliary resonant electrode 34 may be arranged on another interlayer of the multilayer body 10.

Moreover, in the second, the fourth, the fifth, the eighth, the thirteenth to the fifteenth, and the eighteenth to the twentieth embodiments described above show an example in which the auxiliary resonant electrodes 32*c* and 32*d* are arranged on an interlayer different from that of the input-stage auxiliary resonant electrode 32*a* and the output-stage auxiliary resonant electrode 32*b*. However, the auxiliary resonant electrodes 32*c* and 32*d* may be arranged on the same interlayer as that of the input-stage auxiliary resonant electrode 32*a* and the output-stage auxiliary resonant electrode 32*b*.

Moreover, the eighth embodiment described above shows an example in which the auxiliary input coupling electrode 46*a* and the auxiliary output coupling electrode 46*b* are arranged on the fourth interlayer together with the second input coupling electrode 142*a*. However, the auxiliary input coupling electrode 46*a* and the auxiliary output coupling electrode 46*b*, and the second input coupling electrode 142*a* may be arranged on different interlayers of the multilayer body 10. Furthermore, the auxiliary input coupling electrode 46*a* and the auxiliary output coupling electrode 46*b* may be arranged on different interlayers.

Moreover, the eighth embodiment described above shows an example in which the auxiliary input coupling electrode 46*a* is connected via the through conductor 50*h* to the composite input coupling electrode 140*a*. However, for example, the auxiliary input coupling electrode 46*a* may be directly connected to the second input coupling electrode 142*a*.

Furthermore, the first to the tenth embodiments described above show an example in which four first resonant electrodes 30*a*, 30*b*, 30*c*, and 30*d* and four second resonant electrodes 31*a*, 31*b*, 31*c*, and 31*d* are arranged. However, the number of first resonant electrodes and the number of second resonant electrodes may be changed according to a necessary pass bandwidth and a necessary attenuation outside the pass band. For example, in the case where a necessary pass bandwidth is narrow or in the case where a necessary attenuation outside the pass band is small, the number of resonant electrodes may be reduced. On the other hand, for example, in the case where a necessary pass bandwidth is wide or in the case where a necessary attenuation outside the pass band is large, the number of, resonant electrodes may be further increased. Here, in the case where the number of resonant electrodes is too large, the apparatus size increases or the loss in the pass band increases, and, thus, it is desirable to set each of the number of first resonant electrodes and the number of second resonant electrodes to approximately 10 or less. Furthermore, the number of first resonant electrodes and the number of second resonant electrodes may be different from each other.

Moreover, the first, the second, the fourth to the eighth, and the tenth embodiments described above show a case in which the first resonant electrodes 30*a*, 30*b*, 30*c*, and 30*d* and the second resonant electrodes 31*a*, 31*b*, 31*c*, and 31*d* are arranged side by side with their one ends as well as their other ends displaced in relation to each other in a staggered manner, and coupled to each other in an interdigital form. However, there is no limitation to this. That is to say, the first resonant electrodes 30*a*, 30*b*, 30*c*, and 30*d* and the second resonant electrodes 31*a*, 31*b*, 31*c*, and 31*d* may be arranged such that both a comb-line coupling and an interdigital coupling are present, as in the third and the ninth embodiments. Furthermore, all of the first resonant electrodes 30*a*, 30*b*, 30*c*, and 30*d* and the second resonant electrodes 31*a*, 31*b*, 31*c*, and 31*d* may make electromagnetic-field coupling in a comb-line form, by arranging the one ends of all resonant electrodes on the same side. Here, in the case where the resonant electrodes make electromagnetic-field coupling in a comb-line form, it is desirable, for example, to reduce the gap between the resonators compared with in the case where the resonant electrodes make electromagnetic-field coupling in an interdigital form, in order to obtain an electromagnetic coupling having a necessary intense.

Furthermore, the eleventh to the sixteenth embodiments described above show a case in which the number of first resonant electrodes is four, and the number of second resonant electrodes is four or three. However, the number of resonant electrodes may be further increased, or the number of resonant electrodes may be reduced, according to a necessary pass bandwidth and a necessary attenuation outside the pass band. Here, in the case where the number of resonant electrodes is too large, the apparatus size increases or the loss in the pass band increases, and, thus, it is desirable to each of the number of first resonant electrodes and the number of second resonant electrodes to approximately 10 or less. Here, in the case where the number of second resonant electrodes is two, the third resonant electrode 33 and the input-stage first resonant electrode 30*a* are located closer to each other, and the electromagnetic coupling therebetween becomes too intense. Thus, the influence on the properties of the pass band formed by the first resonant electrodes increases, and adjustments for obtaining good filter properties are difficult, and, thus, it is desirable to set the number of second resonant electrodes to three or more. Moreover, in the case where the number of second resonant electrodes is 2n+1, it is necessary to arrange the one end of the output-stage second resonant electrode 31*b* and the one end of the third resonant electrode 33 on opposite sides. Accordingly, the output-stage second resonant electrode 31*b* and the third resonant electrode 33 are arranged in an interdigital form and the electromagnetic coupling therebetween becomes intense. Thus, the influence on the pass band formed by the second resonant electrodes increases, and adjustments for obtaining good filter properties are difficult. Thus, it is more desirable to set the number of second resonant electrodes to 2n+2, and to arrange the one end of the output-stage second resonant electrode 31*b* and the one end of the third resonant electrode 33 on the same side.

Moreover, the eleventh to the sixteenth embodiments described above show a case in which the first resonant electrodes 30*a*, 30*b*, 30*c*, and 30*d* are arranged side by side with their one ends as well as their other ends displaced in relation to each other in a staggered manner, and coupled to each other in an interdigital form. However, there is no limitation to this. That is to say, the first resonant electrodes 30*a*, 30*b*, 30*c*, and 30*d* may be arranged such that both a comb-line coupling and an interdigital coupling are present, as in the third and the ninth embodiments. Furthermore, the first resonant electrodes 30*a*, 30*b*, 30*c*, and 30*d* may make electromagnetic-field coupling in a comb-line form, by arranging all one ends thereof on the same side. Here, in the case where the resonant electrodes make electromagnetic-field coupling in a comb-line form, it is desirable, for example, to reduce the gap between the resonators compared with in the case where the resonant electrodes make electromagnetic-field coupling in an interdigital form, in order to obtain an electromagnetic coupling having a necessary intense.

Moreover, the seventeenth to the twenty-first embodiments described above show a case in which the number of first resonant electrodes and the number of second resonant electrodes are four. However, the number of resonant electrodes may be further increased according to a necessary pass bandwidth and a necessary attenuation outside the pass band. Furthermore, the number of resonant electrodes not forming the resonant electrode group may be reduced, and the number of first resonant electrodes and the number of second resonant electrodes may be different from each other. Here, in the case where the number of resonant electrodes is too large, the apparatus size increases or the loss in the pass band increases, and, thus, it is desirable to each of the number of first resonant electrodes and the number of second resonant electrodes to approximately 10 or less.

Moreover, the seventeenth to the twenty-first embodiments described above show an example in which a first resonant electrode group is configured from four first resonant electrodes 30*a*, 30*b*, 30*c*, and 30*d*, and a second resonant electrode group is configured from four second resonant electrodes 31*a*, 31*b*, 31*c*, and 31*d*. However, the number of resonant electrodes forming the first resonant electrode group and the second resonant electrode group may be any even number of four or more, and the number may be six, eight, or 10 or more.

Furthermore, the seventeenth to the twenty-first embodiments described above show an example in which the first resonant electrode group is configured from all of the first resonant electrodes, and the seventeenth and the twenty-first embodiments show an example in which the second resonant electrode group is configured from all of the second resonant electrodes. However, the first resonant electrode group can be configured from four or more given adjacent first resonant electrodes among the first resonant electrodes, and the second resonant electrode group can be configured from four or more given adjacent second resonant electrodes among the second resonant electrodes. For example, the first resonant electrode group may be configured from four adjacent first resonant electrodes including the second to the fifth first resonant electrodes among seven first resonant electrodes that are linearly arranged.

Moreover, the eighteenth to the twentieth embodiments described above show an example in which the second resonant electrodes 31*a*, 31*b*, 31*c*, and 31*d* are arranged with their one ends as well as their other ends displaced in relation to each other in a staggered manner, and make electromagnetic-field coupling in an interdigital form. However, the plurality of second resonant electrodes 31*a*, 31*b*, 31*c*, and 31*d* may be arranged side by side such that all one ends thereof are located in the same orientation, and make electromagnetic-field coupling in a comb-line form. Furthermore, the electrodes may be arranged side by side such that both an electromagnetic coupling in an interdigital form and an electromagnetic coupling in a comb-line form are present. More specifically, the electrodes need only be arranged side by side so as to make electromagnetic-field coupling with each other. The same can be applied also to the first resonant electrodes that do not form a resonant electrode group.

Furthermore, the eleventh to the sixteenth embodiments described above show a configuration in which both ends of the resonant electrode coupling conductor 71 are respectively connected via the through conductors 50*p* and 50*q* to the first annular ground electrode 23 close to the one ends of the input-stage first resonant electrode 30*a* and the third resonant electrode 33. However, both ends of the resonant electrode coupling conductor 71 may be connected via the through conductors 50*p* and 50*q* to the first ground electrode 21. Furthermore, for example, an annular ground conductor may be disposed around the resonant electrode coupling conductor 71, and both ends of the resonant electrode coupling conductor 71 may be connected to the annular ground conductor. Here, a configuration in which both ends of the resonant electrode coupling conductor 71 are respectively connected via the through conductors 50*p* and 50*q* to the first annular ground electrode 23 close to the one ends of the input-stage first resonant electrode 30*a* and the third resonant electrode 33 can realize a more intense electromagnetic coupling between the input-stage first resonant electrode 30*a* and the third resonant electrode 33 via the resonant electrode coupling conductor 71.

Moreover, the seventeenth and the twenty-first embodiments described above show an example in which both of the first resonant electrode coupling conductor 71 and the second resonant electrode coupling conductor 72 are arranged, and the eighteenth to the twentieth embodiments show an example in which only the first resonant electrode coupling conductor 71 is disposed. However, only the second resonant electrode coupling conductor 72 may be disposed. In the case where only the second resonant electrode coupling conductor 72 is disposed, attenuation poles can be formed close to both ends of a pass band formed by the second resonant electrodes.

Furthermore, the seventeenth to the twenty-first embodiments described above show an example in which both ends of the first resonant electrode coupling conductor 71 are respectively connected via the through conductors 50*p* and 50*q* to the first annular ground electrode 23 close to the one ends of the frontmost-stage first resonant electrode and the rearmost-stage first resonant electrode forming the first resonant electrode group, and the seventeenth and the twenty-first embodiments show a configuration in which both ends of the second resonant electrode coupling conductor 72 are respectively connected via the through conductors 50*v* and 50*w* to the second annular ground electrode 24 close to the one ends of the frontmost-stage second resonant electrode and the rearmost-stage second resonant electrode forming the second resonant electrode group. However, both ends of the first resonant electrode coupling conductor 71 may be connected via the through conductors 50*p* and 50*q* to the first ground electrode 21, and both ends of the second resonant electrode coupling conductor 72 may be connected via the through conductors 50*v* and 50*w* to the second ground electrode 22. Furthermore, for example, annular ground conductors may be arranged around the first resonant electrode coupling conductor 71 and the second resonant electrode coupling conductor 72, and both ends of the first resonant electrode coupling conductor 71 and the second resonant electrode coupling conductor 72 may be connected to the annular ground conductors. Here, in the case where attenuation poles formed on both sides of a pass band are requested to be closer to the pass band, these methods are not preferable so much.

Moreover, the first to the twenty-first embodiments described above show an example in which the first ground electrode 21 is disposed on the lower face of the multilayer body 10, and the second ground electrode 22 is disposed on the upper face of the multilayer body 10. However, for example, a dielectric layer 11 may be further disposed below the first ground electrode 21, or a dielectric layer 11 may be further disposed above the second ground electrode 22.

Moreover, the sixth, the tenth, the sixteenth, and the twenty-first embodiments described above show an example in which the diplexer is divided at the third interlayer into the first multilayer body 10*a* and the second multilayer body lob. However, the diplexer may be divided at an interlayer different from the third interlayer, into the first multilayer body 10*a* and the second multilayer body lob according to the situation, and the diplexer may be divided into a larger number of multilayer bodies. In the tenth embodiment, substantially the same effect can be obtained even in the case where the diplexer is divided at the fourth interlayer into the first multilayer body 10*a* and the second multilayer body 10*b*.

Moreover, the twenty-first embodiment described above shows an example in which both of the first resonant electrode coupling conductor 71 and the second resonant electrode coupling conductor 72 are arranged. However, it will be appreciated that only either one of the first resonant electrode coupling conductor 71 and the second resonant electrode coupling conductor 72 may be disposed even in the case where the multilayer body is divided into a plurality of multilayer bodies as in the twenty-first embodiment.

Furthermore, the description is given above using as an example a diplexer used for a UWB, but it will be appreciated that the diplexer of the invention is effective also for other applications that require a wide band.

Examples

Next, specific examples of the diplexer of the invention will be described.

Example 1

The electrical properties of the diplexer of the second embodiment shown in FIGS. 5 to 8 were calculated by a simulation using a finite element method.

The calculation conditions were as follows. The first resonant electrodes 30*a*, 30*b*, 30*c*, and 30*d* were set in the shape of rectangles having a width of 0.3 mm and a length of 3.6 mm, the gap between the first resonant electrode 30*a* and the first resonant electrode 30*c* and the gap between the first resonant electrode 30*d* and the first resonant electrode 30*b* were set to 0.2 mm, and the gap between the first resonant electrode 30*c* and the first resonant electrode 30*d* was set to 0.25 mm. The second resonant electrodes 31*a*, 31*b*, 31*c*, and 31*d* were set in the shape of rectangles having a width of 0.3 mm and a length of 2.7 mm, the gap between the second resonant electrode 31*a* and the second resonant electrode 31*c* was set to 0.22 mm, the gap between the second resonant electrode 31*c* and the second resonant electrode 31*d* was set to 0.30 mm, and the gap between the second resonant electrode 31*d* and the second resonant electrode 31*b* was set to 0.23 mm. The widths of the input coupling electrode 40*a*, the auxiliary input coupling electrode 41*a*, the first output coupling electrode 40*b*, the auxiliary output coupling electrode 41*b*, and the second output coupling electrode 40*c* were set to 0.3 mm. The input-stage auxiliary resonant electrode 32*a* and the output-stage auxiliary resonant electrode 32*b* were set so as to have a shape obtained by joining a rectangle spaced away from the other ends of the first resonant electrodes 30*a* and 30*b* by 0.2 mm and having a width of 0.45 mm and a length of 0.41 mm and a rectangle facing the first resonant electrodes 30*a* and 30*b* and having a width of 0.2 mm and a length of 0.5 mm, and the auxiliary resonant electrodes 32*c* and 32*d* other than the auxiliary resonant electrodes 32*a* and 32*b* were set so as to have a shape obtained by joining a rectangle spaced away from the other ends of the first resonant electrodes 30*c* and 30*d* by 0.2 mm and having a width of 0.5 mm and a length of 0.41 mm and a rectangle facing the first resonant electrodes 30*c* and 30*d* and having a width of 0.2 mm and a length of 0.5 mm. The input terminal electrode 60*a*, the first output terminal electrode 60*b*, and the second output terminal electrode 60*c* were set in the shape of squares with each side having a length of 0.3 mm, and the gaps between the electrodes and the second ground electrode 22 were set to 0.2 mm. The first ground electrode 21, the second ground electrode 22, the first annular ground electrode 23, and the second annular ground electrode 24 were set in the shape of squares with each side having a length of 5 mm, an opening portion of the first annular ground electrode 23 was set in the shape of a rectangle having a width of 3.9 mm and a length of 3.75 mm, and an opening portion of the second annular ground electrode 24 was set in the shape of a rectangle having a width of 3.9 mm and a length of 2.85 mm. The overall shape of the diplexer was set such that the width and the length were 5 mm and the thickness was 0.975 mm, and that the third interlayer was located at the center in its thickness direction. In the first to the third interlayers and the interlayers A and B, the gap between adjacent interlayers (the gap between the various electrodes arranged on adjacent interlayers) was set to 0.065 mm. The thicknesses of the various electrodes were set to 0.01 mm, and the diameters of the various through conductors were set to 0.1 mm. The relative permittivity of the dielectric layers 11 was set to 9.45.

Figure 74:
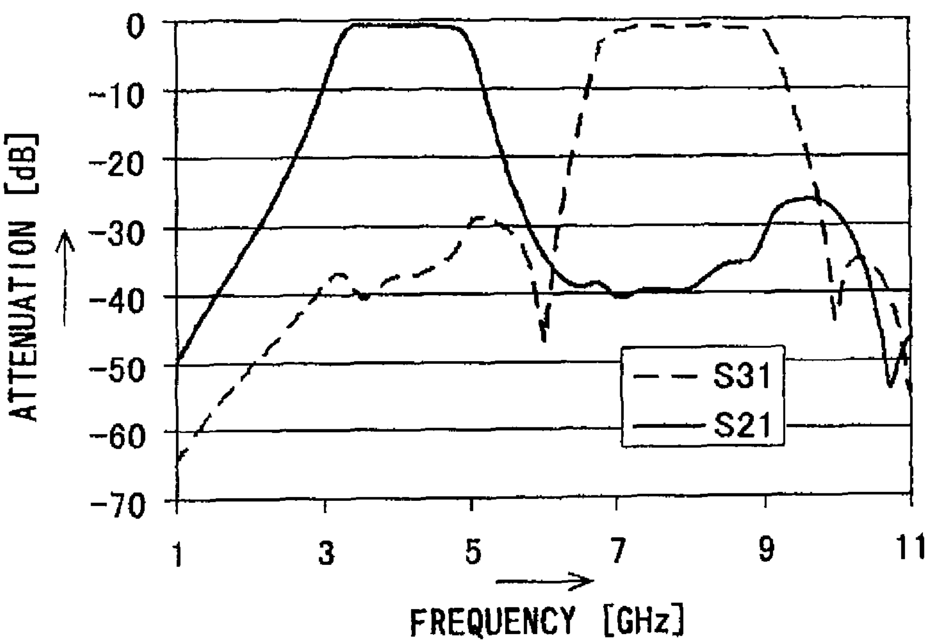
FIG. 74 is a graph showing simulation results of the electrical properties of the diplexer of the invention.

FIG. 74 is a graph showing the simulation results. The horizontal axis indicates frequency, and the vertical axis indicates attenuation. The graph shows a pass characteristic (S21) between a port 1 and a port 2 and a pass characteristic (S31) between a port 1 and a port 3 when the input terminal electrode 60*a* was set to the port 1, the first output terminal electrode 60*b* was set to the port 2, and the second output terminal electrode 60*c* was set to the port 3. According to the graph shown in FIG. 74, the loss is low in both pass characteristics, throughout an entire very wide pass band in which the fractional bandwidth is approximately 40%, which is much wider than a region realized by a conventional filter using a quarter-wavelength resonator. Based on these results, it is seen that the diplexer of the invention can obtain an excellent pass characteristic in which the form is flat and the loss is low throughout the entire wide pass band in each of the two pass characteristics, and the effectiveness of the invention was confirmed.

Example 2

The electrical properties of the diplexer of the eighth embodiment shown in FIGS. 25 to 28 were calculated by a simulation using a finite element method.

The calculation conditions were as follows. The first resonant electrodes 30*a*, 30*b*, 30*c*, and 30*d* were set in the shape of rectangles having a width of 0.3 mm and a length of 3.6 mm, the gap between the first resonant electrodes 30*a* and 30*c* and the gap between the first resonant electrodes 30*d* and 30*b* were set to 0.2 mm, and the gap between the first resonant electrodes 30*c* and 30*d* was set to 0.265 mm. The second resonant electrodes 31*a*, 31*b*, 31*c*, and 31*d* were set in the shape of rectangles having a length of 2.8 mm, the widths of the second resonant electrodes 31*a* and 31*b* were set to 0.25 mm, and the widths of the second resonant electrodes 31*c* and 31*d* were set to 0.2 mm. The gap between the second resonant electrodes 31*a* and 31*c* was set to 0.15 mm, the gap between the second resonant electrodes 31*c* and 31*d* was set to 0.22 mm, and the gap between the second resonant electrodes 31*d* and 31*b* was set to 0.19 mm. The input-stage auxiliary resonant electrode 32*a* and the output-stage auxiliary resonant electrode 32*b* were set so as to have a shape obtained by joining a rectangle spaced away from the other ends of the first resonant electrodes 30*a* and 30*b* by 0.2 mm and having a width of 0.45 mm and a length of 0.41 mm and a rectangle facing the first resonant electrodes 30*a* and 30*b* and having a width of 0.2 mm and a length of 0.5 mm, and the auxiliary resonant electrodes 32*c* and 32*d* other than the auxiliary resonant electrodes 32*a* and 32*b* were set so as to have a shape obtained by joining a rectangle spaced away from the other ends of the first resonant electrodes 30*c* and 30*d* by 0.2 mm and having a width of 0.5 mm and a length of 0.41 mm and a rectangle facing the first resonant electrodes 30*c* and 30*d* and having a width of 0.2 mm and a length of 0.5 mm.

The first input coupling electrode 141*a* was set in the shape of a rectangle having a width of 0.25 mm and a length of 3.3 mm, and an end thereof was provided with an additional extending portion having a width of 0.95 mm and a length of 0.4 mm in order to adjust the coupling. The second input coupling electrode 142*a* was set in the shape of a rectangle having a width of 0.25 mm and a length of 2.6 mm, and an end thereof was provided with an additional extending portion having a width of 0.95 mm and a length of 0.4 mm in order to adjust the coupling. Furthermore, the input-side connection conductor 143*a* and the input-side auxiliary connection conductor 144*a* formed of via-holes were arranged so as to connect the first input coupling electrode 141*a* and the second input coupling electrode 142*a*. All of the first output coupling electrode 40*b*, the second output coupling electrode 40*c*, the auxiliary input coupling electrode 46*a*, and the auxiliary output coupling electrode 46*b* were set in the shape of rectangles having a width of 0.25 mm, the lengths of the first output coupling electrode 40*b* and the second portion 40*c*2 of the second output coupling electrode 40*c* were set to 3.2 mm, and the lengths of the first portion 40*c*1 of the second output coupling electrode 40*c*, the auxiliary input coupling electrode 46*a*, and the auxiliary output coupling electrode 46*b* were set to 1.1 mm.

The input terminal electrode 60*a*, the first output terminal electrode 60*b*, and the second output terminal electrode 60*c* were set in the shape of squares with each side having a length of 0.3 mm. The first ground electrode 21, the second ground electrode 22, the first annular ground electrode 23, and the second annular ground electrode 24 were set in the shape of squares with each side having a length of 5 mm, and an opening portion of the first annular ground electrode 23 was set in the shape of a rectangle having a width of 3.9 mm and a length of 3.75 mm, and an opening portion of the second annular ground electrode 24 was set in the shape of a rectangle having a width of 3.9 mm and a length of 2.85 mm. The overall shape of the diplexer was set such that the width was 5 mm, the length was 5 mm, and the thickness was 0.98 mm, and that the third interlayer was located at the center in its thickness direction. In the first to the fourth interlayers and the interlayer A, the gap between adjacent interlayers (the gap between the various electrodes arranged on adjacent interlayers) was set to 0.065 mm. The thicknesses of the various electrodes were set to 0.01 mm, and the diameters of the various through conductors were set to 0.1 mm. The relative permittivity of the dielectric layers 11 was set to 9.45.

Figure 75:
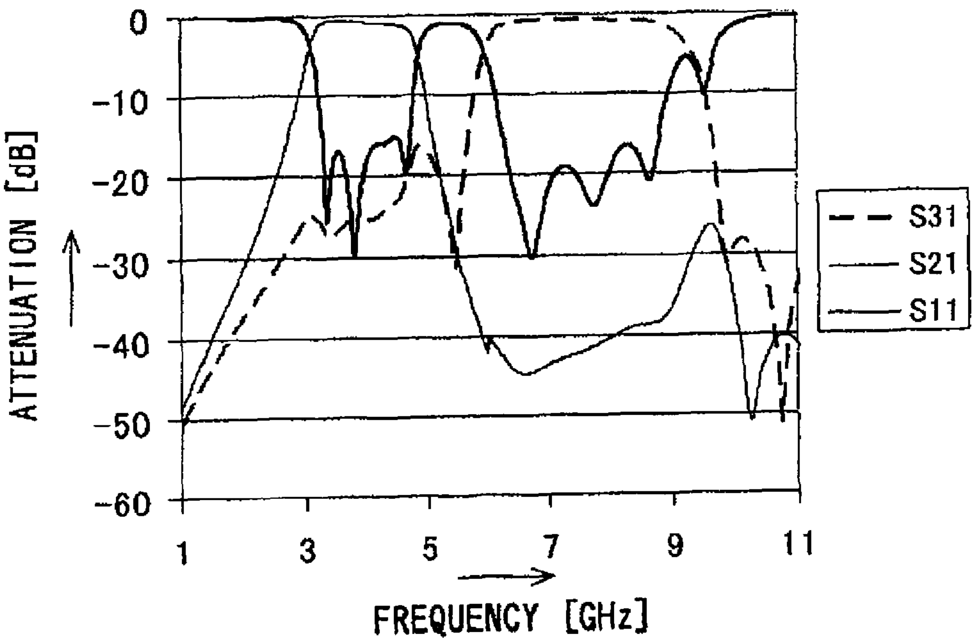
FIG. 75 is a graph showing simulation results of the electrical properties of the diplexer of the invention.

FIG. 75 is a graph showing the simulation results. The horizontal axis indicates frequency, and the vertical axis indicates attenuation. The graph shows pass characteristics (S21 and S31) and a reflection characteristic (S11) of the diplexer when the input terminal electrode 60*a* was set to the port 1, the first output terminal electrode 60*b* was set to the port 2, and the second output terminal electrode 60*c* was set to the port 3.

According to the graph shown in FIG. 75, S11 is −16 dB or more in each of the two very wide pass bands in which the fractional bandwidth is approximately 40% to 50%, and it is seen that good input impedance matching is obtained. In particular, in a pass band having the higher frequency, the improvement in S11 is significant. Also, regarding the pass characteristic, the form is flatter and the loss is lower in each of the two pass bands. Based on these results, it is seen that the diplexer of the invention can obtain an excellent pass characteristic in which good input impedance matching is obtained and in which the form is flat and the loss is low throughout the entire wide pass bands, and the effectiveness of the invention was confirmed.

Example 3

The electrical properties of the diplexer of the fourteenth embodiment shown in FIGS. 43 to 46 were calculated by a simulation using a finite element method.

The calculation conditions were as follows. The first resonant electrodes 30*a*, 30*b*, 30*c*, and 30*d* were set in the shape of rectangles having a width of 0.3 mm and a length of 3.6 mm, the gap between the first resonant electrode 30*a* and the first resonant electrode 30*c* and the gap between the first resonant electrode 30*d* and the first resonant electrode 30*b* were set to 0.2 mm, and the gap between the first resonant electrode 30*c* and the first resonant electrode 30*d* was set to 0.26 mm. The second resonant electrodes 31*a* and 31*b* were set in the shape of rectangles having a width of 0.25 mm and a length of 2.3 mm, the second resonant electrodes 31*c* and 31*d* were set in the shape of rectangles having a width of 0.2 mm and a length of 2.8 mm, the gap between the second resonant electrode 31*a* and the second resonant electrode 31*c* was set to 0.15 mm, the gap between the second resonant electrode 31*c* and the second resonant electrode 31*d* was set to 0.26 mm, and the gap between the second resonant electrode 31*d* and the second resonant electrode 31*b* was set to 0.23 mm. The third resonant electrode 33 was set in the shape of a rectangle having a width of 0.3 mm and a length of 3.6 mm. The widths of the input coupling electrode 40*a*, the first output coupling electrode 40*b*, the second output coupling electrode 40*c*, the auxiliary input coupling electrode 46*a*, the auxiliary output coupling electrode 46*b*, and the second auxiliary output coupling electrode 46*c* were set to 0.25 mm, and the lengths thereof were respectively set to 3.6 mm, 3.2 mm, 3.6 mm, 1.1 mm, 1.1 mm, and 1.1 mm. The input-stage auxiliary resonant electrode 32*a* and the output-stage auxiliary resonant electrode 32*b* were set so as to have a shape obtained by joining a rectangle spaced away from the other ends of the first resonant electrodes 30*a* and 30*b* by 0.2 mm and having a width of 0.5 mm and a length of 0.49 mm and a rectangle facing the first resonant electrodes 30*a* and 30*b* and having a width of 0.2 mm and a length of 0.5 mm, and the auxiliary resonant electrodes 32*c* and 32*d* other than the auxiliary resonant electrodes 32*a* and 32*b* were set so as to have a shape obtained by joining a rectangle spaced away from the other ends of the first resonant electrodes 30*c* and 30*d* by 0.2 mm and having a width of 0.5 mm and a length of 0.47 mm and a rectangle facing the first resonant electrodes 30*c* and 30*d* and having a width of 0.2 mm and a length of 0.5 mm. The second auxiliary resonant electrode 34 was set so as to have a shape obtained by joining a rectangle spaced away from the other end of the third resonant electrode 33 by 0.2 mm and having a width of 0.5 mm and a length of 0.49 mm and a rectangle facing the third resonant electrode 33 and having a width of 0.2 mm and a length of 0.5 mm. The front-stage side coupling region 71*a* and the rear-stage side coupling region 71*b* of the resonant electrode coupling conductor 71 were set in the shape of rectangles having a width of 0.1 mm and a length of 2.15 mm, and the connecting region 71*c* was set in the shape of a rectangle having a width of 0.1 mm and a length of 0.985 mm. The input terminal electrode 60*a*, the first output terminal electrode 60*b*, and the second output terminal electrode 60*c* were set in the shape of squares with each side having a length of 0.3 mm, and the gaps between the electrodes and the second ground electrode 22 were set to 0.2 mm. The first ground electrode 21, the second ground electrode 22, the first annular ground electrode 23, and the second annular ground electrode 24 were set in the shape of squares with each side having a length of 5 mm, an opening portion of the first annular ground electrode 23 was set in the shape of a rectangle having a width of 3.9 mm and a length of 3.75 mm, and an opening portion of the second annular ground electrode 24 was set in the shape of a rectangle having a width of 3.9 mm and a length of 2.85 mm. The overall shape of the diplexer was set such that the width and the length were 5 mm and the thickness was 0.975 mm, and that the third interlayer was located at the center in its thickness direction. In the first to the fourth interlayers and the interlayer A, the gap between adjacent interlayers (the gap between the various electrodes arranged on adjacent interlayers) was set to 0.065 mm. The thicknesses of the various electrodes were set to 0.01 mm, and the diameters of the various through conductors were set to 0.1 mm. The relative permittivity of the dielectric layers 11 was set to 9.45.

Figure 76:
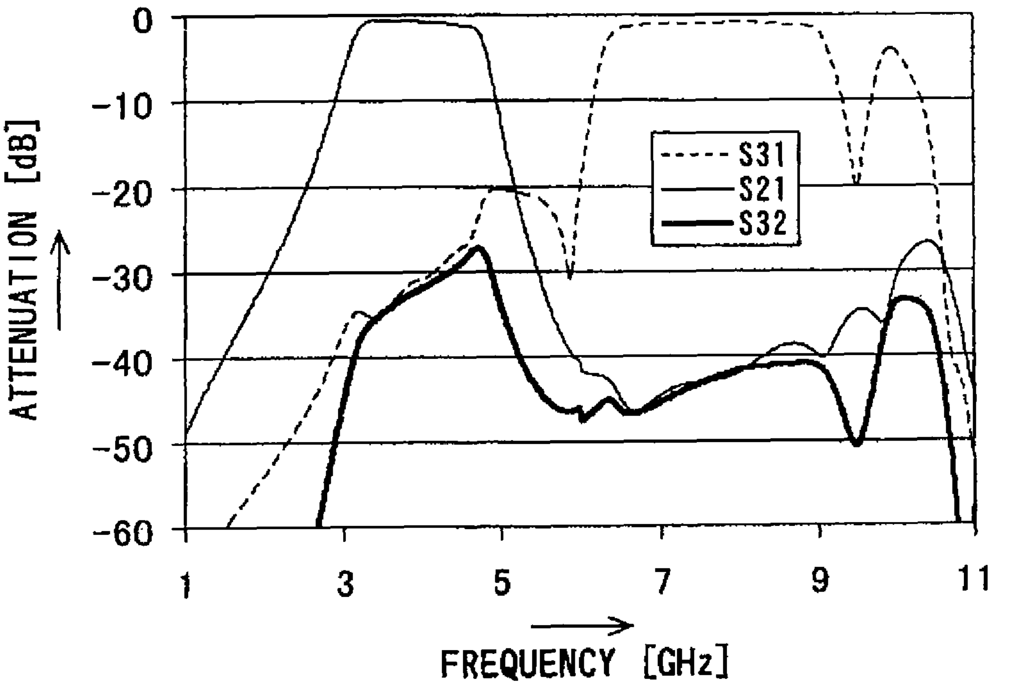
FIG. 76 is a graph showing simulation results of the electrical properties of the diplexer of the invention.

FIG. 76 is a graph showing the simulation results. The horizontal axis indicates frequency, and the vertical axis indicates attenuation. The graph shows pass characteristics (S21 and S31) and an isolation characteristic (S32) of the diplexer when the input terminal electrode 60*a* was set to the port 1, the first output terminal electrode 60*b* was set to the port 2, and the second output terminal electrode 60*c* was set to the port 3.

According to the graph shown in FIG. 76, S32 is approximately −30 dB at a frequency of approximately 3 to 5 GHz near the pass band formed by the first resonant electrodes 30*a*, 30*b*, 30*c*, and 30*d*, and it is seen that a very good isolation characteristic is obtained in the diplexer of the invention. Based on these results, it is seen that the diplexer of the invention can obtain an excellent pass characteristic in which the form is flat and the loss is low throughout two entire wide pass bands, and can obtain a good isolation characteristic, and the effectiveness of the invention was confirmed.

Example 4

The electrical properties of the diplexer of the eighteenth embodiment shown in FIGS. 58 to 61 were calculated by a simulation using a finite element method.

The calculation conditions were as follows. The first resonant electrodes 30*a*, 30*b*, 30*c*, and 30*d* were set in the shape of rectangles having a width of 0.3 mm and a length of 3.6 mm, the gap between the first resonant electrode 30*a* and the first resonant electrode 30*c* and the gap between the first resonant electrode 30*d* and the first resonant electrode 30*b* were set to 0.2 mm, and the gap between the first resonant electrode 30*c* and the first resonant electrode 30*d* was set to 0.26 mm. The second resonant electrodes 31*a* and 31*b* were set in the shape of rectangles having a width of 0.25 mm and a length of 2.3 mm, the second resonant electrodes 31*c* and 31*d* were set in the shape of rectangles having a width of 0.2 mm and a length of 2.8 mm, the gap between the second resonant electrode 31*a* and the second resonant electrode 31*c* was set to 0.145 mm, the gap between the second resonant electrode 31*c* and the second resonant electrode 31*d* was set to 0.26 mm, and the gap between the second resonant electrode 31*d* and the second resonant electrode 31*b* was set to 0.225 mm. The widths of the input coupling electrode 40*a*, the auxiliary input coupling electrode 46*a*, the first output coupling electrode 40*b*, the auxiliary output coupling electrode 46*b*, and the second output coupling electrode 40*c* were set to 0.3 mm. The input-stage auxiliary resonant electrode 32*a* and the output-stage auxiliary resonant electrode 32*b* were set so as to have a shape obtained by joining a rectangle spaced away from the other ends of the first resonant electrodes 30*a* and 30*b* by 0.2 mm and having a width of 0.5 mm and a length of 0.42 mm and a rectangle facing the first resonant electrodes 30*a* and 30*b* and having a width of 0.2 mm and a length of 0.5 mm, and the auxiliary resonant electrodes 32*c* and 32*d* other than the auxiliary resonant electrodes 32*a* and 32*b* were set so as to have a shape obtained by joining a rectangle spaced away from the other ends of the first resonant electrodes 30*c* and 30*d* by 0.2 mm and having a width of 0.5 mm and a length of 0.47 mm and a rectangle facing the first resonant electrodes 30*c* and 30*d* and having a width of 0.2 mm and a length of 0.5 mm. The first front-stage side coupling region 71*a* and the first rear-stage side coupling region 71*b* were set in the shape of rectangles having a width of 0.1 mm and a length of 2.1 mm, and the first connecting region 71*c* was set in the shape of a rectangle having a width of 0.1 mm and a length of 1.7 mm. The input terminal electrode 60*a*, the first output terminal electrode 60*h*, and the second output terminal electrode 60*c* were set in the shape of squares with each side having a length of 0.3 mm, and the gaps between the electrodes and the second ground electrode 22 were set to 0.2 mm. The first ground electrode 21, the second ground electrode 22, the first annular ground electrode 23, and the second annular ground electrode 24 were set in the shape of squares with each side having a length of 5 mm, an opening portion of the first annular ground electrode 23 was set in the shape of a rectangle having a width of 3.9 mm and a length of 3.75 mm, and an opening portion of the second annular ground electrode 24 was set in the shape of a rectangle having a width of 3.9 mm and a length of 2.85 mm. The overall shape of the diplexer was set such that the width and the length were 5 mm and the thickness was 0.975 mm, and that the third interlayer was located at the center in its thickness direction. In the first to the fourth interlayers and the interlayers A and B, the gap between adjacent interlayers (the gap between the various electrodes arranged on adjacent interlayers) was set to 0.065 mm. The thicknesses of the various electrodes were set to 0.01 mm, and the diameters of the various through conductors were set to 0.1 mm. The relative permittivity of the dielectric layers 11 was set to 9.45.

Figure 77:
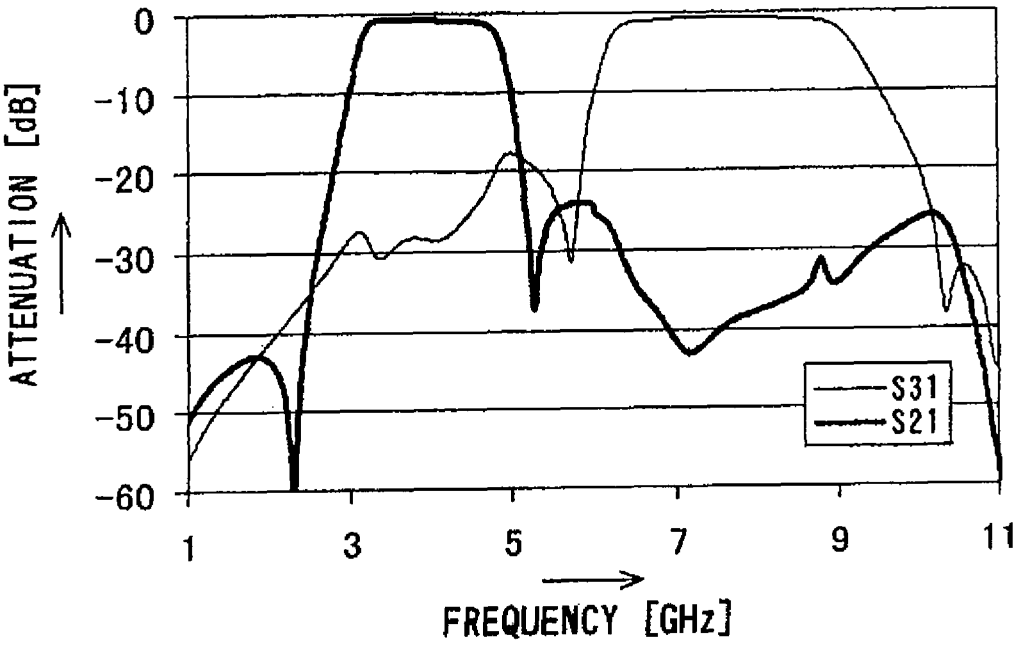
FIG. 77 is a graph showing simulation results of the electrical properties of the diplexer of the invention.

FIG. 77 is a graph showing the simulation results. The horizontal axis indicates frequency, and the vertical axis indicates attenuation. The graph shows a pass characteristic (S21) between a port 1 and a port 2 and a pass characteristic (S31) between the port 1 and a port 3 when the input terminal electrode 60*a* was set to the port 1, the first output terminal electrode 60*b* was set to the port 2, and the second output terminal electrode 60*c* was set to the port 3.

According to the graph shown in FIG. 77, the loss is low in both of the pass characteristic (S21) between the port 1 and the port 2 and the pass characteristic (S31) between the port 1 and the port 3, throughout an entire very wide pass band in which the fractional bandwidth is approximately 40%, which is much wider than a region realized by a conventional filter using a quarter-wavelength resonator. Moreover, in the pass characteristic (S21) between the port 1 and the port 2, excellent properties are obtained in which attenuation poles are respectively formed near both ends of a pass band, and the attenuation sharply changes from the passband to the stop band. Here, the diplexer used in this simulation does not include the second resonant electrode coupling conductor 72, and the attenuation poles formed on both sides of a pass band in the pass characteristic (S31) between the port 1 and the port 3 are not intentionally formed poles. In the case where this diplexer is adjusted by adding the second resonant electrode coupling conductor 72, attenuation poles can be formed at positions closer to both sides of a pass band in the pass characteristic (S31) between the port 1 and the port 3, and excellent properties can be obtained in which the attenuation more sharply changes from the passband to the stop band. Based on these results, it is seen that the diplexer of the invention can obtain a wide pass band in which the form is flat and the loss is low in each of the two pass characteristics, and can obtain an excellent pass characteristic in which the attenuation sharply changes from the passband to the stop band, and the effectiveness of the invention was confirmed.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. A diplexer, comprising:

a multilayer body having a stack of a plurality of dielectric layers on top of each other;

a first ground electrode that is disposed on a lower face of the multilayer body;

a plurality of strip-like first resonant electrodes that are arranged side by side on a first interlayer of the multilayer body for mutual electromagnetic-field coupling, with their one ends connected to a ground potential so as to serve as a quarter-wavelength resonator;

a plurality of strip-like second resonant electrodes that are arranged side by side on a second interlayer of the multilayer body different from the first interlayer for mutual electromagnetic-field coupling, with their one ends connected to a ground potential so as to serve as a quarter-wavelength resonator that resonates at a frequency higher than a frequency at which the first resonant electrode resonates;

a strip-like input coupling electrode that is disposed on a third interlayer of the multilayer body located between the first interlayer and the second interlayer, faces an input-stage first resonant electrode of the plurality of first resonant electrodes, over more than half of an entire longitudinal area thereof for electromagnetic-field coupling, faces an input-stage second resonant electrode of the plurality of second resonant electrodes, over more than half of an entire longitudinal area thereof for electromagnetic-field coupling, and has an electric signal input point for receiving input of an electric signal from an external circuit;

a strip-like first output coupling electrode that is disposed on an interlayer of the multilayer body different from the first interlayer, faces an output-stage first resonant electrode of the plurality of first resonant electrodes, over more than half of an entire longitudinal area thereof for electromagnetic-field coupling, and has a first electric signal output point for producing output of an electric signal toward the external circuit; and a strip-like second output coupling electrode that is disposed on an interlayer of the multilayer body different from the second interlayer, faces an output-stage second resonant electrode of the plurality of second resonant electrodes, over more than half of an entire longitudinal area thereof, and has a second electric signal output point for producing output of an electric signal toward the external circuit, the one end of the input-stage first resonant electrode and the one end of the input-stage second resonant electrode being located on a same side, the first output coupling electrode and the second output coupling electrode in a plan view being located on opposite sides with the input coupling electrode interposed therebetween, the electric signal input point being located, on the input coupling electrode, closer to another end of the input-stage first resonant electrode than a center of a part facing the input-stage first resonant electrode, and closer to another end of the input-stage second resonant electrode than a center of a part facing the input-stage second resonant electrode, the first electric signal output point being located, on the first output coupling electrode, closer to another end of the output-stage first resonant electrode than a center of a part facing the output-stage first resonant electrode, and the second electric signal output point being located, on the second output coupling electrode, closer to another end of the output-stage second resonant electrode than a center of a part facing the output-stage second resonant electrode.

2. The diplexer of claim 1, wherein the plurality of first resonant electrodes are arranged side by side, with their one ends as well as their other ends displaced in relation to each other in a staggered manner, and the plurality of second resonant electrodes are arranged side by side, with their one ends as well as their other ends displaced in relation to each other in a staggered manner.

3. The diplexer of claim 1, further comprising:

a first annular ground electrode that is formed in an annular shape on the first interlayer so as to surround the plurality of first resonant electrodes, and is connected to the one ends, respectively, of the plurality of first resonant electrodes; and a second annular ground electrode that is formed in an annular shape on the second interlayer so as to surround the plurality of second resonant electrodes, and is connected to the one ends, respectively, of the plurality of second resonant electrodes.

4. The diplexer of claim 3, further comprising auxiliary resonant electrodes that are arranged, on an interlayer of the multilayer body different from the first interlayer, so as to have a region facing the first annular ground electrode, and are connected via through conductors to the other ends of the first resonant electrodes, the auxiliary resonant electrodes being arranged respectively corresponding to the plurality of first resonant electrodes.

5. The diplexer of claim 4, wherein among the auxiliary resonant electrodes, an input-state auxiliary resonant electrode connected to the input-stage first resonant electrode is disposed on an interlayer of the multilayer body located on a same side as the input coupling electrode with respect to the first interlayer, an output-stage auxiliary resonant electrode connected to the output-stage first resonant electrode is disposed on an interlayer of the multilayer body located on a same side as the first output coupling electrode with respect to the first interlayer, and the diplexer further comprises:

an auxiliary input coupling electrode that is disposed, on an interlayer of the multilayer body different from the first interlayer, the third interlayer, and the interlayer bearing the input-stage auxiliary resonant electrode, so as to have a region facing the input-stage auxiliary resonant electrode, and is connected via a through conductor to the electric signal input point of the input coupling electrode; and an auxiliary output coupling electrode that is disposed, on an interlayer of the multilayer body different from the first interlayer, the interlayer bearing the first output coupling electrode, and the interlayer bearing the output-stage auxiliary resonant electrode, so as to have a region facing the output-stage auxiliary resonant electrode, and is connected via a through conductor to the first electric signal output point of the first output coupling electrode.

6. The diplexer of claim 1, wherein the multilayer body comprises a first multilayer body and a second multilayer body that is placed thereon, the first ground electrode is disposed on a lower face of the first multilayer body, the plurality of first resonant electrodes and the plurality of second resonant electrodes are arranged in mutually different multilayer bodies of the first multilayer body and the second multilayer body, and the input coupling electrode, the first output coupling electrode, and the second output coupling electrode are arranged between the first multilayer body and the second multilayer body.

7. A diplexer, comprising:

a multilayer body having a stack of a plurality of dielectric layers on top of each other;

a first ground electrode that is disposed on a lower face of the multilayer body;

a plurality of strip-like first resonant electrodes that are arranged side by side on a first interlayer of the multilayer body for mutual electromagnetic-field coupling, with their one ends connected to a ground potential so as to serve as a quarter-wavelength resonator;

a plurality of strip-like second resonant electrodes that are arranged side by side on a second interlayer of the multilayer body different from the first interlayer for mutual electromagnetic-field coupling, with their one ends connected to a ground potential so as to serve as a quarter-wavelength resonator that resonates at a frequency higher than a frequency at which the first resonant electrode resonates;

a composite input coupling electrode including a strip-like first input coupling electrode that is disposed on a third interlayer of the multilayer body located between the first interlayer and the second interlayer, and faces an input-stage first resonant electrode of the plurality of first resonant electrodes, over more than half of an entire longitudinal area thereof; a strip-like second input coupling electrode that is disposed on a fourth interlayer of the multilayer body located between the second interlayer and the third interlayer, and faces an input-stage second resonant electrode of the plurality of second resonant electrodes, over more than half of an entire longitudinal area thereof; and an input-side connection conductor that connects the first input coupling electrode and the second input coupling electrode; the composite input coupling electrode making electromagnetic-field coupling with the input-stage first resonant electrode and the input-stage second resonant electrode, and having an electric signal input point for receiving input of an electric signal;

a strip-like first output coupling electrode that is disposed on an interlayer of the multilayer body different from the first interlayer, faces an output-stage first resonant electrode of the plurality of first resonant electrodes, over more than half of an entire longitudinal area thereof for electromagnetic-field coupling, and has a first electric signal output point for producing output of an electric signal; and a strip-like second output coupling electrode that is disposed on an interlayer of the multilayer body different from the second interlayer, faces an output-stage second resonant electrode of the plurality of second resonant electrodes, over more than half of an entire longitudinal area thereof for electromagnetic-field coupling, and has a second electric signal output point for producing output of an electric signal;

the one end of the input-stage first resonant electrode and the one end of the input-stage second resonant electrode being located on a same side, the first output coupling electrode and the second output coupling electrode in a plan view being located on opposite sides with the input coupling electrodes interposed therebetween, the electric signal input point and the input-side connection conductor being located, on the composite input coupling electrode, closer to another end of the input-stage first resonant electrode than a center of a part facing the input-stage first resonant electrode, and closer to another end of the input-stage second resonant electrode than a center of a part facing the input-stage second resonant electrode, the first electric signal output point being located, on the first output coupling electrode, closer to another end of the output-stage first resonant electrode than a center of a part facing the output-stage first resonant electrode, and the second electric signal output point being located, on the second output coupling electrode, closer to another end of the output-stage second resonant electrode than a center of a part facing the output-stage second resonant electrode.

8. The diplexer of claim 7, wherein the plurality of first resonant electrodes are arranged side by side, with their one ends as well as their other ends displaced in relation to each other in a staggered manner, and the plurality of second resonant electrodes are arranged side by side, with their one ends as well as their other ends displaced in relation to each other in a staggered manner.

9. The diplexer of claim 7, further comprising an input-side auxiliary connection conductor that is disposed on a side opposite the input-side connection conductor with respect to a center of a region where the first input coupling electrode and the second input coupling electrode face each other, and connects the first input coupling electrode and the second input coupling electrode.

10. The diplexer of claim 7, further comprising:

a first annular ground electrode that is formed in an annular shape on the first interlayer so as to surround the plurality of first resonant electrodes, and is connected to the one ends, respectively, of the plurality of first resonant electrodes; and a second annular ground electrode that is formed in an annular shape on the second interlayer so as to surround the plurality of second resonant electrodes, and is connected to the one ends, respectively, of the plurality of second resonant electrodes.

11. The diplexer of claim 10, further comprising auxiliary resonant electrodes that are arranged, on an interlayer of the multilayer body different from the first interlayer, so as to have a region facing the first annular ground electrode, and are connected via through conductors to the other ends of the first resonant electrodes, the auxiliary resonant electrodes being arranged respectively corresponding to the plurality of first resonant electrodes.

12. The diplexer of claim 11, wherein among the auxiliary resonant electrodes, an input-stage auxiliary resonant electrode connected to the input-stage first resonant electrode is disposed on an interlayer of the multilayer body located on a same side as the composite input coupling electrode with respect to the first interlayer, an output-stage auxiliary resonant electrode connected to the output-stage first resonant electrode is disposed on an interlayer of the multilayer body located on a same side as the first output coupling electrode with respect to the first interlayer, and the diplexer further comprises:

an auxiliary input coupling electrode that is disposed, on an interlayer of the multilayer body different from the first interlayer, the third interlayer, and the interlayer bearing the input-stage auxiliary resonant electrode, so as to have a region facing the input-stage auxiliary resonant electrode, and is connected via a through conductor to the electric signal input point of the composite input coupling electrode; and an auxiliary output coupling electrode that is disposed, on an interlayer of the multilayer body different from the first interlayer, the interlayer bearing the first output coupling electrode, and the interlayer bearing the output-stage auxiliary resonant electrode, so as to have a region facing the output-stage auxiliary resonant electrode, and is connected via a through conductor to the first electric signal output point of the first output coupling electrode.

13. The diplexer of claim 7, wherein the multilayer body comprises a first multilayer body and a second multilayer body that is placed thereon, the first ground electrode is disposed on a lower face of the first multilayer body, the first interlayer and the second interlayer are interlayers in mutually different multilayer bodies of the first multilayer body and the second multilayer body, the first output coupling electrode is disposed on the third interlayer, the second output coupling electrode is disposed on the fourth interlayer, and the third interlayer or the fourth interlayer is an interlayer between the first multilayer body and the second multilayer body.

14. A diplexer, comprising:

a multilayer body having a stack of a plurality of dielectric layers on top of each other;

a first ground electrode that is disposed on a lower face of the multilayer body;

a plurality of strip-like first resonant electrodes that are arranged side by side on a first interlayer of the multilayer body for mutual electromagnetic-field coupling, with their one ends connected to a ground potential so as to serve as a quarter-wavelength resonator;

2n strip-like second resonant electrodes (n is a natural number) that are arranged side by side on a second interlayer of the multilayer body different from the first interlayer, with their one ends as well as their other ends displaced in relation to each other in a staggered manner, have their one ends connected to a ground potential so as to serve as a quarter-wavelength resonator that resonates at a frequency higher than a frequency at which the first resonant electrode resonates, and make electromagnetic-field coupling with each other;

a strip-like input coupling electrode that is disposed on a third interlayer of the multilayer body located between the first interlayer and the second interlayer, faces an input-stage first resonant electrode of the plurality of first resonant electrodes, over more than half of an entire longitudinal area thereof for electromagnetic-field coupling, faces an input-stage second resonant electrode of the 2n second resonant electrodes, over more than half of an entire longitudinal area thereof for electromagnetic-field coupling, and has an electric signal input point for receiving input of an electric signal;

a strip-like first output coupling electrode that is disposed on an interlayer of the multilayer body different from the first interlayer, faces an output-stage first resonant electrode of the plurality of first resonant electrodes, over more than half of an entire longitudinal area thereof for electromagnetic-field coupling, and has a first electric signal output point for producing output of an electric signal;

a strip-like second output coupling electrode that is disposed on the third interlayer of the multilayer body, faces an output-stage second resonant electrode of the 2n second resonant electrodes, over more than half of an entire longitudinal area thereof for electromagnetic-field coupling, and has a second electric signal output point for producing output of an electric signal;

a third resonant electrode that is disposed, on the first interlayer of the multilayer body, faces the second output coupling electrode for electromagnetic-field coupling, with one end connected to a ground potential so as to serve as a quarter-wavelength resonator that resonates at a same frequency as a frequency at which the first resonant electrode resonates; and a resonant electrode coupling conductor that is disposed on a fourth interlayer of the multilayer body located on a side opposite the third interlayer with the first interlayer interposed therebetween, has its one end connected to a ground potential close to the one end of the input-stage first resonant electrode, has its another end connected to a ground potential close to the one end of the third resonant electrode, and has a region facing the one end of the input-stage first resonant electrode for electromagnetic-field coupling and a region facing the one end of the third resonant electrode for electromagnetic-field coupling, the one end of the input-stage first resonant electrode and the one end of the input-stage second resonant electrode being located on a same side, the one end of the output-stage second resonant electrode and the one end of the third resonant electrode being located on a same side, the first output coupling electrode and the second output coupling electrode in a plan view being located on opposite sides with the input coupling electrode interposed therebetween, the electric signal input point being located, on the input coupling electrode, closer to another end of the input-stage first resonant electrode than a center of a part facing the input-stage first resonant electrode, and closer to another end of the input-stage second resonant electrode than a center of a part facing the input-stage second resonant electrode, the first electric signal output point being located, on the first output coupling electrode, closer to another end of the output-stage first resonant electrode than a center of a part facing the output-stage first resonant electrode, and the second electric signal output point being located, on the second output coupling electrode, closer to another end of the output-stage second resonant electrode than a center of a part facing the output-stage second resonant electrode.

15. A diplexer, comprising:

a multilayer body having a stack of a plurality of dielectric layers on top of each other;

a first ground electrode that is disposed on a lower face of the multilayer body;

a plurality of strip-like first resonant electrodes that are arranged side by side on a first interlayer of the multilayer body for mutual electromagnetic-field coupling, with their one ends connected to a ground potential so as to serve as a quarter-wavelength resonator;

2n+1 strip-like second resonant electrodes (n is a natural number) that are arranged side by side on a second interlayer of the multilayer body different from the first interlayer, with their one ends as wells as their other ends displaced in relation to each other in a staggered manner, have their one ends connected to a ground potential so as to serve as a quarter-wavelength resonator that resonates at a frequency higher than a frequency at which the first resonant electrode resonates, and make electromagnetic-field coupling with each other;

a strip-like input coupling electrode that is disposed on a third interlayer of the multilayer body located between the first interlayer and the second interlayer, faces an input-stage first resonant electrode of the plurality of first resonant electrodes, over more than half of an entire longitudinal area thereof for electromagnetic-field coupling, faces an input-stage second resonant electrode of the 2n+1 second resonant electrodes, over more than half of an entire longitudinal area thereof for electromagnetic-field coupling, and has an electric signal input point for receiving input of an electric signal;

a strip-like first output coupling electrode that is disposed on an interlayer of the multilayer body different from the first interlayer, faces an output-stage first resonant electrode of the plurality of first resonant electrodes, over more than half of an entire longitudinal area thereof for electromagnetic-field coupling, and has a first electric signal output point for producing output of an electric signal;

a strip-like second output coupling electrode that is disposed on the third interlayer of the multilayer body, faces an output-stage second resonant electrode of the 2n+1 second resonant electrodes, over more than half of an entire longitudinal area thereof for electromagnetic-field coupling, and has a second electric signal output point for producing output of an electric signal;

a third resonant electrode that is disposed, on the first interlayer of the multilayer body, faces the second output coupling electrode for electromagnetic-field coupling, with its one end connected to a ground potential so as to serve as a quarter-wavelength resonator that resonates at a same frequency as a frequency at which the first resonant electrode resonates; and a resonant electrode coupling conductor that is disposed on a fourth interlayer of the multilayer body located on a side opposite the third interlayer with the first interlayer interposed therebetween, has its one end connected to a ground potential close to the one end of the input-stage first resonant electrode, has its another end connected to a ground potential close to the one end of the third resonant electrode, and has a region facing the one end of the input-stage first resonant electrode for electromagnetic-field coupling and a region facing the one end of the third resonant electrode for electromagnetic-field coupling, the one end of the input-stage first resonant electrode and the one end of the input-stage second resonant electrode being located on a same side, the one end of the output-stage second resonant electrode and the one end of the third resonant electrode being located on opposite sides, the first output coupling electrode and the second output coupling electrode in a plan view being located on opposite sides with the input coupling electrode interposed therebetween, the electric signal input point being located, on the input coupling electrode, closer to another end of the input-stage first resonant electrode than a center of a part facing the input-stage first resonant electrode, and closer to another end of the input-stage second resonant electrode than a center of a part facing the input-stage second resonant electrode, the first electric signal output point being located, on the first output coupling electrode, closer to another end of the output-stage first resonant electrode than a center of a part facing the output-stage first resonant electrode, and the second electric signal output point being located, on the second output coupling electrode, closer to another end of the output-stage second resonant electrode than a center of a part facing the output-stage second resonant electrode.

16. The diplexer of claim 14, wherein the resonant electrode coupling conductor comprises:

a strip-like first coupling region facing the input-stage first resonant electrode in parallel;

a strip-like second coupling region facing the third resonant electrode in parallel; and a connecting region formed so as to be perpendicular to each of the first coupling region and the second coupling region, for providing connection between these coupling regions.

17. The diplexer of claim 14, further comprising:

a first annular ground electrode that is formed in an annular shape on the first interlayer so as to surround the first resonant electrodes and the third resonant electrode, and is connected to the one ends, respectively, of the first resonant electrodes and the third resonant electrode; and a second annular ground electrode that is formed in an annular shape on the second interlayer so as to surround the second resonant electrodes, and is connected to the one ends, respectively, of the second resonant electrodes.

18. The diplexer of claim 17, further comprising auxiliary resonant electrodes that are arranged, on an interlayer of the multilayer body different from the first interlayer, so as to have a region facing the first annular ground electrode, and are connected via through conductors to the other ends of the first resonant electrodes, the auxiliary resonant electrodes being arranged respectively corresponding to the first resonant electrodes.

19. The diplexer of claim 18, wherein among the auxiliary resonant electrodes, an input-stage auxiliary resonant electrode connected to the input-stage first resonant electrode is disposed on an interlayer of the multilayer body located on a same side as the input coupling electrode with respect to the first interlayer, an output-stage auxiliary resonant electrode connected to the output-stage first resonant electrode is disposed on an interlayer of the multilayer body located on a same side as the first output coupling electrode with respect to the first interlayer, and the diplexer further comprises:

an auxiliary input coupling electrode that is disposed, on an interlayer of the multilayer body different from the first interlayer, the third interlayer, and the interlayer bearing the input-stage auxiliary resonant electrode, so as to have a region facing the input-stage auxiliary resonant electrode, and is connected via a through conductor to the electric signal input point of the input coupling electrode; and an auxiliary output coupling electrode that is disposed, on an interlayer of the multilayer body different from the first interlayer, the interlayer bearing the first output coupling electrode, and the interlayer bearing the output-stage auxiliary resonant electrode, so as to have a region facing the output-stage auxiliary resonant electrode, and is connected via a through conductor to the first electric signal output point of the first output coupling electrode.

20. The diplexer of claim 14, wherein the multilayer body comprises a first multilayer body and a second multilayer body that is placed thereon, the first ground electrode is disposed on a lower face of the first multilayer body, the first output coupling electrode is disposed on the third interlayer, the first interlayer and the second interlayer are interlayers in mutually different multilayer bodies of the first multilayer body and the second multilayer body, and the third interlayer is an interlayer between the first multilayer body and the second multilayer body.

21. A diplexer, comprising:

a multilayer body having a stack of a plurality of dielectric layers on top of each other;

a first ground electrode that is disposed on a lower face of the multilayer body;

four or more strip-like first resonant electrodes that are arranged side by side on a first interlayer of the multilayer body, with their one ends as well as their other ends displaced in relation to each other in a staggered manner, have their one ends connected to a ground potential so as to serve as a quarter-wavelength resonator, and make electromagnetic-field coupling with each other;

a plurality of strip-like second resonant electrodes that are arranged side by side on a second interlayer of the multilayer body different from the first interlayer for mutual electromagnetic-field coupling, with their one ends connected to a ground potential so as to serve as a quarter-wavelength resonator that resonates at a frequency higher than a frequency at which the first resonant electrode resonates;

a strip-like input coupling electrode that is disposed on a third interlayer of the multilayer body located between the first interlayer and the second interlayer, faces an input-stage first resonant electrode of the four or more first resonant electrodes, over more than half of an entire longitudinal area thereof for electromagnetic-field coupling, faces an input-stage second resonant electrode of the plurality of second resonant electrodes, over more than half of an entire longitudinal area thereof for electromagnetic-field coupling, and has an electric signal input point for receiving input of an electric signal;

a strip-like first output coupling electrode that is disposed on an interlayer of the multilayer body different from the first interlayer, faces an output-stage first resonant electrode of the four or more first resonant electrodes, over more than half of an entire longitudinal area thereof for electromagnetic-field coupling, and has a first electric signal output point for producing output of an electric signal;

a strip-like second output coupling electrode that is disposed on an interlayer of the multilayer body different from the second interlayer, faces an output-stage second resonant electrode of the plurality of second resonant electrodes, over more than half of an entire longitudinal area thereof for electromagnetic-field coupling, and has a second electric signal output point for producing output of an electric signal; and a first resonant electrode coupling conductor that is disposed on a fourth interlayer of the multilayer body located on a side opposite the third interlayer with the first interlayer interposed therebetween, has its one end connected to a ground potential close to one end of a frontmost-stage first resonant electrode forming a first resonant electrode group including an even number of the four or more first resonant electrodes adjacent to each other, has its other end connected to a ground potential close to one end of a rearmost-stage first resonant electrode forming the first resonant electrode group, and has a region facing the one end of the frontmost-stage first resonant electrode for electromagnetic-field coupling and a region facing the one end of the rearmost-stage first resonant electrode for electromagnetic-field coupling, the one end of the input-stage first resonant electrode and the one end of the input-stage second resonant electrode being located on a same side, the first output coupling electrode and the second output coupling electrode in a plan view being located on opposite sides with the input coupling electrode interposed therebetween, the electric signal input point being located, on the input coupling electrode, closer to another end of the input-stage first resonant electrode than a center of a part facing the input-stage first resonant electrode, and closer to another end of the input-stage second resonant electrode than a center of a part facing the input-stage second resonant electrode, the first electric signal output point being located, on the first output coupling electrode, closer to another end of the output-stage first resonant electrode than a center of a part facing the output-stage first resonant electrode, and the second electric signal output point being located, on the second output coupling electrode, closer to another end of the output-stage second resonant electrode than a center of a part facing the output-stage second resonant electrode.

22. The diplexer of claim 21, wherein the first resonant electrode coupling conductor comprises:

a strip-like first front-stage side coupling region facing the frontmost-stage first resonant electrode in parallel;

a strip-like first rear-stage side coupling region facing the rearmost-stage first resonant electrode in parallel; and a first connecting region formed so as to be perpendicular to each of the first front-stage side coupling region and the first rear-stage side coupling region, for providing connection between these coupling regions.

23. A diplexer, comprising:

a multilayer body having a stack of a plurality of dielectric layers on top of each other;

a first ground electrode that is disposed on a lower face of the multilayer body;

a plurality of strip-like first resonant electrodes that are arranged side by side on a first interlayer of the multilayer body for mutual electromagnetic-field coupling, with their one ends connected to a ground potential so as to serve as a quarter-wavelength resonator;

four or more strip-like second resonant electrodes that are arranged side by side on a second interlayer of the multilayer body different from the first interlayer, with their one ends as well as their other ends displaced in relation to each other in a staggered manner, have their one ends connected to a ground potential so as to serve as a quarter-wavelength resonator that resonates at a frequency higher than a frequency at which the first resonant electrode resonates, and make electromagnetic-field coupling with each other;

a strip-like input coupling electrode that is disposed on a third interlayer of the multilayer body located between the first interlayer and the second interlayer, faces an input-stage first resonant electrode of the plurality of first resonant electrodes, over more than half of an entire longitudinal area thereof for electromagnetic-field coupling, faces an input-stage second resonant electrode of the four or more second resonant electrodes, over more than half of an entire longitudinal area thereof for electromagnetic-field coupling, and has an electric signal input point for receiving input of an electric signal;

a strip-like first output coupling electrode that is disposed on an interlayer of the multilayer body different from the first interlayer, faces an output-stage first resonant electrode of the plurality of first resonant electrodes, over more than half of an entire longitudinal area thereof for electromagnetic-field coupling, and has a first electric signal output point for producing output of an electric signal;

a strip-like second output coupling electrode that is disposed on an interlayer of the multilayer body different from the second interlayer, faces an output-stage second resonant electrode of the four or more second resonant electrodes, over more than half of an entire longitudinal area thereof for electromagnetic-field coupling, and has a second electric signal output point for producing output of an electric signal; and a second resonant electrode coupling conductor that is disposed on a fifth interlayer of the multilayer body located on a side opposite the third interlayer with the second interlayer interposed therebetween, has its one end connected to a ground potential close to one end of a frontmost-stage second resonant electrode forming a second resonant electrode group including an even number of the four or more second resonant electrodes adjacent to each other, has its another end connected to a ground potential close to one end of a rearmost-stage second resonant electrode forming the second resonant electrode group, and has a region facing the one end of the frontmost-stage second resonant electrode for electromagnetic-field coupling and a region facing the one end of the rearmost-stage second resonant electrode for electromagnetic-field coupling, the one end of the input-stage first resonant electrode and the one end of the input-stage second resonant electrode being located on a same side, the first output coupling electrode and the second output coupling electrode in a plan view being located on opposite sides with the input coupling electrode interposed therebetween, the electric signal input point being located, on the input coupling electrode, closer to another end of the input-stage first resonant electrode than a center of a part facing the input-stage first resonant electrode, and closer to another end of the input-stage second resonant electrode than a center of a part facing the input-stage second resonant electrode, the first electric signal output point being located, on the first output coupling electrode, closer to another end of the output-stage first resonant electrode than a center of a part facing the output-stage first resonant electrode, and the second electric signal output point being located, on the second output coupling electrode, closer to another end of the output-stage second resonant electrode than a center of a part facing the output-stage second resonant electrode.

24. The diplexer of claim 23, wherein the second resonant electrode coupling conductor comprises:

a strip-like second front-stage side coupling region facing the fronmost-stage second resonant electrode in parallel;

a strip-like second rear-stage side coupling region facing the rearmost-stage second resonant electrode in parallel; and a second connecting region formed so as to be perpendicular to each of the second front-stage side coupling region and the second rear-stage side coupling region, for providing connection between these coupling regions.

25. A diplexer, comprising:

a multilayer body having a stack of a plurality of dielectric layers on top of each other;

a first ground electrode that is disposed on a lower face of the multilayer body;

four or more strip-like first resonant electrodes that are arranged side by side on a first interlayer of the multilayer body, with their one ends as well as their other ends displaced in relation to each other in a staggered manner, have their one ends connected to a ground potential so as to serve as a quarter-wavelength resonator, and make electromagnetic-field coupling with each other;

four or more strip-like second resonant electrodes that are arranged side by side on a second interlayer of the multilayer body different from the first interlayer, with their one ends as well as their other ends displaced in relation to each other in a staggered manner, have their one ends connected to a ground potential so as to serve as a quarter-wavelength resonator that resonates at a frequency higher than a frequency at which the first resonant electrode resonates, and make electromagnetic-field coupling with each other;

a strip-like input coupling electrode that is disposed on a third interlayer of the multilayer body located between the first interlayer and the second interlayer, faces an input-stage first resonant electrode of the four or more first resonant electrodes, over more than half of an entire longitudinal area thereof for electromagnetic-field coupling, faces an input-stage second resonant electrode of the four or more second resonant electrodes, over more than half of an entire longitudinal area thereof for electromagnetic-field coupling, and has an electric signal input point for receiving input of an electric signal;

a strip-like first output coupling electrode that is disposed on an interlayer of the multilayer body different from the first interlayer, faces an output-stage first resonant electrode of the four or more first resonant electrodes, over more than half of an entire longitudinal area thereof for electromagnetic-field coupling, and has a first electric signal output point for producing output of an electric signal;

a strip-like second output coupling electrode that is disposed on an interlayer of the multilayer body different from the second interlayer, faces an output-stage second resonant electrode of the four or more second resonant electrodes, over more than half of an entire longitudinal area thereof for electromagnetic-field coupling, and has a second electric signal output point for producing output of an electric signal;

a first resonant electrode coupling conductor that is disposed on a fourth interlayer of the multilayer body located on a side opposite the third interlayer with the first interlayer interposed therebetween, has its one end connected to a ground potential close to one end of a frontmost-stage first resonant electrode forming a first resonant electrode group including an even number of the four or more first resonant electrodes adjacent to each other, has its another end connected to a ground potential close to one end of a rearmost-stage first resonant electrode forming the first resonant electrode group, and has a region facing the one end of the frontmost-stage first resonant electrode for electromagnetic-field coupling and a region facing the one end of the rearmost-stage first resonant electrode for electromagnetic-field coupling; and a second resonant electrode coupling conductor that is disposed on a fifth interlayer of the multilayer body located on a side opposite the third interlayer with the second interlayer interposed therebetween, has its one end connected to a ground potential close to one end of a frontmost-stage second resonant electrode forming a second resonant electrode group including an even number of the four or more second resonant electrodes adjacent to each other, has its another end connected to a ground potential close to one end of a rearmost-stage second resonant electrode forming the second resonant electrode group, and has a region facing the one end of the frontmost-stage second resonant electrode for electromagnetic-field coupling and a region facing the one end of the rearmost-stage second resonant electrode for electromagnetic-field coupling, the one, end of the input-stage first resonant electrode and the one end of the input-stage second resonant electrode being located on a same side, the first output coupling electrode and the second output coupling electrode in a plan view being located on opposite sides with the input coupling electrode interposed therebetween, the electric signal input point being located, on the input coupling electrode, closer to another end of the input-stage first resonant electrode than a center of a part facing the input-stage first resonant electrode, and closer to another end of the input-stage second resonant electrode than a center of a part facing the input-stage second resonant electrode, the first electric signal output point being located, on the first output coupling electrode, closer to another end of the output-stage first resonant electrode than a center of a part facing the output-stage first resonant electrode, and the second electric signal output point being located, on the second output coupling electrode, closer to another end of the output-stage second resonant electrode than a center of a part facing the output-stage second resonant electrode.

26. The diplexer of claim 25, wherein the first resonant electrode coupling conductor comprises:

a strip-like first front-stage side coupling region facing the frontmost-stage first resonant electrode in parallel;

a strip-like first rear-stage side coupling region facing the rearmost-stage first resonant electrode in parallel; and a first connecting region formed so as to be perpendicular to each of the first front-stage side coupling region and the first rear-stage side coupling region, for providing connection between these coupling regions; and the second resonant electrode coupling conductor comprises:

a strip-like second front-stage side coupling region facing the frontmost-stage second resonant electrode in parallel;

a strip-like second rear-stage side coupling region facing the rearmost-stage second resonant electrode in parallel; and a second connecting region formed so as to be perpendicular to each of the second front-stage side coupling region and the second rear-stage side coupling region, for providing connection between these coupling regions.

27. The diplexer of claim 21, further comprising:

a first annular ground electrode that is formed in an annular shape on the first interlayer so as to surround the first resonant electrodes, and is connected to the one ends of the first resonant electrodes; and a second annular ground electrode that is formed in an annular shape on the second interlayer so as to surround the second resonant electrodes, and is connected to the one ends of the second resonant electrodes.

28. The diplexer of claim 27, further comprising auxiliary resonant electrodes that are arranged, on an interlayer of the multilayer body different from the first interlayer, so as to have a region facing the first annular ground electrode, and are connected via through conductors to the other ends of the first resonant electrodes, the auxiliary resonant electrodes being arranged respectively corresponding to the first resonant electrodes.

29. The diplexer of claim 28, wherein among the auxiliary resonant electrodes, an input-stage auxiliary resonant electrode connected to the input-stage first resonant electrode is disposed on an interlayer of the multilayer body located on a same side as the input coupling electrode with respect to the first interlayer, an output-stage auxiliary resonant electrode connected to the output-stage first resonant electrode is disposed on an interlayer of the multilayer body located on a same side as the first output coupling electrode with respect to the first interlayer, and the diplexer further comprises:

an auxiliary input coupling electrode that is disposed, on an interlayer of the multilayer body different from the first interlayer, the third interlayer, and the interlayer bearing the input-stage auxiliary resonant electrode, so as to have a region facing the input-stage auxiliary resonant electrode, and is connected via a through conductor to the electric signal input point of the input coupling electrode; and an auxiliary output coupling electrode that is disposed, on an interlayer of the multilayer body different from the first interlayer, the interlayer bearing the first output coupling electrode, and the interlayer bearing the output-stage auxiliary resonant electrode, so as to have a region facing the output-stage auxiliary resonant electrode, and is connected via a through conductor to the first electric signal output point of the first output coupling electrode.

30. The diplexer of claim 21, wherein the multilayer body comprises a first multilayer body and a second multilayer body that is placed thereon, the first ground electrode is disposed on a lower face of the first multilayer body, the first output coupling electrode and the second output coupling electrode are arranged on the third interlayer, the first interlayer and the second interlayer are interlayers in mutually different multilayer bodies of the first multilayer body and the second multilayer body, and the third interlayer is an interlayer between the first multilayer body and the second multilayer body.

31. A wireless communication module comprising:

a RF portion that includes the diplexer of claim 1; and a baseband portion that is connected to the RF portion.

32. A wireless communication apparatus comprising:

a RF portion that includes the diplexer of claim 1;

a baseband portion that is connected to the RF portion; and an antenna that is connected to the RF portion.

* * * * *